(12) United States Patent
Yunogami et al.

(10) Patent No.: US 6,607,988 B2
(45) Date of Patent: Aug. 19, 2003

(54) MANUFACTURING METHOD OF SEMICONDUCTOR INTEGRATED CIRCUIT DEVICE

(75) Inventors: Takashi Yunogami, Niiza (JP);
Yoshitaka Nakamura, Ome (JP);
Kazuo Nojiri, Higashimurayama (JP);
Sukeyoshi Tsunekawa, Iruma (JP);
Toshiyuki Arai, Machida (JP); Miwako Nakahara, Yokohama (JP); Shigeru Ohno, Yokohama (JP); Tomonori Saeki, Yokohama (JP); Masaru Izawa, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/749,554

(22) Filed: Dec. 28, 2000

(65) Prior Publication Data
US 2001/0006245 A1 Jul. 5, 2001

(30) Foreign Application Priority Data
Dec. 28, 1999 (JP) .............................. 11-375745

(51) Int. Cl.$^7$ ............................... H01L 21/302
(52) U.S. Cl. ............................... 438/720; 438/3
(58) Field of Search ................... 438/3, 257, 240, 438/706, 720, 754

(56) References Cited

U.S. PATENT DOCUMENTS 6,451,665 B1 * 9/2002 Yunogami et al. .......... 438/397

FOREIGN PATENT DOCUMENTS

| JP | 8-78396 | 3/1996 | |
| JP | 08153707 A | * 6/1996 | ....... H01L/21/3065 |
| JP | 11-50163 A | 2/1999 | |

OTHER PUBLICATIONS

Zeitschrift Fuer Naturforschung, Section B, Chemical Sciences, vol. 36B, No. 3, 1981, pp395 by Loessberg et al.
"Journal of Nuclear Science and Technology, 28, No. 6(1986), pp 493–500" by Watari, et al.

* cited by examiner

Primary Examiner—Olik Chaudhuri
Assistant Examiner—Brook Kebede
(74) Attorney, Agent, or Firm—Antonelli, Terry, Stout & Kraus, LLP

(57) ABSTRACT

With a view to providing a technique for highly-selective etching of Ru (ruthenium) using a photoresist as an etching mask, an Ru-film, which is an lower electrode material deposited on the side walls and bottom surface of a hole, is covered with a photoresist film, followed by isotropic dry etching in a gas atmosphere containing an ozone gas, whereby a portion of the Ru film outside of the hole is removed.

10 Claims, 102 Drawing Sheets

ASPECT RATIO = $\dfrac{D_{eff}}{W_{eff}}$

PRINCIPLE OF OZONIZER

PROCESSING TEMPERATURE DEPENDENCE OF Ru, RuO$_2$, PR
(PROCESSING FOR 60sec)

PROCESSING TEMPERATURE DEPENDENCE
(PROCESSING FOR 30sec, 60sec)

PROCESSING TIME DEPENDENCE
(PROCESSING AT 100°C FOR 60sec)

Ru/PR SELECTIVITY

INFLUENCE OF EXPOSURE TO UV

COMPARISON BETWEEN SP-Ru FILM AND CVD-Ru FILM

O₃ ETCHING APPARATUS

FIG. 63

MEASUREMENT OF RE-DEPOSIT

AMOUNT OF Ru: $\leq 2 \times 10^{11}$ atoms/cm$^2$ (ETCHING CONDITIONS: 100Torr, 150°C, 12min)

ANALYSIS, DURING Ru ETCHING, OF AN Si WAFER SURFACE DISPOSED DOWNSTREAM SHOWED AN Ru AMOUNT NOT EXCEEDING DETECTION LIMIT

| SAMPLE STRUCTURE | AMOUNT OF ETCHING RESIDUE |
|---|---|
| Ru(NS)/Si | $5 \times 10^{15}$ atoms/cm$^2$ |
| Ru(NS)/TEOS | $3 \times 10^{14}$ atoms/cm$^2$ |
| Ru(LTS)/Si | $4 \times 10^{14}$ atoms/cm$^2$ |

ETCHING CONDITIONS: 700Torr, 80°C
NS: NORMAL SPUTTERING
LTS: LONG THROW SPUTTERING

MEASUREMENT OF THE AMOUNT OF ETCHING RESIDUE

FIG. 86
CALCULATION OF ION FLUX
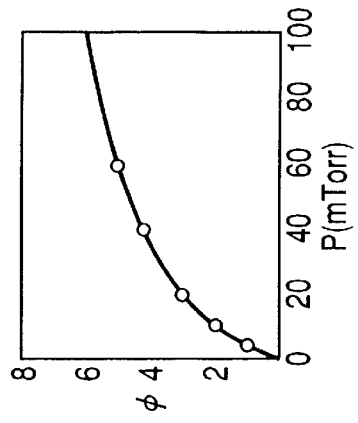
$\phi$ MEANS A FUNCTION OR PRESSURE
$\phi = \phi(P)$
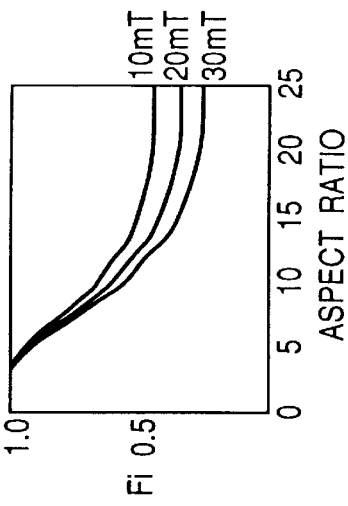
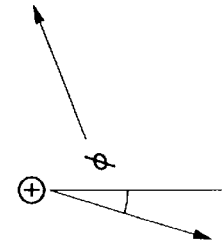
ASPECT RATIO $r = b/a$
ION FLUX ON THE HOLE BOTTOM BECOMES A FUNCTION OF $\phi$ (THAT IS, PRESSURE) AND ASPECT RATIO
$F_i = F_i(\phi(P), r)$
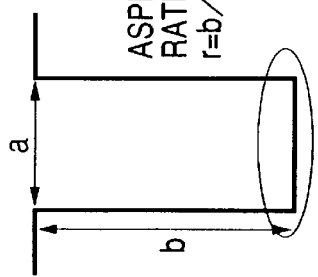
ION FLUX ON THE HOLE BOTTOM: $F_i$

FIG. 87
CALCULATION OF RADICAL FLUX
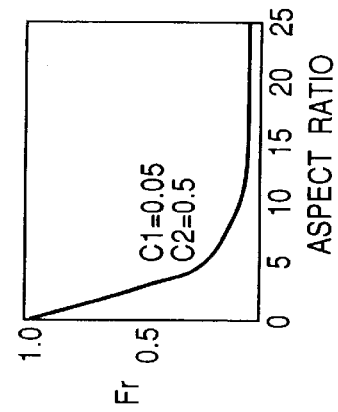
○ RADICAL
ADSORPTION COEFFICIENT C1 AGAINST WALL
ADSORPTION COEFFICIENT C2 ON THE HOLE BOTTOM
RADICAL FLUX ON THE HOLE BOTTOM: Fr
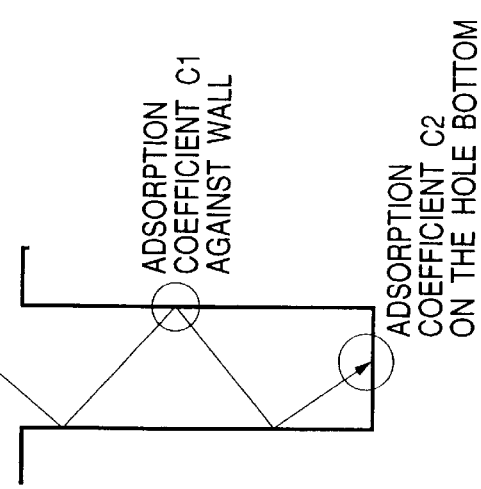
RADICAL FLUX ON THE HOLE BOTTOM IS A FUNCTION OF C1, C2 AND ASPECT RATIO r
$Fr = Fr(C1, C2, r)$
C1=0.05
C2=0.5
CALCULATION OF ETCHING RATE
$ER = k \cdot Fi \cdot Fr$
k STANDS FOR A PROPORTIONALITY FACTOR

MANUFACTURING METHOD OF SEMICONDUCTOR INTEGRATED CIRCUIT DEVICE

BACKGROUND OF THE INVENTION

The present invention relates to a semiconductor integrated circuit device and to a method of manufacture thereof; and more, particularly, the invention relates to a structure wherein a conductor film made of a metal or an alloy containing Ru (ruthenium) as a principal component is formed inside of a hole (redess) which has been formed in an insulating film with a high aspect ratio, and to a technique effective when adapted to the method of manufacture of the structure.

Japanese Patent Application Laid-Open Hei 8(1996)-78396 (Tokashiki, et al.) discloses a technique for the manufacture of a semiconductor device which comprises dry etching of an Ru oxide by using a plasma formed from a gas mixture containing at least one substance selected from the group consisting of halogen gases, containing at least one of fluorine gas, chlorine gas, bromine gas and iodine gas, and hydrogen halides, and an oxygen gas or an ozone gas.

Japanese Patent Application Laid-Open No. Hei 11(1999)-50163 (Shindo, et al.) discloses a process for preparing a high purity ruthenium material for thin film formation, which comprises blowing an ozone-containing gas into a crude ruthenium powder while adding thereto hypochlorous acid, thereby forming ruthenium tetraoxide, allowing the resulting ruthenium tetraoxide to absorb to a hydrochloric acid solution, evaporating the resulting solution to dryness and roasting the resulting $RuOCl_3$ crystals in a hydrogen atmosphere.

Rainer Loessberg and Ulrich Mueller disclose in "Zeitschrift Fuer Naturforschung, Section B, Chemical Sciences, Vol, 36B, No.3, 1981, pp395", a process for preparing pure ruthenium tetraoxide by reacting ruthenium and ozone at room temperature. The following is the outline of the process: "$RuO_4$ can be synthesized from an Ru metal and zone at room temperature. This process makes it possible to prepare pure $RuO_4$ directly without causing a problem of separation of water which occurs in the standard preparing process. In the well known synthesizing process of an Ru (VIII) oxide, an aqueous solution of a ruthenium compound (such as $RuCl_3$, $RuO_2$ or $RuO_4$) is mixed with an oxidizing agent (such as $BrO_3^-$, $IO_4^-$ or $MnO_4^-$), followed by distillation or extraction of the resulting $RuO_4$. Then, a subsequent operation for separating water present in the system, which is accompanied with some difficulty, is required, which lowers the yield. We have found a simple synthesis process of reacting metal ruthenium with ozone at room temperature. Ozone must be free of oxygen, because unless so, the reaction becomes markedly slow (presumably because of immobilization owing to the formation of a lower bxide of ruthenium). For this purpose, a U-tube for feeding an $O_2/O_3$ mixture from an ozonizer is filled in advance with dried silica gel and it is maintained at $-78°$ C. The silica gel becomes dark blue when $O_3$ is adsorbed thereto, but $O_2$ is not adsorbed to it. The condenser is gradually distanced from the U-tube and dry nitrogen is allowed to pass therethrough slowly, whereby ozone is released. An $N_2/O_3$ mixed gas is introduced into the tube of about 30 cm long and 3 cm wide having therein finely dispersed Ru powders (particle size: 60 $\mu$m) uniformly. The $RuO_4$ thus formed is carried by a gas flow and is separated as gold crystals in the condenser of $-78°$ C. For preventing contamination by water, the apparatus is filled with completely dried nitrogen from the beginning of the reaction. Oxygen to be introduced into the ozonizer must be dry so that a drying tube filled with $P_2O_5$ is connected with the inlet of the separating condenser. The Ru filled in the tube is converted at a stoichiometric ratio so that an excess amount of $O_3$ is required. The same amount of $RuO_4$ is available when the time spent is the same".

Watari, et al. in "Journal of Nuclear Science and Technology, 28, No. 6(1986), pp 493–500", describe the volatility of an oxide of Ru, which is one of platinum metals produced by nuclear fission, from the viewpoint of spent fuel reprocessing.

SUMMARY OF THE INVENTION

As a countermeasure against a decrease in a storage charge amount owing to microfabrication of a memory cell in large-capacity DRAMs (Dynamic Random Access Memories) after a DRAM of 256 Mbit, the constitution of a capacitor insulating film of an information storage capacitor made from a high dielectric material, such as BST ((Ba, Sr)$TiO_3$), which has a dielectric constant of 50 or greater and is an $ABO_3$ type double oxide, that is, a perovskite type double oxide, or even from a ferroelectric substance, which has a dielectric constant of 100 or greater and contains a perovskite crystal structure, such as PZT ($PbZr_xTi_{1-x}O_3$), PLT ($PbLa_xTi_{1-x}O_3$), PLZT, $PbTiO_3$, $SrTiO_3$ or $BaTiO_3$, is under investigation.

When a capacitor insulating film is formed from a high dielectric or ferroelectric material as in the conventional manner, conductor films for the electrode between which the high dielectric or ferroelectric material is sandwiched must be constituted from a material having a high affinity with the material. As such an electrode material, platinum metals typified by Ru and Os and conductive oxides thereof have been investigated as a candidate, and, particularly, the introduction of Ru is under way.

When Ru is used as a lower electrode material of an information storage capacitor, a step is required for forming a hole (recess) in a thick silicon oxide film, depositing an Ru film over the silicon oxide film and inside (on the side walls and bottom surface) of the hole, and etching away a portion of the Ru film over the silicon oxide film, thereby forming a lower electrode of Ru on the side walls and bottom surface of the hole.

In the conventional ion assist plasma etching using oxygen as a main etching gas, however, removal the Ru film from the upper surface of the silicon oxide film without etching away the Ru film inside of the hole is difficult and this becomes a large cause for disturbing the satisfactory formation of an information storage capacitor using Ru as a lower electrode material.

An object of the present invention is therefore to provide an etching technique which is capable of removing an Ru film outside of a hole having a high aspect ratio without etching away the Ru film inside the hole.

Another object of the present invention is to provide a technique for forming a lower electrode of an information storage capacitor inside of a hole having a markedly high aspect ratio.

The above-described and other objects, and novel features of the present invention will be apparent from the description herein and the accompanying drawings.

Among the features disclosed in the present application, typical ones will be summarized simply in the following items.

1. A manufacturing method of a semiconductor integrated circuit device according to the present invention, which comprises:
   (a) forming, over the first main surface of a wafer, a first conductor film made of a metal or an alloy containing ruthenium or osmium as a principal component; and
   (b) subjecting the first conductor film to isotropic dry etching in a gas atmosphere containing an ozone gas.

2. A manufacturing method of a semiconductor integrated circuit device according to the present invention, which comprises:
   (a) forming, over the first main surface of a wafer, a first conductor film made of a metal or an alloy containing ruthenium or osmium as a principal component, and
   (b) subjecting the first conductor film to non-plasma dry etching in a gas atmosphere containing an ozone gas.

3. A manufacturing method of a semiconductor integrated circuit device according to the present invention, which comprises:
   (a) forming, over the first main surface of a wafer, a first conductor film made of a metal or an alloy containing ruthenium or osmium as a principal component,
   (b) forming a first resist pattern over the first main surface of the wafer having the first conductor film formed thereover, and
   (c) subjecting the first conductor film to isotropic dry etching with the first resist pattern as a etching mask.

4. A manufacturing method of a semiconductor integrated circuit device according to the present invention, which comprises:
   (a) forming, over the first main surface of a wafer, a first conductor film made of a metal or an alloy containing ruthenium or osmium as a principal component,
   (b) forming a first resist pattern over the first main surface of the wafer having the first conductor film formed thereover,
   (c) subjecting the first conductor film to isotropic dry etching while having the first resist pattern over the first main surface of the wafer, and
   (d) removing the first resist pattern after the step (c).

5. A manufacturing method of a semiconductor integrated circuit device according to the present invention, which comprises:
   (a) forming, over the first main surface of a wafer having a first recess, a first conductor film made of a metal made of a metal or an alloy containing ruthenium or osmium as a principal component to cover the first main surface outside the recess and the bottom surface and side walls of the recess and not to embed the recess, thereby leaving the recess having the side walls and bottom surface covered with the first conductor film,
   (b) forming a photoresist pattern to cover at least the upper end portion of the recess, and
   (c) subjecting the first main surface of the wafer to dry etching with the photoresist pattern as an etching mask in a gas atmosphere containing an ozone gas, thereby removing the first conductor film from the first main surface outside the recess.

6. A manufacturing method of a semiconductor integrated circuit device according to the present invention, which comprises:
   (a) forming, over the first main surface of a wafer having a first recess, a first conductor film made of a metal to cover the first main surface outside the recess and the bottom surface and side walls of the recess and not to embed the recess, thereby leaving the recess having the side walls and bottom surface covered with the first conductor film,
   (b) forming a photoresisr pattern to cover at least the upper end portion of the recess,
   (c) subjecting, in the presence of the photoresist pattern, the first main surface of the wafer to dry etching in a gas atmosphere containing an ozone gas, thereby removing the first conductor film fxom the first main surface outside the recess, and
   (d) removing the photoresist pattern after the step (c).

7. A manufacturing method of a semiconductor integrated circuit device according to the present invention, which comprises:
   (a) forming, over the first main surface of a wafer, a first conductor film made of a metal or an alloy containing ruthenium or osmium as a principal component,
   (b) forming a first resist pattern over the first main surface of the wafer having the first conductor film formed thereover, and
   (c) dry etching the first conductor film at a selectivity of 4 or greater relative to a resist, with the first resist pattern as an etching mask.

8. A manufacturing method of a semiconductor integrated circuit device according to the present invention, which comprises:
   (a) forming, over the first main surface of a wafer, a first conductor film made of a metal or an alloy containing ruthenium or osmium as a principal component,
   (b) forming a first resist pattern over the first main surface of the wafer having the first conductor film formed thereover,
   (c) dry etching, in the presence of the first resist pattern, the first conductor film at a selectivity of 4 or greater relative to a resist, and
   (d) removing the photoresist pattern after the step (c).

9. A manufacturing method of a semiconductor integrated circuit device according to the present invention, which comprises:
   (a) forming, over the first main surface of a wafer, a first conductor film made of a metal or an alloy containing ruthenium or osmium as a principal component,
   (b) forming a first resist pattern over the first main surface of the wafer having the first conductor film formed thereover, and
   (c) dry etching the first conductor film at a selectivity of 0.5 or greater relative to a resist, with the first resist pattern as an etching mask.

10. A manufacturing method of a semiconductor integrated circuit device according to the present invention, which comprises:
    (a) forming, over the first main surface of a wafer, a first conductor film made of a metal or an alloy containing ruthenium or osmium as a principal component,
    (b) forming a first resist pattern over the first main surface of the wafer having the first conductor film formed thereover,
    (c) subjecting the first conductor film to chemical dry etching at a selectivity of 0.5 or greater relative to a resist, with the first resist pattern as an etching mask, and
    (d) removing the photoresist pattern after the step (c).

11. A manufacturing method of a semiconductor integrated circuit device according to the present invention, which comprises:

(a) opening a first recess in a first insulating film over the first main surface of a wafer, (b) forming a first conductor film made of a metal or an alloy containing ruthenium or osmium as a principal component to cover the first main surface outside the first recess and the bottom surface and side walls of the first recess and not to embed the first recess, thereby leaving the recess having the side walls and bottom surface covered with the first conductor film, (c) forming a photoresist film pattern to fill the remaining inside portion of the recess, (d) subjecting, in the presence of the photoresist film pattern, the first main surface to dry etching in a gas atmosphere containing an ozone gas, thereby removing the first conductor film from the outside of the recess, (e) removing the photoresist film pattern after the step (d), and (f) forming a capacitor insulating film containing a perovskite high dielectric substance or ferroelectric substance as a principal component inside of the first recess from which the photoresist film pattern has been removed.

12. A manufacturing method of a semiconductor integrated circuit device according to the present invention, which comprises:

(a) forming, over the first main surface of a water, a first conductor film made of a metal or an alloy containing ruthenium or osmium as a principal component, (b) forming a first resist pattern over the first main surface of the wafer having the first conductor film formed thereover, and (c) subjecting the first conductor film to non-plasma dry etching with the first resist pattern as an etching mask.

13. A semiconductor integrated circuit device according to the present invention, which comprises:

(a) a semiconductor integrated circuit board having a first main surface, (b) a first conductor film made of a metal or an alloy containing ruthenium or osmium as a principal component, or alloy thereof and formed over the first main surface, and (c) a conductive oxide film formed over the first conductor film and containing a metal double oxide of ruthenium or osmium as a principal component, or a polymetal double oxide having the metal double dioxide as a main component.

14. A manufacturing method of a semiconductor integrated circuit device according to the present invention, which comprises:

(a) forming, over the first main surface of a wafer, a first conductor film made of a metal or an alloy containing ruthenium or osmium as a principal component, (b) forming, over the first conductor film, a first conductive oxide film which contains a metal double oxide of ruthenium or osmium as a principal component, or a polymetal double oxide having the metal double dioxide as a main component, (c) forming a first resist film pattern over the first conductive oxide film, (d) subjecting the first conductive oxide film and first conductor film to anisotropic dry etching with the first resist film pattern as an etching mask, thereby forming a first conductor film pattern made of the first conductive oxide film and the first conductor film, and (e) ashing the first resist film pattern over the first conductor film pattern in a gas atmosphere containing an ozone gas, thereby removing the first resist film.

15. A manufacturing method of a semiconductor integrated circuit device of the present invention, which comprises:

(a) forming, over the first main surface of a wafer, a first conductor film made of a metal or an alloy containing ruthenium or osmium as a principal component, or alloy thereof and (b) etching the first conductor film by dry etching at an etching rate of 200 nm/min or greater.

16. A manufacturing method of a semiconductor integrated circuit device of the present invention, which comprises:

(a) forming, over the first main surface of a wafer, a first region from which a silicon member has been exposed and a second region from which no silicon member has been exposed, (b) forming, over the first main surface of the wafer which has been divided into the first and second regions, a first conductor film made of a metal or an alloy containing ruthenium or osmium as a principal component, or alloy thereof, (c) heat treating the first main surface having the first conductor film formed thereover to convert at least a portion of the first conductor film,over the first region into a silicide, (d) dry etching the heat-treated first main surface in a gas atmosphere containing an ozone gas, thereby leaving the silicide-formed portion and removing the first conductor film other than the silicide-formed portion.

17. A manufacturing method of a semiconductor integrated circuit device according to the present invention, which comprises:

(a) forming a first recess in a first insulating film over the first main surface of a wafer, thereby exposing a silicon member of a first region on the bottom surface of the first recess, (b) forming a first conductor film which is made of a metal or an alloy containing ruthenium or osmium as a principal component, or alloy thereof to cover at least the bottom surface of the first recess, (c) heat treating the first main surface of the wafer having the first conductor film formed thereover to convert at least a portion of the first conductor film over the first region into a silicide, and (d) subjecting the heat-treated first main surface to dry etching in a gas atmosphere containing an ozone gas, thereby leaving the silicide-formed portion and removing the first conductor film other than the silicide-formed portion.

18. A manufacturing method of a semiconductor integrated circuit device according to the present invention, which comprises:

(a) forming a first conductor film over the first main surface of a wafer having therein a first recess with an aspect ratio of 5 or greater so as to cover the first main surface outside the recess and bottom surface and side walls of the recess with the first conductor film and not to embed the recess therewith, thereby leaving the recess having side walls and bottom surface made of the first conductor film and having an aspect ratio of 10 or greater, and (b) subjecting the first main surface of the wafer to anisotropic dry etching, thereby removing the first film from the first main surface outside the recess without exposing the bottom surface of the recess lying under the first conductor film.

19. A manufacturing method of a semiconductor integrated circuit device according to the present invention, which comprises:
   (a) opening, in a first insulating film over the first main surface of a wafer, a first recess having an aspect ratio of 5 or greater,
   (b) forming a first conductor film which is made of a metal or an alloy containing ruthenium or osmium as a principal component, or alloy thereof so as to cover the first main surface outside the first recess and bottom surface and side walls of the first recess with the first conductor film and not to embed therewith the first recess, thereby leaving the recess having side walls and bottom surface made of the first conductor film and having an aspect ratio of 10 or greater,
   (c) subjecting the first main surface to anisotropic dry etching while exposing the first conductor film inside of the first recess, thereby removing the first conductor film from the outside of the first recess, and
   (d) forming, inside of the first recess, a capacitor insulating film containing a non-perovskite high dielectric substance as a principal component after the step (c).

20. A manufacturing method of a semiconductor integrated circuit device according to the present invention which comprises:
   (a) forming, in a first insulating film over the first main surface of a wafer, a first recess having an aspect ratio of for greater,
   (b) forming a first conductor film which is made of a metal or an alloy containing ruthenium or osmium as a principal component, or alloy thereof so as to cover the first main surface outside the first recess and bottom surface and side walls of the firstrecess with the first conductor film and not to embed therewith the first recess, thereby leaving the recess having side walls and bottom surface made of the first conductor film and having an aspect ratio of 10 or greater,
   (c) subjecting the first main surface to anisotropic dry etching while not covering the first recess with an etching mask, thereby removing the first conductor film from the outside of the first recess, and
   (d) forming, inside of the first recess, a capacitor insulating film containing a non-perovskite high dielectric substance as a principal component after the step (c).

21. A semiconductor integrated circuit device according to the present invention, which comprises:
   (a) an integrated circuit board having a semiconductor surface over a first main surface,
   (b) a first insulating film formed over the first main surface, and
   (c) a first recess opened in the first insulating film and having an aspect ratio of 12 or greater.

22. A manufacturing method of a semiconductor integrated circuit device according to the present invention, which comprises:
   (a) forming a first inorganic member film over a first insulating film over the first main surface of a wafer,
   (b) forming a first photoresist film over the first inorganic member film,
   (c) patterning the first photoresist film to form a first resist film pattern,
   (d) subjecting the first main surface to first dry etching treatment in the presence of the first resist film pattern, thereby forming first and second openings in the first organic member film, and
   (e) subjecting the first main surface to second dry etching treatment in the presence of the first inorganic member film having therein the first and second openings formed, thereby forming first and second recesses having an aspect ratio of 12 or greater in the first insulating film.

23. A semiconductor integrated circuit device according to the present invention, which comprises:
   (a) forming, over the first main surface of a wafer having a first recess, a first conductor film which is made of a metal or an alloy containing ruthenium or osmium as a principal component to cover the first main surface outside the recess and the bottom surface and side walls of the recess with the first conductor film and not to embed therewith the recess, thereby leaving the recess having side walls and bottom surface covered with the first conductor film,
   (b) forming a photoresist pattern to cover the inside of the recess, and
   (c) etching the first main surface of the wafer with the photoresist pattern as an etching mask, and
   (d) after the step (c), removing the photoresist pattern by treating it in an ozone-containing gas phase.

24. A manufacturing method of a semiconductor integrated circuit device according to the present invention, which comprises:
   (a) forming, over the first main surface of a wafer, a first conductor film made of a metal or an alloy containing ruthenium or osmium as a principal component, or alloy thereof,
   (b) forming a photoresist pattern to cover the first main surface,
   (c) etching the first main surface of the wafer with the photoresist pattern as an etching mask, and
   (d) removing the photoresist pattern by treating it in an ozone-containing gas phase at 180 to 280° C. after the step (c).

25. A manufacturing method of a semiconductor integrated circuit device according to the present invention, which comprises:
   (a) forming, over the first main surface of a wafer having a first recess, a first conductor film which is made of a metal or an alloy containing ruthenium or osmium as a principal component, or alloy thereof so as to cover the first main surface outside the recess and the bottom surface and side walls of the recess with the first conductor film and not to embed therewith the recess, thereby leaving the recess having the side wails and bottom surface covered with the first conductor film and having an aspect ratio of 5 or greater,
   (b) forming a photoresist pattern to cover the inside of the recess, and
   (c) etching the first main surface of the wafer with the photoresist pattern as an etching mask, and
   (d) after the step (c), removing the photoresist pattern by treating it in a liquid phase.

26. A manufacturing method of a semiconductor integrated circuit device according to the present invention, which comprises:
   (a) forming, over the first main surface of a wafer having a first recess, a first conductor film which is made of a metal or an alloy containing ruthenium or osmium as a principal component, or alloy thereof so as to cover the first main surface outside the recess and the bottom surface and side walls of the recess with the first conductor film and not to embed therewith the recess, thereby leaving the recess having the side walls and bottom surface covered with the first conductor film, (b) embedding the inside of the recess with an organic coating film, and (c) dry etching the first main surface of the wafer in a gas atmosphere containing an ozone gas with the organic coating film as an etching mask, thereby removing the first conductor film over the first main surface outside the recess.

An outline of other features according to the present application will next be described in the following items.

1. A manufacturing method of a semiconductor integrated circuit device, which comprises:

(a) forming an insulating film over the main surface of a substrate and then forming a hole in the insulating film, (b) forming, over the insulating film including the inside of the hole, a first conductor film containing ruthenium or osmium as a principal component to have a thickness within an extent not embedding the inside of the hole, (c) embedding a photoresist film inside of the hole and dry etghing the photoresist film in an ozone-containing gas atmosphere with the photoresist film as an etching mask, thereby removing the first conductor film outside of the hole and leaving the first conductor film inside of the hole.

2. A manufacturing method of a semiconductor integrated circuit device as described above in 1, wherein the first conductor film contains ruthenium as a principal component.

3. A manufacturing method of a semiconductor integrated circuit device as described above in 1, which further comprises removing the photoresist film inside of the hole after the step (c).

4. A manufacturing method of a semiconductor integrated circuit device as described above in 1, wherein the first conductor film is dry etched by anisotropic dry etching.

5. A manufacturing method of a semiconductor integrated circuit device as described above in 1, wherein the first conductor film is dry etched by non-plasma dry etching.

6. A manufacturing method of a semiconductor integrated circuit device as described above in 1, wherein the first conductor film is dry etched at a temperature permitting the etching rate of the first conductor film to exceed an oxidation-induced film-thickness increasing rate.

7. A manufacturing method of a semiconductor integrated circuit device as described above in 1, wherein upon dry etching of the first conductor film, the temperature of the substrate is at least 25° C. but not greater than 150° C.

8. A manufacturing method of a semiconductor integrated circuit device as described above in 7, wherein upon dry etching of the first conductor film, the temperature of the substrate is at least 25° C. but not greater than 110° C.

9. A manufacturing method of a semiconductor integrated circuit device as described above in 1, wherein the ozone-containing gas is not exposed to ultraviolet rays.

10. A manufacturing method of a semiconductor integrated circuit device as described above in 1, wherein upon dry etching, the selectivity of the first conductor film relative to a resist is at least 20.

11. A manufacturing method of a semiconductor integrated circuit device as described above in 1, wherein upon dry-etching, the selectivity of the first conductor film relative to a resist is at least 100.

12. A manufacturing method of a semiconductor integrated circuit device as described above in 1, wherein the hofe having the first conductor film formed therein has an aspect ratio of 12 or less.

13. A manufacturing method of a semiconductor integrated circuit device as described above in 12, wherein the insulating film is made of a silicon oxide type insulating film and the hole is formed by dry etching with the photoresist film as an etching mask.

14. A manufacturing method of a semiconductor integrated circuit device, which comprises:

(a) forming an MISFET over the main surface of a substrate and forming a first insulating film over the MISFET, (b) after formation of a first connecting hole in the first insulating film, forming a first plug inside of the first connecting hole to electrically connect the first plug and the MISFET, (c) after formation of the second insulating film over the first insulating film, forming a hole in the second insulating film over the first connecting hole, thereby exposing the surface of the first plug from the bottom of the hole, (d) forming, over the second insulating film including the inside of the hole, a first conductor film containing ruthenium or osmium as a principal component and having a thickness not so high as to embed the inside of the hole with it, (e) embedding a photoresist film inside of the hole and then carry out dry etching with the photoresist film as an etching mask, thereby removing the first conductor film from the outside of the hole, and (f) removing the photoresist film inside of the hole, thereby forming a capacitor electrode which is made of the first conductor film left inside of the hole and is to be electrically connected with the first plug.

15. A manufacturing method of a semiconductor integrated circuit device as described above in 14, wherein the first conductor film contains ruthenium as a principal component.

16. A manufacturing method of a semiconductor integrated circuit device as described above in 14, which further comprises forming, over the capacitor electrode, a capacitor insulating film of a capacitor constituting another part of the memory cell after the step (f).

17. A manufacturing method of a semiconductor integrated circuit device as described above in 16, wherein the capacitor insulating film has a dielectric constant of 50 or greater.

18. A manufacturing method of a semiconductor integrated circuit device as described above in 17, wherein the capacitor insulating film is made of a high dielectric or ferroelectric substance containing a perovskite type metal oxide as a principal component.

19. A manufacturing method of a semiconductor integrated circuit device as described above in 18, wherein the perovskite type metal oxide is BST.

20. A manufacturing method of a semiconductor integrated circuit device as described above in 17, wherein the holo having the first conductor film formed therein has an aspect ratio of 12 or less.

21. A manufacturing method of a semiconductor integrated circuit device as described above in 14, wherein dry etching of the first conductor film is isotropic dry etching.

22. A manufacturing method of a semiconductor integrated circuit device as described above in 14, wherein dry etching of the first conductor film is non-plasma dry etching.

23. A manufacturing method of a semiconductor integrated circuit device as described above in 14, wherein the first conductor film is dry etched at a temperature permitting the etching rate of the first conductor film to exceed an oxidation-induced film-thickness increasing rate.

24. A manufacturing method of a semiconductor integrated circuit device as described above in 14, wherein upon dry etching of the first conductor film, the temperature of the substrate is at least 25° C. but not greater than 150° C.

25. A manufacturing method of a semiconductor integrated circuit device as described above in 24, wherein upon dry etching of the first conductor film, the temperature of the substrate is at least 25° C. but not greater than 110° C.

26. A manufacturing method of a semiconductor integrated circuit device as described above in 14, wherein the ozone-containing gas is not exposed to ultraviolet rays.

27. A manufacturing method of a semiconductor integrated circuit device as described above in 14, wherein upon dry etching, the selectivity of the first conductor film relative to a resist is at least 20.

28. A manufacturing method of a semiconductor integrated circuit device as described above in 14, wherein upon dry etching, the selectivity of the first conductor film relative to a resist is at least 100.

29. A manufacturing method of a semiconductor integrated circuit device as described above in 20, wherein the second insulating film is made of a silicon oxide type insulating film and the hole is formed by dry etching with the photoresist film a s an etching mask.

30. A manufacturing method of a semiconductor integrated circuit device, which comprises:
   (a) after the formation of an insulating film over the main surface of a substrate, forming a hole in the insulating film,
   (b) forming, over the insulating film including the inside of the hole, a first conductor film having a thickness not so high as to embed the inside of the hole, thereby adjusting the aspect ratio of the hole to 12 or greater, and
   (c) removing the first conductor film outside of the hole by ion assist dry etching in an oxygen-containing gas atmosphere, thereby leaving the first conductor film inside of the hole.

31. A manufacturing method of a semiconductor integrated circuit device as described above in 30, wherein the hole having the first conductor film formed therein has an aspect ratio of 20 or greater.

32. A manufacturing method of a semiconductor integrated circuit device as described above in 31, wherein the hole having the first conductor film formed therein has an aspect ratio of 30 or greater.

33. A manufacturing method of a semiconductor integrated circuit device as described above in 30, wherein the insulating film is made of a silicon oxide type insulating film and the hole is formed by dry etching with a hard mask which has been formed over the insulating film and its selectivity relative to a resist is greater than that of the silicon oxide type insulating film—as an etching mask.

34. A manufacturing method of a semiconductor integrated circuit device as described above in 33, wherein the selectivity of the hard mask relative to a resist is 4 or greater.

35. A manufacturing method of a semiconductor integrated circuit device as described above in 33, wherein the hard mask is tungsten.

36. A manufacturing method of a semiconductor integrated circuit device, which comprises:
   (a) forming an MISFET over the main surface of a substrate and forming a first insulating film over the MISFET,
   (b) after formation of a first connecting hole in the first insulating film, forming a first plug inside of the first connecting hole, thereby electrically connecting the first plug with the MISFET,
   (c) after formation of a second insulating film over the first insulating film, forming a hole in the second insulating film over the first connecting hole, thereby exposing the surface of the first plug from the bottom of the hole,
   (d) forming, over the second insulating film including the inside of the hole, a first conductor film having a thickness not so high as to embed the inside of the hole with it, and
   (e) removing the first conductor film outside the hole by ion assist dry etching in an oxygen-containing gas atmosphere, thereby forming, inside of the hole, a capacitor electrode which has the first conductor film and is to be electrically connected with the first plug.

37. A manufacturing method of a semiconductor integrated circuit device according to claim 36, wherein the first conductor film is a conductor film containing ruthenium or osmium as a principal component.

38. A manufacturing method of a semiconductor integrated circuit device as described above in 37, wherein the first conductor film is a conductor film containing ruthenium as a principal component.

39. A manufacturing method of a semiconductor integrated circuit device as described above in 36, wherein the hole having the first conductor film formed therein has an aspect ratio of 12 or greater.

40. A manufacturing method of a semiconductor integrated circuit device as described above in 39, wherein the hole having the first conductor film formed therein has an aspect ratio of 20 or greater.

41. A manufacturing method of a semiconductor integrated circuit device as described above in 40, wherein the hole having the first conductor film formed therein has an aspect ratio of 30 or greater.

42. A manufacturing method of a semiconductor integrated circuit device as described above in 36, wherein the second insulating film is made of a silicon oxide type insulating film and the hole is formed by dry etching with a hard mask—which has been formed over the second insulating film and has a resist-relative selectivity greater than that of the silicon oxide type insulating film—as an etching mask.

43. A manufacturing method of a semiconductor integrated circuit device as described above in 42, wherein the selectivity of the hard mask relative to a resist is 4 or greater.

44. A manufacturing method of a semiconductor integrated circuit device as described above in 42, wherein the hard mask is made of tungsten.

45. A manufacturing method of a semiconductor integrated circuit device as described above in 39, which further comprises forming a capacitor insulating film over the capacitor electrode after the step (e).

46. A manufacturing method of a semiconductor integrated circuit device as described above in 45, wherein the capacitor insulating film has a dielectric constant less than 50.

47. A manufacturing method of a semiconductor integrated circuit device as described above in 45, wherein the capacitor insulating film is made of a high dielectric substance containing a non-perovskite metal oxide as a principal component.

48. A manufacturing method of a semiconductor integrated circuit device as described above in 47, wherein the non-perovskite metal oxide is tantalum oxide.

49. A manufacturing method of a semiconductor integrated circuit device, which comprises:
(a) forming, over the main surface of a substrate, a first conductor film containing ruthenium or osmium as a principal component and forming, over the first conductor film, a second conductor film containing a double oxide of ruthenium or osmium, and
(b) after formation of a photoresist film over the second conductor film to partially cover it, dry etching a portion of each of the second conductor film and first conductor film not covered with the photoresist film in an zone-containing gas atmosphere, with the photoresist film as an etching mask.

50. A manufacturing method of a semiconductor integrated circuit device as described above in 49, wherein the first conductor film is a conductor film containing ruthenium as a principal component.

51. A manufacturing method of a semiconductor integrated circuit device as described above in 49, wherein the first conductor film is dry etched at a substrate temperature of 25° C. or greater but not greater than 150° C.

52. A manufacturing method of a semiconductor integrated circuit device as described above in 51, wherein the first conductor film is dry etched at a substrate temperature of 25° C. or greater but not greater than 110° C.

53. A manufacturing method of a semiconductor integrated circuit device as described above in 49, wherein the ozone-containing gas is not exposed to ultraviolet rays.

54. A manufacturing method of a semiconductor integrated circuit device as described above in 1, wherein the first conductor film is dry etched at a selectivity of 20 or greater relative to a resist.

55. A manufacturing method of a semiconductor integrated circuit device as described above in 54, wherein the first conductor film is dry etched at a selectivity of 100 or greater relative to a resist.

56. A manufacturing method of a semiconductor integrated circuit device, which comprises:
(a) forming a first insulating film over the main surface of a substrate,
(b) after formation of a first connecting hole in the first insulating film, forming a first plug made of a silicon conductor film inside of the first connecting hole, (c) after formation of a second insulating film over the first insulating film, forming a hole in the second insulating film over the first connecting hole, thereby exposing the surface of the first plug from the bottom of the hole,
(d) forming a first conductor film containing ruthenium or osmium as a principal component over the second insulating film including the inside of the hole,
(e) heat treating the substrate to form a conductor layer made of ruthenium silicide or osmium silicide on the interface between the first plug and the first conductor film thereover, and
(f) removing the first conductor film inside of the hole and over the second insulating film by dry etching in an ozone-containing gas atmosphere.

57. A manufacturing method of a semiconductor integrated circuit device as described above in 56, wherein the first conductor film is a conductor film containing ruthenium as a principal component.

58. A manufacturing method of a semiconductor integrated circuit device as described above in 56, wherein the first conductor film is dry etched by isotropic dry etching.

59. A manufacturing method of a semiconductor integrated circuit device as described above in 56, wherein the first conductor film is dry etched by non-plasma type dry etching.

60. A manufacturing method of a semiconductor integrated circuit device as described above in 56, wherein the first conductor film is dry etched at a temperature permitting the etching rate of the first conductor film to exceed an oxidation-induced film-thickness increasing rate.

61. A manufacturing method of a semiconductor integrated circuit device as described above in 56, wherein the first conductor film is dry etched at the substrate temperature of 25° C. or greater but not greater than 150° C.

62. A manufacturing method of a semiconductor integrated circuit device as described above in 61, wherein the first conductor film is dry etched at the substrate temperature of 25° C. or greater but not greater than 110° C.

63. A manufacturing method of a semiconductor integrated circuit device as described above in 56, wherein the ozone-containing gas is not exposed to ultraviolet rays.

BRIEF DESCRIPTION OF THE DRAWINGS

FIG. 63 is diagram illustrating measuring results of an amount of the reaction product deposited again after etching of an Ru film and measuring results of an amount of the etching residue left on the surface of the wafer;

FIG. 86 is a diagram which schematically illustrates the method of calculation of ion flux on the bottom of a hole;

FIG. 87 is a diagram which schematically illustrates the method of calculation of radical flux on the bottom of a hole;

Figure 110:
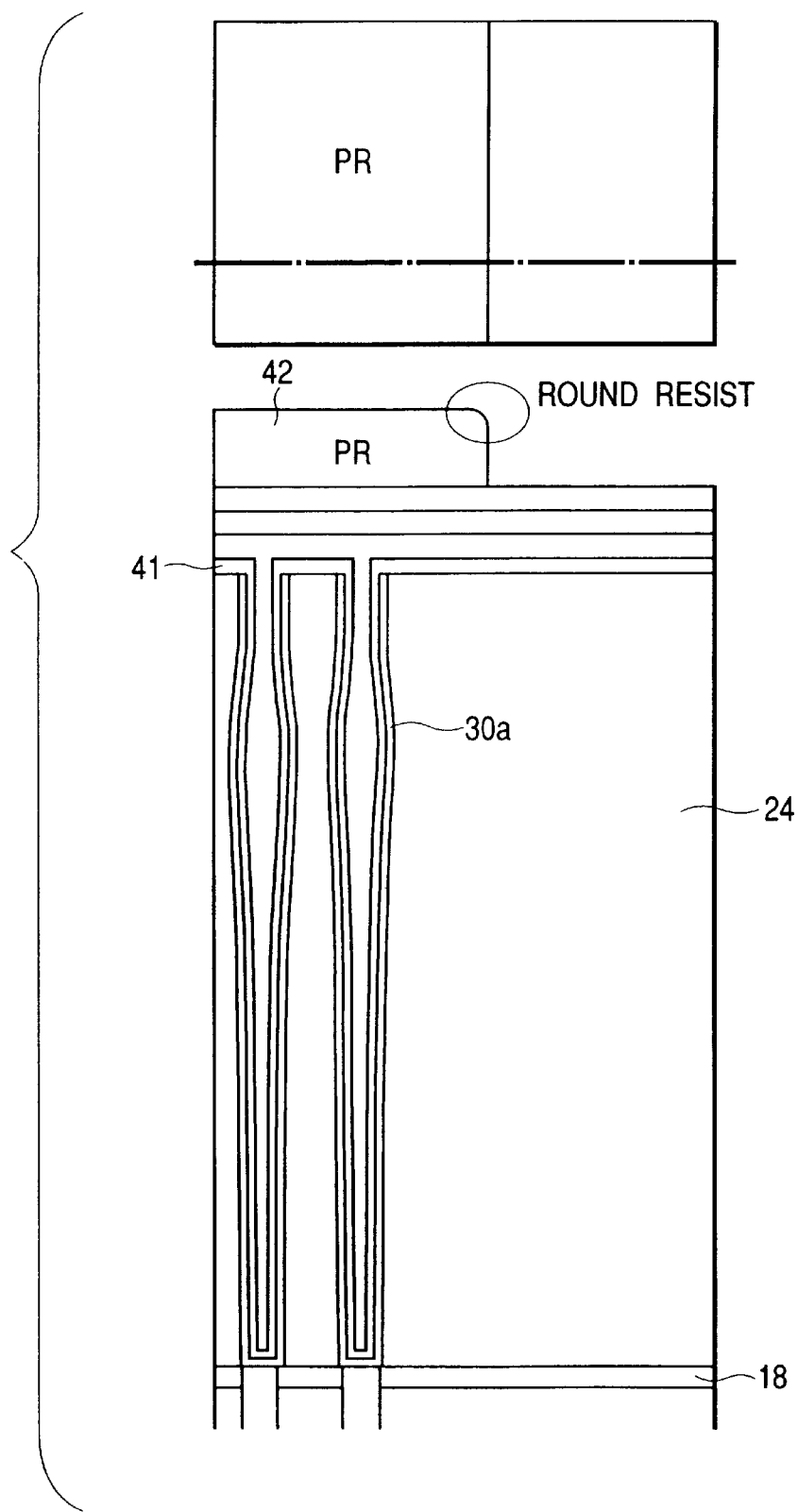
Figure 111:
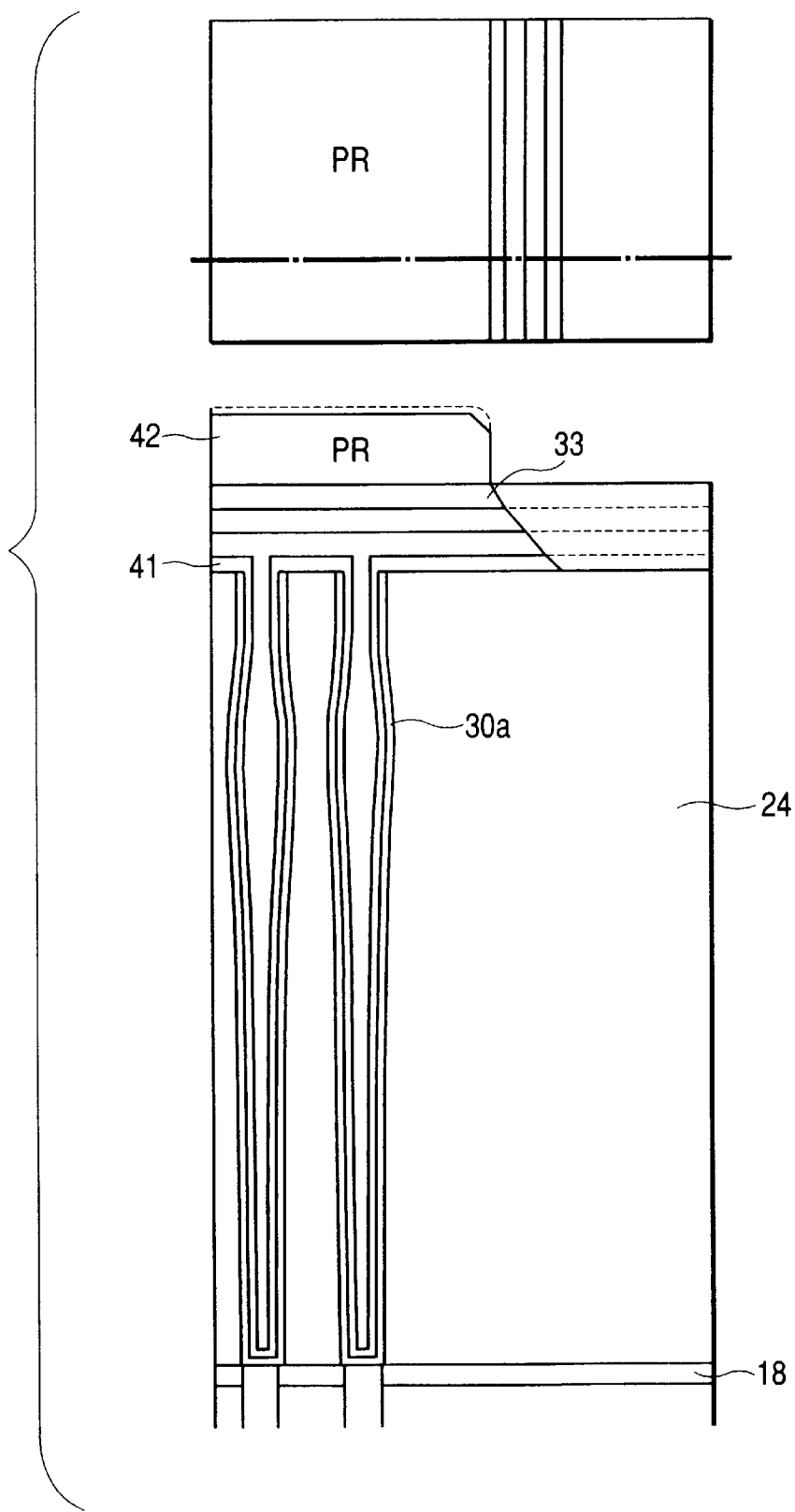
Figure 112:
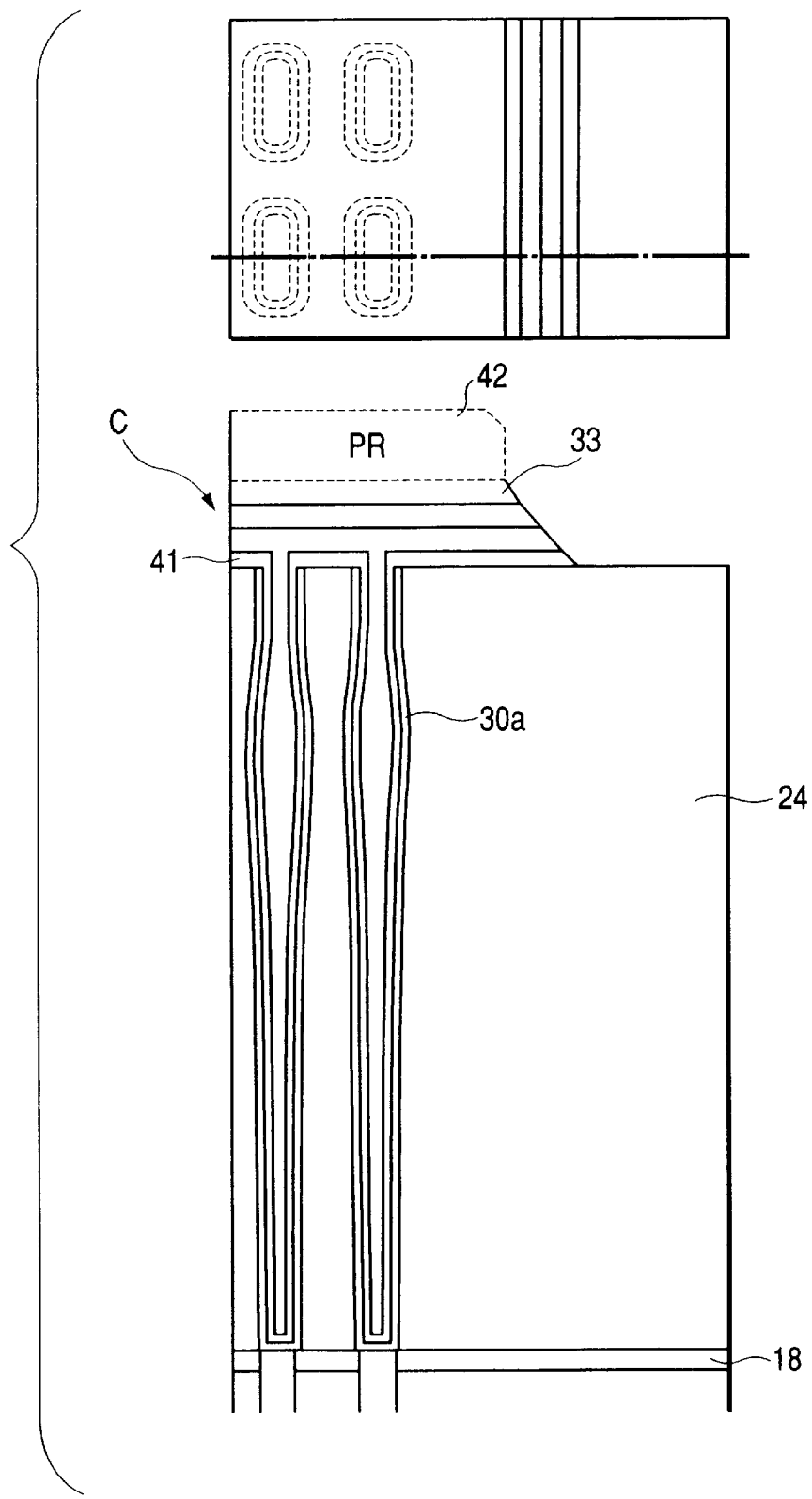
Figure 113:
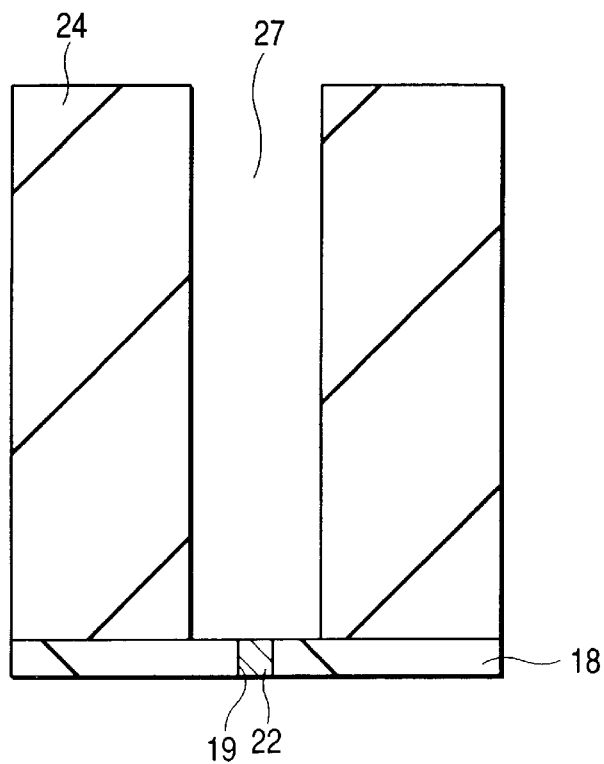
Figure 114:
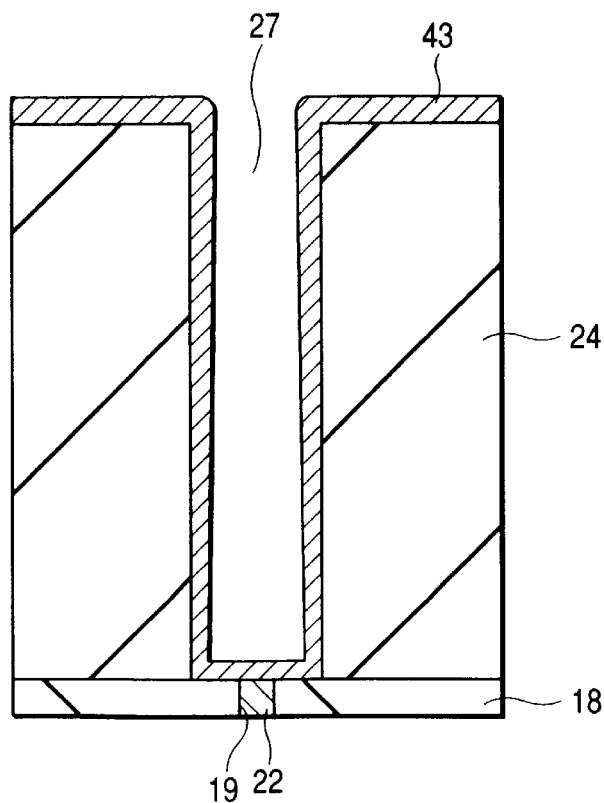
Figure 115:
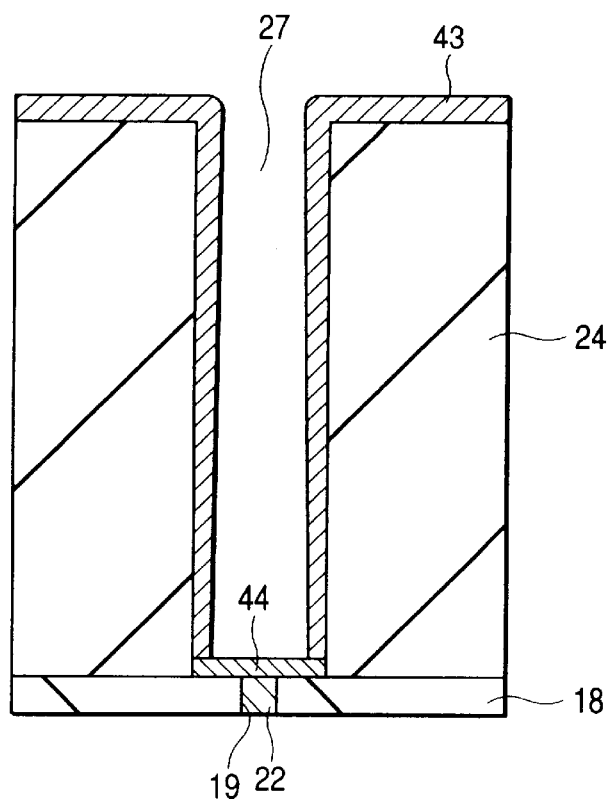
Figure 116:
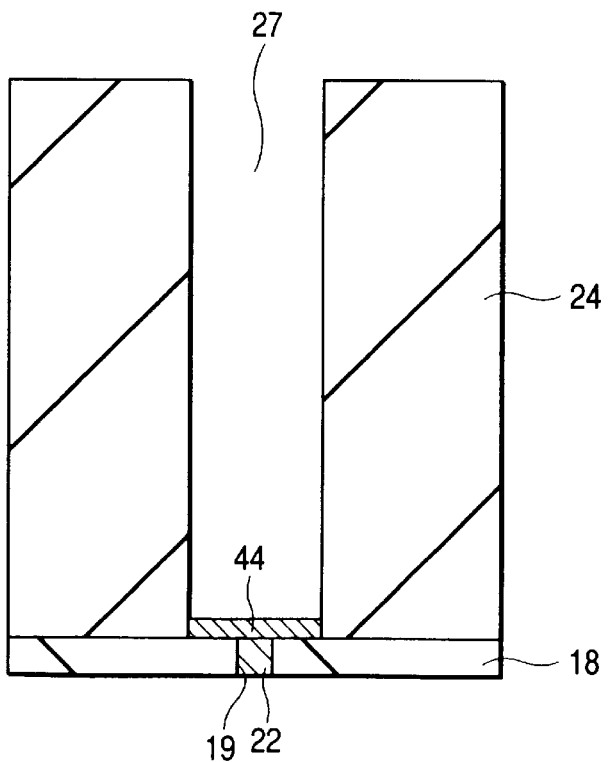
Figure 117A:
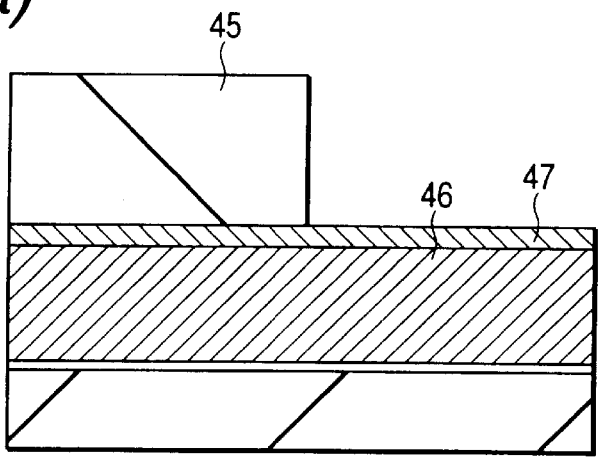
Figure 117B:
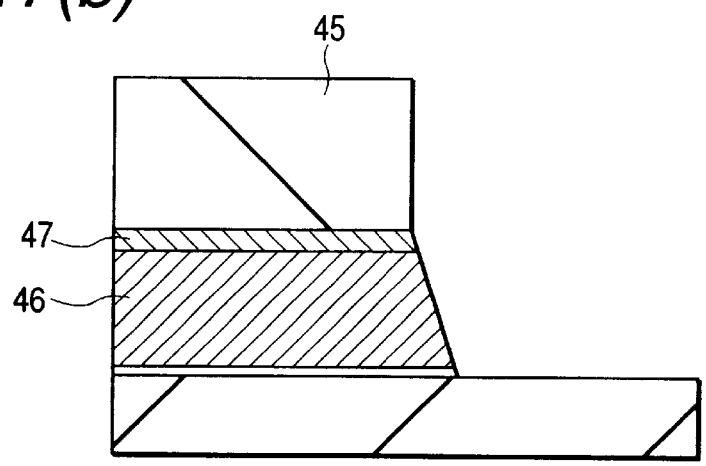
Figure 117C:
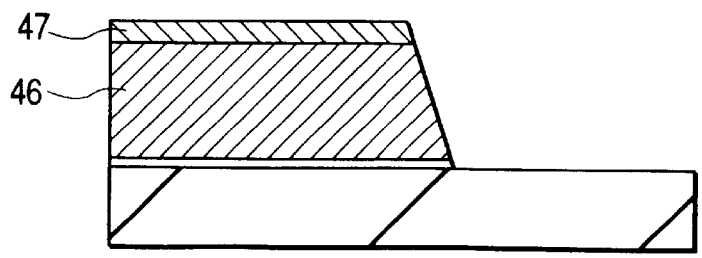

109 is a fragmentary cross-sectional view of a semiconductor substrate illustrating the method of manufacture of a DRAM according to another embodiment of the present invention;

FIG. 110 is a fragmentary cross-sectional view of a semiconductor substrate illustrating the method of manufacture of a DRAM according to another embodiment of the present invention;

FIG. 111 is a fragmentary cross-sectional view of a semiconductor substrate illustrating the method of manufacture of a DRAM according to another embodiment of the present invention;

FIG. 112 is a fragmentary cross-sectional view of a semiconductor substrate illustrating the method of manufacture of a DRAM according to another embodiment of the present invention;

FIG. 113 is a fragmentary cross-sectional view of a semiconductor substrate illustrating the method of manufacture of a DRAM according to another embodiment of the present invention;

FIG. 114 is a fragmentary cross-sectional view of a semiconductor substrate illustrating the method of manufacture of a DRAM according to another embodiment of the present invention;

FIG. 115 is a fragmentary cross-sectional view of a semiconductor substrate illustrating the method of manufacture of a DRAM according to another embodiment of the present invention;

FIG. 116 is a fragmentary cross-sectional view of a semiconductor substrate illustrating the method of manufacture of a DRAM according to another embodiment of the present invention; and FIGS. 117(a) to 117(c) are each a fragmentary cross-sectional view of a semiconductor substrate illustrating the method of manufacture of a DRAM according to another embodiment of the present invention.

DETAILED DESCRIPTION OF THE PREFERRED EMBODIMENTS

In the description of the Embodiments herein, a description of the same or similar part will not be repeated in principle unless otherwise particularly required. Further, a description will be made after the subject matter is divided in plural sections or in plural embodiments if necessary for convenience's sake. These plural sections or embodiments are not independent of each other, but are in a relation such that one is a modification example, details or a complementary description of a part or whole of the other one unless otherwise specifically indicated.

The term "semiconductor integrated circuit device" as used herein means any devices including not only those formed over a silicon wafer, but also those formed over a substrate, such as TFT liquid crystal, unless otherwise specifically indicated. The terms "the main surface of a wafer" and "over the main surface of a wafer" as used herein refers to the main surface of a substrate itself or the upper surface of a thin film, which is made of a single layer or multiple layer, formed over a substrate, which differs depending on conditions.

The terms "wafer" and "substrate" as used herein refer to a wafer for the fabrication of a semiconductor integrated circuit device, such as a single crystal silicon wafer used for the formation, over the main surface of the wafer, of a semiconductor integrated circuit, an insulating wafer having a single semiconductor region or plural semiconductor regions formed over a semiconductor or insulating substrate, or a combination thereof. It is needless to say that the term "main surface of a wafer or substrate" means not only the main surface of the wafer itself, but also refers to the upper surface including single or plural films formed on the main surface.

In addition, in the description of the Embodiments, when a reference is made to the number of elements (including the number, value, amount and range), the number of elements is not limited to a specific number, but can be not greater than or less than the specific number unless otherwise specifically indicated, except in the case it is principally apparent that the number is limited to the specific number.

Moreover, in the description of the Embodiments, it is needless to say that the constituting elements (including element steps) are not always essential unless otherwise specifically indicated, except in the case where it is principally apparent that they are essential.

When reference is made to the shape, positional relationship or the like of constituting elements, those substantially close or similar to their shapes or the like are included unless otherwise specifically indicated or presumed to be apparently different in principle. This also applies to the above-described numerical value and range.

The term "chemical dry etching" as used herein means, as opposed to anisotropic etching, such as sputter etching wherein etching proceeds only by sputtering action of ions, or reactive ion etching (RIE) or ion assist etching wherein etching reaction mainly proceeds by the action of reactive species and accelerated ions (including those produced in the vicinity of the treated substrate, accelerated by ion sheath, but also those incident substantially vertically to the treated substrate by another accelerating means such as ion beam etching), isotropic etching such, as Barrel etching, wherein reaction of the chemical reaction system made of an etching gas and a substance to be treated is allowed to proceed voluntarily by the difference in free energy or the like, down flow etching, and gas phase etching, which is free from application of a strong bias to a wafer to be treated or incidence of ions having a high energy.

The term "anisotropic etching" includes, for example, sputter etching, reactive ion etching, ion assist etching and ion beam etching, and this etching permits formation of a nearly vertical etching profile, when a decrease in the film thickness of a mask is not taken into consideration, by markedly increasing the etching rate in the vertical direction relative to that in the horizontal direction by making use of high energy ion incidence.

The term "isotropic etching" includes, for example, barrel etching, down flow plasma etching and chemical etching, and this etching does not make use of high energy ion incidence by a high substrate bias or another method, and, as a result, permits the formation of an isotropic etching profile.

Non-plasma type etching is dry etching, that is, simple gas phase etching free of plasma in the vicinity (a distance as near as the thickness of ion sheath) of a wafer to be treated. It is possible to use plasma, UV light or silent discharge for the formation of etching species at a site apart from the wafer to be treated. More specifically, non-plasma type etching refers to etching free of plasma in an ozone-containing gas atmosphere.

Embodiment 1

Figure 1:
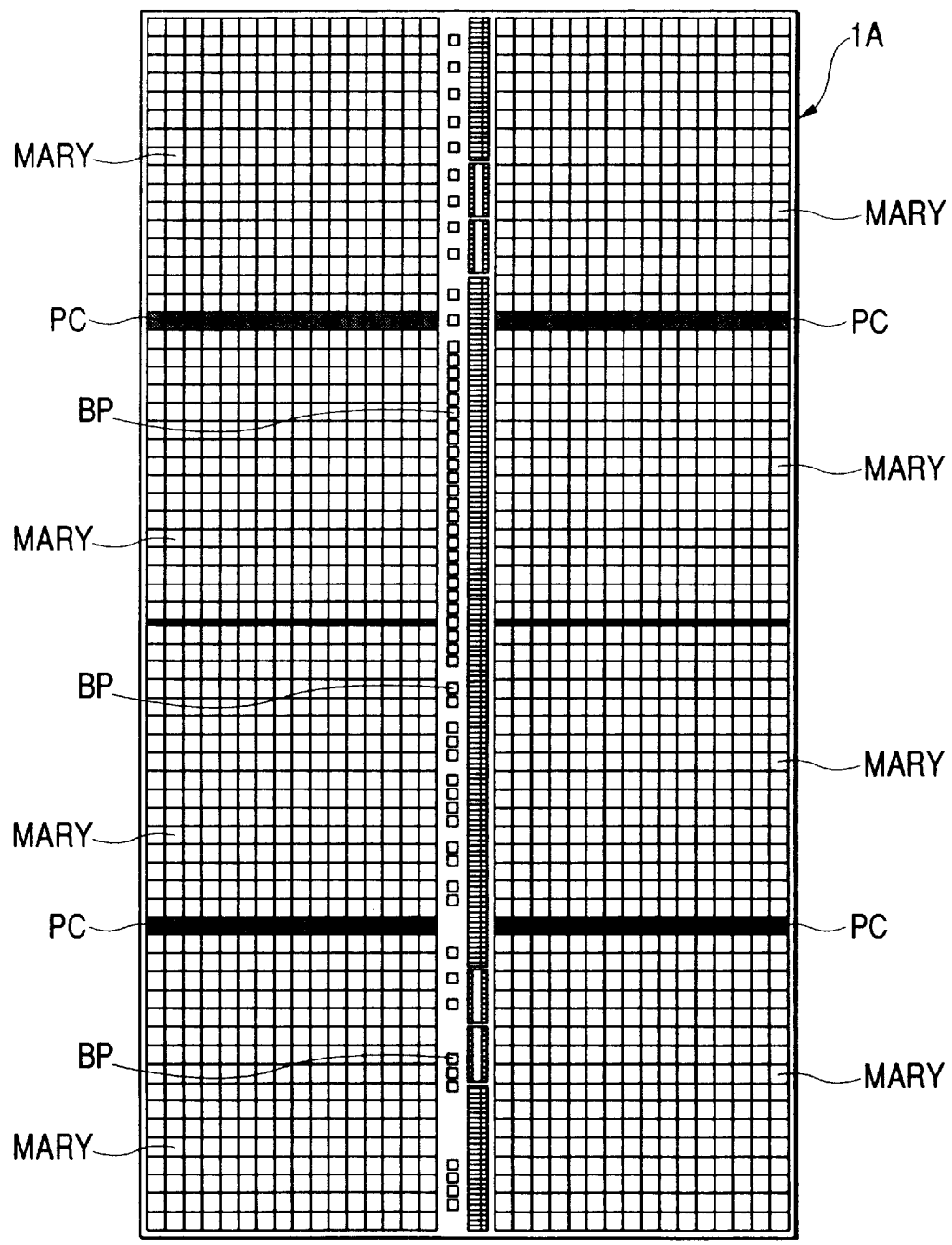
FIG. 1 is-an overall plan view illustrating a semiconductor chip having a DRAM formed thereon according to one embodiment of the present invention.

FIG. 1 is an overall plan view illustrating a semiconductor chip 1A of this Embodiment having a DRAM formed thereon. On the main surface of a rectangular semiconductor chip 1A, there is formed a DRAM having, for example, a memory capacitance of 256 Mbit to 1 Gbit. This DRAM has a memory portion divided into a plurality of memory arrays (MARY) and a peripheral circuit portion (PC) disposed therearound. At the center of the semiconductor chip 1A, a plurality of bonding pads (BP) to be connected with a wire or the like are arranged in a line.

Figure 2:
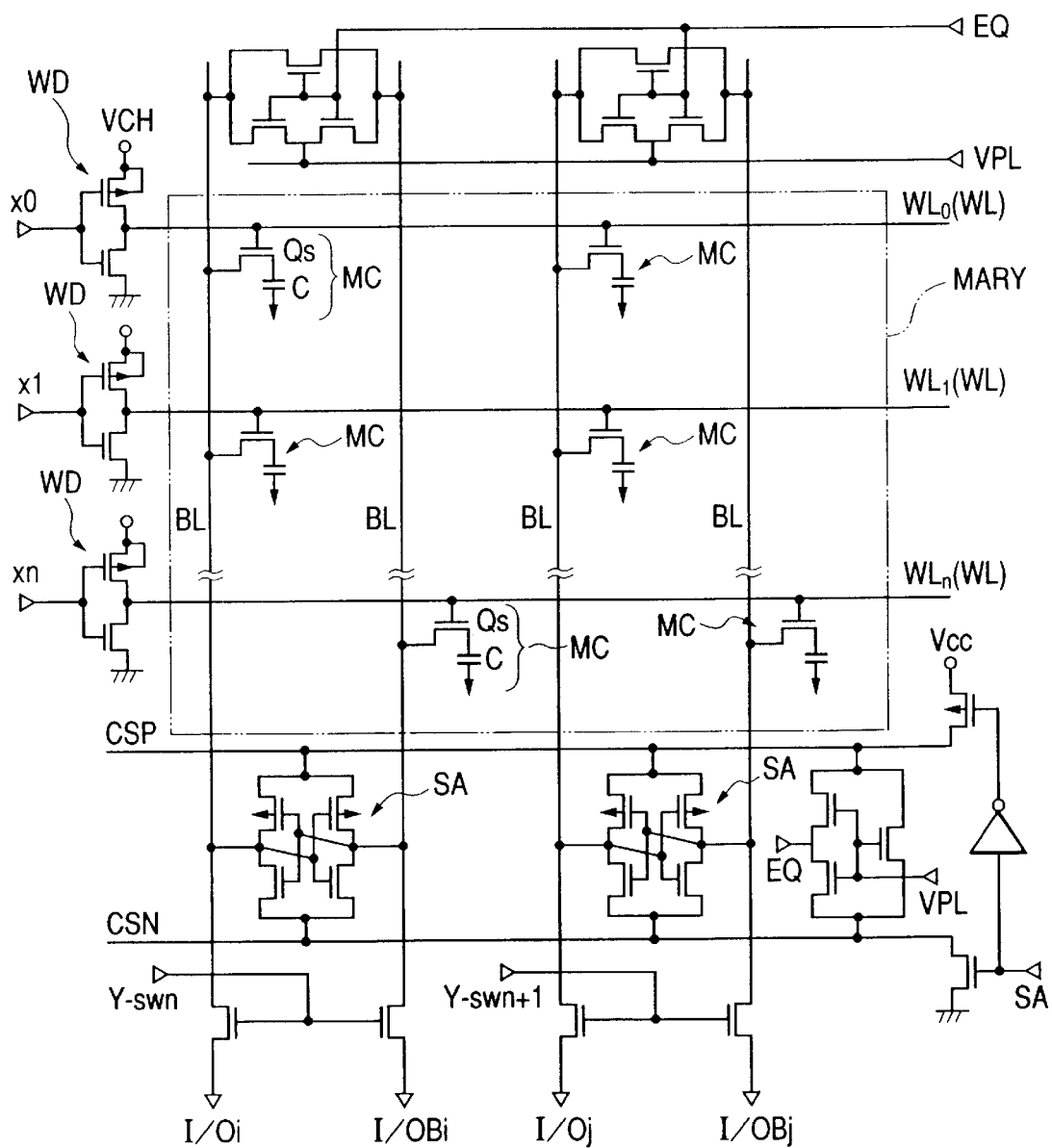
FIG. 2 is an equivalent circuit diagram illustrating the DRAM according to one embodiment of the present invention.

FIG. 2 is an equivalent circuit diagram of the DRAM according to the present embodiment. As illustrated, the memory array (MARY) of this DRAM is formed of a plurality of word lines WL ($Wl_0, W_1, WL_n$ . . . ) disposed in the form of a matrix, a plurality of bit lines BL and a plurality of memory cells (MC) disposed at their intersections. One memory cell (MC) for storing one bit of information is formed of one information storage capacitor (C) and one memory cell selecting MISFETQs connected therewith in series. One of the source and drain of the memory cell selecting MISFETQs is electrically connected with the information storage capacitor C, while the other one is electrically connected with the bit line BL. The word line WL is, at one end thereof, connected with a word driver WD, while the bit line is, at one end thereof, connected with a sense amplifier SA.

The DRAM in this embodiment adopts a stacked capacitor structure wherein the information storage capacitor C, serving as an information storage capacitance portion of the memory cell, is disposed over the memory cell selecting MISFETQS. As will be described later, this information storage capacitor C is formed inside of a high-aspect-ratio hole (recess) which has been formed in a thick silicon oxide film over the memory cell selecting MISFETQs. This information storage capacitor C is constituted of a lower electrode (storage node) formed of a conductor film made of a metal or an alloy containing Ru (ruthenium) as a principal component; a capacitor insulating film containing, as a main component, BST ($Ba_xSr_{l-3},TiO_3$; barium strontium titanate) formed over the lower electrode; and an upper electrode (plate electrode) made of a three-layered conductor film formed from Ru, TiN (titanium nitride) and W (tungsten) over the capacitor insulating film.

A method of manufacture of the DRAM according to this embodiment will next be described in the order of steps based on FIGS. 3 to 85. Among the manufacturing steps which will be described later, steps up to the formation of a memory cell selecting MISFETQs over the main surface of a semiconductor substrate (which will hereinafter be referred to as a "substrate" simply), followed by formation of a bit line BL over the resulting memory cell selecting MISFETQs are described specifically, for example, in Japanese Patent Application No. Hei 11(1999)-166320 (Matsuoka, et al.). Accordingly, in this application, steps up to the formation of the bit line BL will be described roughly and the structure of the information storage capacitor C, a main component, and its manufacturing process will be described in detail. Steps up to the formation of the bit line BL are not defined by the steps described by the present application. Japanese Patent Application No. Hei 11(1999)-24452 disclose an invention made prior to this application by the present inventors concerning the formation of a lower electrode of the information storage capacitor C by using a conductor film containing Ru as a principal component. In it, the lower electrode has a columnar structure so that it is different in structure and manufacturing method from the lower electrode of this application, which is to be formed inside of a high-aspect-ratio hole (recess).

Figure 3:
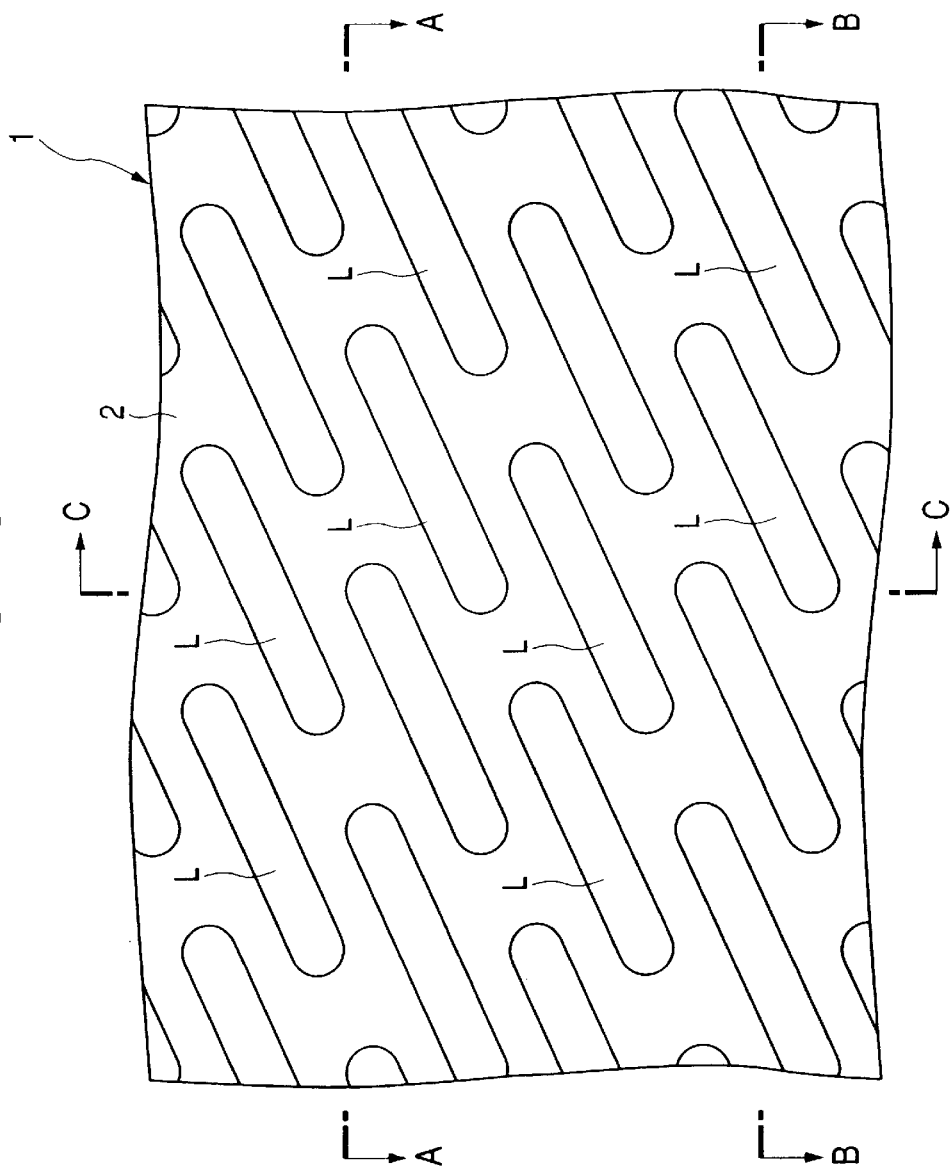
FIG. 3 is a fragmentary plan view of a semiconductor substrate illustrating the method of manufacture of a DRAM according to one embodiment of the present invention.
Figure 4:
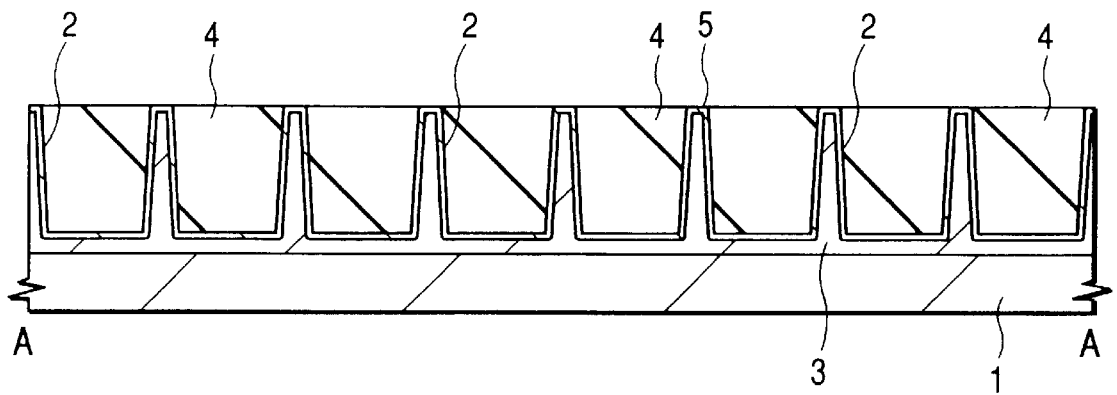
FIG. 4 is a fragmentary cross-sectional view of a semiconductor substrate illustrating the method of manufacture of a DRAM according to one embodiment of the present invention.
Figure 5:
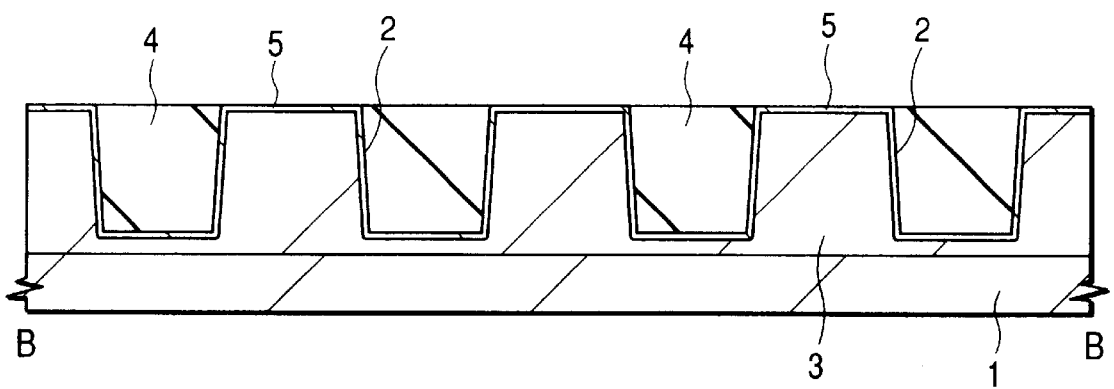
FIG. 5 is a fragmentary cross-sectional view of a semiconductor substrate illustrating the method of manufacture of a DRAM according to one embodiment of the present invention.
Figure 6:
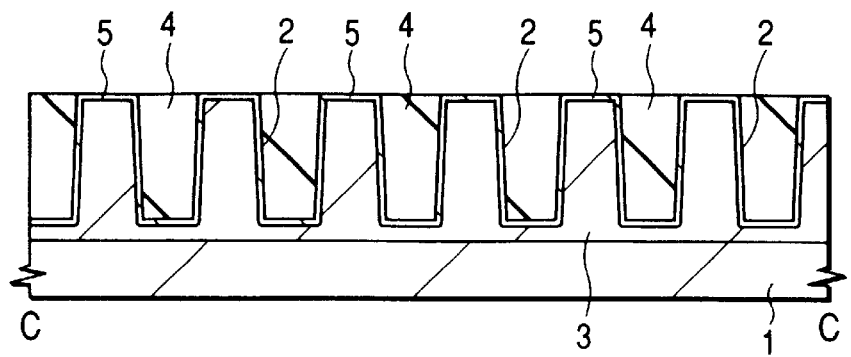
FIG. 6 is a fragmentary cross-sectional view of a semiconductor substrate illustrating the method of manufacture of a DRAM according to one embodiment of the present invention.

As illustrated in FIG. 3 (fragmentary plan view of a memory array), FIG. 4 (cross-sectional view taken along a line A—A of FIG. 3), FIG. 5 (cross-sectional view taken along a line B—B of FIG. 3) and FIG. 6 (cross-sectional view taken along a line C—C of FIG. 3), element isolating grooves 2 are formed in an element isolating region on the main surface of a substrate (wafer) 1 made of, for example, p-type single crystal silicon. By the formation of these element isolating grooves 2, active regions (L) in a slender island form surrounded by the element isolating grooves 2 are formed simultaneously, as illustrated in FIG. 3. In each of these active regions (L), two memory cell selecting MISFETQs having one of a source and a drain in common are formed.

Each of the element isolating grooves 2 is formed by etching the surface of the substrate 1 to form a groove of about 300 to 400 nm deep, depositing a silicon oxide film 4 (about 600 nm thick) over the substrate 1, including the inside of this groove, by CVD (chemical vapor deposition), and then polishing back the silicon oxide film 4 by chemical mechanical polishing (CMP). At this time, the surface of the silicon oxide film 4 inside the groove is planarized so that it has almost a similar surface height with that of the active region (L). The silicon oxide film 4 is formed, for example, by deposition by plasma CVD using oxygen (or ozone) and tetraethoxysilane (TEOS) as source gases and then densifying the deposited film by dry oxidation at about 1000° C.

In this application, the term "wafer (substrate)" means a wafer or semiconductor wafer for the manufacture of a semiconductor integrated circuit device, and it embraces insulating substrates, such as SOS (silicon on sapphire), SOI (silicon on insulator), single crystal silicone substrate and TFT (thin film transistor). It is needless to say that not only an unprocessed wafer, but also a processed one having an insulating film or conductor film formed thereon is also-included in the term "wafer". In general, the term "semiconductor chip" means a pellet, but in some cases, it means a wafer or semiconductor wafer for a semiconductor integrated circuit device and embraces insulating substrates, such SOS, SOI, single crystal silicone substrate and TFT.

A p-type well 3 is then formed by ion implantation of B (boron) into the substrate 1. After washing the surface of the p-type well 3 with an HF (hydrofluoric acid) washing liquid, the substrate 1 is subjected to thermal oxidation to form a clean silicon-oxide gate insulating film 5 (about 6 nm tfiick) on the surface of the active region (L) of the p-type well 3. The gate insulating film 5 may be made of, not only a silicon oxide insulating film formed by the thermal oxidation of the substrate 1, but also a silicon nitride insulating film or metal oxide insulating film (such as tantalum oxide or titanium oxide) having a dielectric constant greater than that of the silicon oxide film. Such an insulating film is formed over the substrate 1 by CVD or sputtering.

Figure 7:
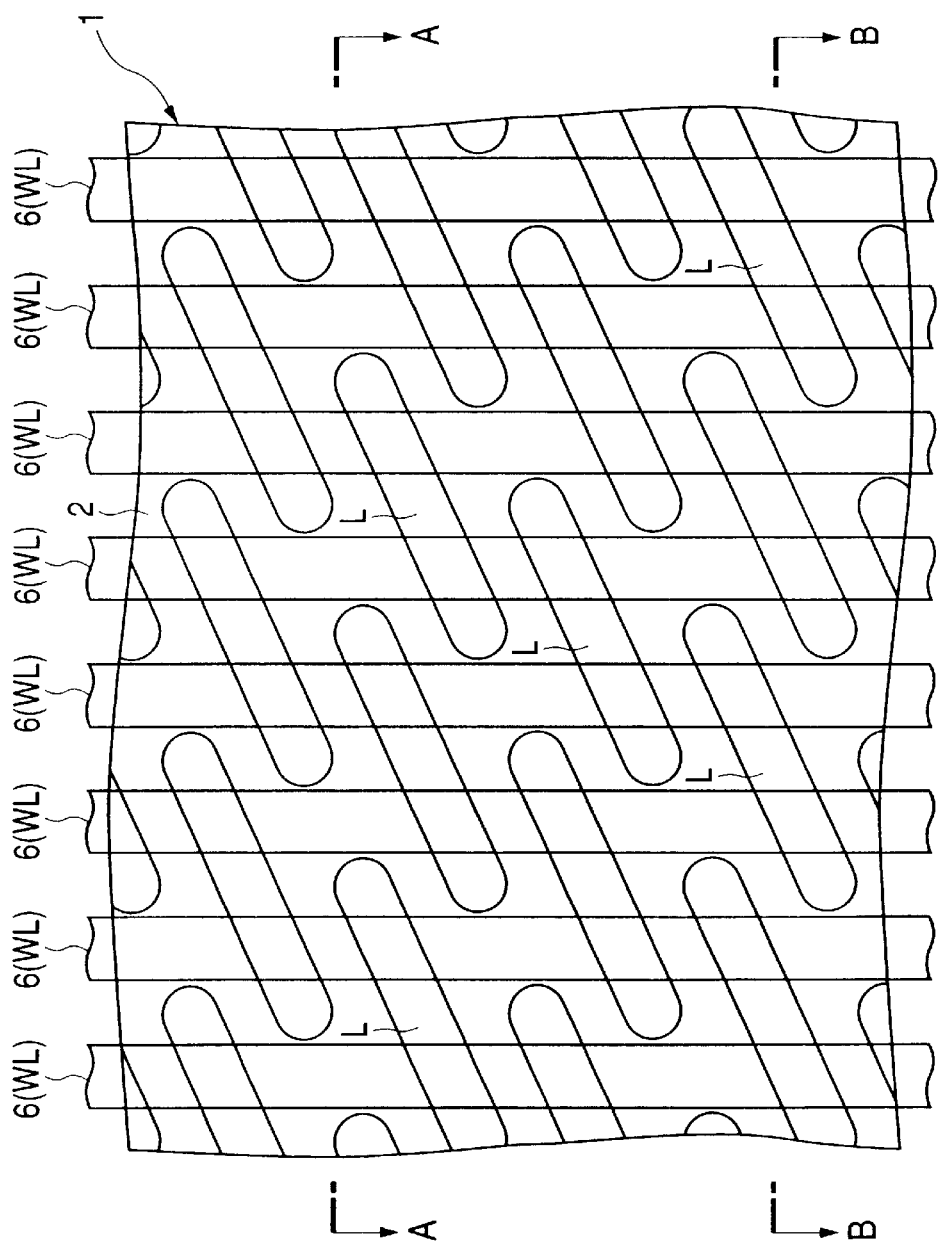
FIG. 7 is a fragmentary plan view of a semiconductor substrate illustrating the method of manufacture of a DRAM according to one embodiment of the present invention.
Figure 8:
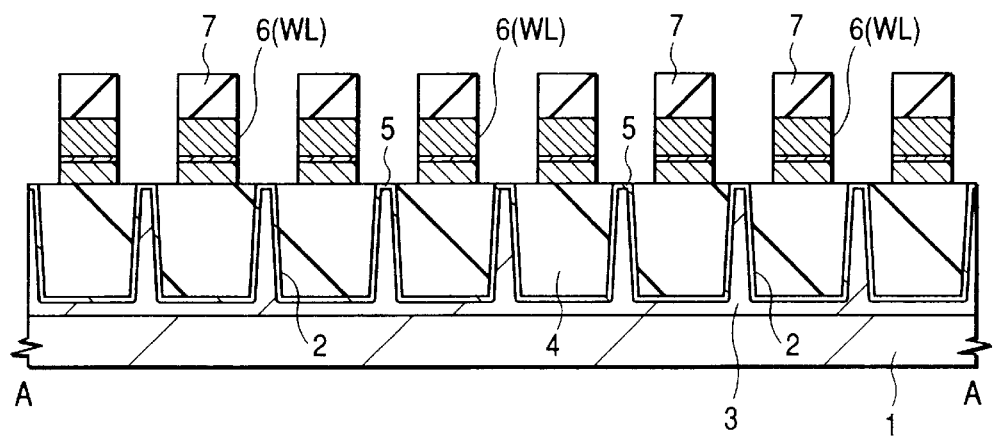
FIG. 8 is a fragmentary cross-sectional view of a semiconductor substrate illustrating the method of manufacture of a DRAM according to one embodiment of the present invention.
Figure 9:
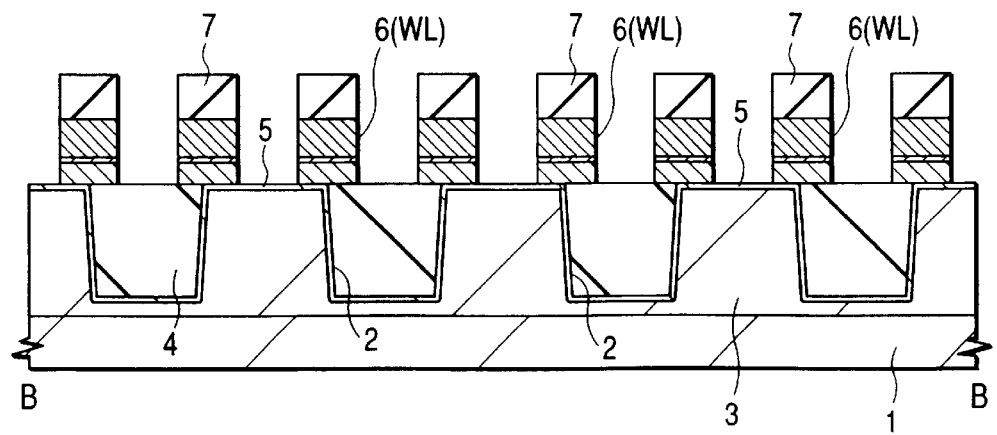
FIG. 9 is a fragmentary cross-sectional view of a semiconductor substrate illustrating the method of manufacture of a DRAM according to one embodiment of the present invention.

As illustrated in FIGS. 7 to 9, a gate electrode 6 is formed over the gate insulating film 5. The gate electrode 6 functions as a word line (WL) in a region other than the active regions. The gate electrode 6 (word line WL) is formed, for example, by depositing, over the gate insulating film 5, an n-type polycrystalline silicon film (about 70 nm thick) having P (phosphor) or the like doped therein a barrier metal film (about 5 nm to 10 nm thick) made of WN (tungsten nitride) or TiN (titanium nitride), a W film (about 100 nm thick) and a silicon nitride film 7 (about 150 nm thick) successively and then dry etching these films using a photoresist film as a mask. The polycrystalline silicon film and silicon nitride film 7 are deposited by CVD, while the barrier metal film and W film are deposited by sputtering.

Figure 10:
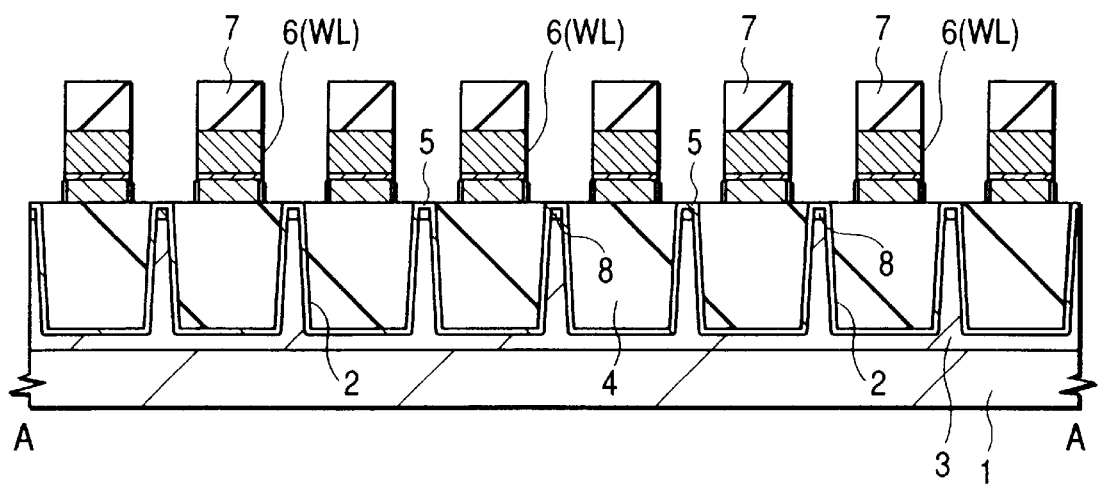
FIG. 10 is a fragmentary cross-sectional view of a semiconductor substrate illustrating the method of manufacture of a DRAM according to one embodiment of the present invention.
Figure 11:
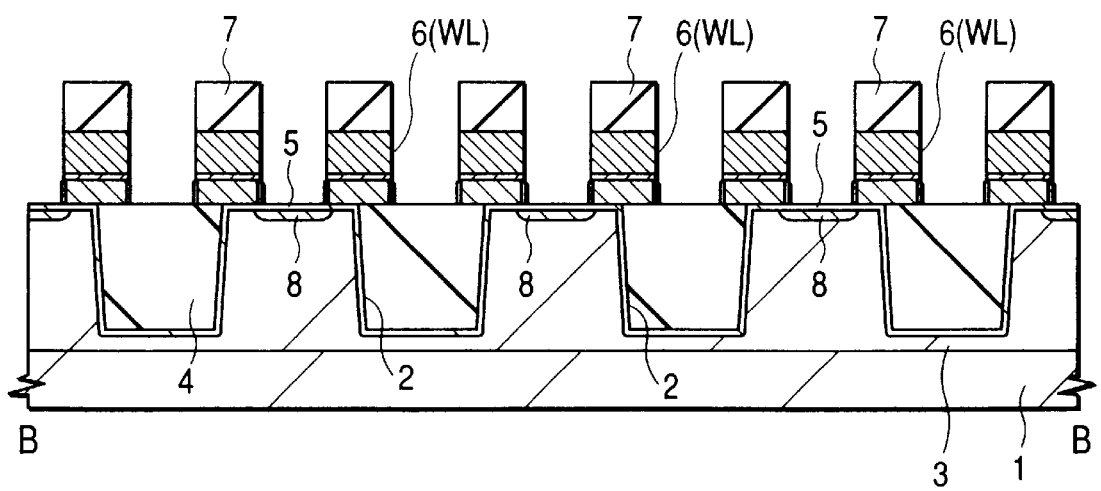
FIG. 11 is a fragmentary cross-sectional view of a semiconductor substrate illustrating the method of manufacture of a DRAM according to one embodiment of the present invention.
Figure 12:
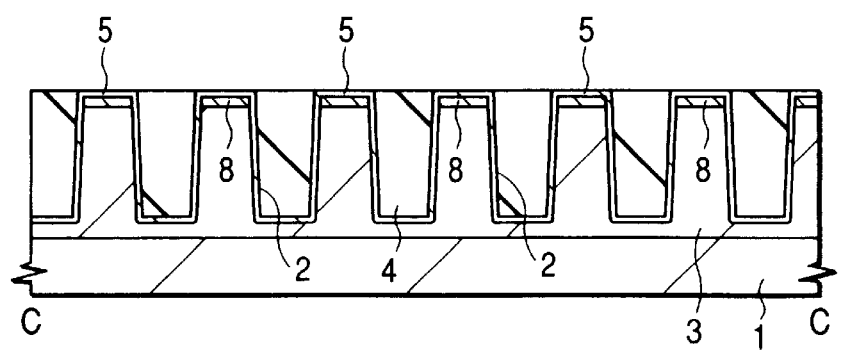
FIG. 12 is a fragmentary cross-sectional view of a semiconductor substrate illustrating the method of manufacture of a DRAM according to one embodiment of the present invention.
Figure 13:
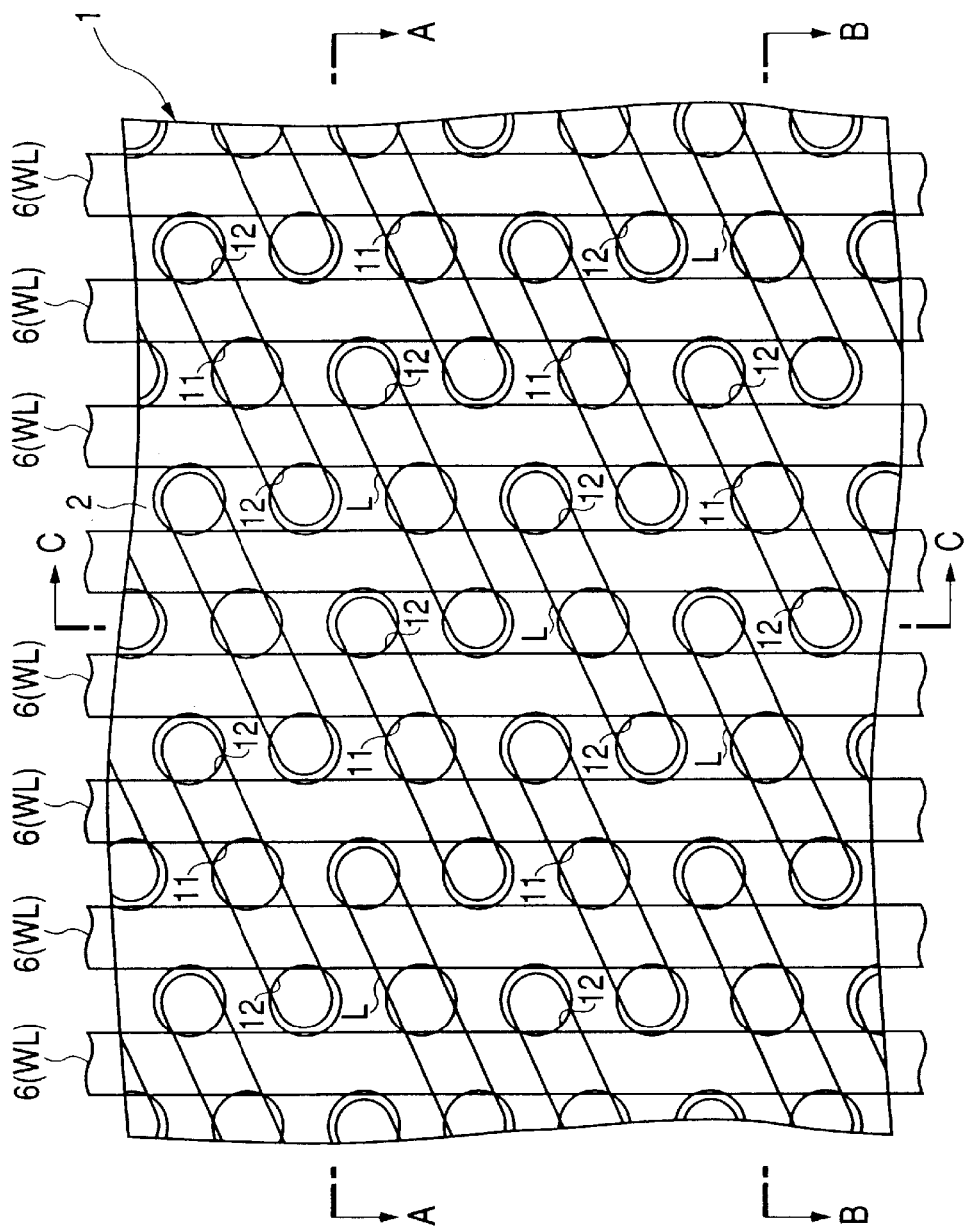
FIG. 13 is a fragmentary plan view of a semiconductor substrate illustrating the method of manufacture of a DRAM according to one embodiment of the present invention.
Figure 14:
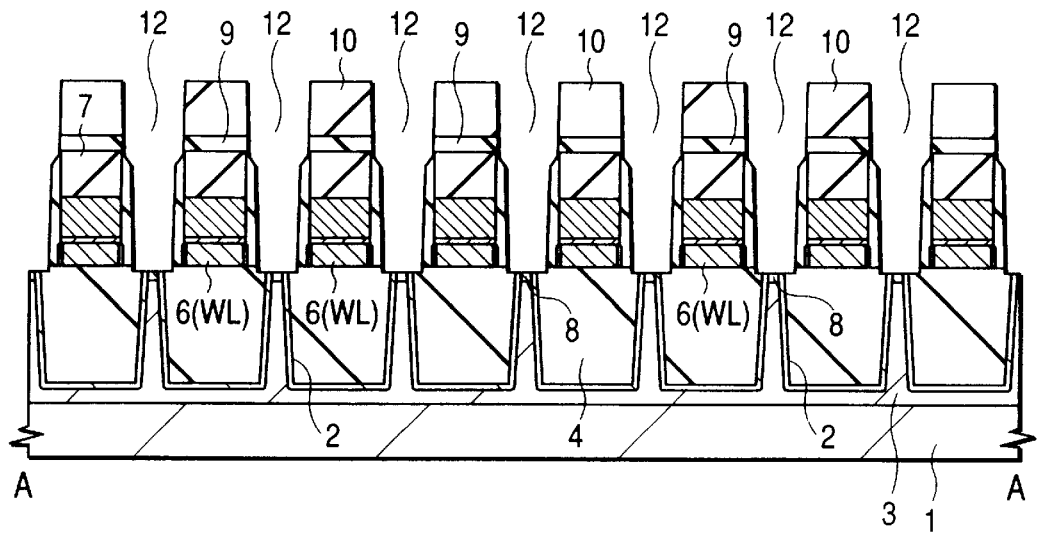
FIG. 14 is a fragmentary cross-sectional view of a semiconductor substrate illustrating the method of manufacture of a DRAM according to one embodiment of the present invention.
Figure 15:
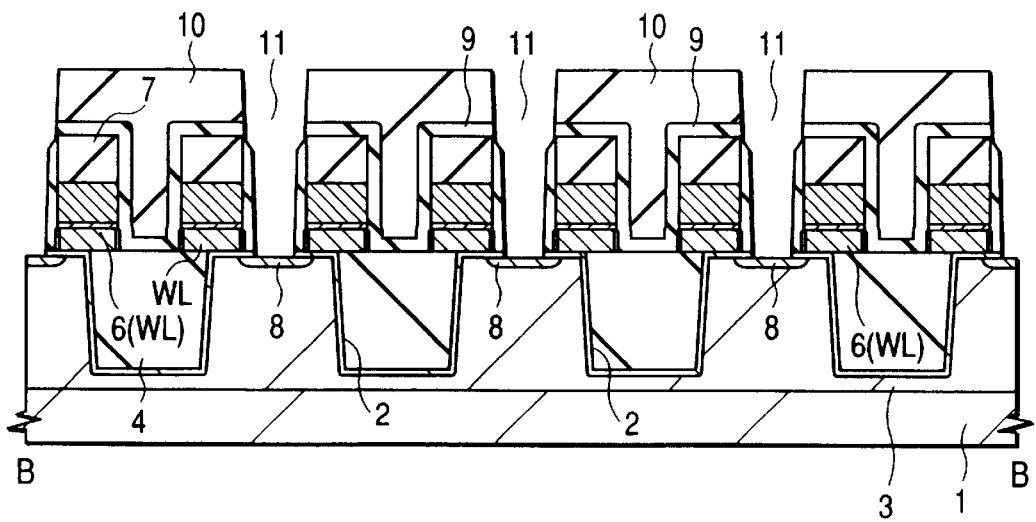
FIG. 15 is a fragmentary cross-sectional view of a semiconductor substrate illustrating the method of manufacture of a DRAM according to one embodiment of the present invention.
Figure 16:
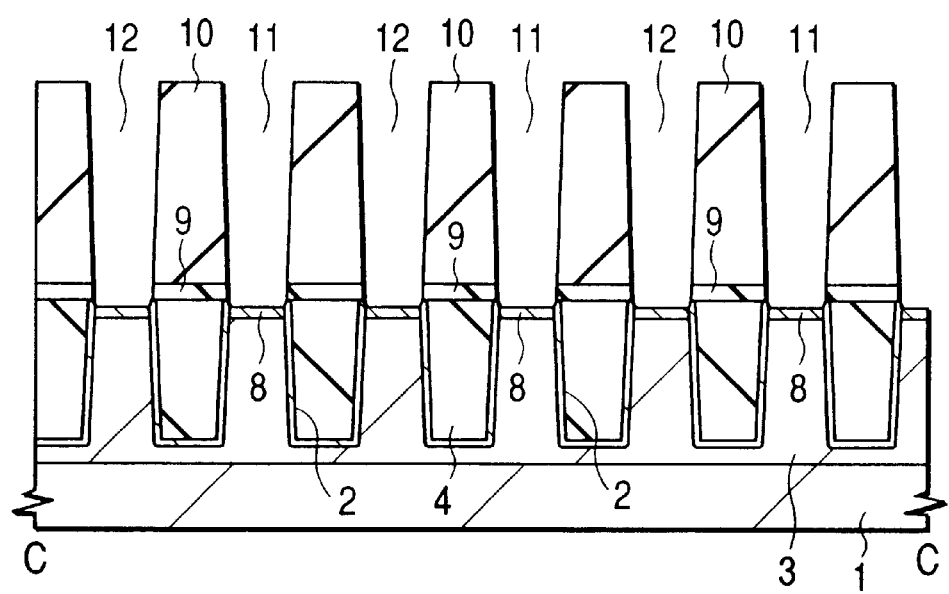
FIG. 16 is a fragmentary cross-sectional view of a semiconductor substrate illustrating the method of manufacture of a DRAM according to one embodiment of the present invention.

As illustrated in FIGS. 10 to 12, n-type semiconductor regions 8 (source, drain) are then formed in the p-type wells 3 on both sides of the gate electrode 6 by ion implantation of As (arsenic) or P (phosphorus) into the p-type wells 3. By the steps so far mentioned, formation of a memory cell selecting MISFETQs is substantially completed.

As illustrated in FIGS. 13 to 16, contact holes 11, 12 are formed over the n-type semiconductor regions 8 (source, drain) of the memory cell selecting MISFETQs by depositing over the Substrate 1 a silicon nitride film 9 (50 nm thick):apd a silicon oxide film 10 (about 600 nm thick), flattening the surface of the silicon oxide film 10 by chemical mechanical polishing and then dry etching the silicon oxide film 10 and silicon nitride film 9 using a photoresist film (not-illustrated) as a mask. The silicon oxide film 10 is etched at a selectivity larger than that of a silicon nitride film, while the silicon nitride film 9 is etched at a selectivity larger than that of silicon or silicon oxide film, whereby the contact holes 11, 12 are formed in self alignment with the gate electrode 6 (word line).

Figure 17:
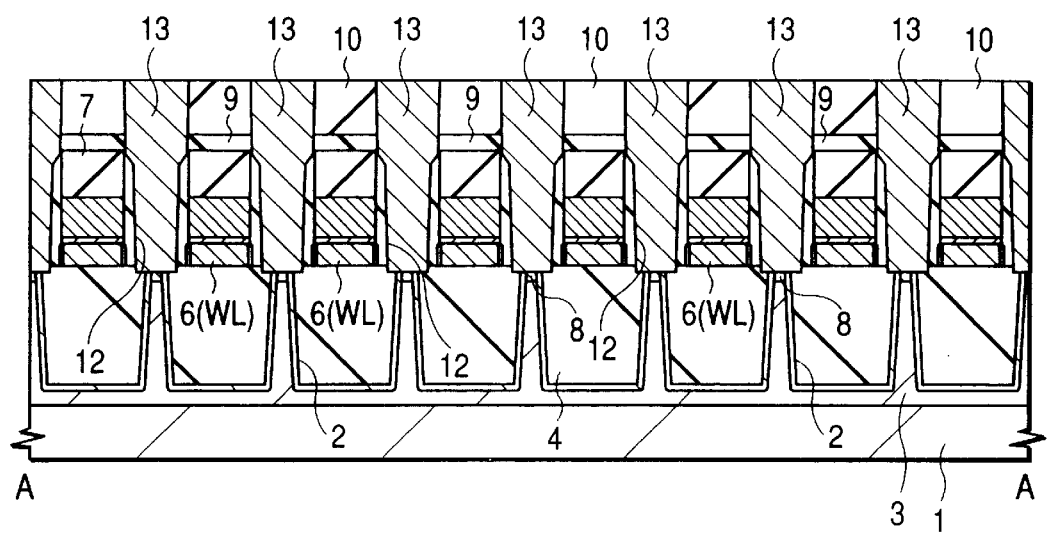
FIG. 17 is a fragmentary cross-sectional view of a semiconductor substrate illustrating the method of manufacture of a DRAM according to one embodiment of the present invention.
Figure 18:
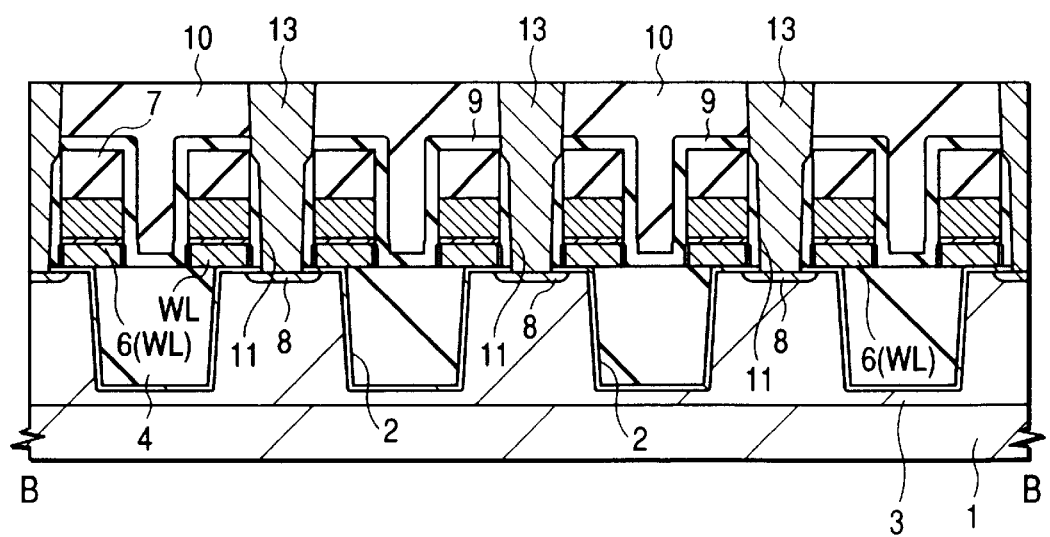
FIG. 18 is a fragmentary cross-sectional view of a semiconductor substrate illustrating the method of manufacture of a DRAM according to one embodiment of the present invention.

As illustrated in FIGS. 17 and 18, a plug 13 is formed inside of the contact holes 11, 12. This plug 13 is formed by depositing a P-doped n-type polycrystalline silicon film over the silicon oxide film 10 by CVD, thereby embedding this n-type polycrystalline silicon film inside of the contact holes 11, 12 and, then, removing the n-type polycrystalline silicon film outside the contact holes 11, 12 by chemical mechanical polishing (or etching back).

Figure 19:
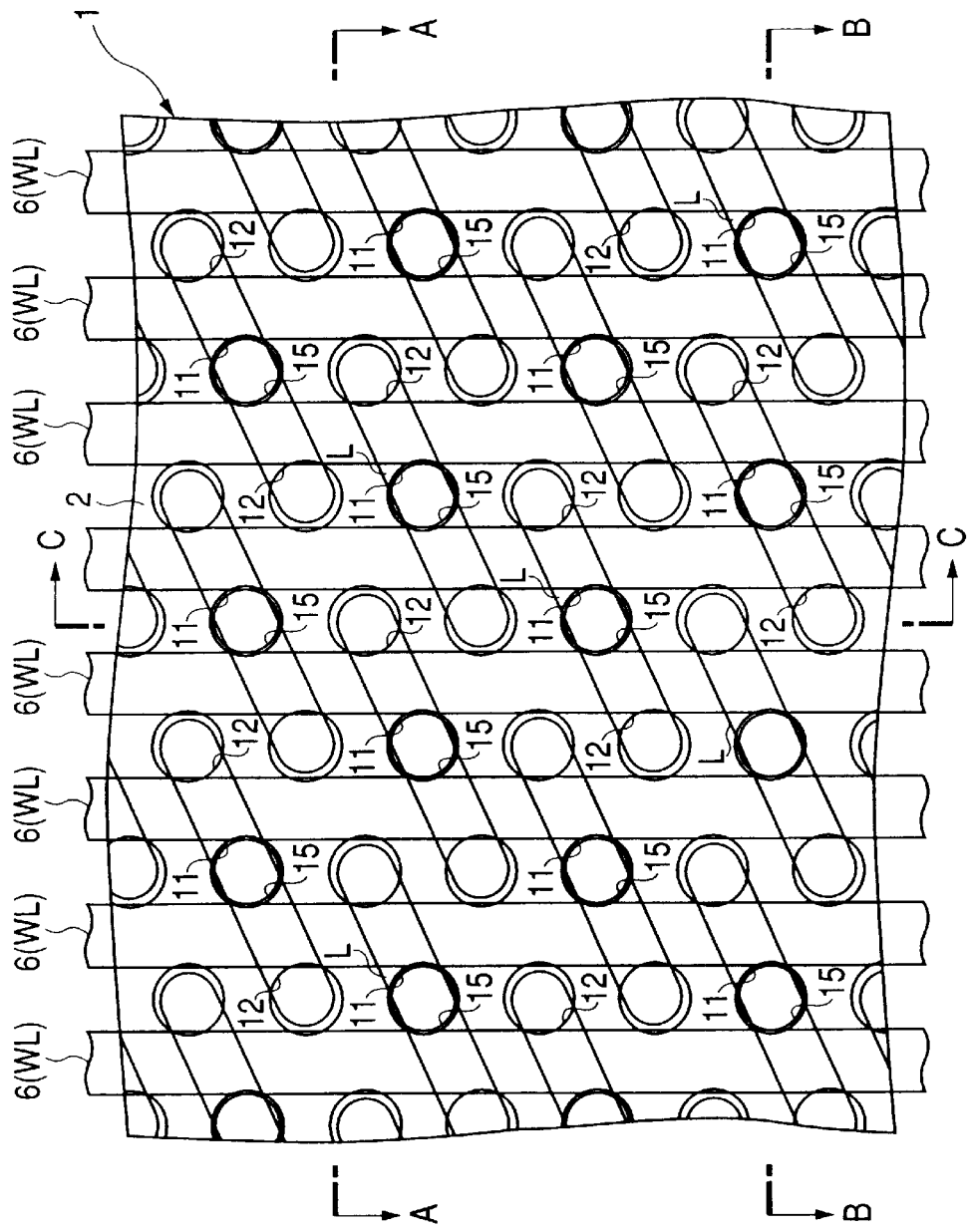
FIG. 19 is a fragmentary plan view of a semiconductor substrate illustrating the method of manufacture of a DRAM according to one embodiment of the present invention.
Figure 20:
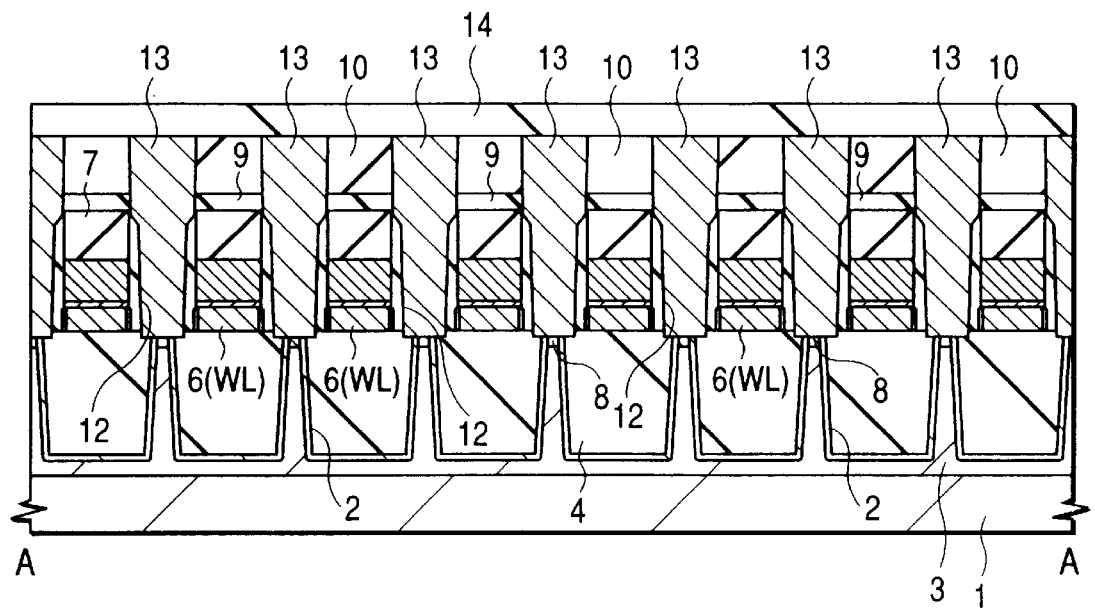
FIG. 20 is a fragmentary cross-sectional view of a semiconductor substrate illustrating the method of manufacture of a DRAM according to one embodiment of the present invention.
Figure 21:
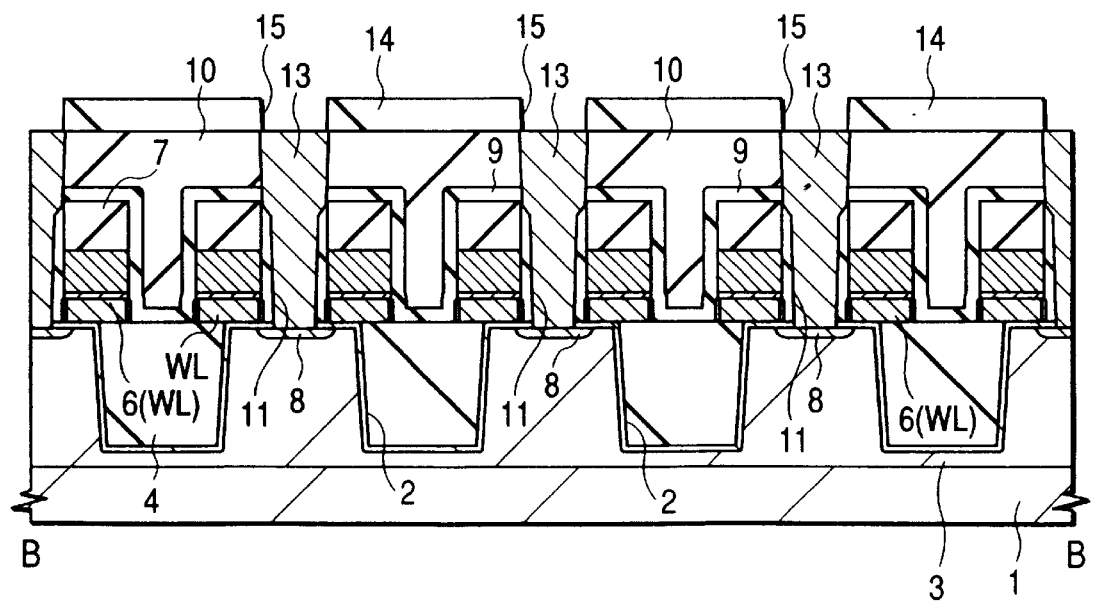
FIG. 21 is a fragmentary cross-sectional view of a semiconductor substrate illustrating the method of manufacture of a DRAM according to one embodiment of the present invention.

After deposition of a silicon oxide film 14 (about 150 nm thick) over the silicon oxide film 10 by CVD, the silicon oxide film 14 over the contact hole 11 is dry etched using a photoresist film (not illustrated) as a mask, as illustrated in FIGS. 19 to 21, whereby a through-hole 15 for connecting a bit line (BL), which will be formed later, is formed with the contact hole 11.

Figure 22:
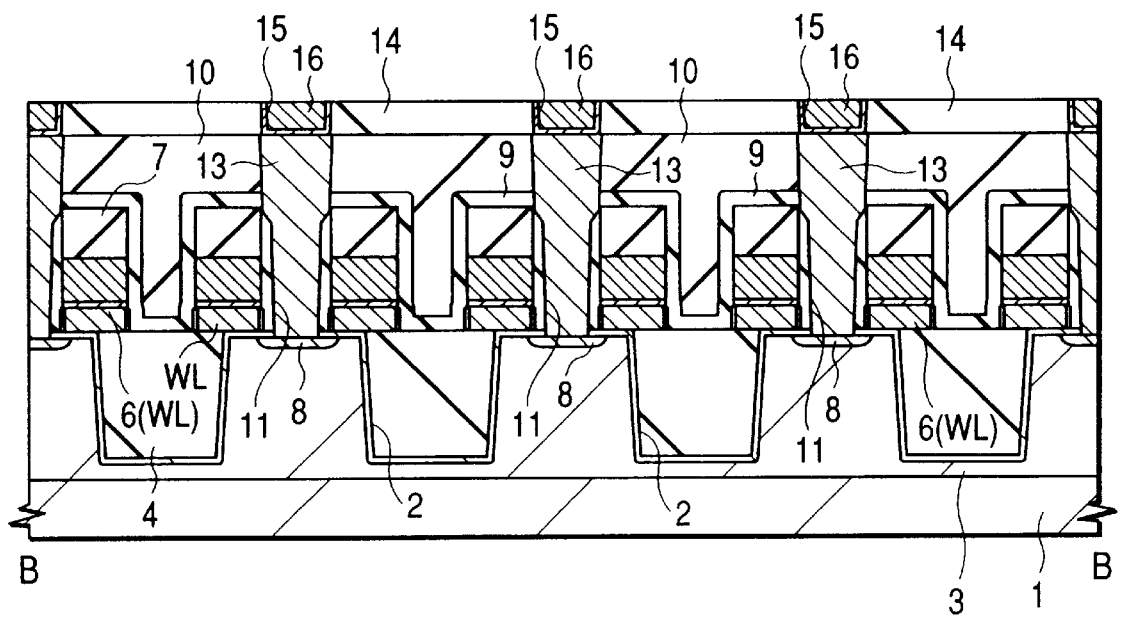
FIG. 22 is a fragmentary cross-sectional view of a semiconductor substrate illustrating the method of manufacture of a DRAM according to one embodiment of the present invention.
Figure 23:
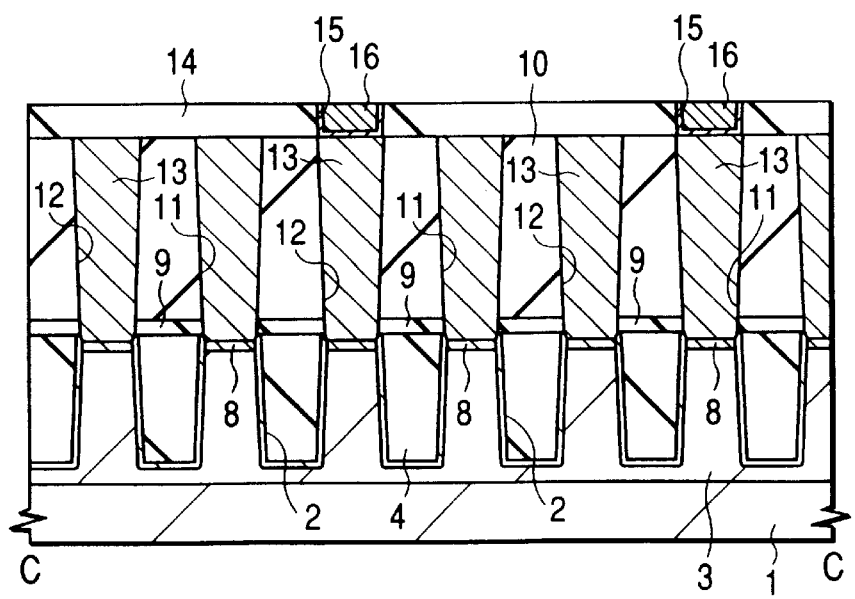
FIG. 23 is a fragmentary cross-sectional view of a semiconductor substrate illustrating the method of manufacture of a DRAM according to one embodiment of the present invention.
Figure 24:
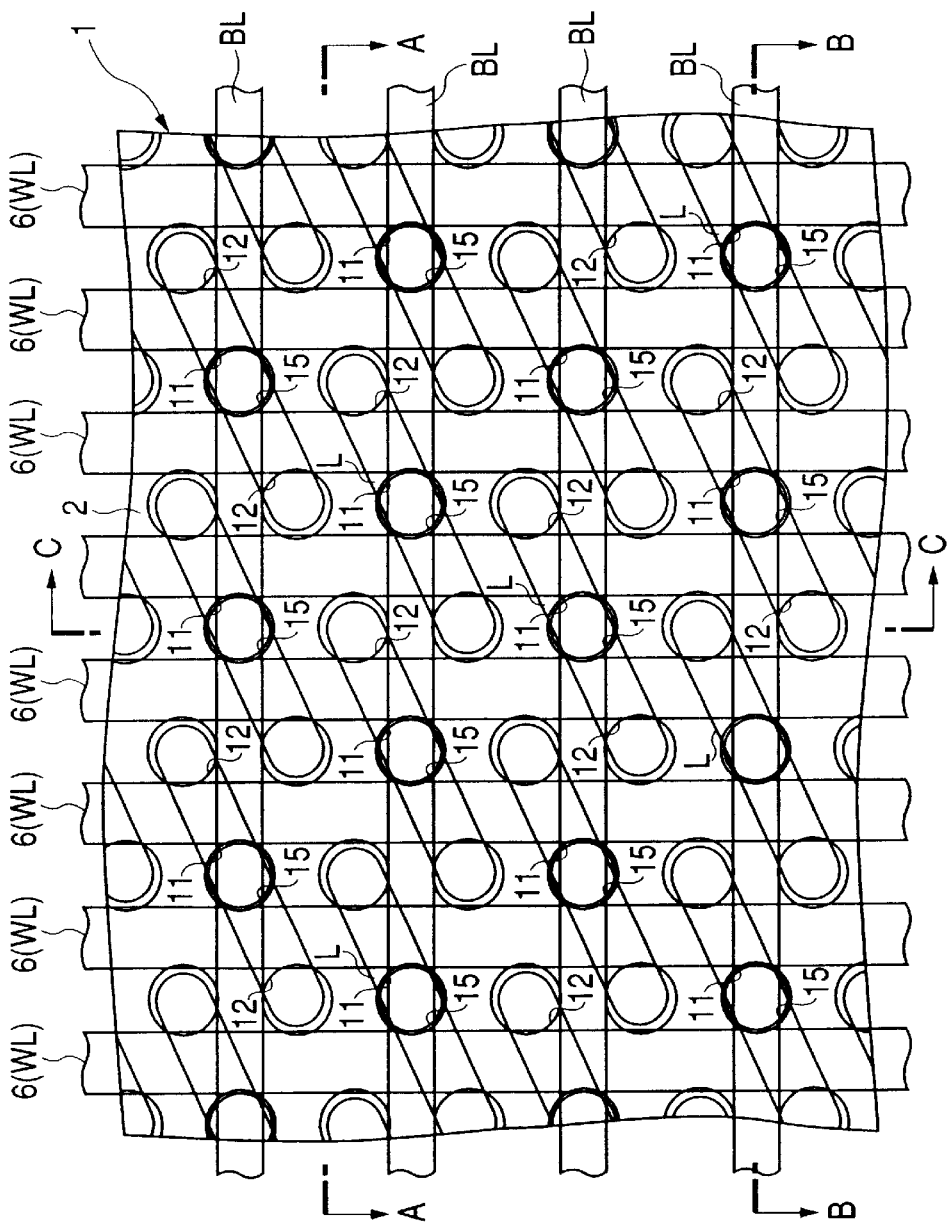
FIG. 24 is a fragmentary plan view of a semiconductor substrate illustrating the method of manufacture of a DRAM according to one embodiment of the present invention.
Figure 25:
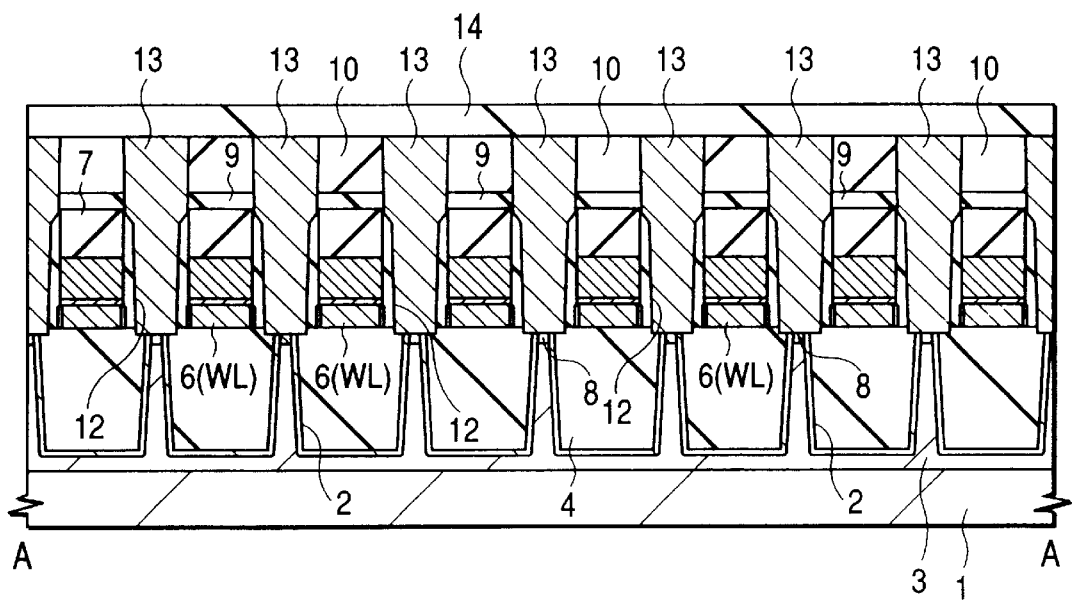
FIG. 25 is a fragmentary cross-sectional view of a semiconductor substrate illustrating the method of manufacture of a DRAM according to one embodiment of the present invention.
Figure 26:
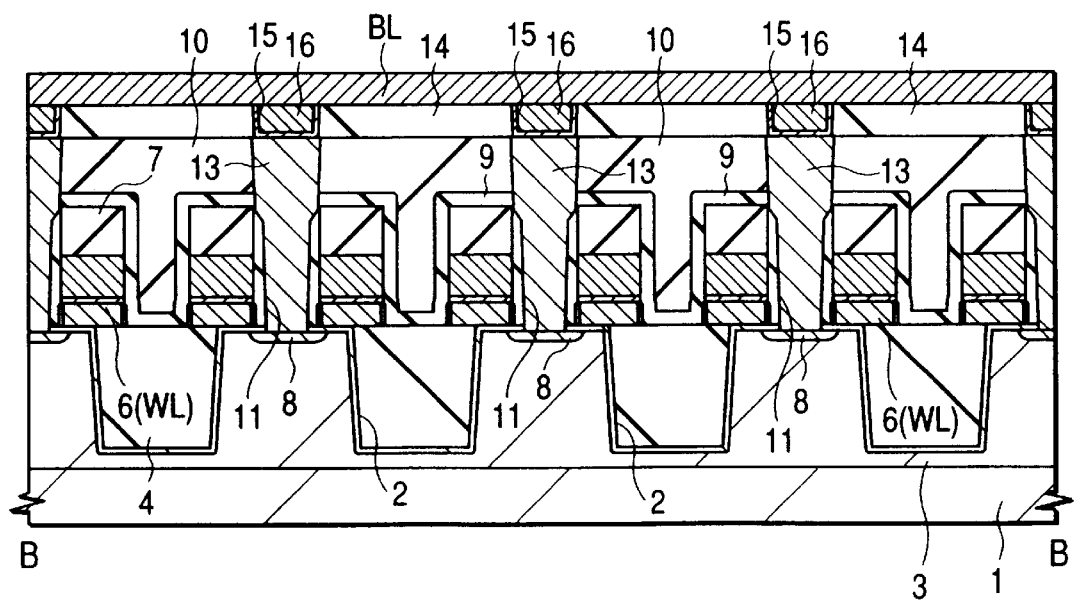
FIG. 26 is a fragmentary cross-sectional view of a semiconductor substrate illustrating the method of manufacture of a DRAM according to one embodiment of the present invention.
Figure 27:
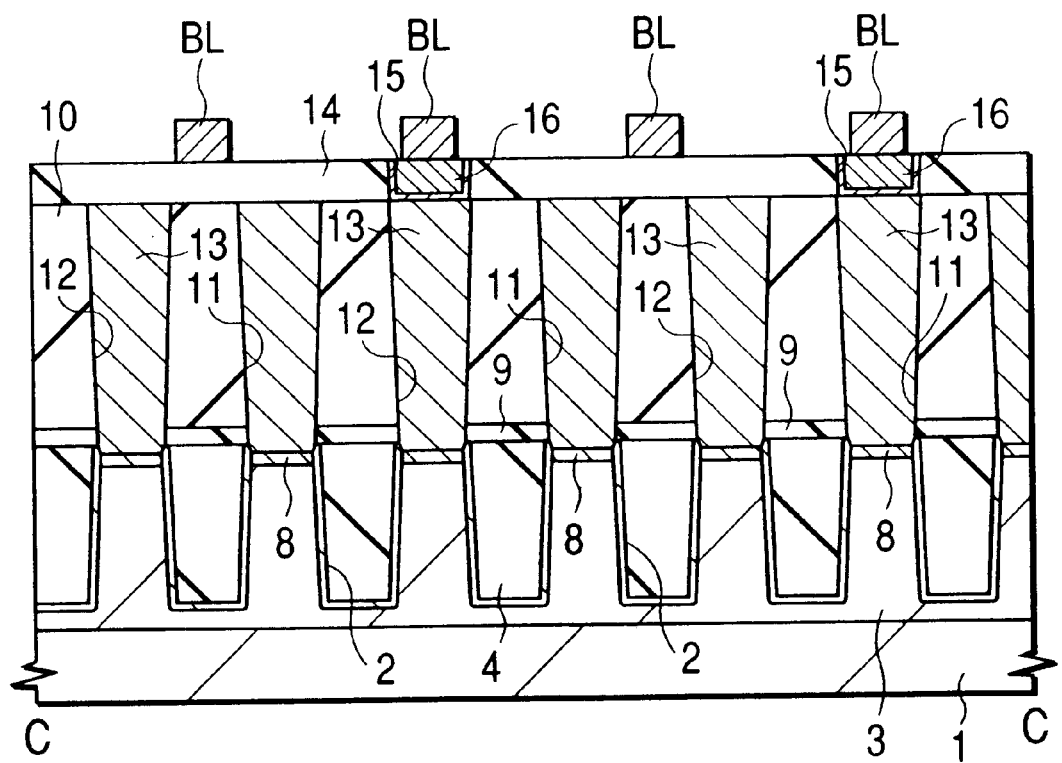
FIG. 27 is a fragmentary cross-sectional view of a semiconductor substrate illustrating the method of manufacture of a DRAM according to one embodiment of the present invention.

As illustrated in FIGS. 22 and 23, a plug 16 is formed inside of the through-hole 15. This plug 16 is formed by depositing a barrier metal film made of a Ti film and TiN film, which have been stacked one on another, for example, by sputtering and then depositing a W film over the barrier metal film by CVD to embed these films inside of the through-hole 15 and then removing these films outside the through-hole 15 by chemical mechanical polishing.

As illustrated in FIGS. 24 to 27, the bit line BL is then formed over the silicon oxide film 14. The bit line BL is formed, for example, by depositing a TiN film (about 10 nm thick) over the silicon oxide film 14 by sputtering, depositing a W film (about 50 nm thick) over the TiN film by CVO and then dry etching these films using a photoresist film as a mask.

As illustrated in FIGS. 28 to 31, a silicon oxide film 17 (about 300 nm thick) is then deposited over the bit line BL by CVD, followed by flattening of its surface by chemical mechanical polishing. Over the silicon oxide film 17, a silicon nitride film 18 (about 50 nm thick) is deposited by CVD and then the silicon nitride film 18 and silicon oxide film 17 are dry etched, whereby a through-hole 19 is formed over the contact hole 11 having the plug 13 embedded therein.

The through-hole 19 is formed so as to make its diameter smaller than that of the contact hole 11. More specifically, a polycrystalline silicon film 20 is deposited over the silicon nitride film 18 by CVD, followed by formation of a hole-by dry etching the polycrystalline silicon film 20 from a region wherein the through-hole 19 is to be formed. Then, a polycrystalline silicon film (not illustrated) is deposited over the polycrystalline silicon film 20. The polycrystalline silicon film over the polycrystalline silicon film 20 is subjected to anisotropic etching, whereby side wall spacers 21 are formed on the side walls of the hole. Then, using the polycrystalline silicon film 20 and side wall spacers 21 as hard masks, the silicon nitride film 18 and silicon oxide film 17 are dry etched from the bottom surface of the hole.

Figure 28:
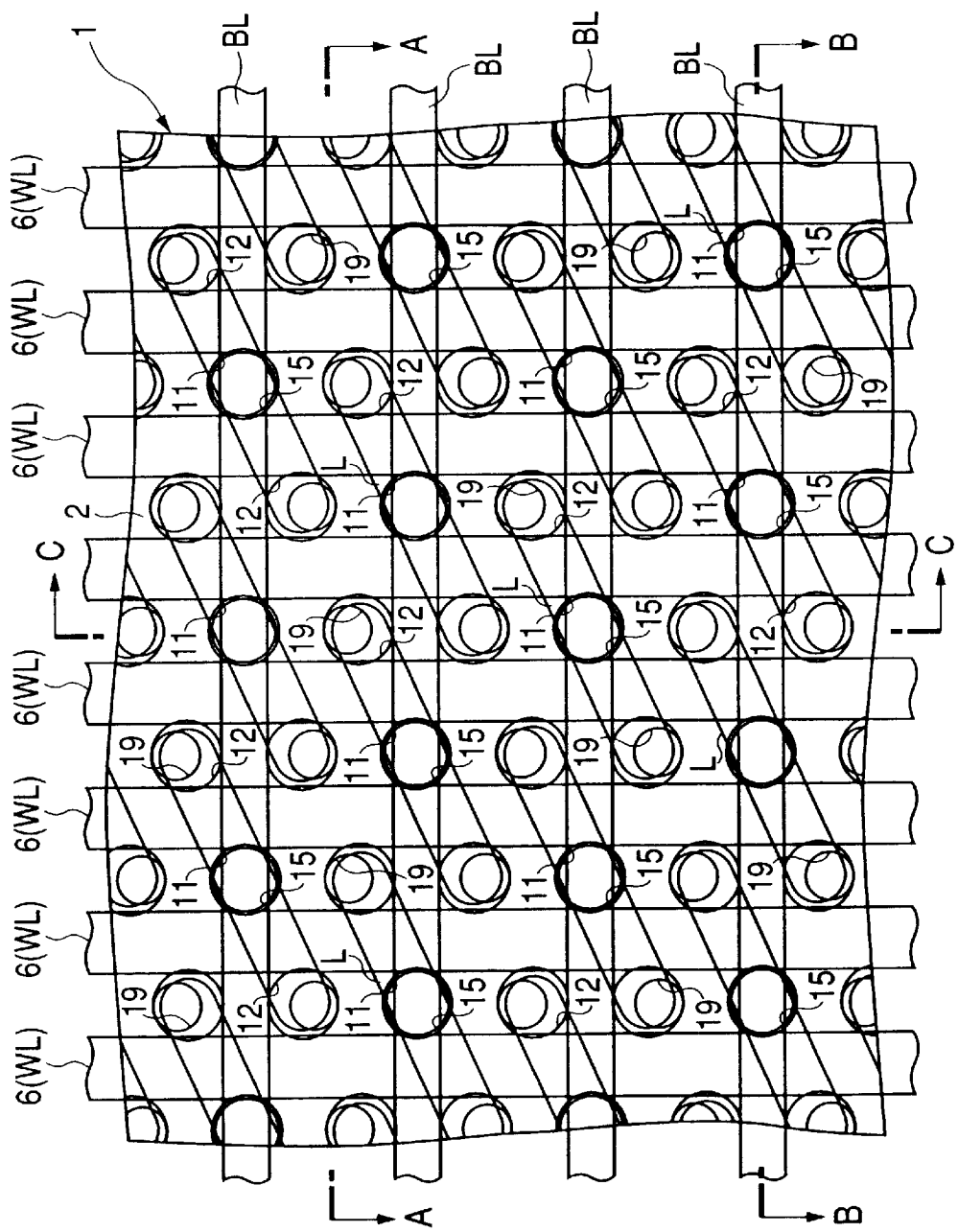
FIG. 28 is a fragmentary plan view of a semiconductor substrate illustrating the method of manufacture of a DRAM according to one embodiment of the present invention.
Figure 29:
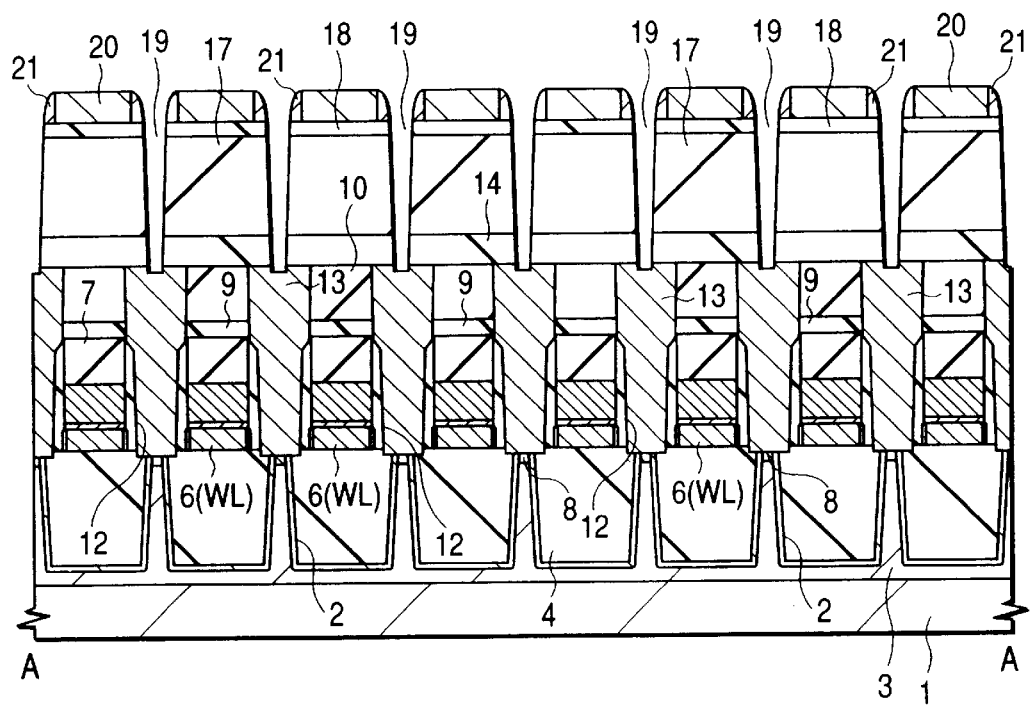
FIG. 29 is a fragmentary cross-sectional view of a semiconductor substrate illustrating the method of manufacture of a DRAM according to one embodiment of the present invention.
Figure 30:
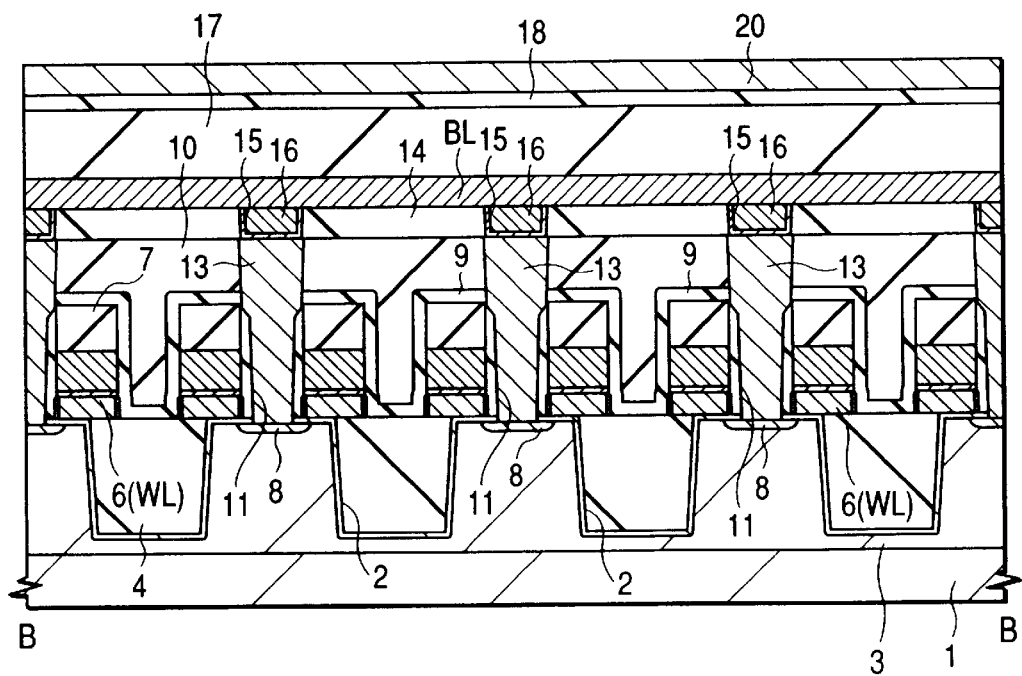
FIG. 30 is a fragmentary cross-sectional view of a semiconductor substrate illustrating the method of manufacture of a DRAM according to one embodiment of the present invention.
Figure 31:
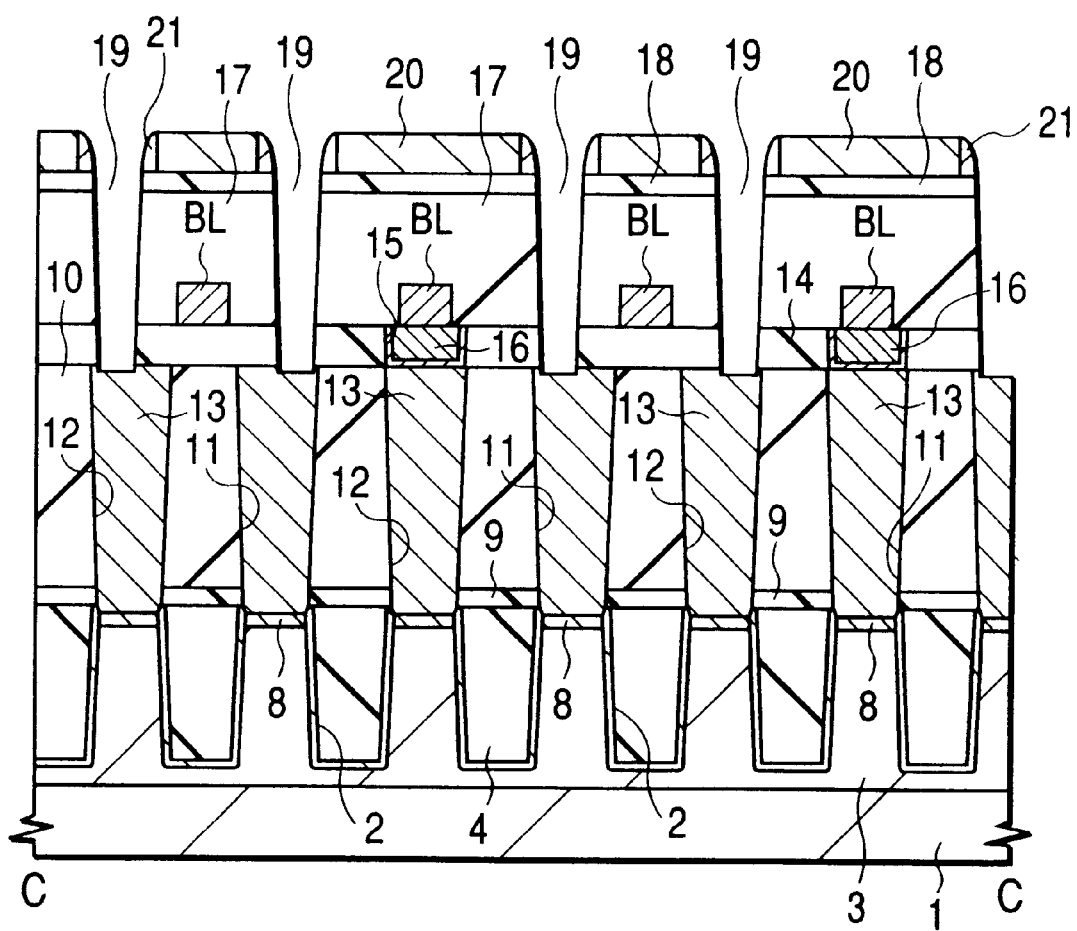
FIG. 31 is a fragmentary cross-sectional view of a semiconductor substrate illustrating the method of manufacture of a DRAM according to one embodiment of the present invention.

As illustrated in FIGS. 28 and 31, the through-hole 19 is offset so as to space the center of it from the bit line BL relative to the center of the contact hole 11 lying under the through-hole 19. By forming the diameter of the through-hole 19 smaller than that of the contact hole 11 lying thereunder and, at the same time, offsetting its center in a direction apart from the BL line, a short circuit between the through-hole 19 (plug to be embedded inside of it) add the bit line BL can be prevented without using a self align contact (SAC) technique, even if the memory size is reduced. In addition, in the formation of the through-hole 19 to have a smaller diameter than that of the contact hole 11 lying thereunder, a sufficient contact area between them can be secured even if their centers do not coincide.

Figure 32:
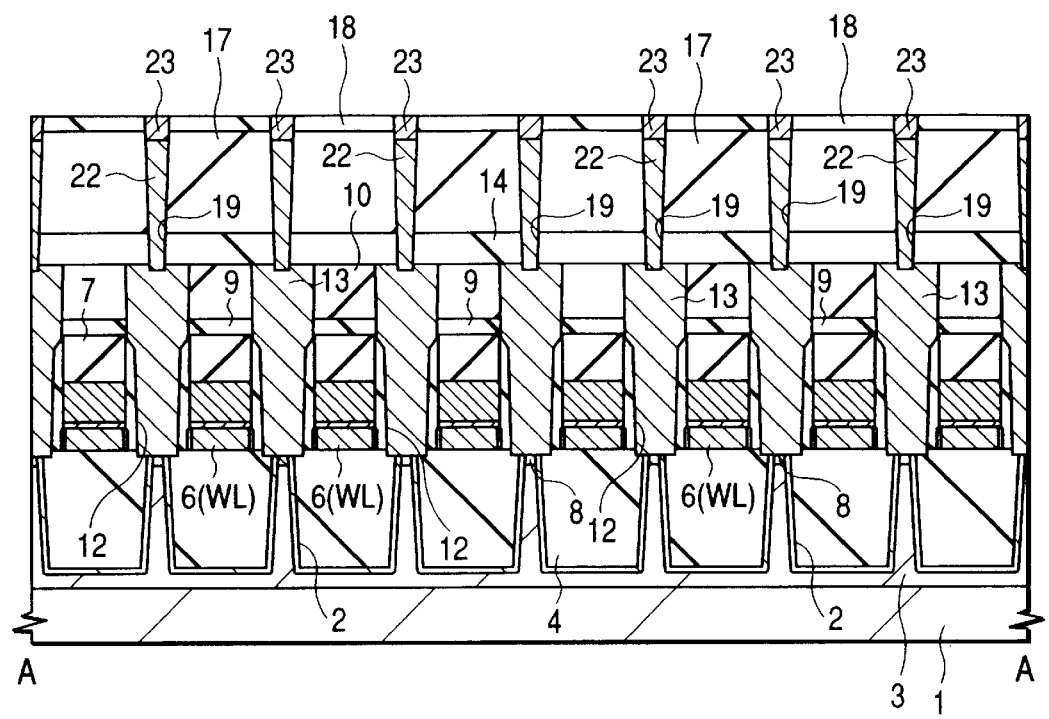
FIG. 32 is a fragmentary cross-sectional view of a semiconductor substrate illustrating the method of manufacture of a DRAM according to one embodiment of the present invention.
Figure 33:
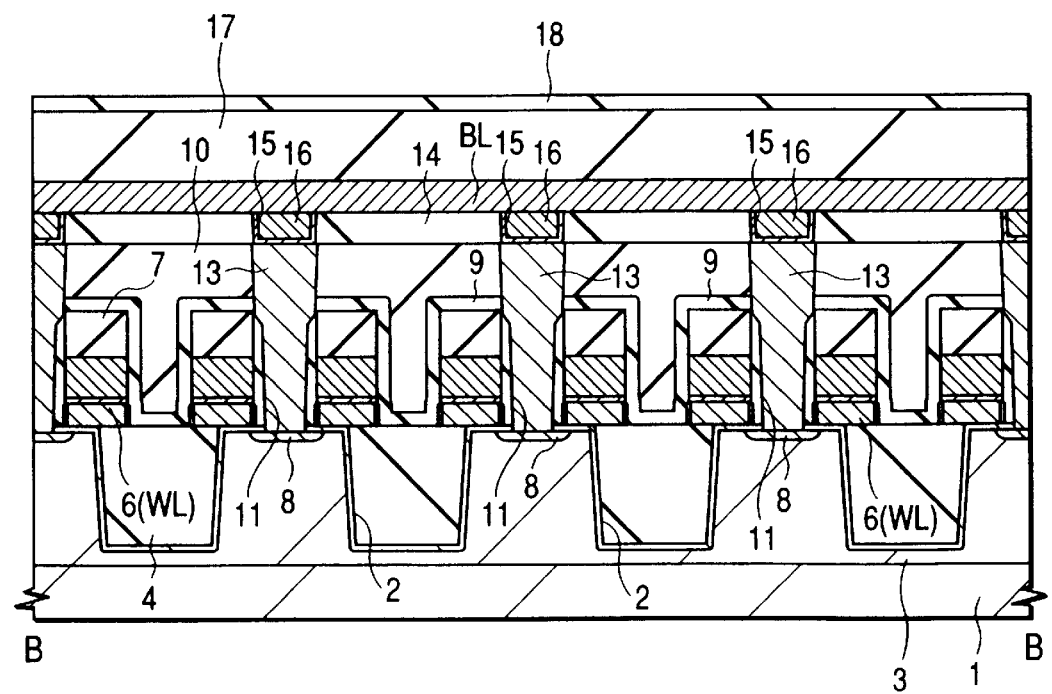
FIG. 33 is a fragmentary cross-sectional view of a semiconductor substrate illustrating the method of manufacture of a DRAM according to one embodiment of the present invention.
Figure 34:
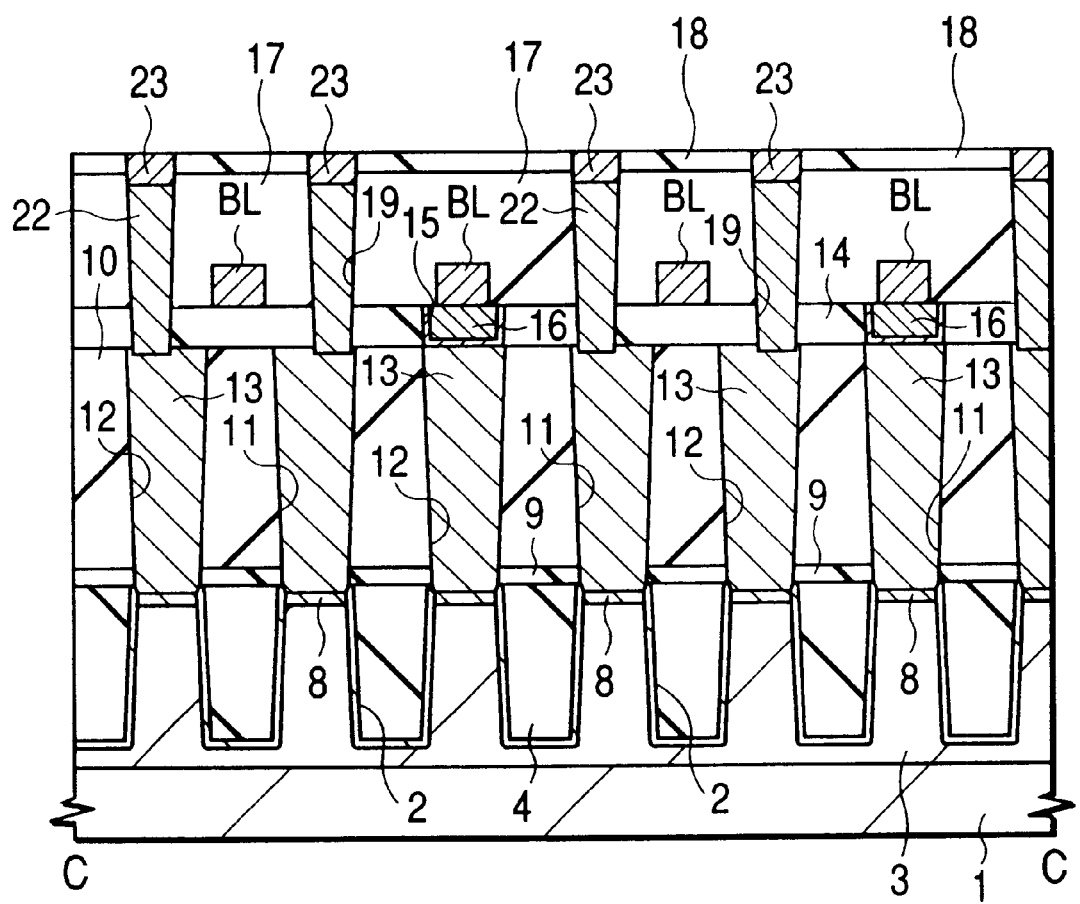
FIG. 34 is fragmentary cross-sectional view of a semiconductor substrate illustrating the method of manufacture of a DRAM according to one embodiment of the present invention.

After removal of the hard mask (polycrystalline silicon film 20 and side wall spacers 21) by dry etching, a plug 22 is formed inside of the through-hole 19, as illustrated in FIGS. 32 to 34, followed by formation of a barrier metal film 23 on the surface of the plug 22. For the formation of the plug 22 and barrier metal film 23, an n-type polycrystalline silicon film having P doped therein is deposited over the silicon nitride film 18 by CVD to embed the n-type polycrystalline silicon film inside of the through-hole 19, followed by removal of the n-type polycrystalline silicon film outside the through-hole 19 by chemical mechanical polishing (or etching back). At this time, a space to embed the barrier metal film 23 over the plug 22 is maintained by over polishing (over etching) the n-type polycrystalline silicon film inside of the through-hole 19, thereby making the surface level of the plug 22 lower than that of the silicon nitride film 18. After a TiN film is deposited over the silicon nitride film 18 by sputtering to embed the TiN film inside of the through-hole 19 over the plug 22, the Ti-N film outside the through-hole 19 is removed by chemical mechanical polishing (or etching back).

The barrier metal film 23 existing between the lower electrode of the information storage capacitor to be formed over the through-hole 19 in the subsequent step and the plug 22 is formed for the purpose of preventing occurrence of undesired reaction on the interface between Ru, the lower electrode material, and a polycrystalline silicon film, a material for the plug 22. As a material for such barrier metal, Ru silicide or Ti-Al (aluminum)-Si (silicon) alloy can also be used, as well as TiN.

Figure 35:
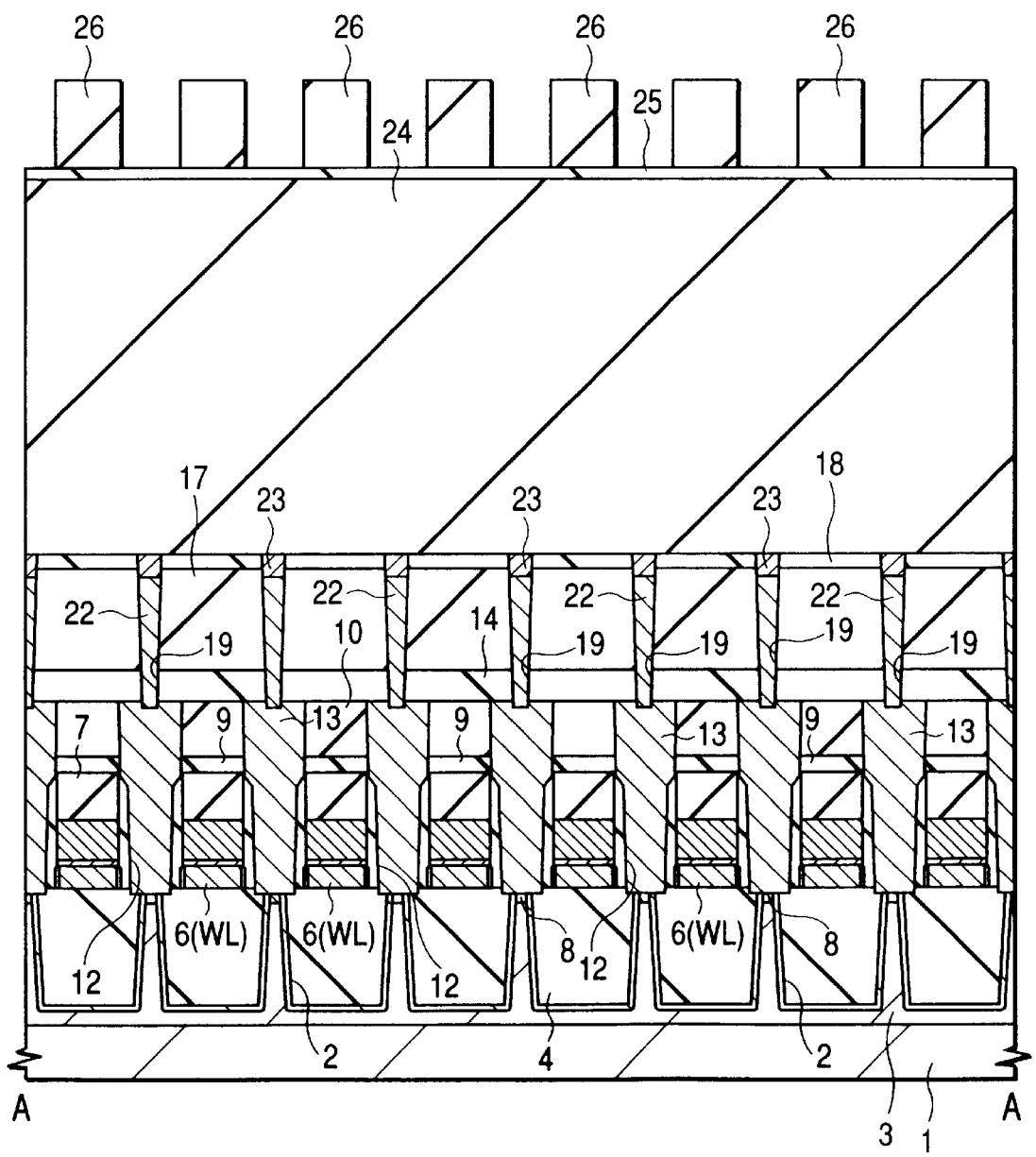
FIG. 35 is a fragmentary cross-sectional view of a semiconductor substrate illustrating the method of manufacture of a DRAM according to one embodiment of the present invention.
Figure 36:
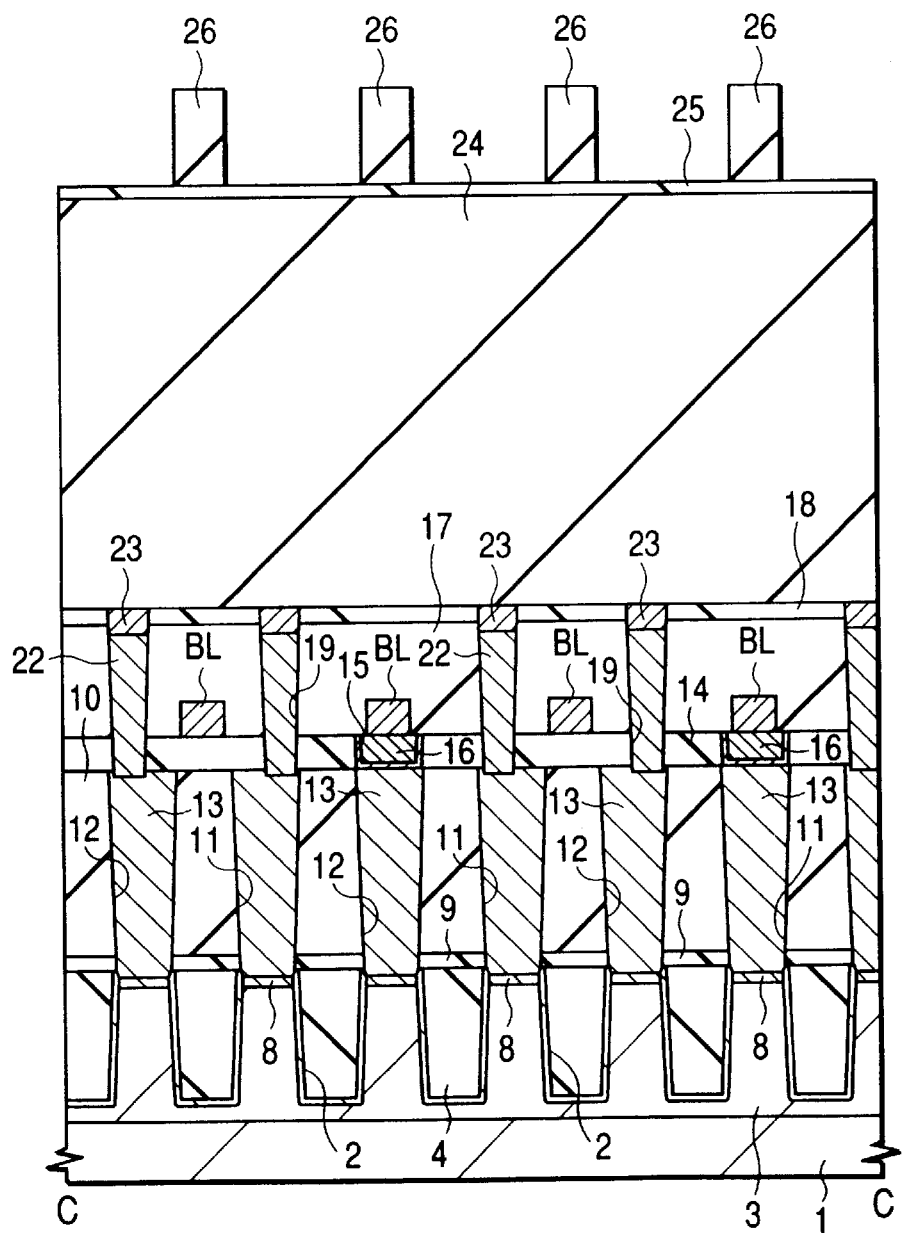
FIG. 36 is a fragmentary cross-sectional view of a semiconductor substrate illustrating the method of manufacture of a DRAM according to one embodiment of the present invention.

As illustrated in FIGS. 35 and 36, a silicon oxide film 24 is then deposited over the silicon nitride film 18, followed by spin coating of an antireflective film 25 (about 80 nm thick) such as BARC (bottom anti-reflective coating) over the silicon oxide film 24. Over the antireflective film 25, a photoresist film is spin coated. A photoresist pattern 26 for etching of the silicon oxide film 24 is then formed by developing the resulting film by exposure to light. In the subsequent step, the lower electrode of the information storage capacitor is formed inside of the hole (recess) to be formed in the silicon oxide film 24. Since the thickness of the silicon oxide film 24 corresponds to the height of the lower electrode, the silicon oxide film 24 must be formed to be as thick as about 0.8 μm in order to increase the surface area of the lower electrode, thereby raising the storage charge amount. The silicon oxide film 24 is deposited by plasma CVD by using, for example, oxygen and tetraethoxysilane (TEOS) as source gases, and then its surface is planarized as needed by chemical mechanical polishing. The photoresist pattern 26 serving as an etching mask upon etching of the thick silicon oxide film 24 is adjusted to have a thickness of about 480 nm in consideration of a decrease in film thickness during etching.

Figure 37:
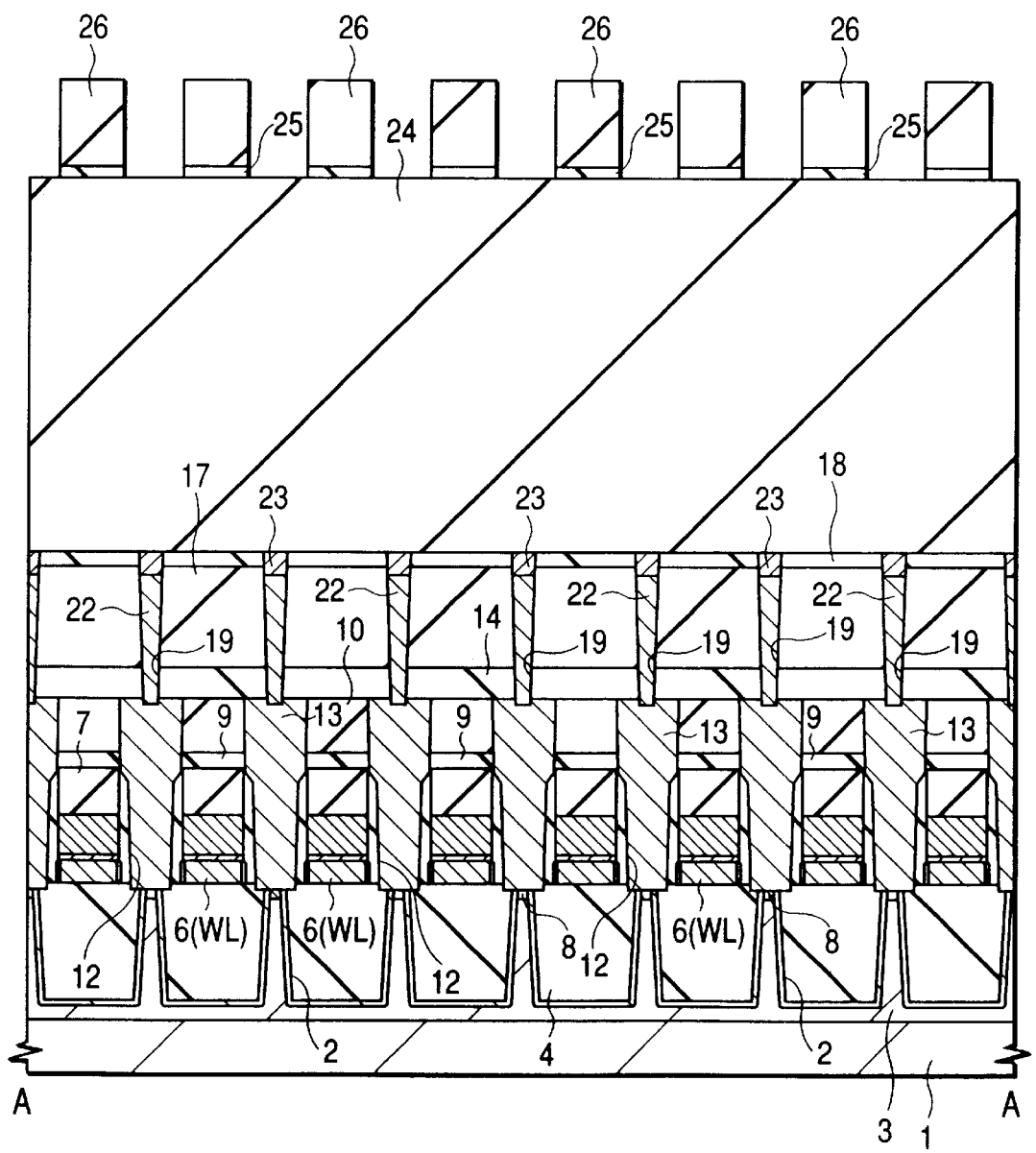
FIG. 37 is a fragmentary cross-sectional view of a semiconductor substrate illustrating the method of manufacture of a DRAM according to one embodiment of the present invention.
Figure 38:
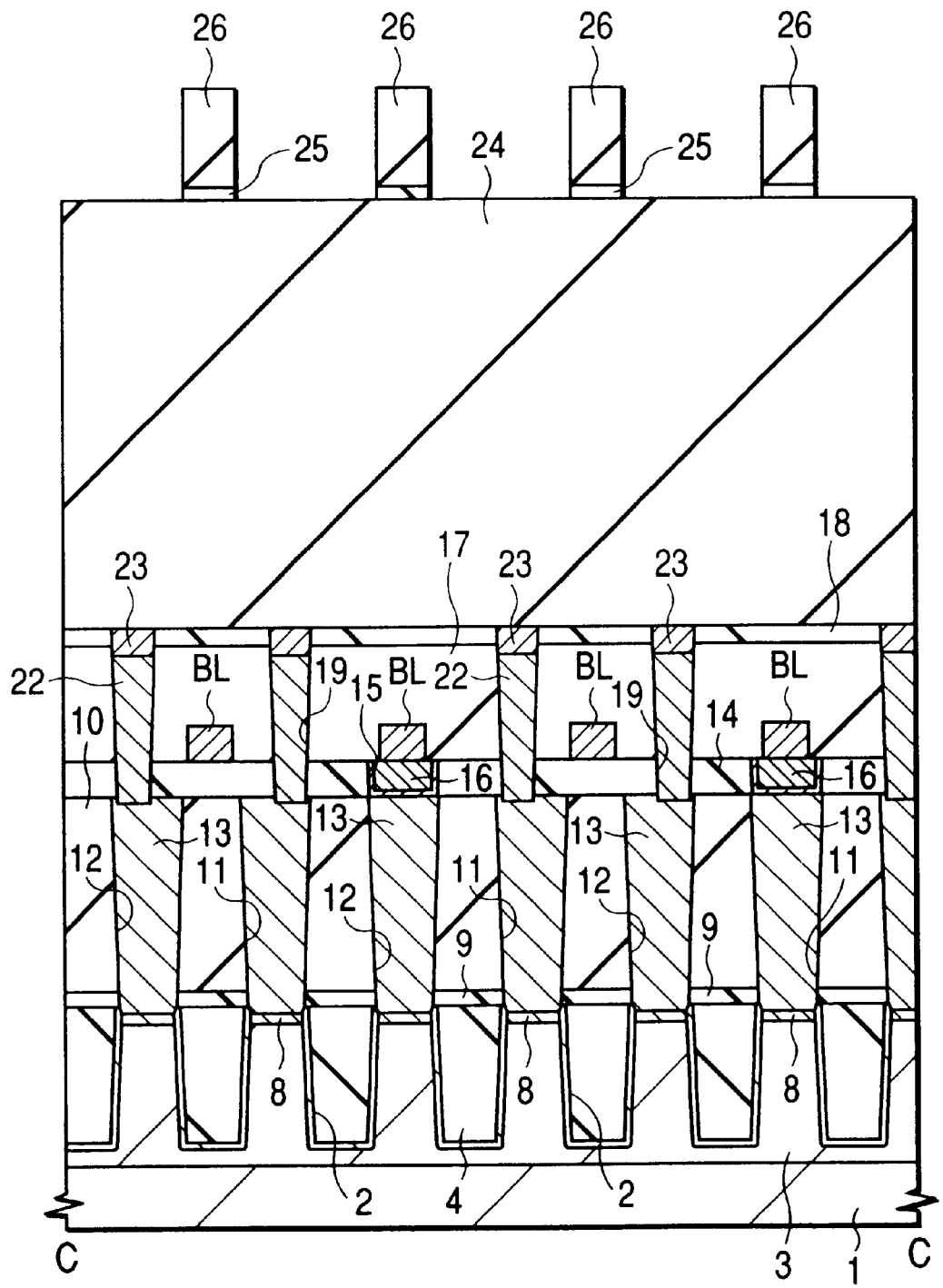
FIG. 38 is a fragmentary cross-sectional view of a semiconductor substrate illustrating the method of manufacture of a DRAM according to one embodiment of the present invention.

As illustrated in FIGS. 37 and 38, the antireflective film 25 lying under the photoresist pattern 26 is dry etched using this pattern as a mask. The antireflective film 25 is etched, for example, by a parallel plate narrow-electrode type RIE (reactive ion etching) apparatus under the conditions of an RF bias power of 900 W, gas pressure ($CHF_3/CF_4/Ar=10/90/95$ sccm) of 75 mTorr, a lower electrode (wafer stage) temperature of 10° C. and an overetching amount of 60%.

Figure 39:
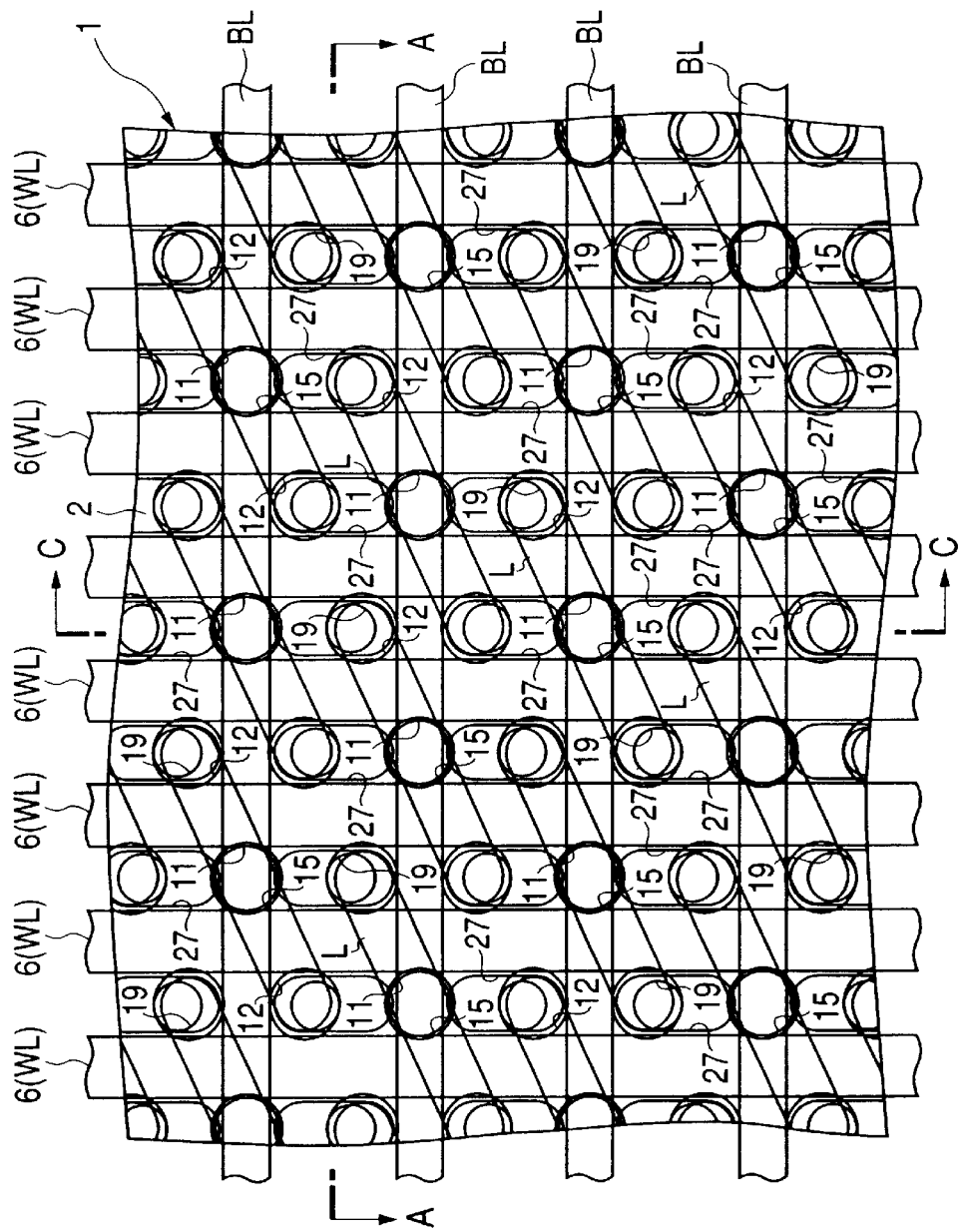
FIG. 39 is a fragmentary plan view of a semiconductor substrate illustrating the method of manufacture of a DRAM according to one embodiment of the present invention.
Figure 40:
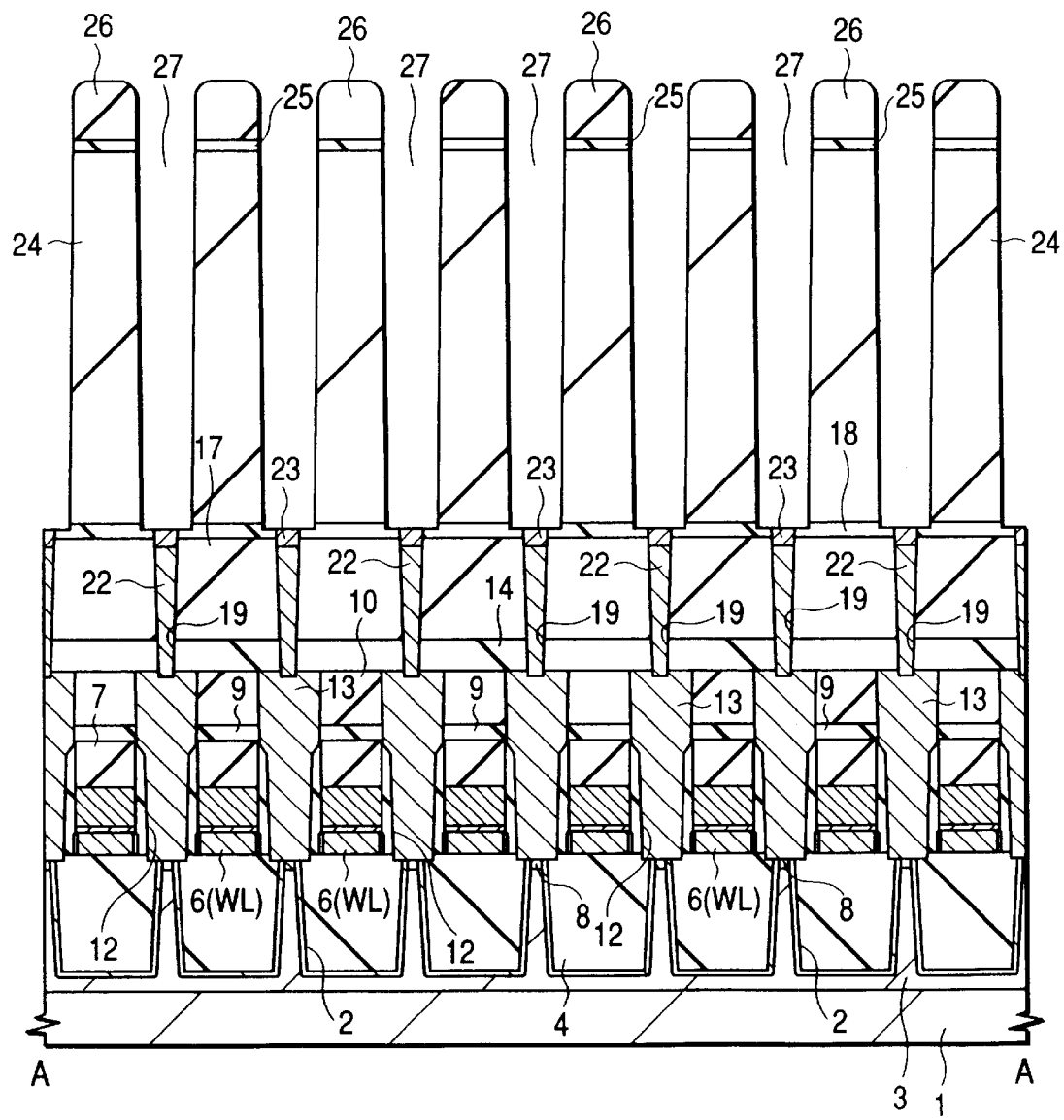
FIG. 40 is a fragmentary cross-sectional view of a semiconductor substrate illustrating the method of manufacture of a DRAM according to one embodiment of the present invention.
Figure 41:
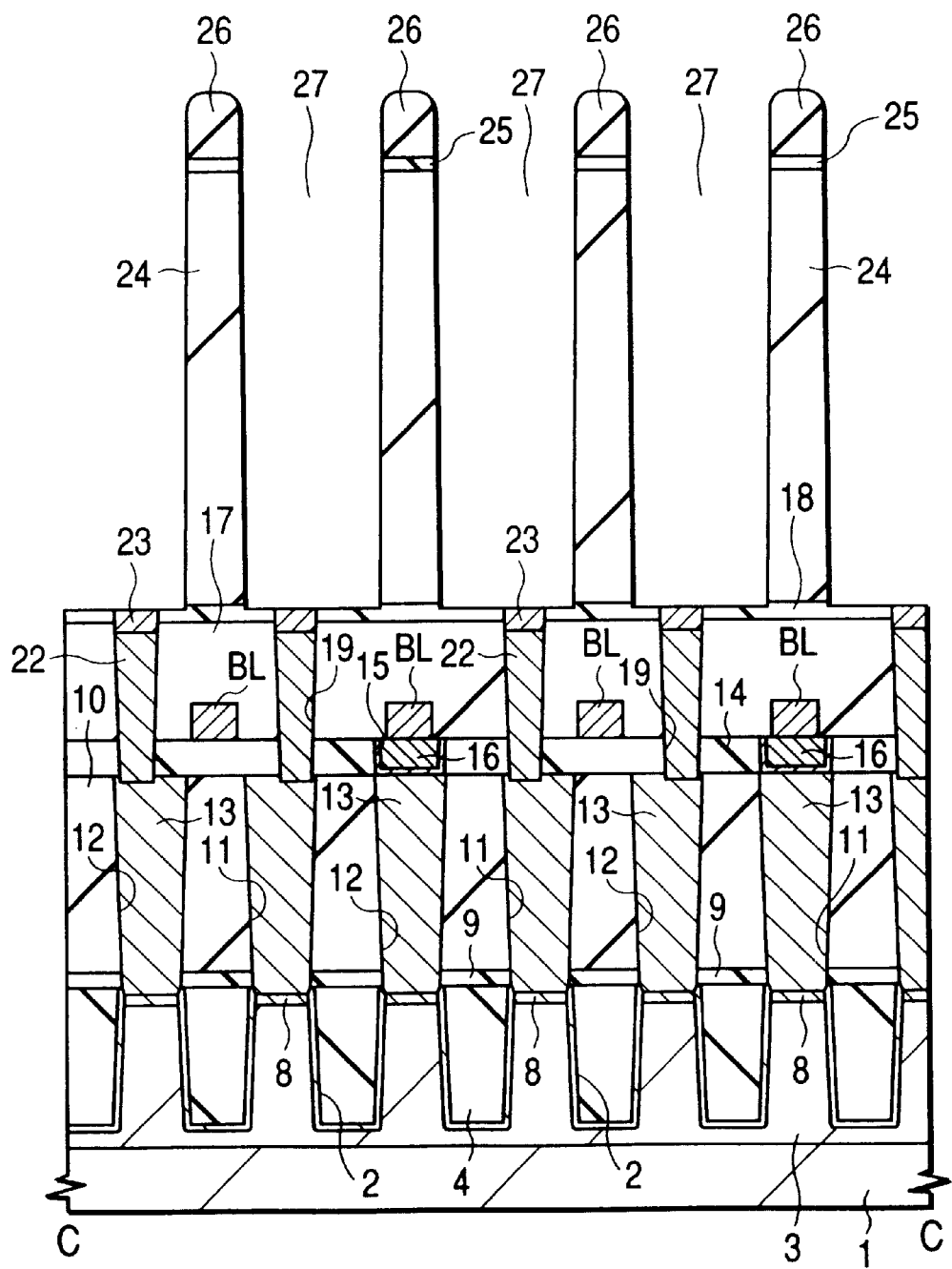
FIG. 41 is a fragmentary cross-sectional view of a semiconductor substrate illustrating the method of manufacture of a DRAM according to one embodiment of the present invention.

As illustrated in FIGS. 39 to 41, the silicon oxide film 24 is dry etched using the photoresist pattern 26 as a mask, whereby a deep hole (recess) 27 is formed, having a bottom surface from which the surface of the barrier metal 23 inside of the through-hole 19 is exposed. The dry etching of this silicon oxide film 24 is carried out, for example, using a parallel-plate double-channel-excited narrow-electrode type RIE apparatus under the conditions of an RF bias power of 2200 W (upper electrode)/1400 W (lower electrode), gas pressure ($C_4F_8/O_2/Ar=18/13/420$ sccm) of 30 mTorr, lower electrode temperature of −20° C. and overetching amount of 20%.

Figure 42:
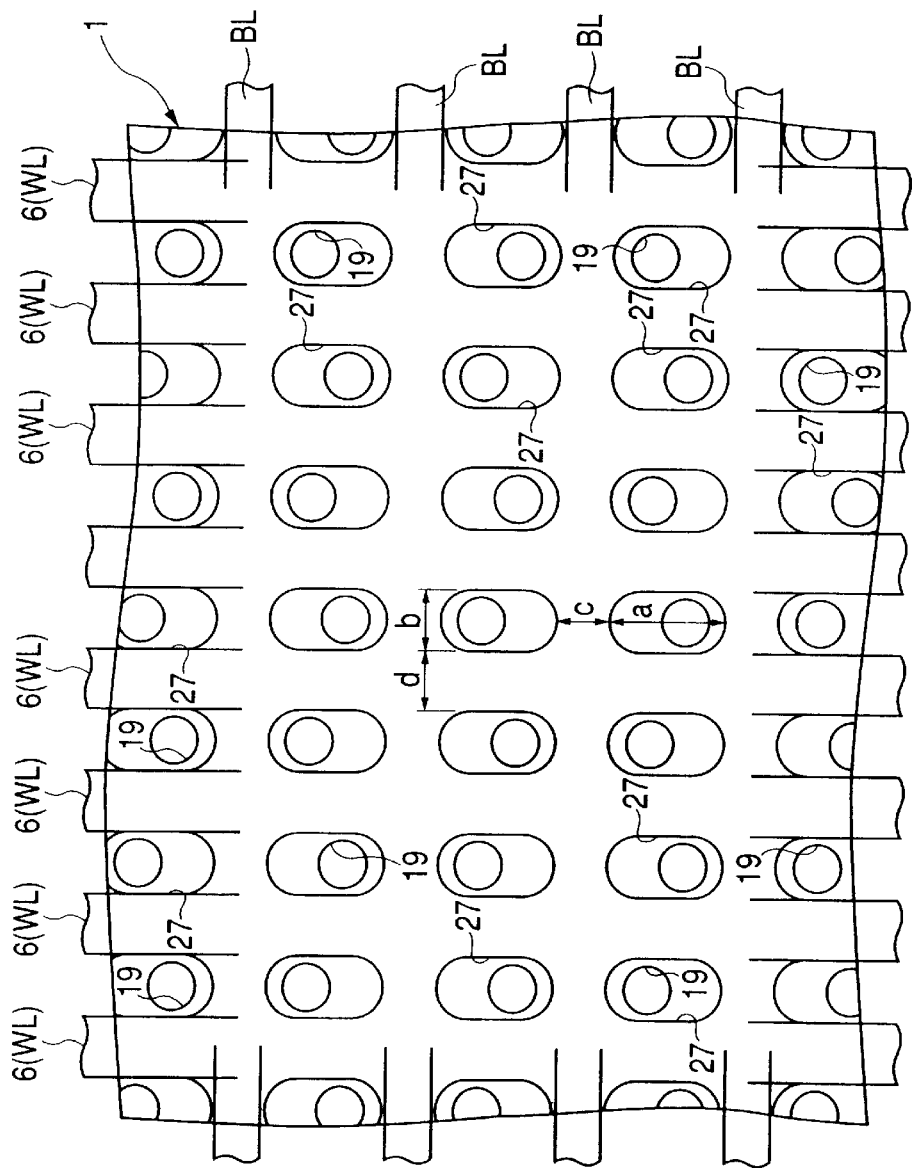
FIG. 42 is a fragmentary plan view which illustrates the planar shape and size of a hole (recess) in which a lower electrode of an information storage capacitor is to be formed.

FIG. 42 illustrates the planar shape and size of the hole (recess) in which an upper electrode of an information storage capacitor is to be embedded. The hole 27 is formed to have a rectangular plain pattern with a long side in the extending direction of a word line (WL) and a short side in the extending direction of a bit line (BL). It has a diameter (a) of 260 nm in the long side direction, while the diameter (b) in the short side direction is 130 nm. The distance between the holes 27 contiguous to each other in the long side direction and the distance between the holes 27 contiguous to each other in the short side direction are each, 130 nm. The pattern of the hole 27 drawn on a photo mask for the formation of the photoresist pattern 26 has a rectangular shape of the above-described dimension, but the pattern to be transferred to the substrate (wafer) 1 becomes an angle-rounded rectangular shape or a substantially an oval shape, as illustrated in FIG. 42, owing to a diffraction phenomenon upon exposure.

Figure 43:
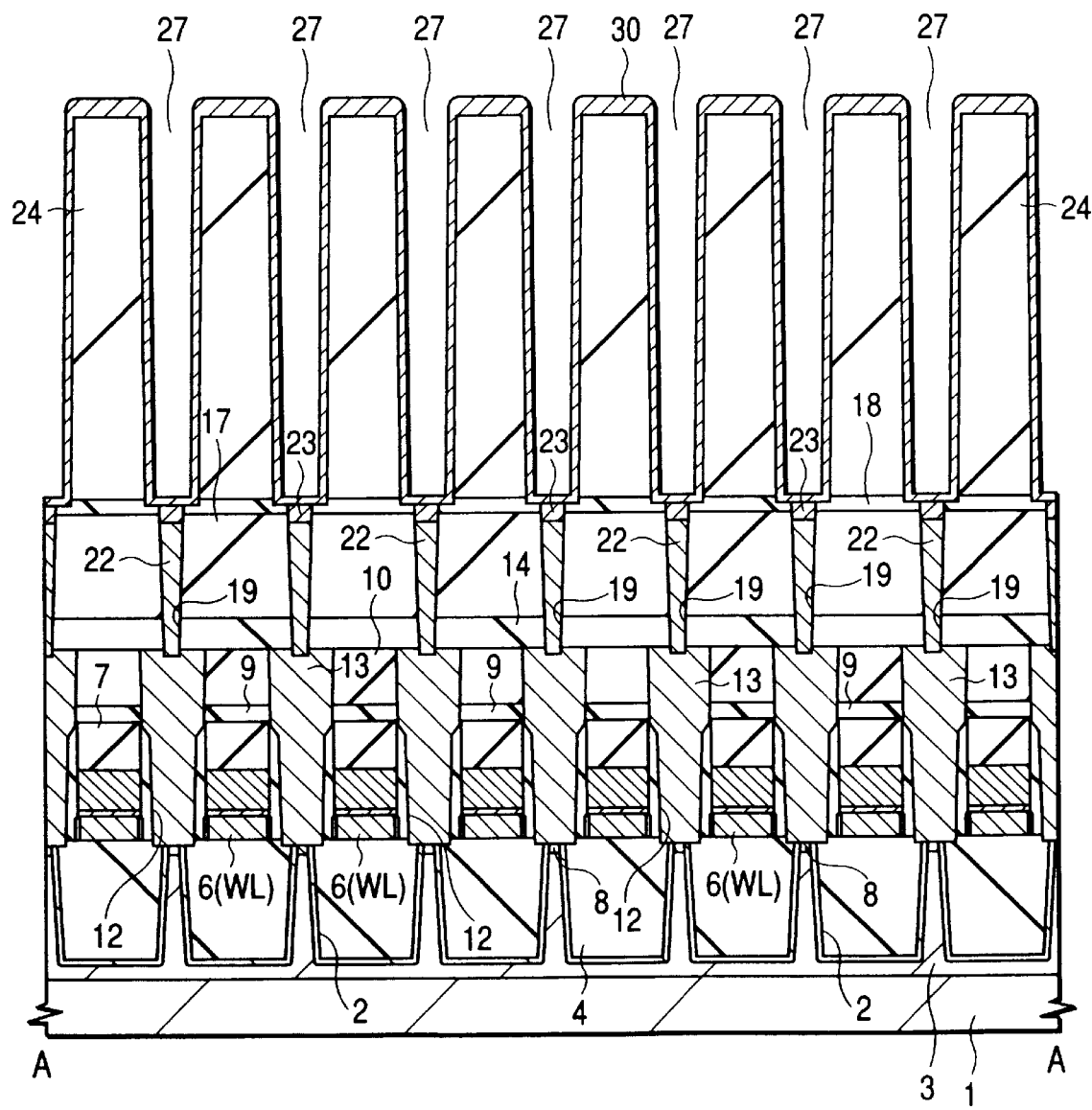
FIG. 43 is a fragmentary cross-sectional view of a semiconductor substrate illustrating the method of manufacture of a DRAM according to one embodiment of the present invention.
Figure 44:
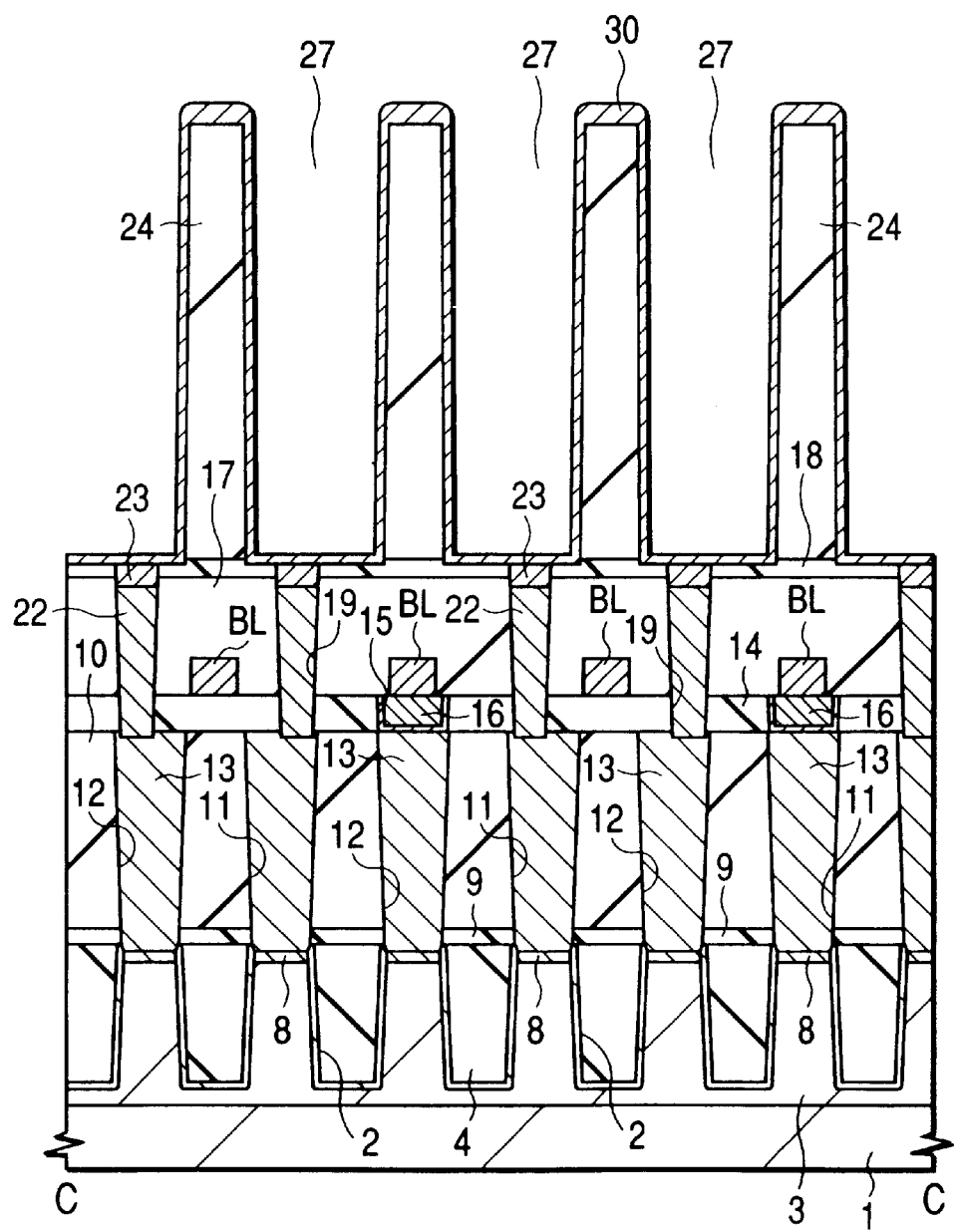
FIG. 44 is a fragmentary cross-sectional view of a semiconductor substrate illustrating the method of manufacture of a DRAM according to one embodiment of the present invention.

After removal of the photoresist pattern 26 left over the silicon oxide film 24 and the anti-reflective film 25 lying thereunder by ashing, an Ru film 30 is deposited over the silicon oxide film 24 and inside of the hole 27 as illustrated in FIGS. 43 and 44. The Ru film 30 can be formed either of CVD or sputtering. The Ru film 30 is deposited to be thin enough not to embed therewith the inside of the hole 27, while being deposited to the bottom surface and side walls of the hole 27. More specifically, the Ru film is deposited over the flat silicon oxide film 24 to 25 nm thick by sputtering, followed by deposition to 50 nm thick by CVD, whereby a Ru film 30 about 30 nm thick is deposited on the bottom surface and side walls of the hole 27 which has a lower film coverage compared with the upper surface of the silicon oxide film 24.

Figure 45A:
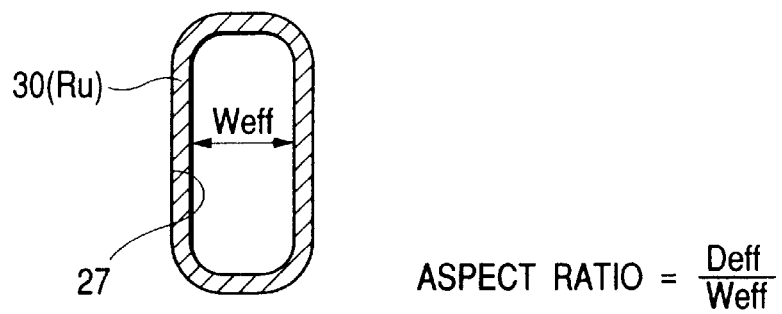
FIG. 45(a) is a schematic plan view of a hole in which, on the side walls and bottom surface thereof, a lower electrode material is deposited.
Figure 45B:
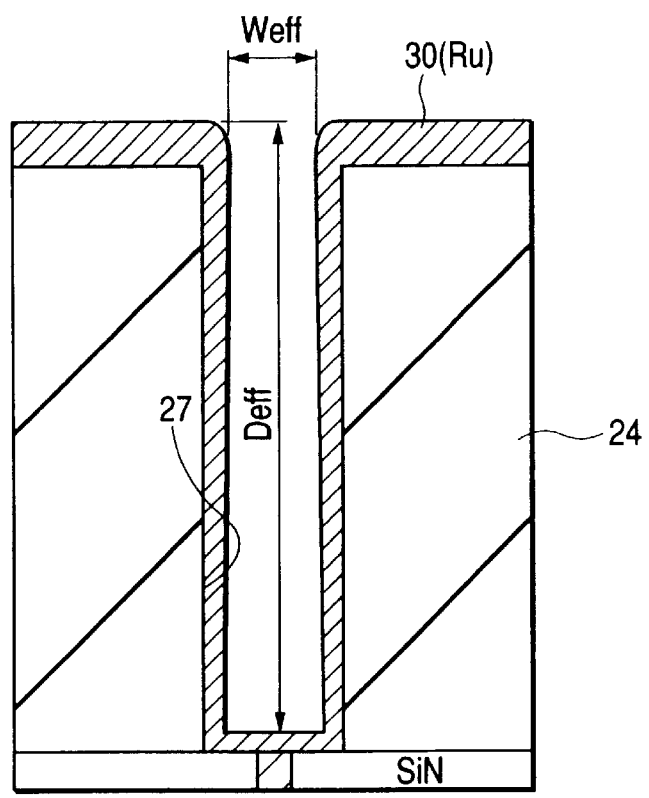
FIG. 45(b) is a schematic cross-sectional view taken along the short side of this hole.

The term "aspect ratio of the hole (recess)" will next be defined. FIG. 45(a) is a schematic plan view of the hole 27 having a lower electrode material (Ru) deposited on the side walls and bottom surface. FIG. 45(b) is a schematic cross-sectional view of the hole 27 as seen along a short side direction. In this application in which an effective aspect ratio of the hole having the lower electrode material deposited therein is regarded as important, the ratio (=Deff/Weff) of the diameter (Weff) of the hole 27 along its short side direction to the depth (Deff) from the surface of the lower electrode material (Ru) deposited over the silicon oxide film (24) down to the surface of the lower electrode material (Ru) deposited on the bottom surface of the hole is designated as the aspect ratio. In the above example, the Ru film 30 having a thickness of 30 nm×2=60 nm is deposited on the side walls of the hole 27 having a diameter of 130 nm at the short side, so that Weff becomes 70 nm. When the thickness of the Ru film 30 deposited on the side walls differs between the bottom surface and upper end portion, the diameter at the thickest site (usually, in the vicinity of the upper end) is regarded as Weff. The hole 27 is formed in the silicon oxide film 24 of 0.8 μm (=800 nm) thick and the Ru film 30 of 30 nm thick is deposited on its bottom surface, followed by deposition of another portion of the Ru film 30 of 75 nm thick over the silicon oxide film 24 so that Deff becomes 825 nm. The effective aspect ratio of the hole 27 at this time is determined by the following equation: 825÷70≈11.8. In the description hereinafter, the term "aspect ratio of the hole (recess)" means an effective aspect ratio (Deff/Weff) of the hole having a lower electrode material deposited therein, unless otherwise specifically described.

Figure 46:
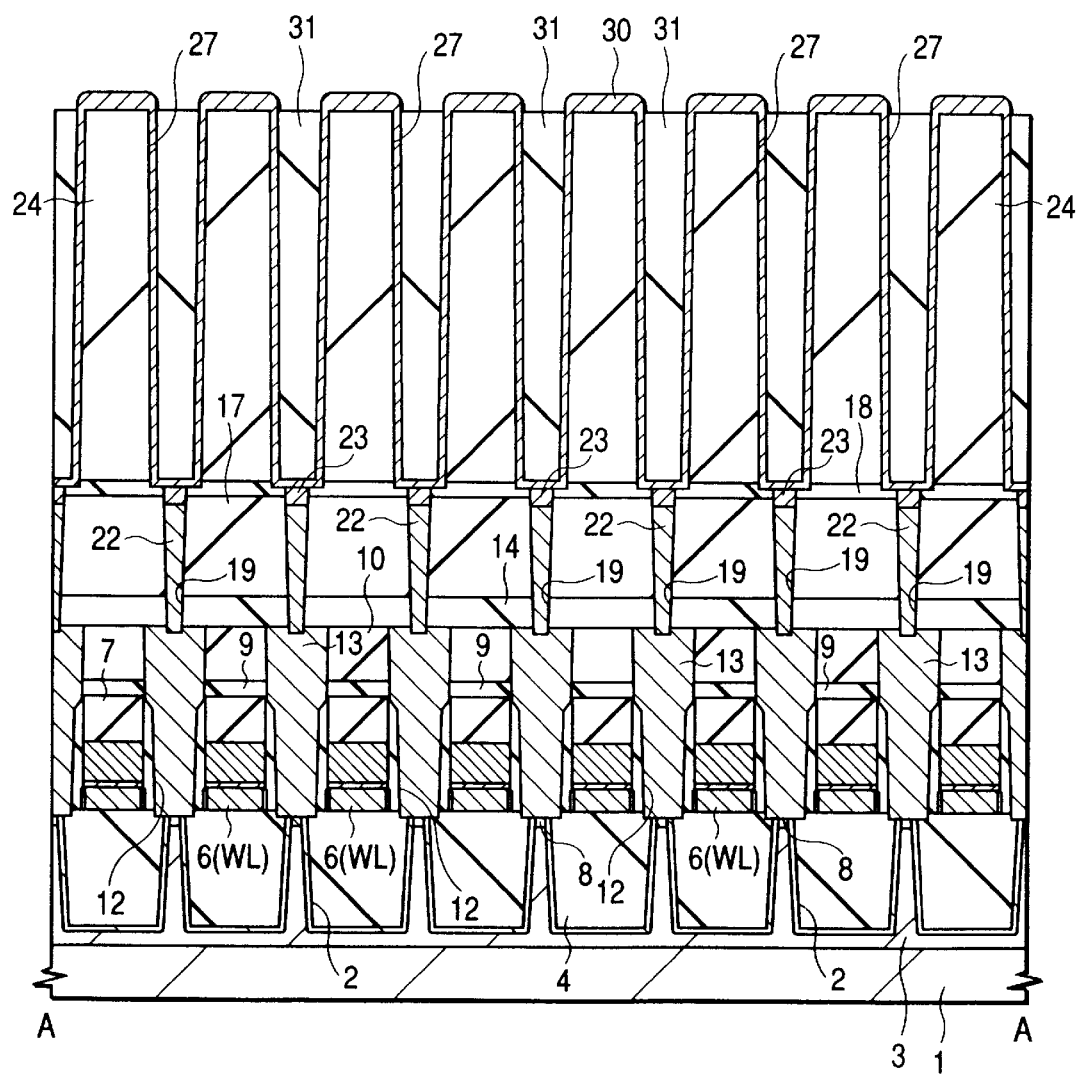
FIG. 46 is a fragmentary cross-sectional view of a semiconductor substrate illustrating the method of manufacture of a DRAM according to one embodiment of the present invention.
Figure 47:
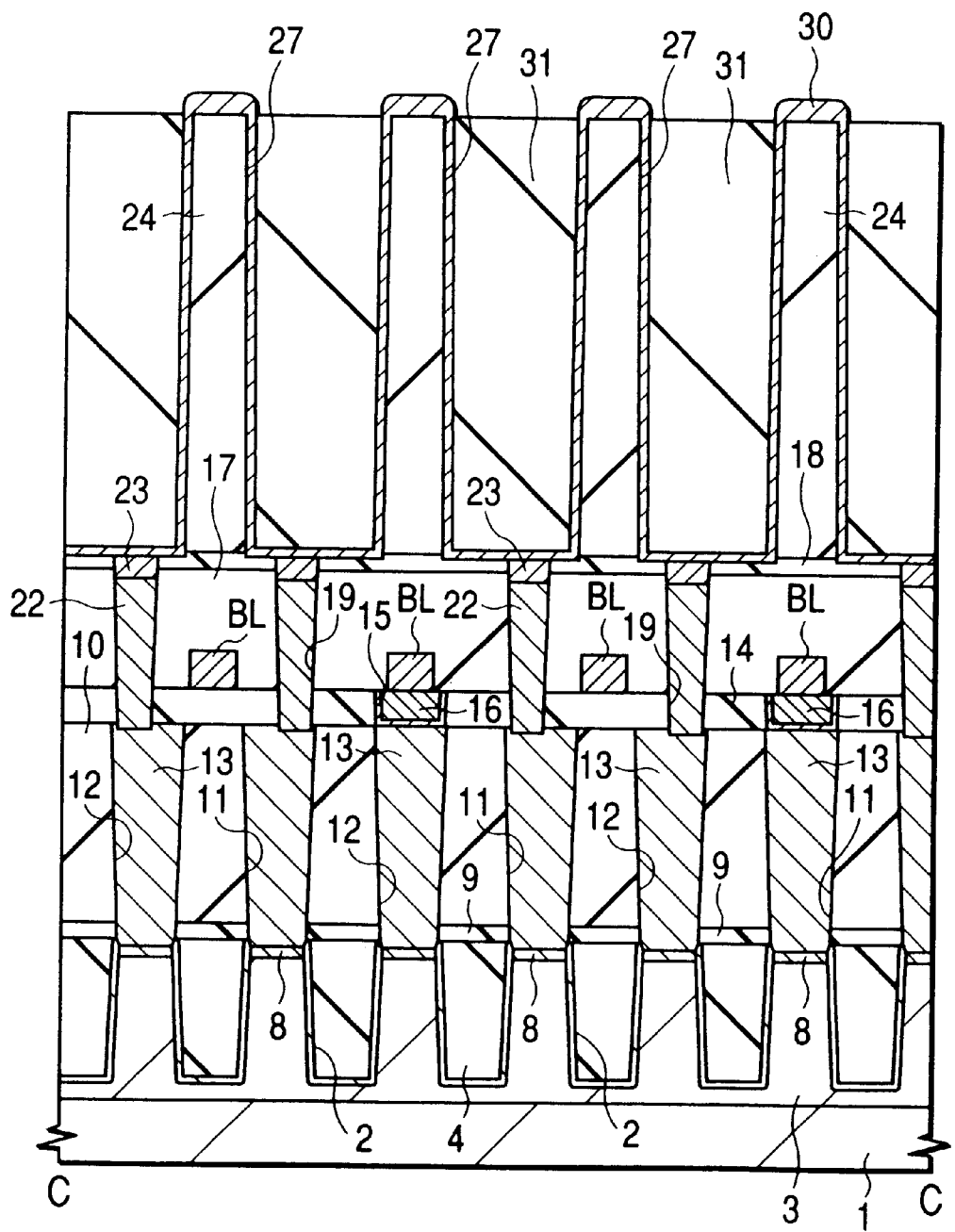
FIG. 47 is a fragmentary cross-sectional view of a semiconductor substrate illustrating the method of manufacture of a DRAM according to one embodiment of the present invention.

As illustrated in FIGS. 46 and 47, a photoresist film 31 is embedded inside of the hole 27. This photoresist film 31 is used as a protecting film for preventing the removal of the Ru film 30 inside of the hole 27 (on the side walls and the bottom surface) when the unnecessary portion of the Ru film 30 over the silicon oxide film 24 is dry etched in the subsequent step.

Embedding of the photoresist film 31 inside of the hole 27 is conducted, for example, by spin coating the whole surface of the substrate 1, including the inside of the hole 27, with a positive type photoresist film, subjecting the resulting whole surface to exposure and development, and removing the exposed portion outside the hole 27 to leave the unexposed portion inside of the hole 27.

A portion of the Ru film 30, which is outside the hole 27 and is not covered with the photoresist film 31, is removed by dry etching. By this etching, a portion of the Ru film 30 outside the hole 27 must be etched selectively without removing the photoresist film 31 serving as a protection of the Ru film 30 inside (on the side walls and the bottom surface) of the hole 27.

Figure 48:
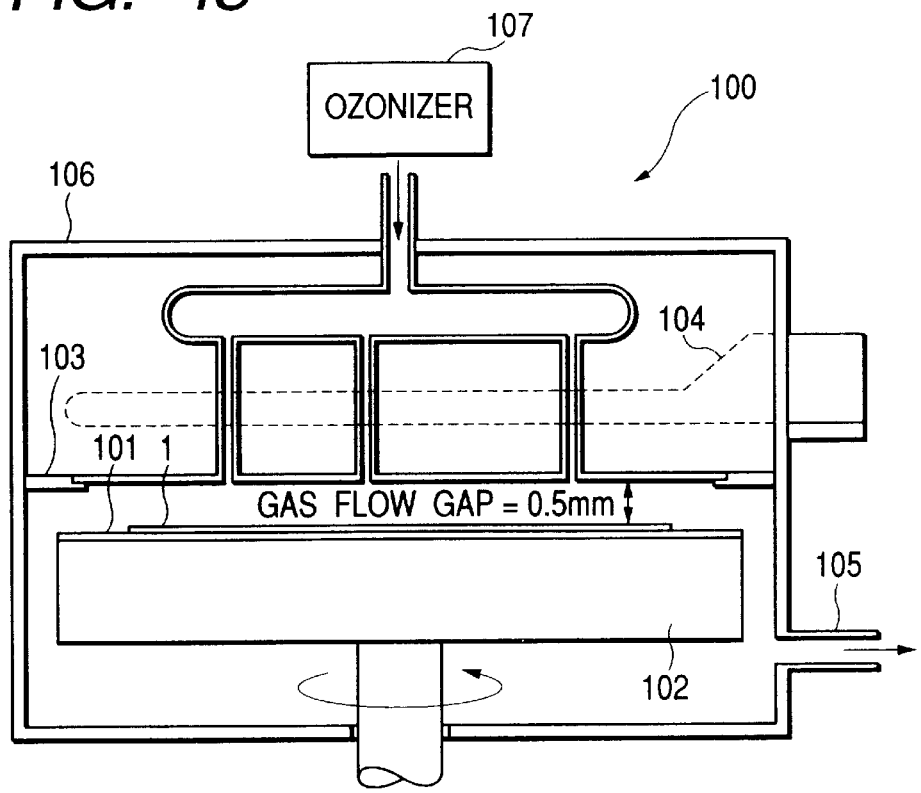
FIG. 48 is a diagram which schematically illustrates the structure of an ozone etching apparatus used for a first experiment in accordance with the present invention.
Figure 49:
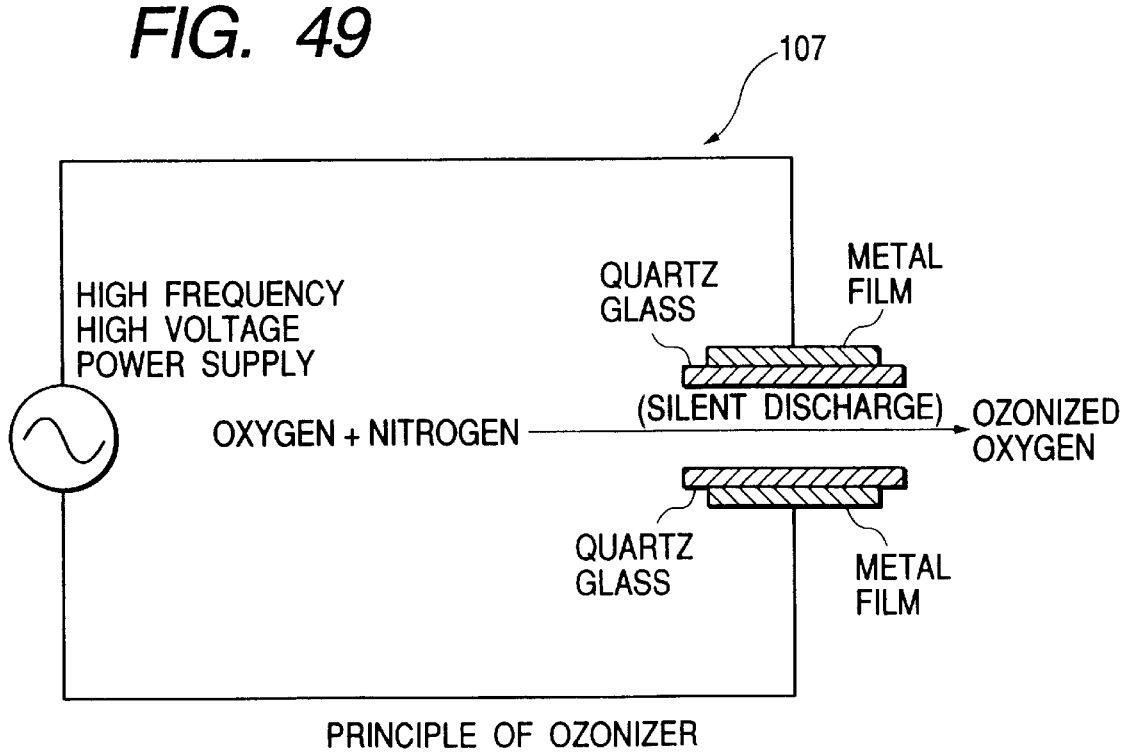
FIG. 49 is a diagram which illustrates the principle of an ozonizing mechanism of the ozone etching apparatus as illustrated in FIG. 48.

The description will next be directed to experiments (Experiment 1 and Experiment 2) made by present inventors using two ozone etching apparatuses in order to accomplish selective dry etching of the Ru film 30. FIG. 48 schematically illustrates the structure of an ozone etching apparatus employed for Experiment 1, and FIG. 49 illustrates the principle of the ozonizing mechanism of this apparatus. This ozone etching apparatus 100 has a treating chamber 106, equipped with a stage 102 for turning, within a horizontal plane, the wafer 1 mounted on a quartz; made plate 101, a dividing plate 103, a UV lamp 104 and an exhaust pipe 105, as well as and an ozonizer 107. Ozone generated from oxygen and nitrogen in the ozonizer 107 is fed to the main surface of the wafer 1 and a photoresist film is ashed by oxygen radicals formed upon decomposition of the ozone by the ultraviolet rays and/or heat energy. This ozone etching apparatus is characterized in that its treating pressure is almost at atmospheric pressure (refer to, for example, "Hitachi Hyoron, Vol 79, No. 10, 1997").

Figure 50:
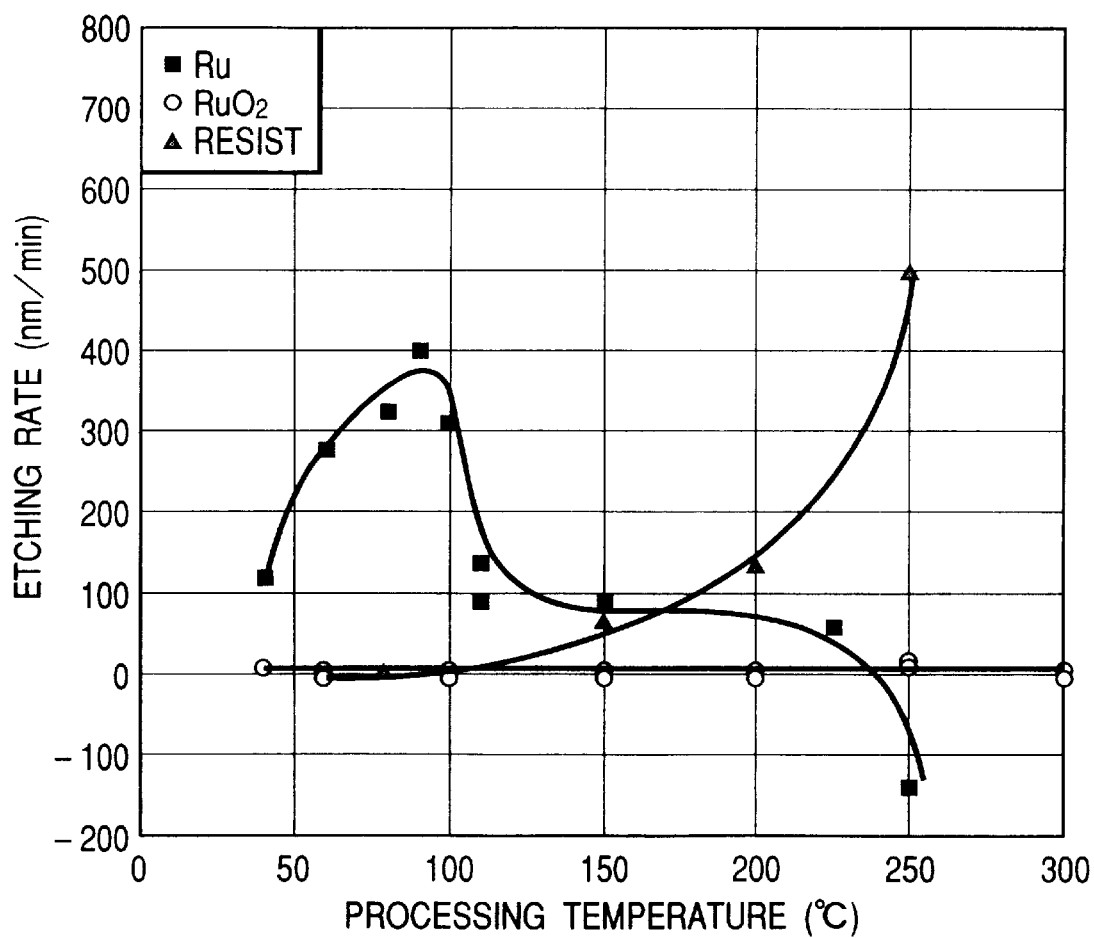
FIG. 50 is a graph illustrating the dependence of the etching rate of each of an Ru film, an $RuO_2$ (ruthenium oxide) film and a photoresist film on a treating temperature.

FIG. 50 is a graph illustrating the dependence, on the treating temperature, of the etching rate of each of an Ru film, $RuO_2$ (ruthenium oxide) film and photoresist film. Each of these films was etched by feeding the wafer surface with a mixed gas of oxygen (flow rate: 10 slm) and nitrogen (flow rate: 75 sccm) containing 4.7 vol. % of ozone. The cross-section of the film was observed through a scanning electron microscope (SEM), and, from a thickness decrease of the film, the etching rate of the film was calculated. The ozone-containing mixed gas was not exposed to ultraviolet rays. The term "treating temperature" as used herein means a temperature on the main surface of the wafer during treatment.

As illustrated in FIG. 50, the etching rate of the Ru film rises as the treating temperature exceeds room temperature and becomes maximum at around 100° C. The etching rate, however, shows a gradual reduction by further increase of the treating temperature. The film became thick at a temperature higher than about 200° C., suggesting that a competition occurs, at temperatures higher than around 100° C., between a decrease in the film thickness by etching and an increase in the film thickness by oxidation, and that the latter exceeds the former at temperatures higher than about 200° C.

The photoresist film, on the other hand, was hardly etched (ashed) at low temperatures, but at temperatures higher than around 100° C., the etching rate showed a drastic increase with a temperature increase. The $RuO_2$ film was not etched by ozone at any treating temperature, which supports the above description that the etching rate is lowered by the oxidation (formation of $RuO_2$ film) of the Ru film upon treating at high temperatures.

Figure 51:
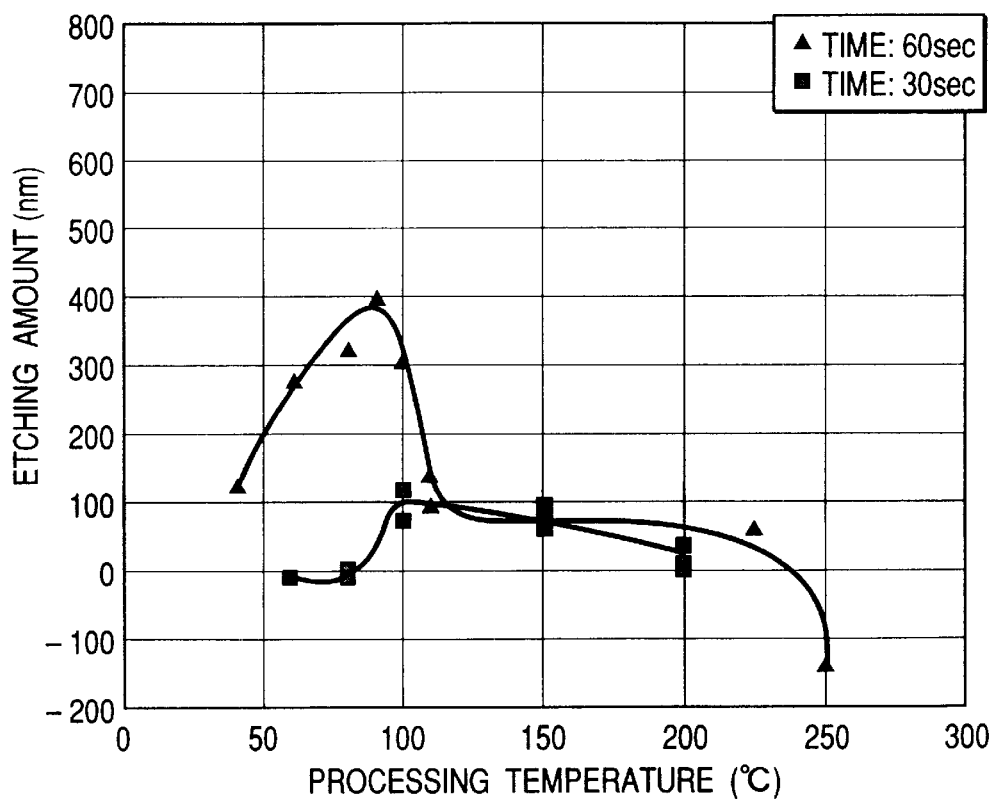
FIG. 51 is a graph illustrating the dependence of the etching amount of an Ru film on treating temperature.

FIG. 51 is a graph illustrating the dependence, on the treating temperature, of the etching amount of an Ru film. Etching was conducted under conditions similar to the above except for the etching time set at 60 sec and 30 sec. As illustrated in FIG. 51, similar results were obtained at an etching time of 60 seconds, while at an etching rate of 30 seconds, the etching rate was small and dependence on the treating temperature was not so large.

Figure 52:
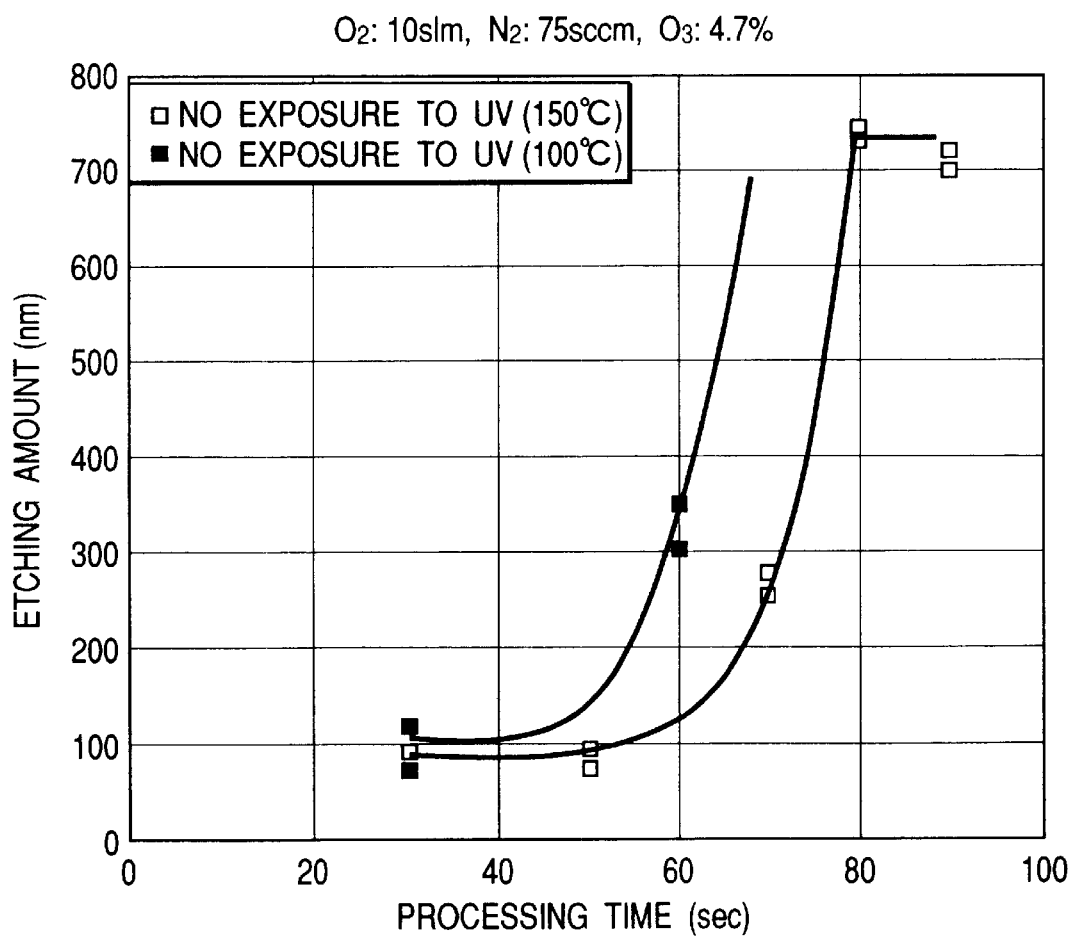
FIG. 52 is a graph illustrating the dependence of the etching amount of an Ru film on treating temperature.

FIG. 52 is a graph illustrating the dependence, on the etching time, of an etching amount of an Ru film with ozone at 100° C. and 150° C. As illustrated in FIG. 52, a decrease in the film thickness did not occur until a certain time had passed after the etching was started, and, after that, the film thickness showed a drastic decrease.

Figure 53:
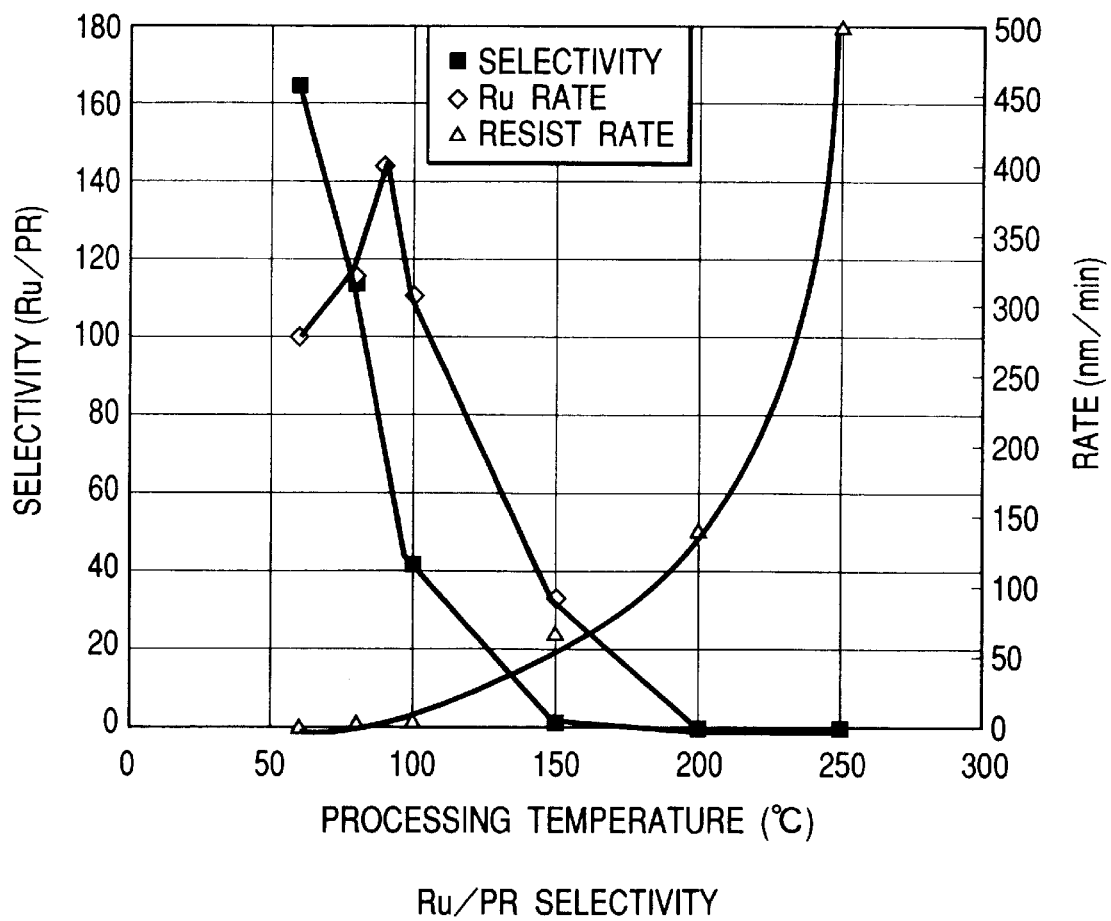
FIG. 53 is a graph illustrating the selectivity of an Ru film relative to a resist.

FIG. 53 is a graph of the selectivity of an Ru film relative to a resist (Ru/Pr selectivity) determined from the experimental results on the etching rates of the Ru film and the photoresist film. This graph suggests that the selectivity of the Ru film relative to a resist drastically lowers with an increase in the treating temperature under the conditions of a temperature higher than around 100° C. The term "selectivity of film A relative to a resist" as used herein means a ratio (Ra/Rr) wherein Rr stands for an etching rate of a resist in the film thickness direction and Ra stands for an etching rate of film A, upon etching of film A with a resist as an etching mask.

Figure 54:
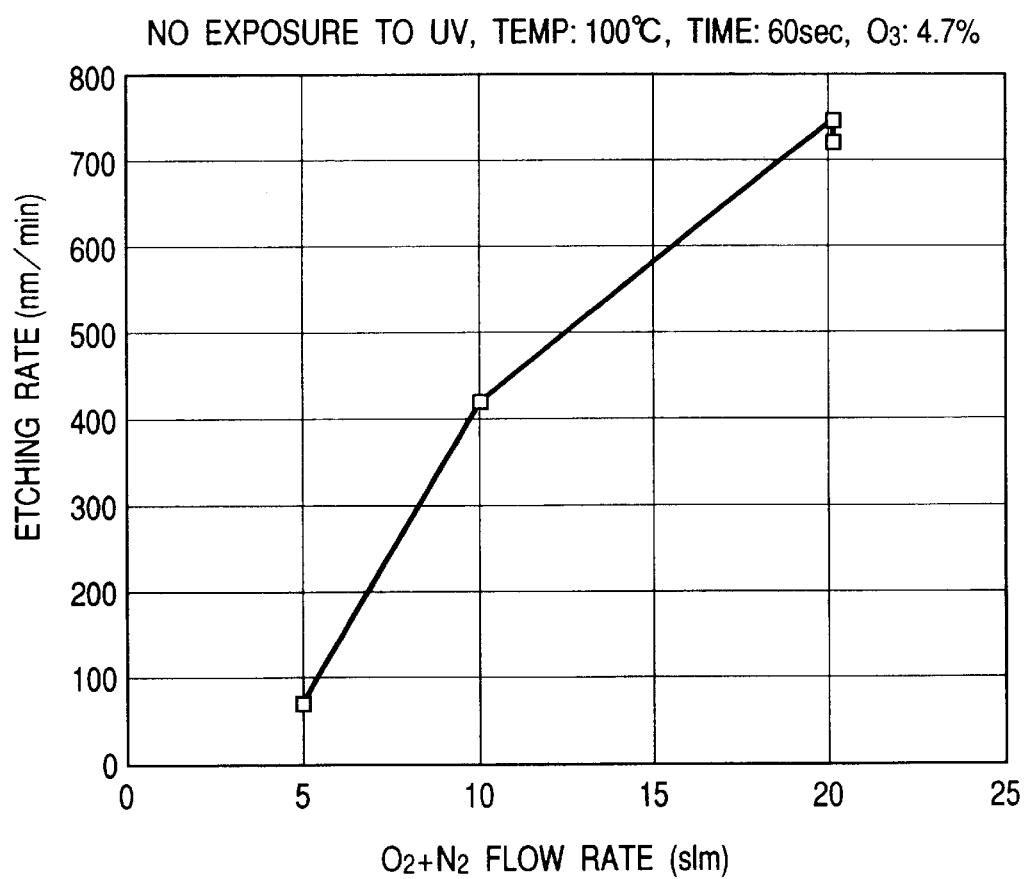
FIG. 54 is a graph illustrating etching rates of an Ru film at varied flow rates of an ozone-containing gas mixture.

FIG. 54 is a graph illustrating an etching rate of an Ru film varied at flow rates of an oxygen+nitrogen gas mixture containing ozone at a predetermined concentration (4.7 vol. %). As illustrated in FIG. 54, the etching rate of an Ru film showed an increase substantially proportional to the flow rate of the ozone-containing gas mixture, which is presumed to occur because, as the diffusion of the ozone-containing gas mixture to the wafer surface and diffusion of reaction products from the wafer surface are promoted, owing to an increase in the flow rate of the ozone-containing gas mixture to the wafer surface, the unreacted Ru film surface is promptly fed with ozone.

Figure 55:
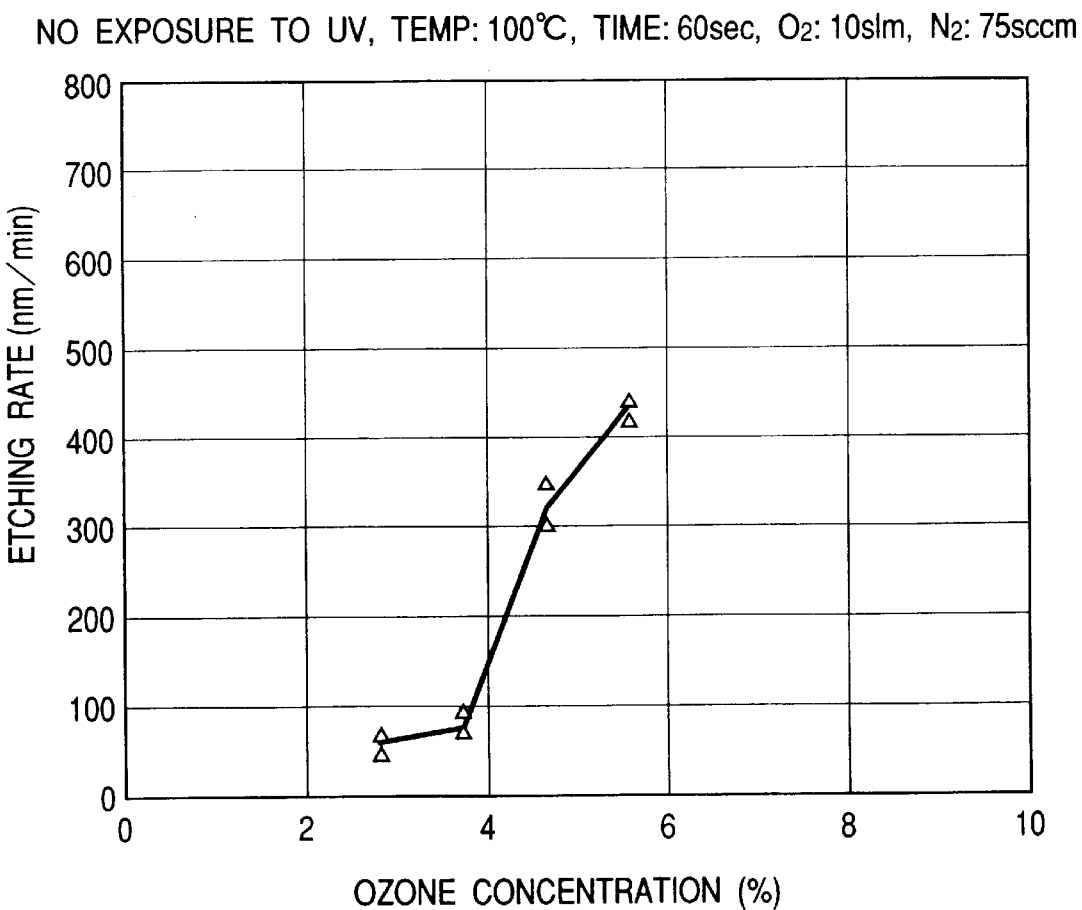
FIG. 55 is a graph illustrating the dependence of the etching rate of an Ru film on ozone concentration.

FIG. 55 is a graph illustrating the etching rate of an Ru film at varied ozone concentrations in the ozone-containing gas mixture having a flow rate which is kept constant. As illustrated in FIG. 55, the etching rate of the Ru film increased almost in proportion to the ozone concentration, indicating that the Ru film is etched by ozone contained in the gas mixture.

Figure 56:
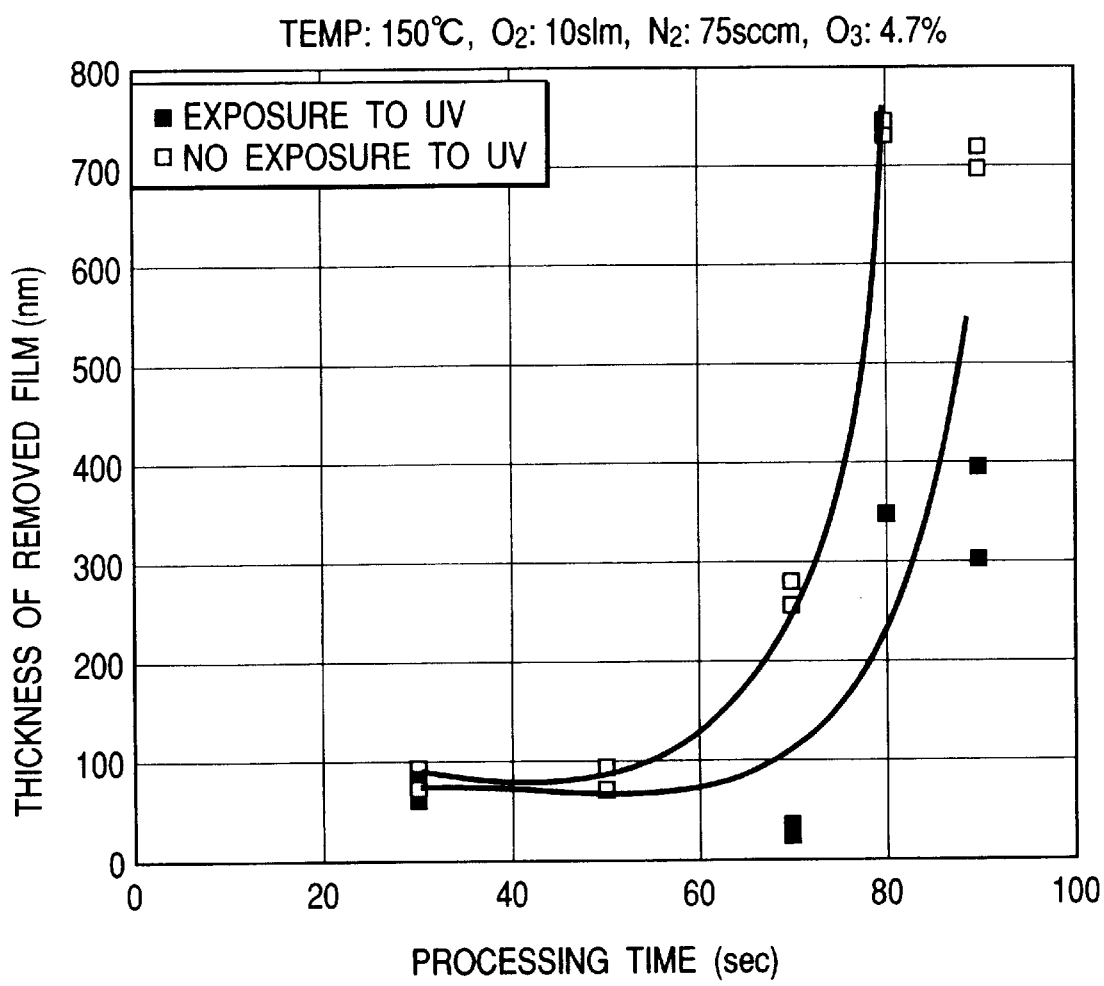
FIG. 56 is a graph illustrating the difference in etching amount between exposure and non-exposure to ultraviolet rays.

FIG. 56 is a graph illustrating the difference in the etching amount between the presence and absence of ultraviolet rays. As illustrated in FIG. 56, the etching amount of the Ru film became smaller when the ozone-containing gas mixture was exposed to ultraviolet rays compared with the case where it was not exposed to ultraviolet rays, which is presumed to occur because the exposure of the ozone-containing gas mixture to ultraviolet rays causes decomposition of a portion of the ozone into oxygen radicals, resulting in a reduction in the ozone concentration. This suggests that, similar to the above-described experiment, the Ru film is etched by ozone.

Figure 57:
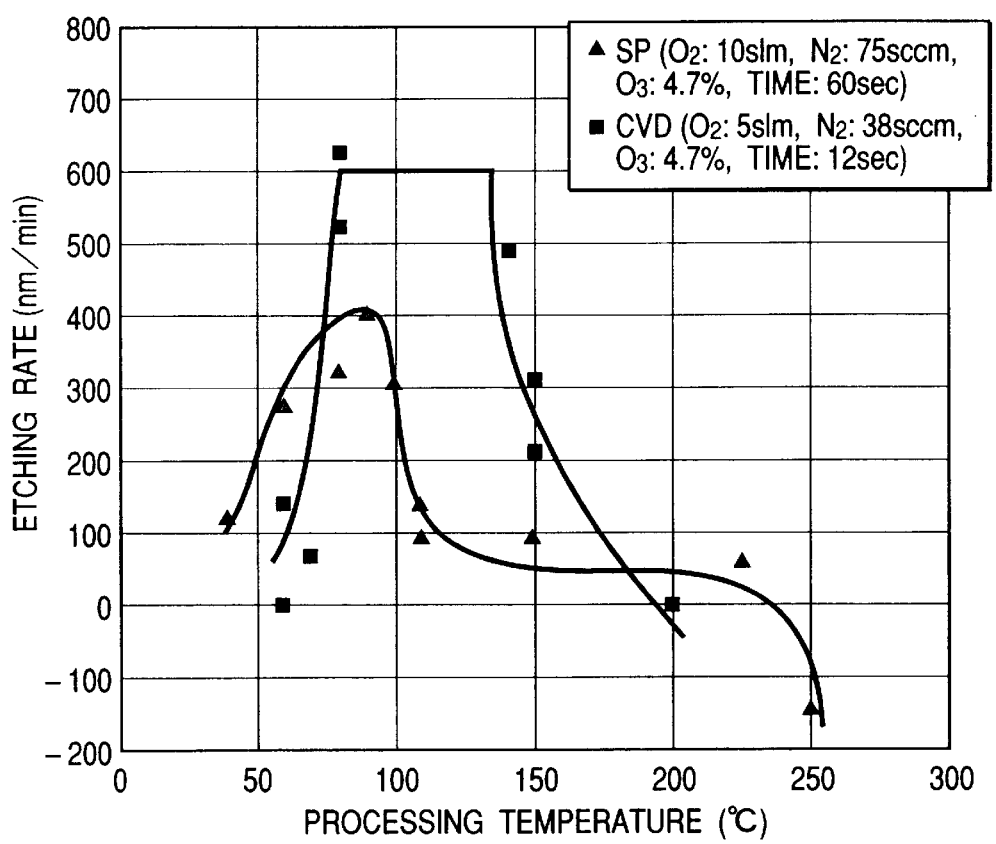
FIG. 57 is a graph illustrating the dependence of the etching rate of an Ru film deposited by CVD or that deposited by sputtering on the treating temperature.

FIG. 57 is a graph illustrating the dependence, on the treating temperature, of the etching rate of an Ru film deposited by each of CVD and sputtering. As illustrated in FIG. 57, a small difference was found in characteristics between the CVD-RU film and sputter-Ru film, but either of these films exhibited the maximum etching rate at a temperature around 100° C.

The above-described experimental results have revealed that the etching rate of an Ru film by ozone markedly depends on the treating temperature, and at a treating temperature of around 100° C., the etching rate is extremely large, and the selectivity relative to the resist also shows the greatest value.

Figure 58:
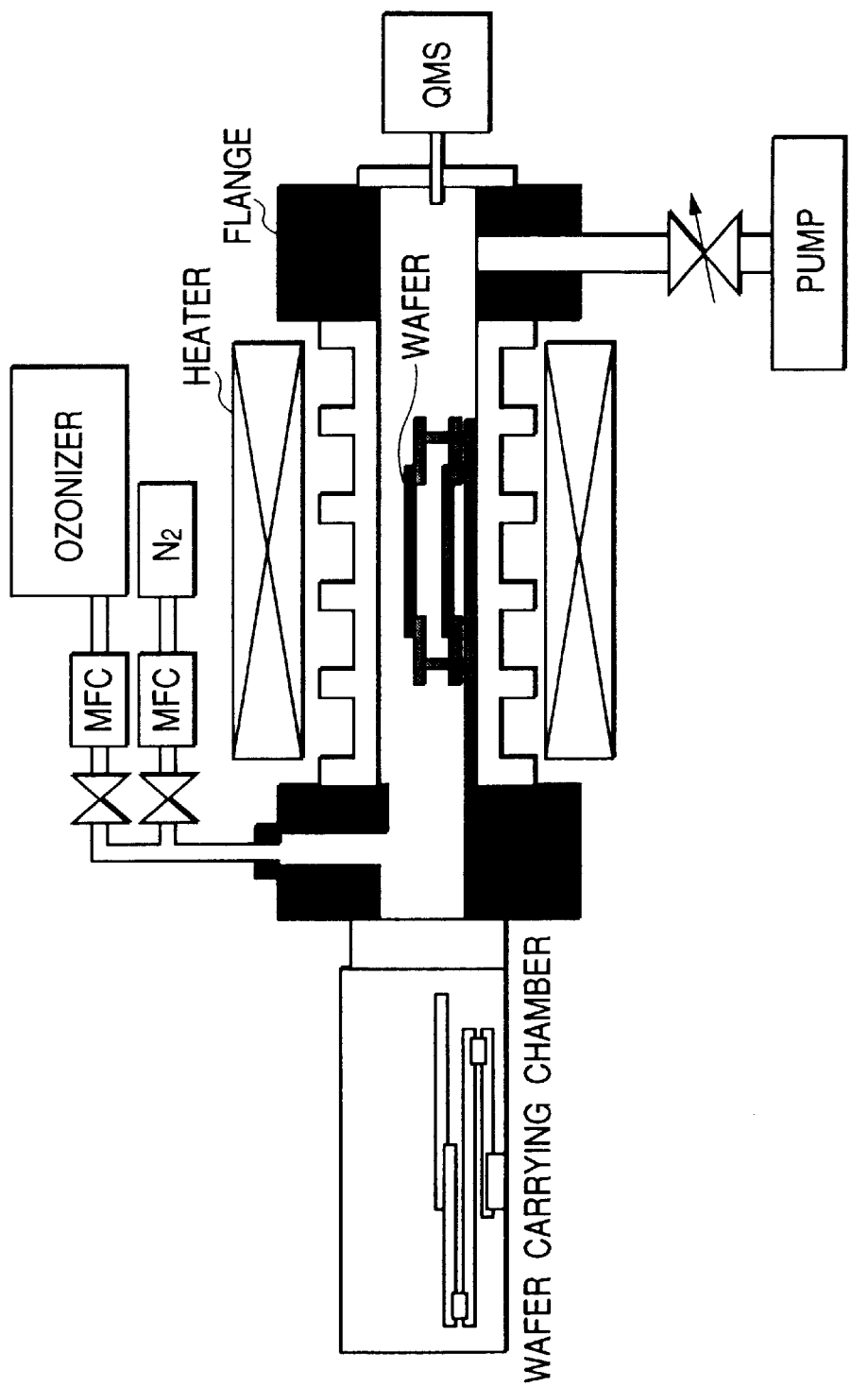
FIG. 58 is a diagram which schematically illustrates the structure of an ozone etching apparatus employed for a second experiment in accordance with the present invention.
Figure 59:
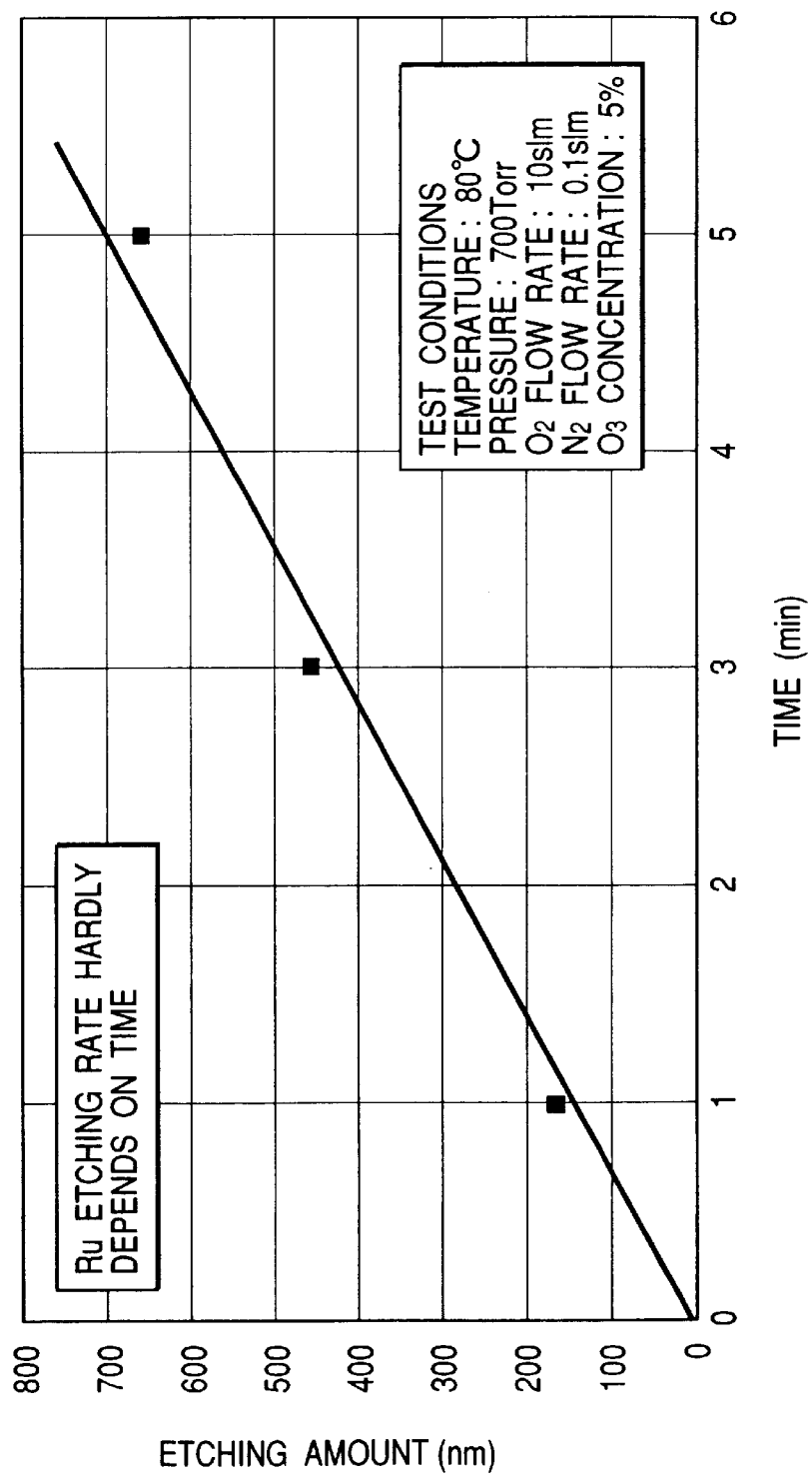
FIG. 59 is a graph illustrating the dependence, on treating time, of the etching amount of an Ru film as measured by the ozone etching apparatus illustrated in FIG. 58.

The structure of the ozone etching apparatus employed for Experiment 2 is schematically illustrated in FIG. 58. FIG. 59 is a graph illustrating the dependence, on the treating time, of the etching amount of an Ru film as measured by this ozone etching apparatus. The Ru film was etched under the conditions of a treating pressure of 700 Torr and treating temperature of 80° C., while feeding the wafer surface with a gas mixture of oxygen (flow rate=10 slm) and nitrogen (flow rate=0.1 slm) containing 5 vol. % of ozone. The etching amount was determined by calculating the number of atoms of Ru based on the strength of characteristic X-rays emitted from the surface of the Ru film when the film is-exposed to X rays. In Experiment 2, ozone was not exposed to ultraviolet rays.

As illustrated in FIG. 59, the dependence of the etching rate on time was not recognized from etching of an Ru film with ozone. From this finding and the finding obtained in Experiment 1 (FIG. 52), it is presumed that etching proceeds inside of the film even if etching does not seem to proceed at the starting time of the etching.

Figure 60:
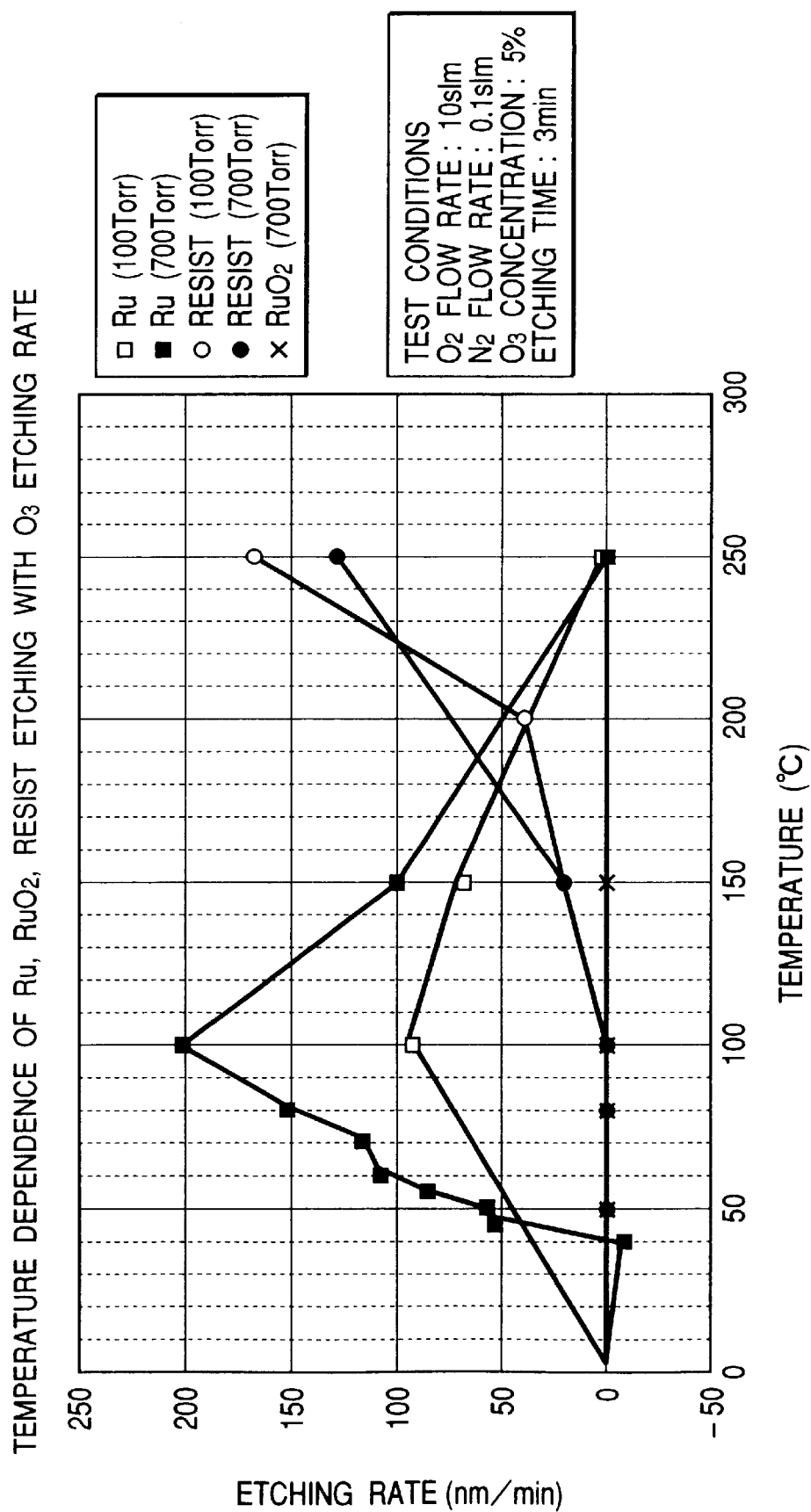
FIG. 60 is a graph illustrating the dependence, on a treating temperature, of the etching rate of each of an Ru film, an $RuO_2$ film and a photoresist film.
Figure 61:
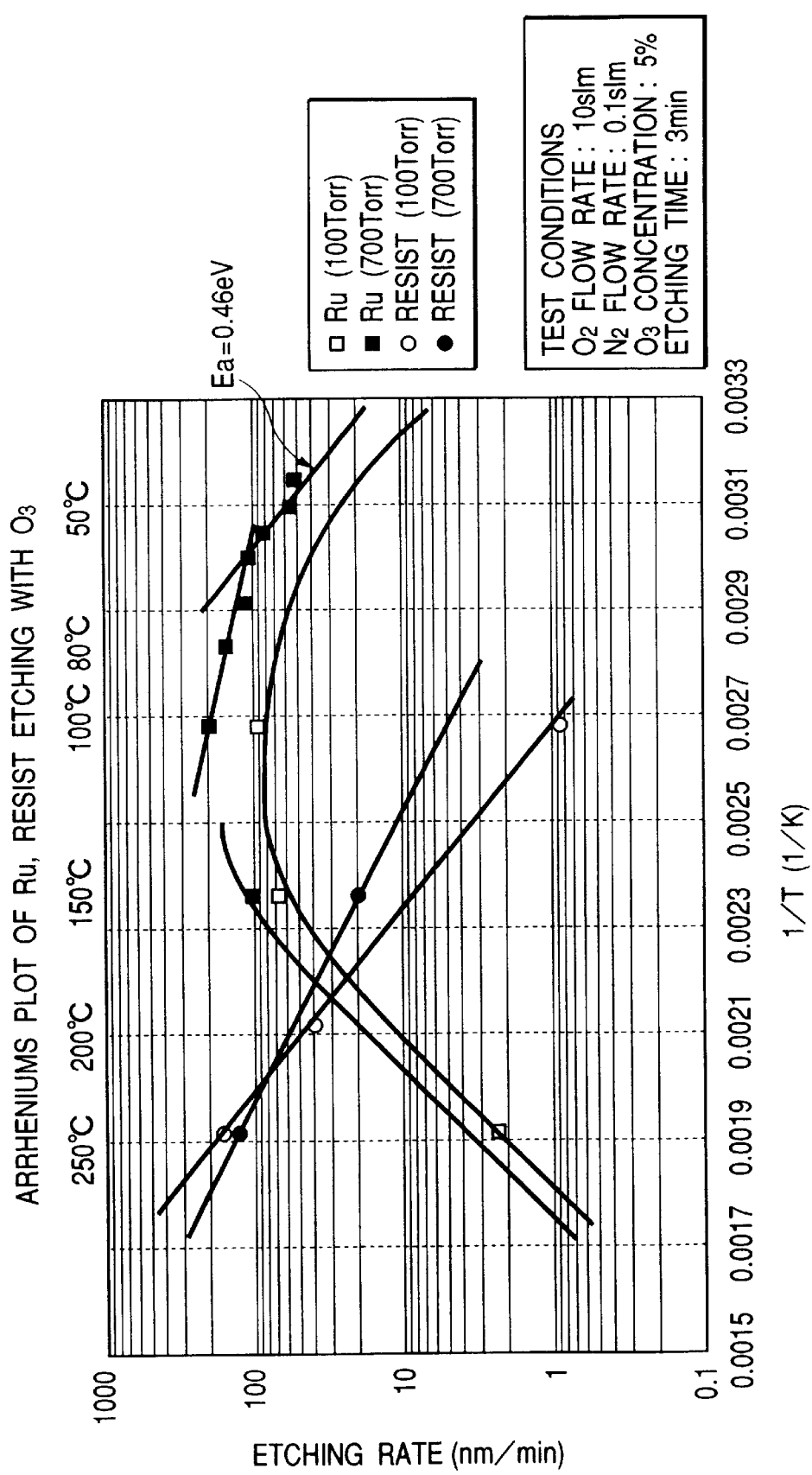
FIG. 61 is a graph obtained by plotting the graph of FIG. 60 (except the $RuO_2$ film) in accordance with the Arrhenius equation.
Figure 62:
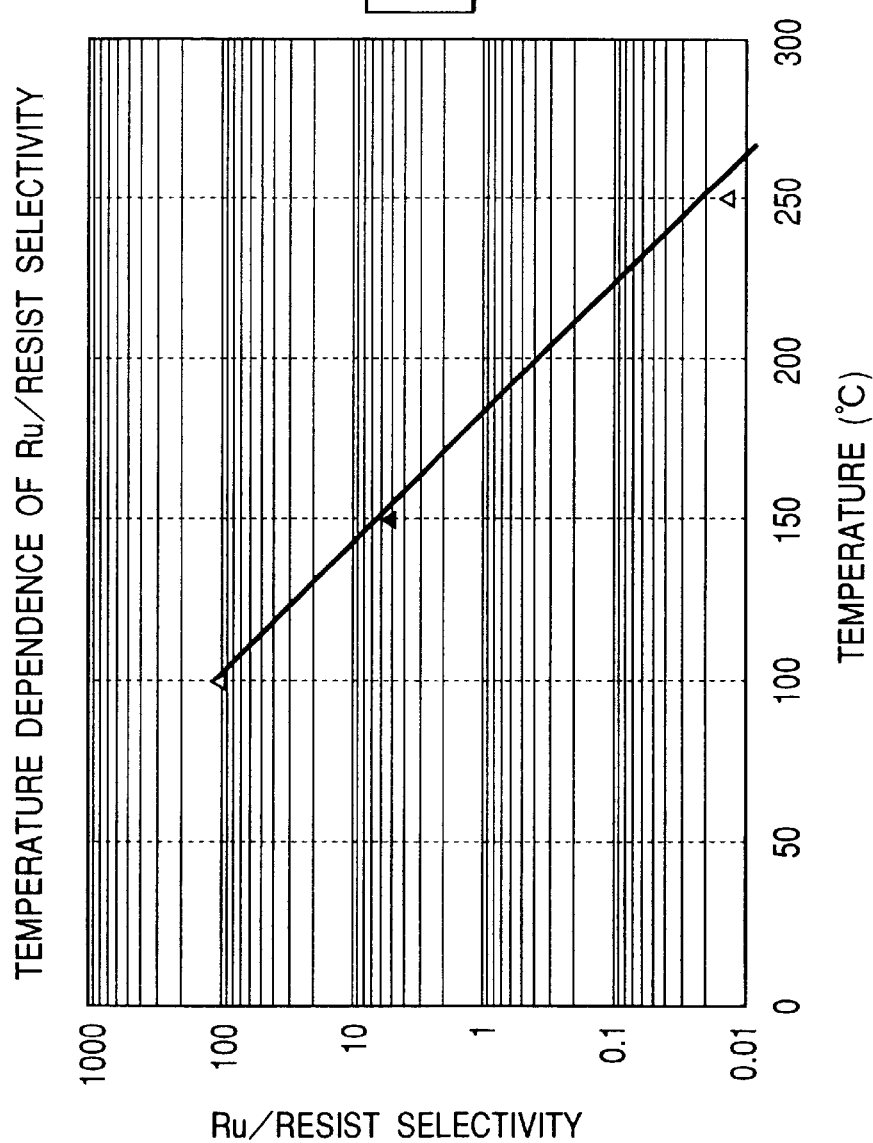
FIG. 62 is a graph illustrating temperature dependence of resist-relative selectivity of an Ru film.

FIG. 60 is a graph illustrating the dependence, on the treating temperature, of the etching rate of each of an Ru film, $RuO_2$ film and photoresist film. Etching was conducted by feeding the wafer surface with the above-described gas mixture containing 5 vol. % of ozone under the conditions of a treating pressure of 100 Torr or 700 Torr for 3 minutes, resulting in almost similar results to Experiment 1 (FIG. 50). FIG. 61 is the Arrhenius plotted graph (except the $RuO_2$ film) of FIG. 60, with the reciprocal of the absolute temperature being indicated on the abscissa. Temperature dependence of a resist-relative selectivity (Ru/PR selectivity) of the Ru film was calculated from the above-described data, resulting in almost similar results (FIG. 62) to Experiment 1 (FIG. 53).

The surface of another silicon wafer disposed downstream during etching of the Ru film was then analyzed, indicating that, as illustrated in FIG. 63, the re;deposition amount of the reaction product was not greater than a detection limit. In addition, the amount of etching residue, on the surface of the wafer, of each of an Ru film deposited by the ordinarily sputtering method (NS) and an Ru film deposited by the long throw sputtering (LTS) method, wherein the distance between the wafer and target is extended was measured. In either case, a slight residue was recognized. By using a washing liquid containing periodic acid and nitric acid, the amount of these etching residues could be reduced to a level not causing a problem. Japanese Patent Application No. Hei 11(1999)-245143 (Futase, et al.) describes in detail a technique for removing the Ru residue by using a washing liquid containing periodic acid and nitric acid. Japanese Patent Application No. Hei 10(1998)-304139 (Suzuki, et al.) and Japanese Patent Application No. Hei 11(1999)-289941 (Suzuki et al.) describes in detail a method for cleaning an apparatus for forming an Ru film on a substrate.

Figure 64:
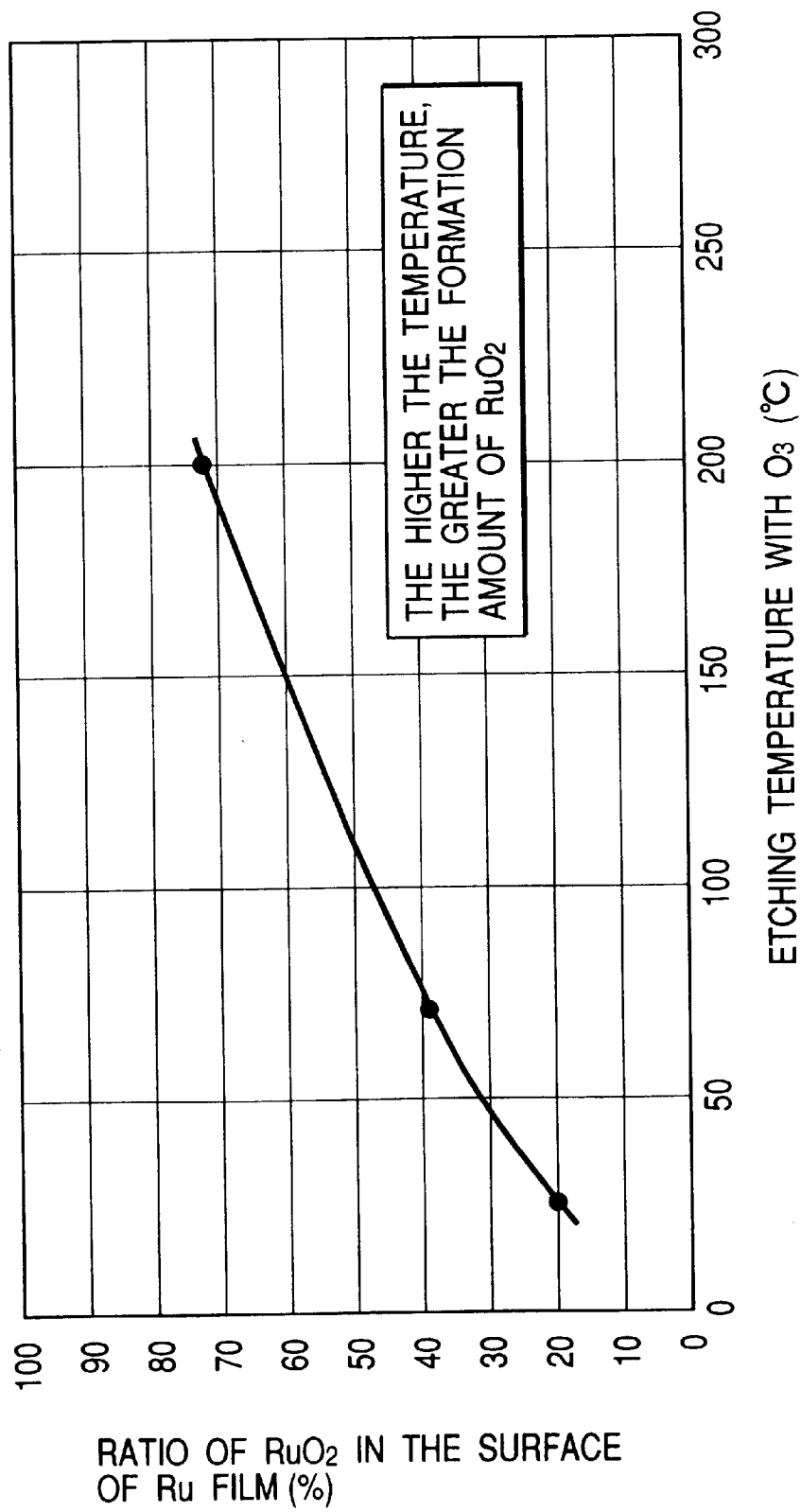
FIG. 64 is a graph illustrating the results of measuring a ratio of $RuO_2$ contained in the surface of the etched Ru film using an X-ray photoelectron spectroscopy.

FIG. 64 is a graph illustrating the results of measuring, using an X-ray photoelectron spectroscopy, a ratio $RuO_2$ contained in the surface of an Ru film after etching with ozone. As illustrated, the amount of $RuO_2$ provided increases with the treating temperature. The results coincide with those of Experiment 1 (FIG. 50) showing that a decrease in film thickness due to etching and an increase in film thickness by oxidation compete with each other with a rise in the treating temperature, and at temperatures higher than around 200° C., the latter exceeds the former.

Figure 65:
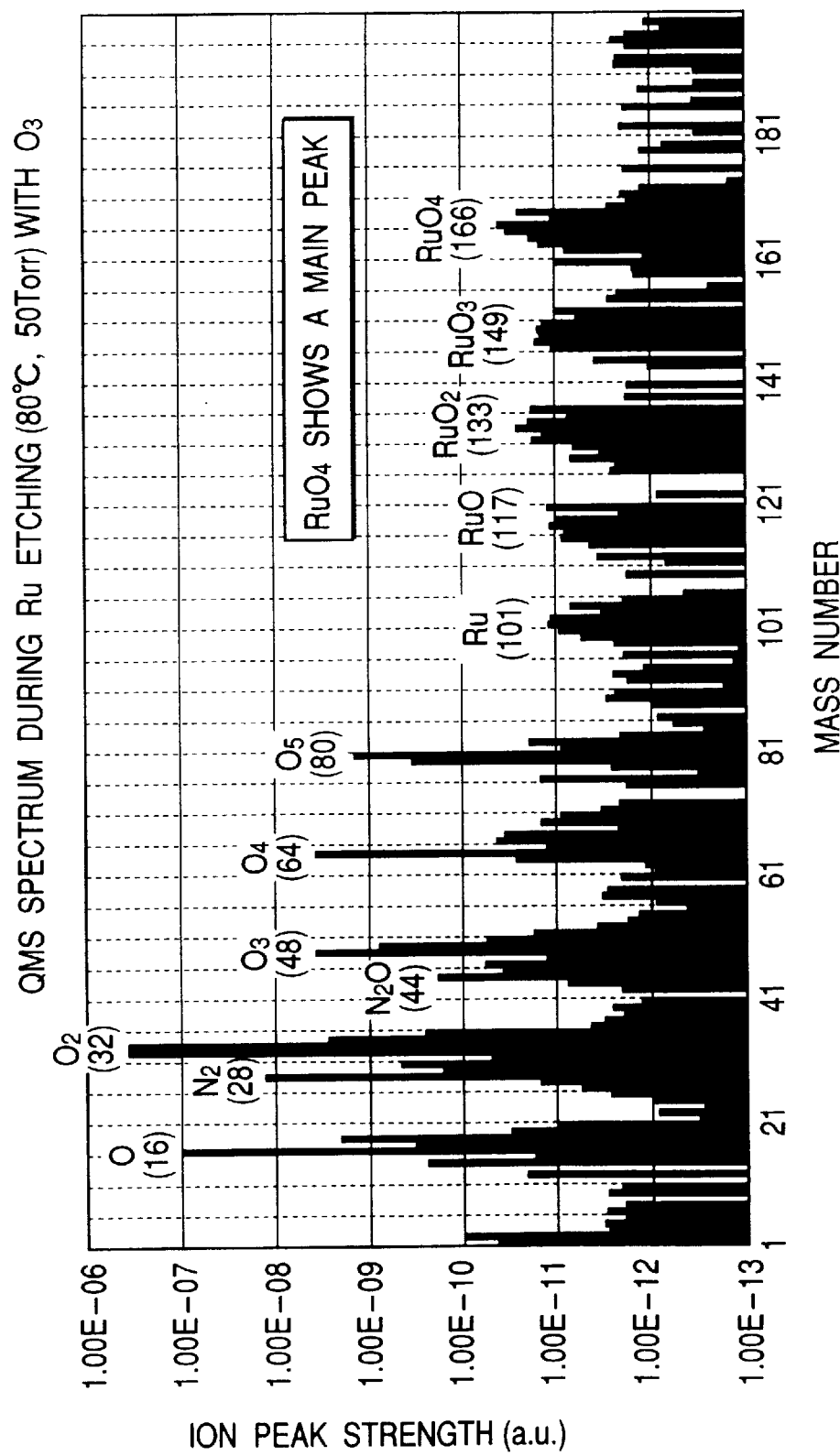
FIG. 65 is a graph illustrating the results of measuring a substance formed during etching of an Ru film using a gas mass spectrometer.

FIG. 65 is a graph illustrating the results of measuring, using a gas mass spectrometer (QMS), a substance formed during etching of an Ru film with ozone. As illustrated, several kinds of ruthenium oxides having a different oxidation number were detected, but $RuO_4$ (ruthenium tetraoxide) showed a main peak.

Figure 66:
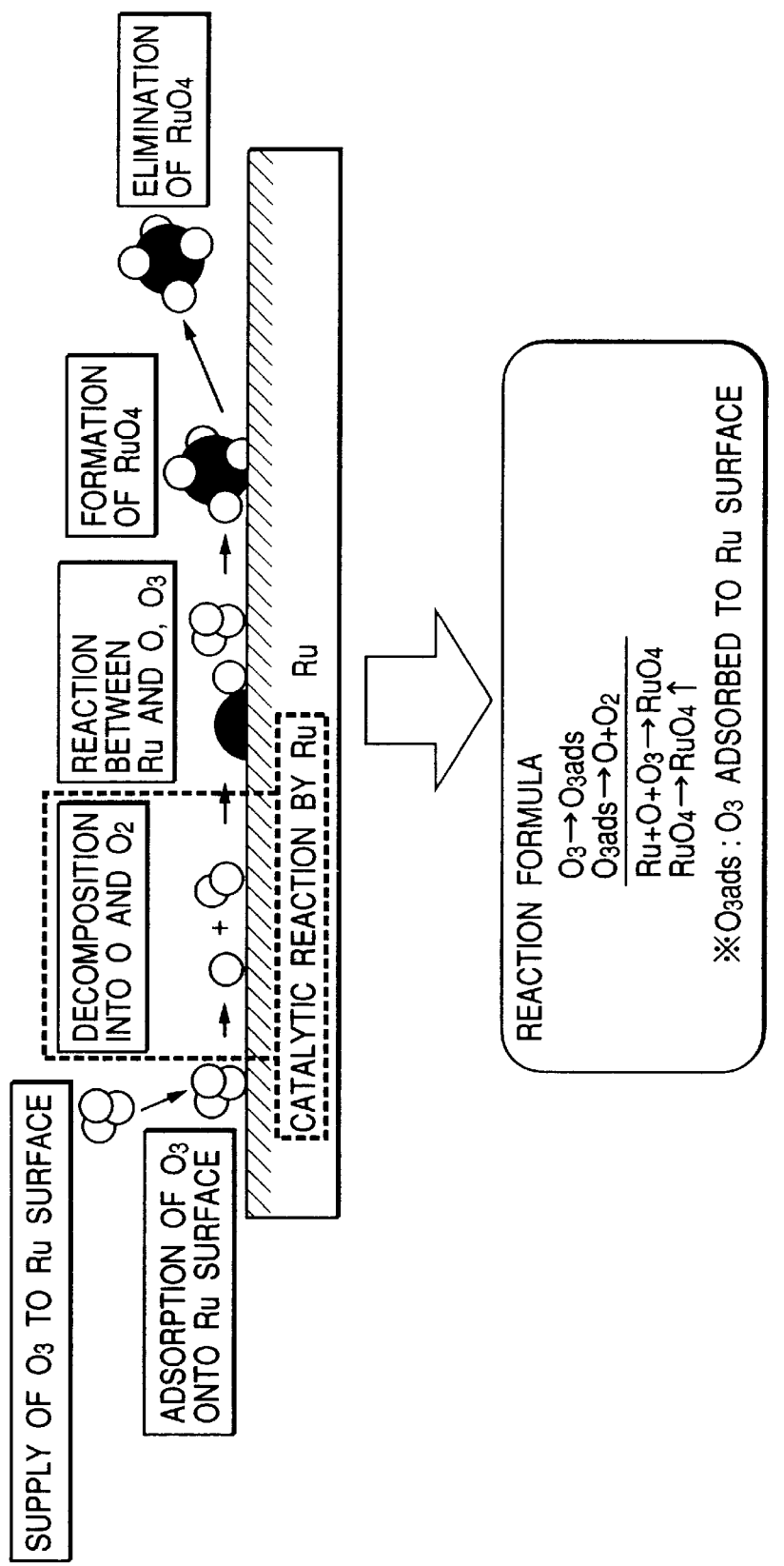
FIG. 66 is a diagram illustrating the etching mechanism of an Ru film by ozone.
Figure 67:
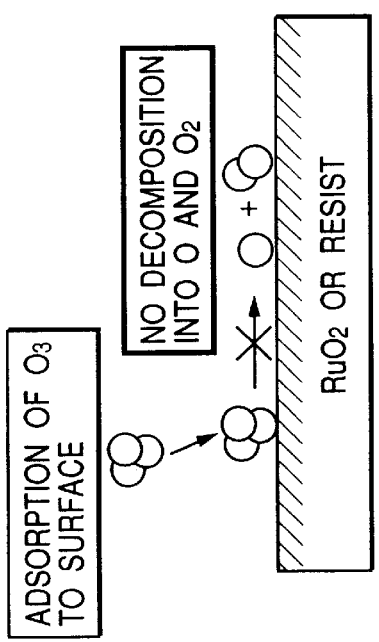
FIG. 67 is a diagram which schematically illustrates a reason why etching of each of an $RuO_2$ film and a photoresist film by ozone is difficult.

Judging from the results of the experiments so far described the Ru film is presumed to be etched with ozone according to the reaction mechanism, as illustrated in FIG. 66. First, when ozone is fed to the surface of the Ru film and is adsorbed thereto, it is decomposed into active atomic oxygen (O) and oxygen ($O_2$) by the catalytic action of Ru, which is one of the platinum elements. This atomic oxygen (O) then reacts with Ru (RO), followed by bonding with newly fed ozone ($O_3$), whereby $RuO_4$ (ruthenium tetraoxide) is formed. Etching proceeds by the release of the resulting oxide from the surface of the film. As illustrated in FIG. 67, on the other hand, ozone decomposes neither an $RuO_2$ film nor a photoresist film, presumably because the surface of each of these films does not function as a catalyst for ozone decomposition, so that ozone does not decompose into atomic oxygen (O) and oxygen ($O_2$) at a relatively low temperature range. In addition, an $RuO_2$ film is not etched even in a high temperature range, presumably because $RuO_2$ is a thermodynamically stable compound, which prevents easy production of $RuO_4$ even if ozone is supplied.

Figure 68:
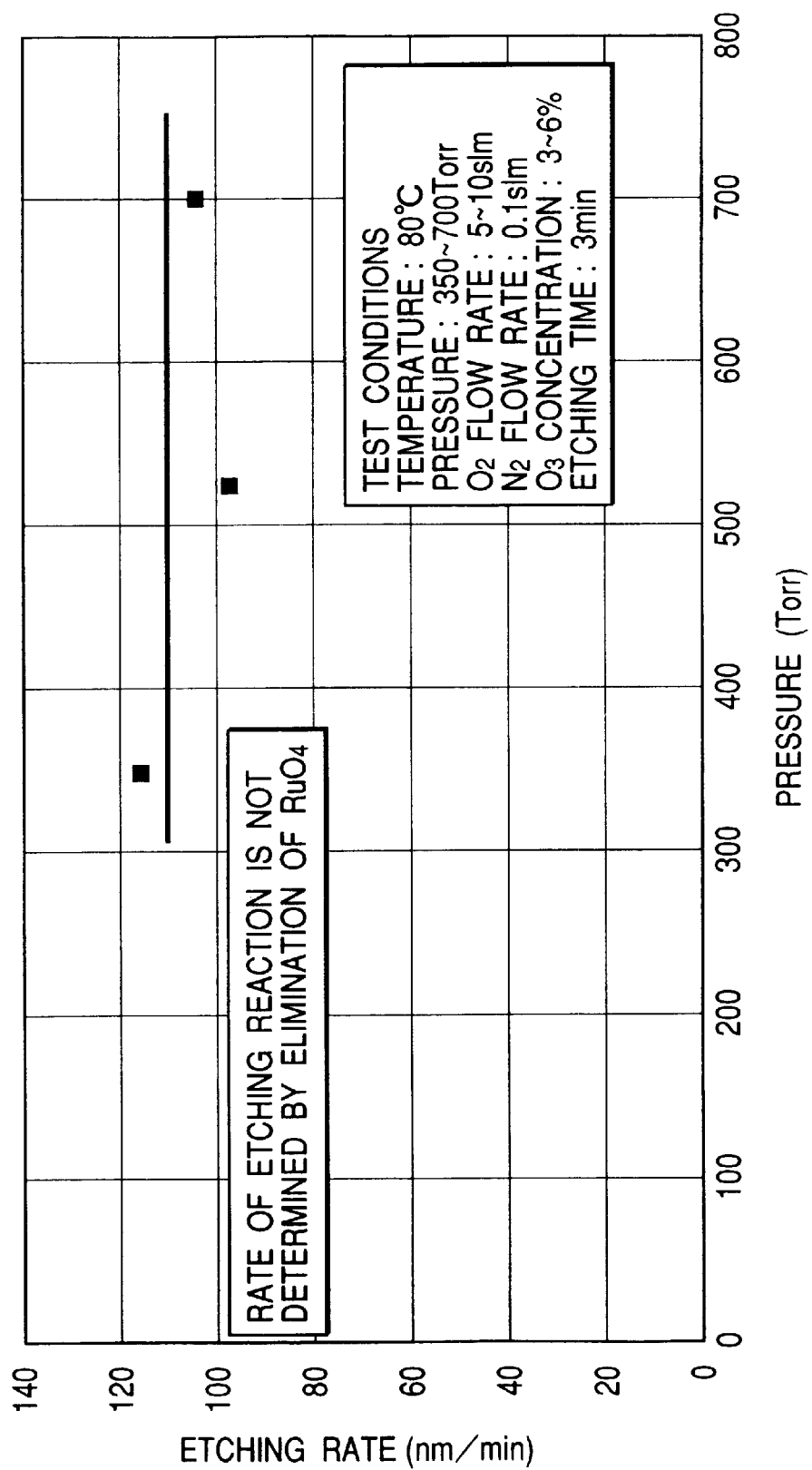
FIG. 68 is a graph illustrating the etching rate of an Ru film at a treating temperature of 80° C.
Figure 69:
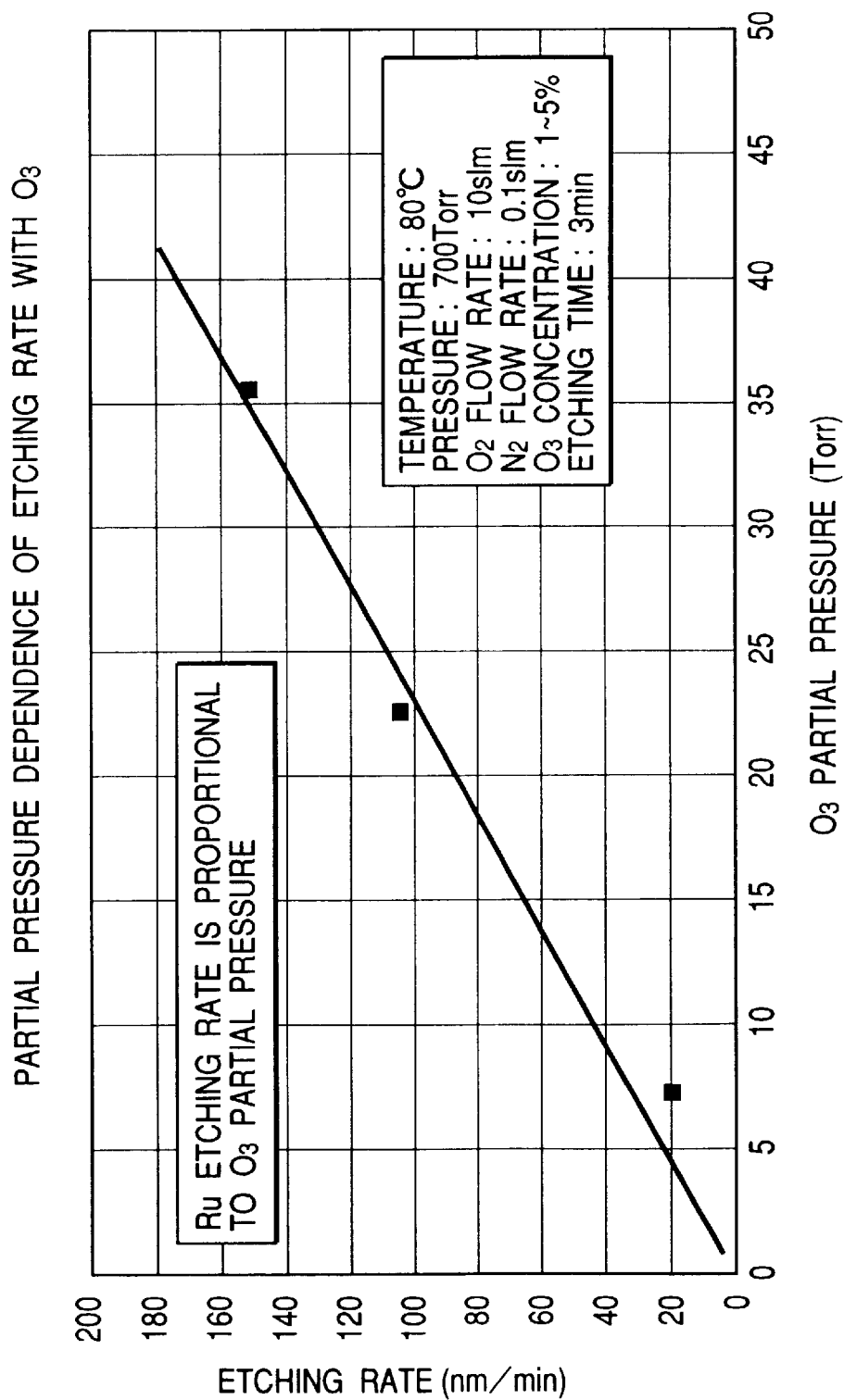
FIG. 69 is a graph illustrating the dependence, on ozone partial pressure, of the etching rate of an Ru film by ozone.
Figure 70:
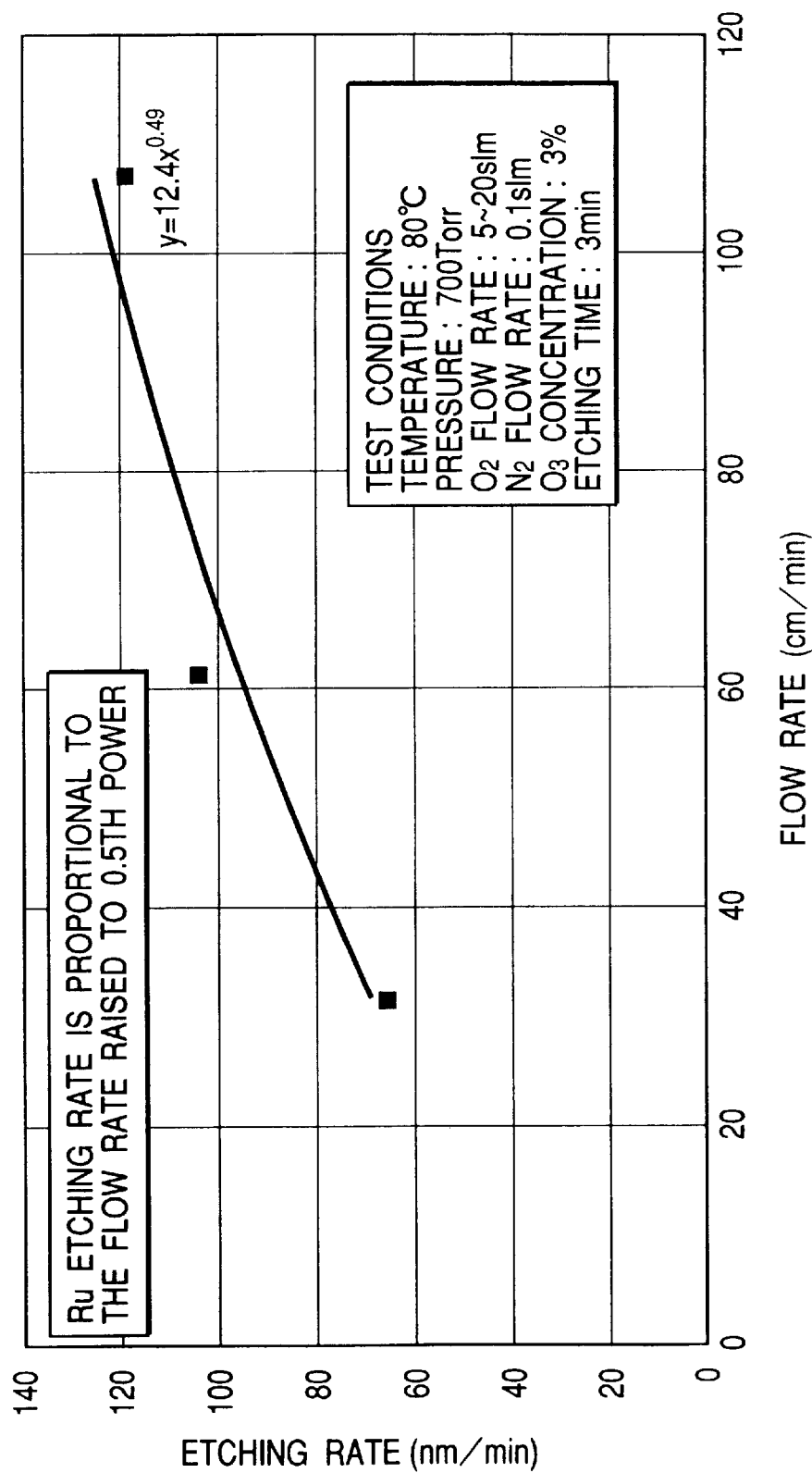
FIG. 70 is a graph illustrating the dependence, on a gas flow rate, of the etching rate of an Ru film by ozone.
Figure 71:
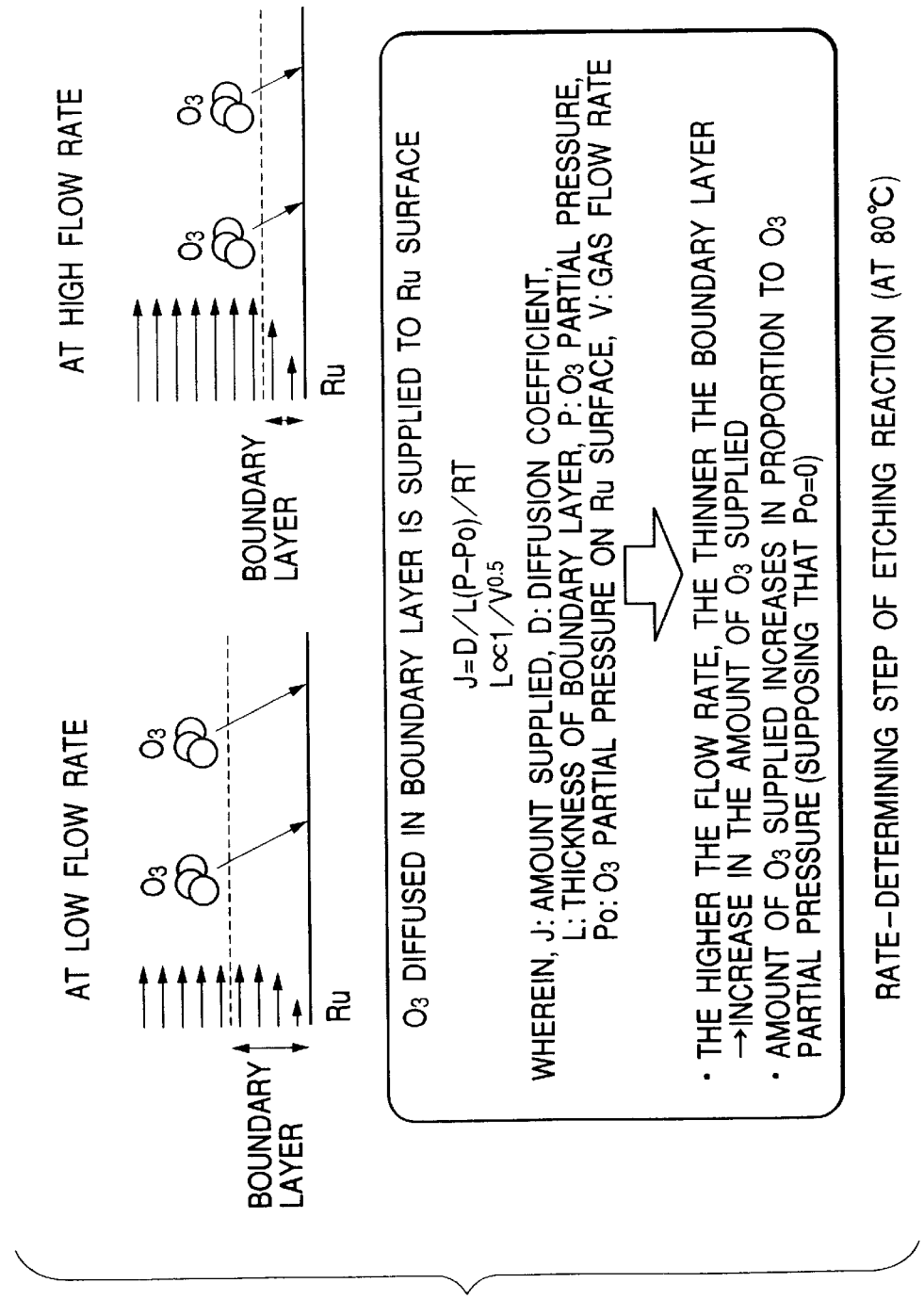
FIG. 71 schematically illustrates the dependence, on a gas flow rate, of the etching rate of an Ru film by ozone.

FIG. 68 is a graph illustrating an etching rate of an Ru film at a treating temperature of 80° C. at varied pressures of an oxygen+nitrogen gas mixture having a predetermined ozone partial pressure. As illustrated in FIG. 68, the etching rate of the Ru film did not depend on the pressure of the ozone-containing gas mixture. Accordingly, the etching reaction of Ru by ozone is not a rate determined reaction by release of $RuO_4$, the reaction product, from the film surface. As illustrated in FIG. 69, when the etching rate was measured at varied ozone partial pressures of the ozone-containing gas mixture within a range of from 1 to 5 vol. %, the etching rate showed an increase in proportion to the ozone partial pressure. As illustrated in FIG. 70, when an etching rate was measured at varied flow rates of the ozone-containing gas mixture, the etching rate showed an increase in proportion to the flow rate raised to the 0.5-th power. From these experiments, the etching reaction of Ru at 80° C. is presumed to be a rate controlled reaction by the supply of ozone to the Ru surface. FIG. 71 illustrates a model of a rate-controlled etching reaction obtained by the supply of ozone to the Ru surface. Ozone is diffused within the boundary layer near the Ru film surface and fed to the film surface. When the flow rate of the ozone-containing gas mixture is low, the boundary layer becomes thick, which prevents supply of a large amount of ozone to the film surface. When the flow rate is high, on the other hand, the boundary layer becomes thin and the amount of ozone supplied to the film surface increases. The greater the ozone partial pressure of the ozone-containing gas mixture, the greater will be the amount of ozone supplied to the film surface.

Figure 72:
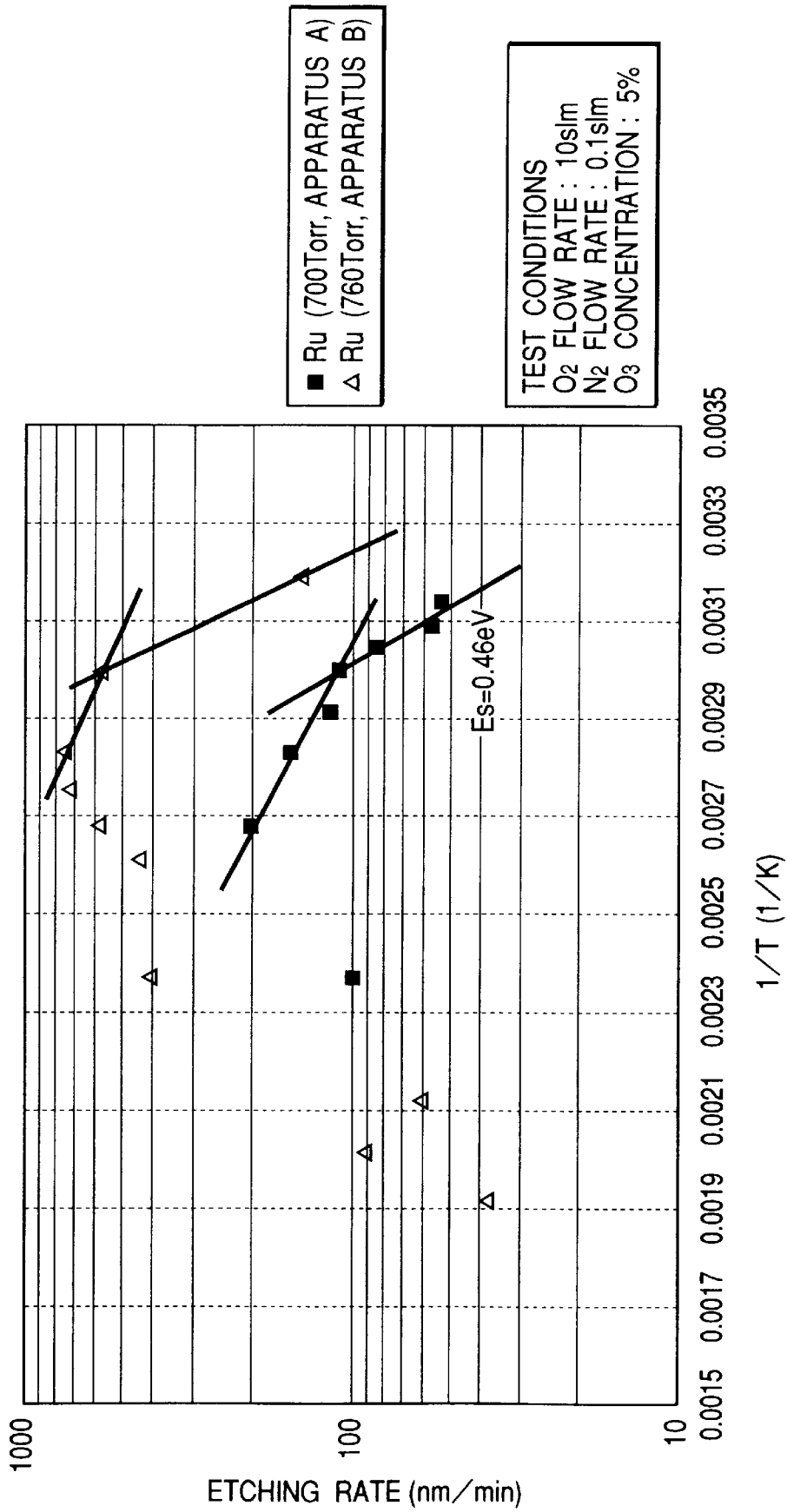
FIG. 72 is a graph illustrating the dependence, on an etching apparatus, of the etching rate of an Ru film by ozone.

FIG. 72 is an Arrhenius plotted graph of an etching rate of an Ru film measured by two ozone etching apparatuses. Apparatus A is an ozone etching apparatus used for Experiment 2, while Apparatus B is an ozone etching apparatus used for Experiment 1. The graph shows that, at around 100° C. (0.0027 (1/T) to 0.0029 (1/T)), a markedly high etching rate is available from either of these apparatuses.

As described above, it has been revealed by the present inventors that use of ozone enables high-rate etching of an Ru film which has conventionally been regarded to be difficult, and, at the same time, its selectivity relative to a resist can be increased largely by the optimization of the treating temperature.

An Ru film can be etched in an ozone-containing gas atmosphere by such a conventional ozone etching apparatus (ozone ashing apparatus) as that used in Experiment 1 or 2. Exposure to ultraviolet rays is, however, not preferred, because it lowers the ozone concentration.

As is apparent from the above-described experiments, an increase in the film thickness by oxidation exceeds a decrease in the film thickness by etching when the treating temperature is increased to about 200° C. or greater. Accordingly, the upper limit of the treating temperature is set at a temperature at which the etching rate exceeds the oxidation-induced film-thickness increasing rate, that is, about 180° C., while the lower limit is set at room temperature (about 25° C.). The upper limit of the treating temperature is set at 150° C., preferably 110° C. in order to etch an Ru film at a rate as high as 200 nm/min or greater, preferably 250 nm/min or greater, more preferably 350 nm/min greater and at a resist-relative selectivity of 20 or greater.

The etching rate of an Ru film depends on an ozone concentration, so that the greater the ozone concentration in a gas fed to the substrate 1, the higher the etching rate of the Ru film. In Table 7.11 (on page 187) of "Ozone, Its Basis and Application", by Hidetoshi Sugimitsu, published by Korin K. K. (in 1996), there is a description indicating that decomposition proceeds slowly at an ozone concentration up to 14.3 vol. %, but explosion occurs at 44 vol. % or greater. In Table 7.10 (on page 185), it is described that the reaction is slow at 25 vol. %, but glass islbroken at 38 vol. %. It is generally said that the limit is 30 wt % (22 vol. %) (page 594 of "New Experimental Chemistry Vol. 15, Oxidation and Reduction I-2", ed. by Nippon Kagakukai, published by Maruzen), but the above-described literature says that the reaction is slow even at 25 vol. %. The limit of the ozone concentration is presumed to exist between 25 vol. % to 38 vol. % and the limit must be set at 25 vol. % in consideration of safety.

Dry etching of an Ru film by ozone is non-plasma type etching, that is, a simple gas-phase etching without plasma in the vicinity of the wafer. This non-plasma type etching is characterized by the fact that, since high-rate ion injection by a strong substrate bias or another method is not utilized for the main etching reaction, an isotropic etching profile is available. In addition, dry etching of an Ru film by ozone is chemical dry etching, that is, isotropic etching wherein the reaction of a chemical reaction system containing ozone and Ru proceeds voluntarily by making use of a difference of free energy without requiring application of a strong bias on a wafer to be treated or injection of high energy ions thereto.

Figure 73:
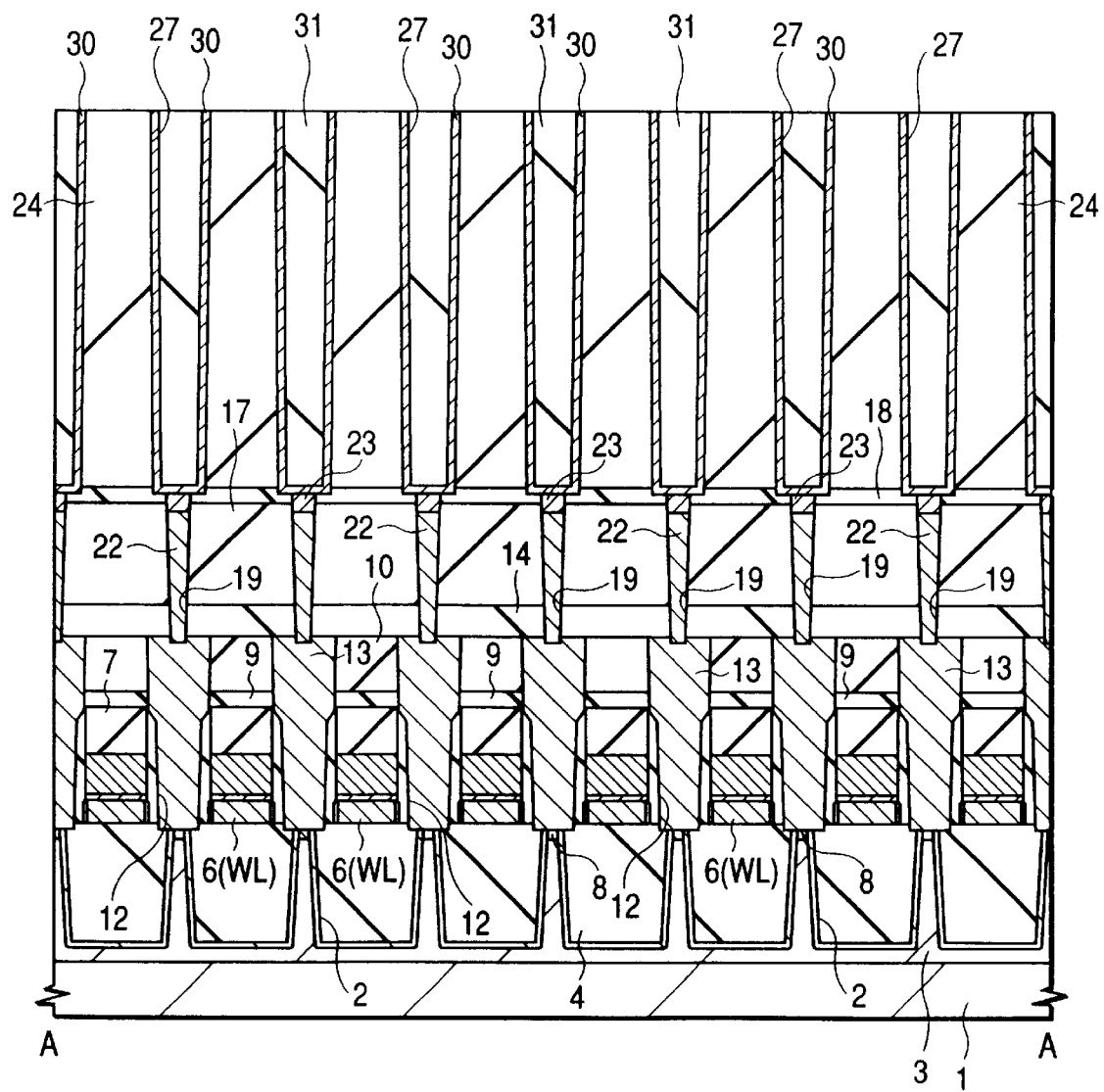
FIG. 73 is a fragmentary cross-sectional view of a semiconductor substrate illustrating the method of manufacture of a DRAM according to one embodiment of the present invention.
Figure 74:
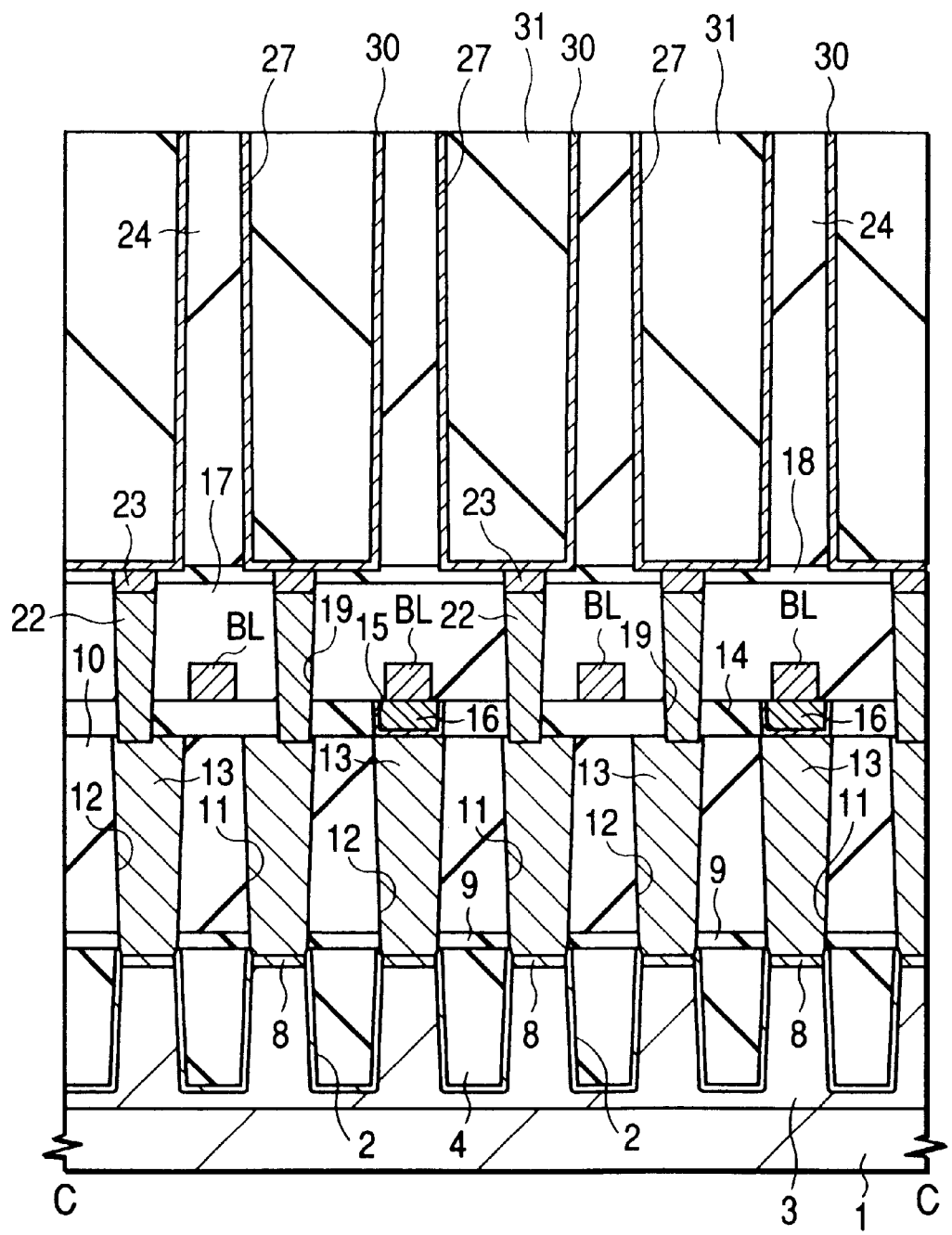
FIG. 74 is a fragmentary cross-sectional view of a semiconductor substrate illustrating the method of manufacture of a DRAM according to one embodiment of the present invention.

FIGS. 73 and 74 illustrate the steps subsequent to those illustrated in FIGS. 46 and 47, showing the state after the Ru film 30 outside the hole 27 and not covered with the photoresist film 31 was removed by dry-etching with ozone. According to the experiment of the present inventors, the Ru film 30 outside the hole 27 could be removed at an etching rate as high as 550 nm/min. The etching rate of the photoresist film 31 at that time was 3 nm/min, that is, a markedly high resistivity (550÷3≈183) relative to resist so that the photoresist film 31 embedded in the hole 27 was hardly etched.

Figure 75:
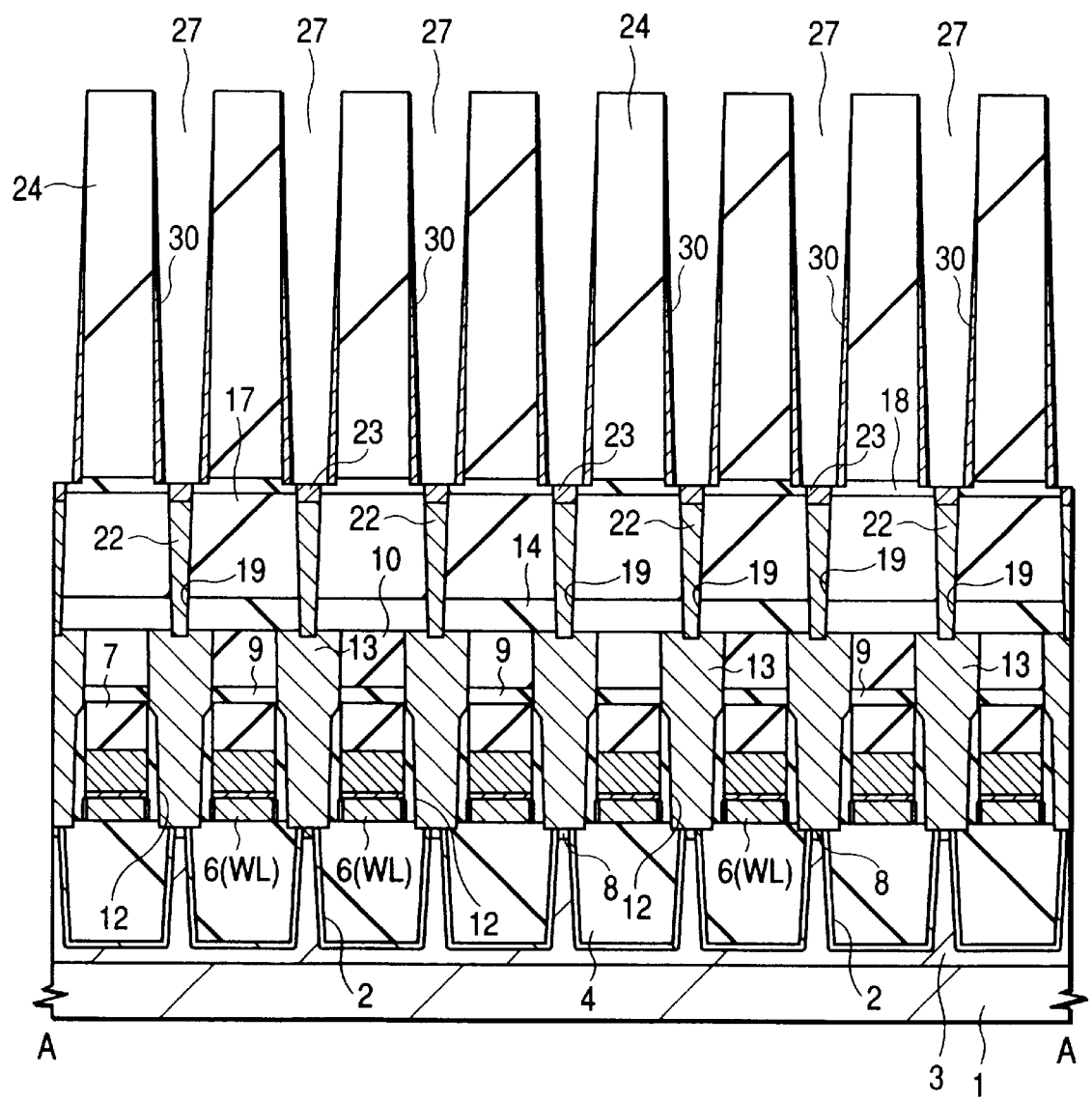
FIG. 75 is a fragmentary cross-sectional view of a semiconductor substrate illustrating the etched state of an Ru film by ion assist etching.

FIG. 75, for comparison, illustrates the state after the Ru film 30 was etched by ion assist etching with an oxygen gas containing 10% of chlorine ($Cl_2$). In this case, the etching rate of the Ru film 30 was 120 nm/min, while that of the photoresist film 31 was 1414 nm/min. Since the photoresist film 31 was etched by an oxygen radical at a high speed, the photoresist film 31 in the hole 27 disappeared completely when the Ru film 30 outside the hole 27 was removed. In addition, the Ru film 30 on the bottom surface of the hole 27 also disappeared and the Ru film 30 on the side walls of the hole 27 became thin.

Figure 76:
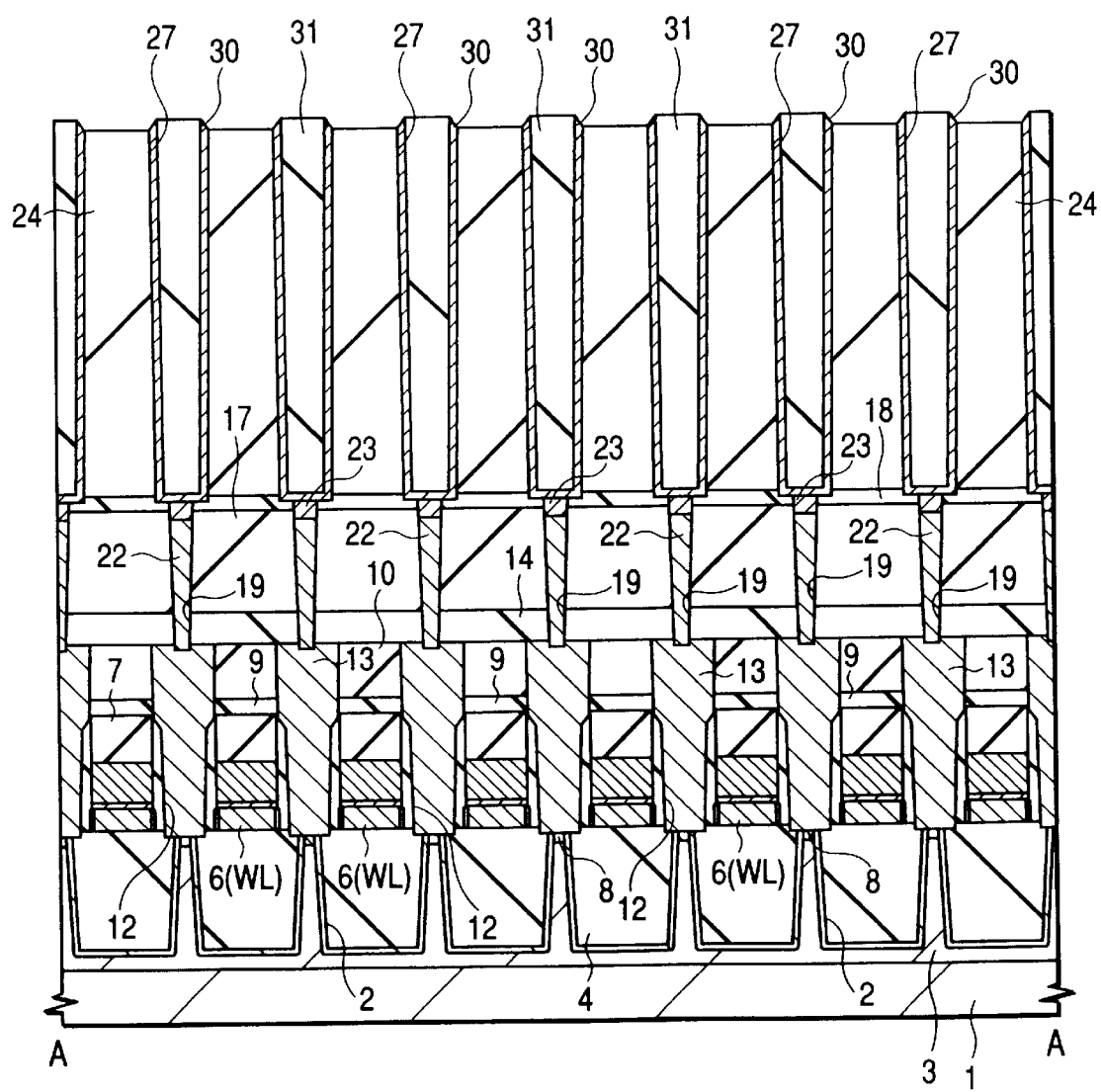
FIG. 76 is a fragmentary cross-sectional view of a semiconductor substrate illustrating the etched state of an Ru film by Ar sputter etching.

FIG. 76 illustrates, also for comparison, the state after the Ru film 30 was etched by Ar sputtering. The etching rate of the Ru film 30 was 70 nm/min, while that of the photoresist film 31 was 26 nm/min (selectivity relative to a resist≈2.7). Compared with dry etching with ozone, the etching rate and selectivity to a resist, each of the Ru film 30 were markedly small so that it took long hours (about 8 times longer than that of ozone etching) to remove the Ru film 30, and the surface level of the photoresist film 31 in the hole 27 was lowered to some extent.

Figure 77:
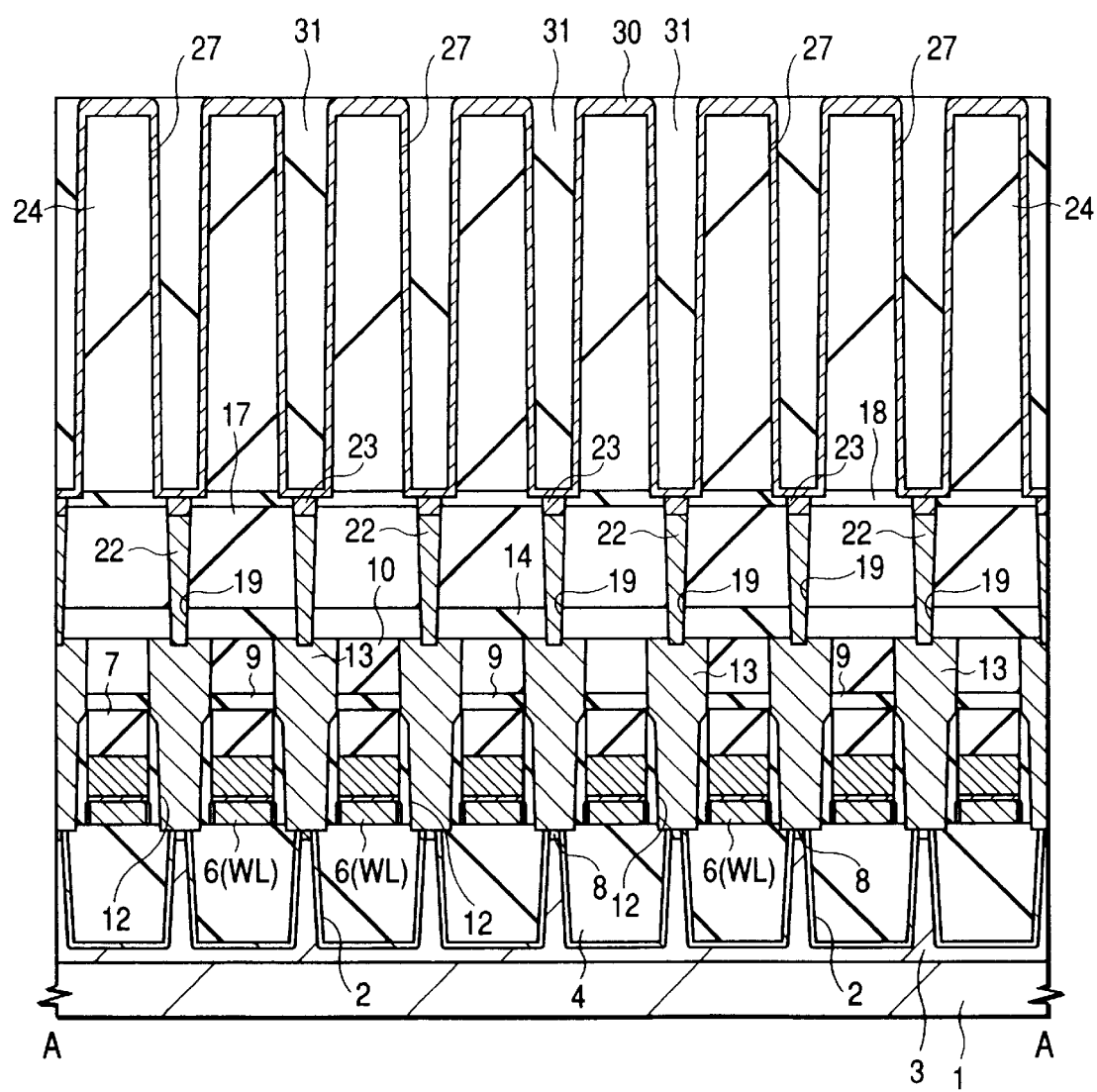
FIG. 77 is a fragmentary cross-sectional view of a semiconductor substrate illustrating the method of manufacture of a DRAM according to one embodiment of the present invention.

When the photoresist film 31 is embedded inside of the hole 27, some exposure conditions make the surface height of the photoresist film 31 almost similar to that of the Ru film 30, as illustrated in FIG. 77.

Figure 78:
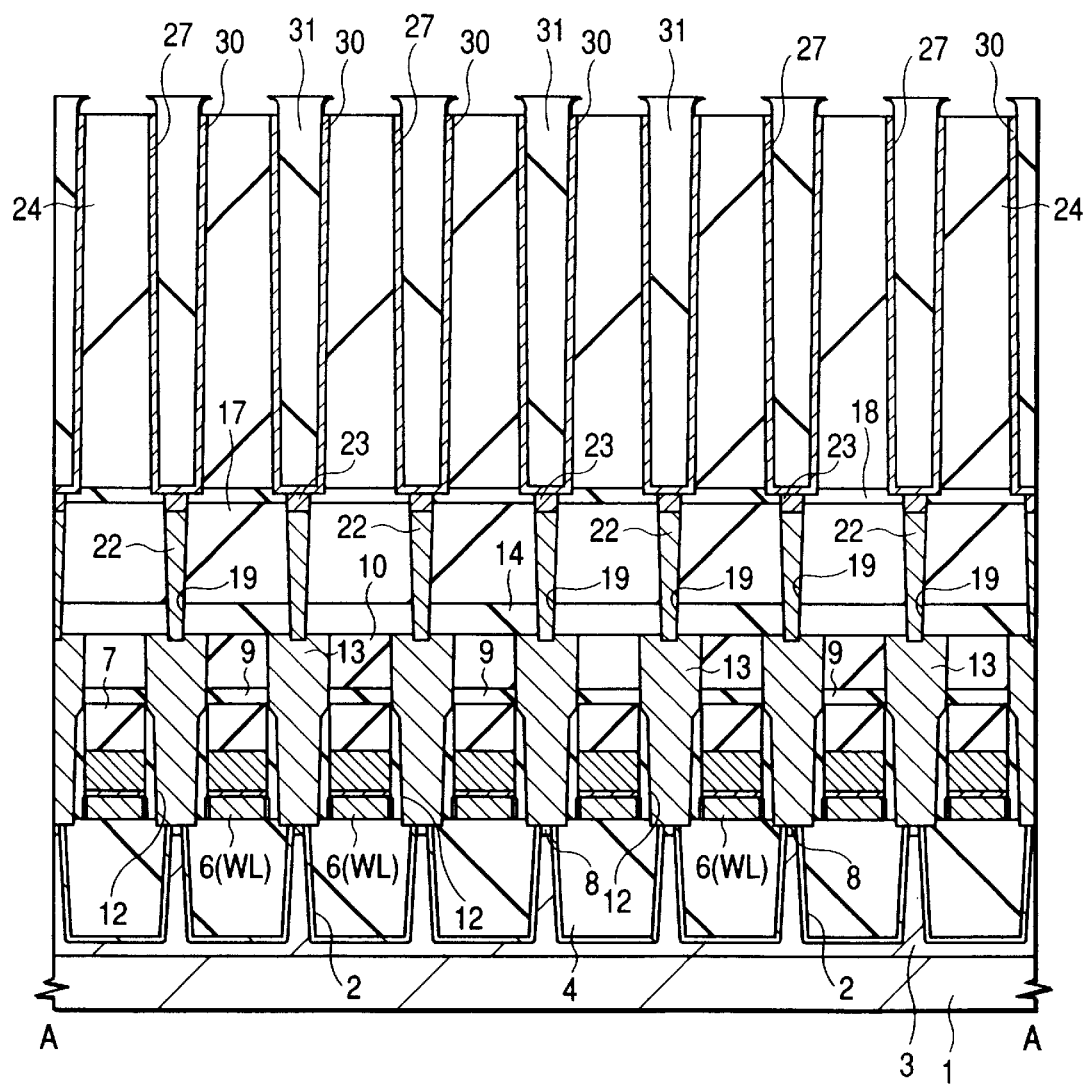
FIG. 78 is a fragmentary cross-sectional view of a semiconductor substrate illustrating the method of manufacture of a DRAM according to one embodiment of the present invention.
Figure 79:
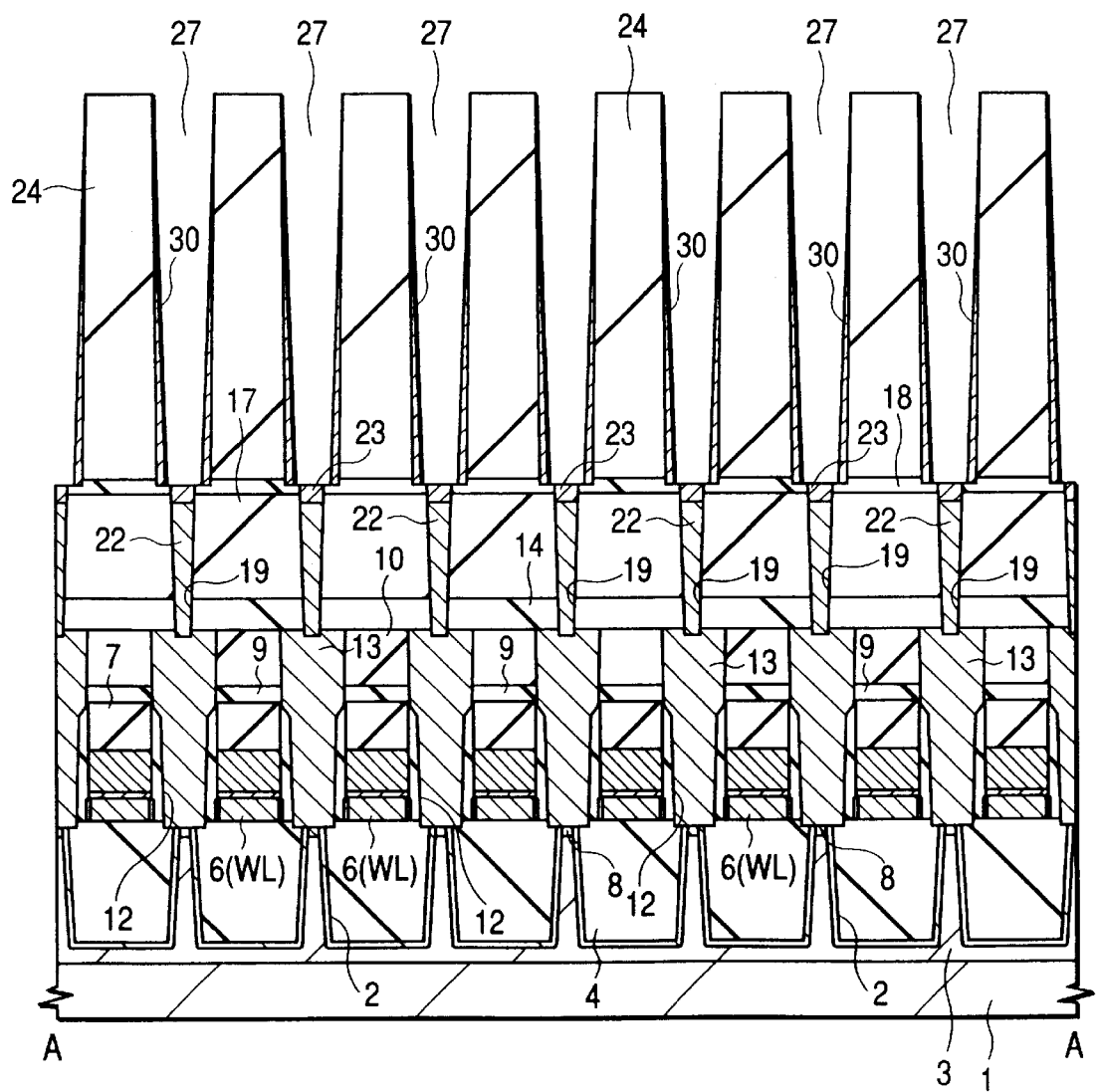
FIG. 79 is a fragmentary cross-sectional view of a semiconductor substrate illustrating the etched state of an Ru film by ion assist etching.
Figure 80:
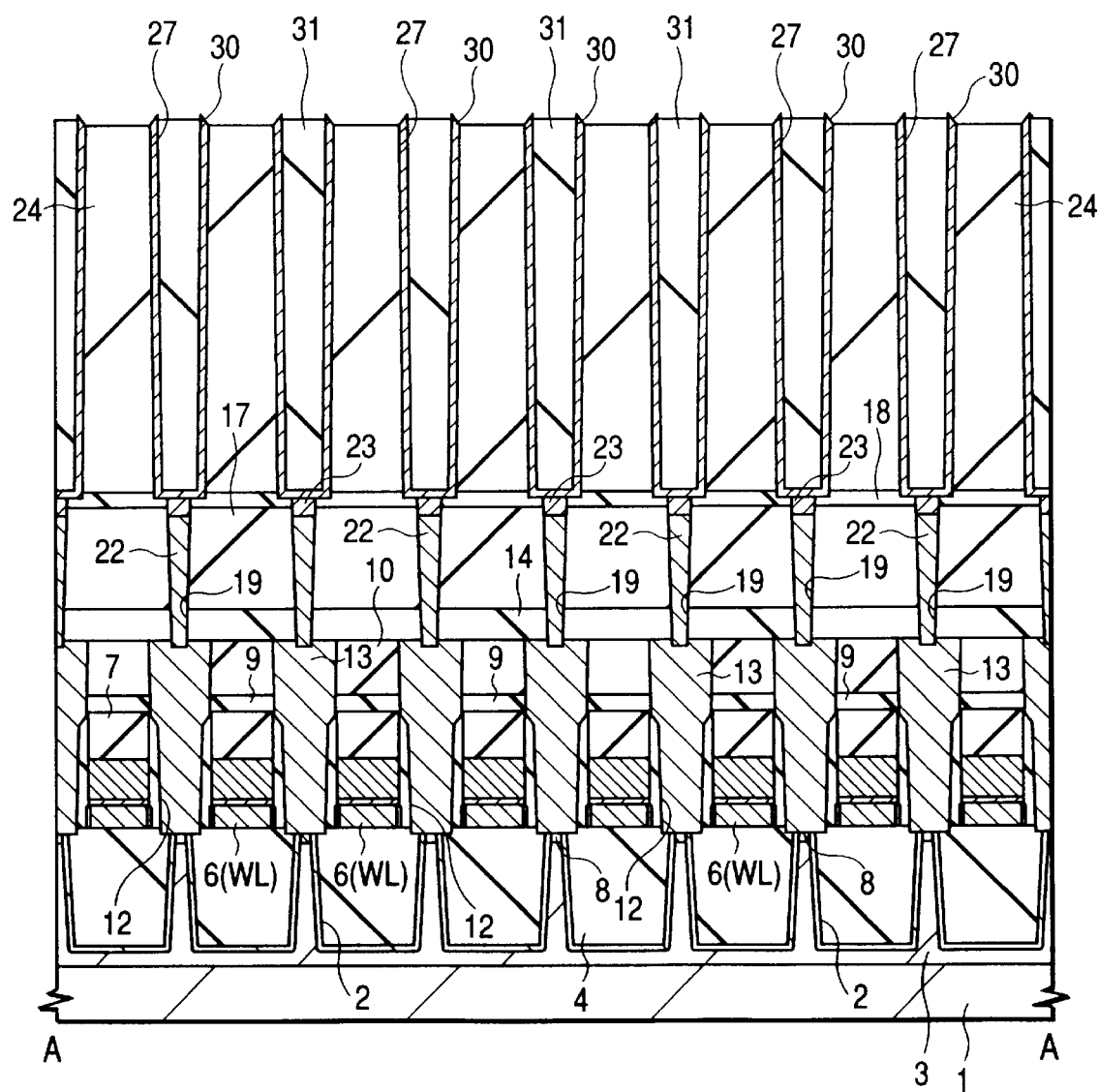
FIG. 80 is a fragmentary cross-sectional view of a semiconductor substrate illustrating the etched state of an Ru film by Ar sputter etching.

Even in such a case, as illustrated in FIG. 78, dry etching with ozone could remove the Ru film 30 outside the hole 27 while hardly etching the photoresist film 31 embedded in the hole 27. Ion assist etching, on the other hand, completely removed the photoresist film 31 from the inside of the hole 27 and also the Ru film 30 from the bottom surface of the hole 27 upon removal of the Ru film 30 outside the hole 27, as illustrated in FIG. 79. Furthermore, the Ru film 30 on the side walls of the hole 27 became thinner. Ar sputtering needed longer hours (about 8 times longer than that of etching with ozone) for the removal of the Ru film 30 and, as illustrated in FIG. 80, formed was a projection on the Ru film 30 at the upper end of the hole 27.

In each case, as described above, dry etching with ozone made it possible to remove the Ru film 30 outside the hole 27 at a high rate without etching the photoresist film 31 protecting the Ru film 30 inside (side walls and the bottom surface) of the hole 27.

Figure 81:
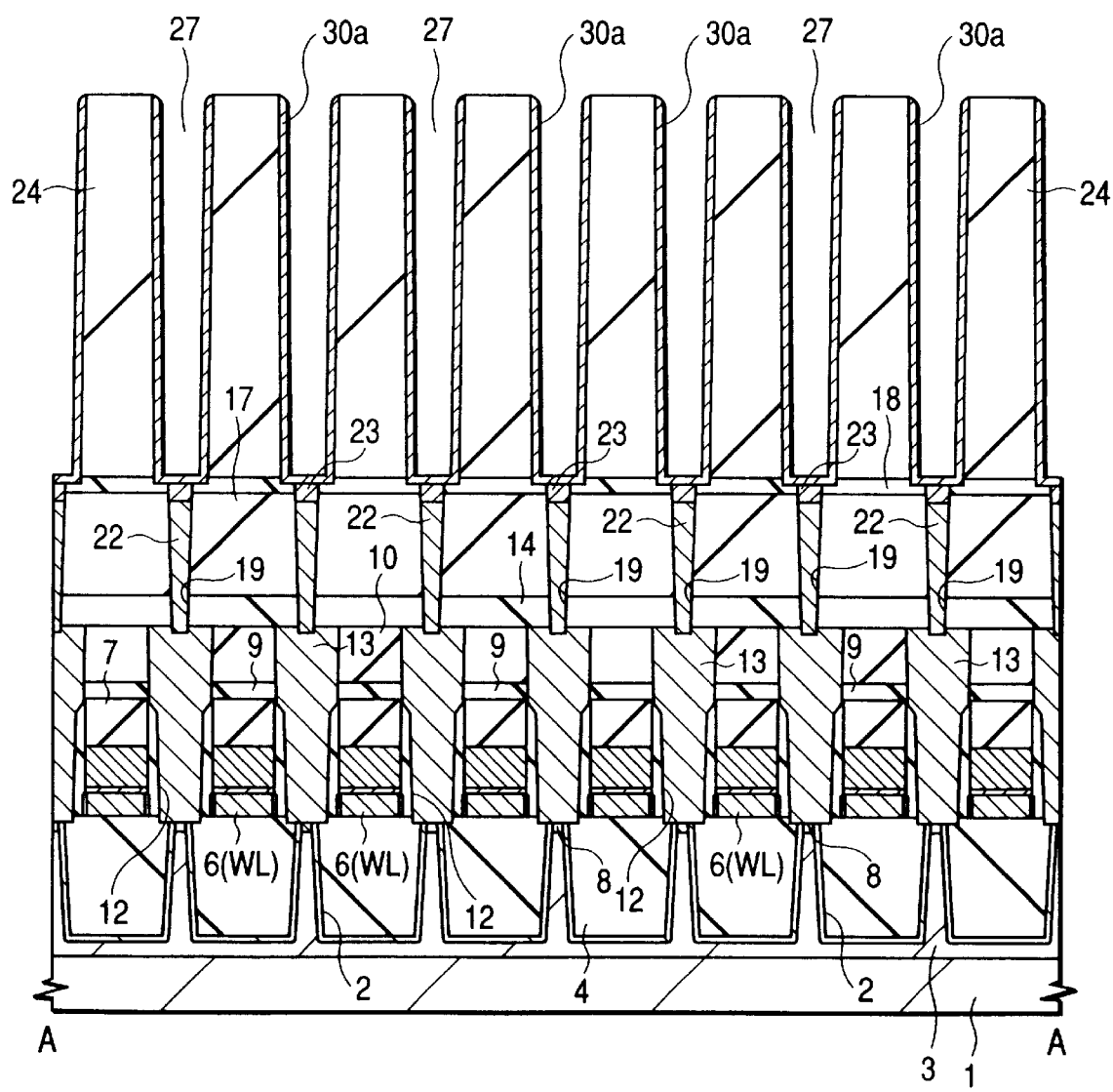
FIG. 81 is a fragmentary cross-sectional view of a semiconductor substrate illustrating the method of manufacture of a DRAM according to one embodiment of the present invention.
Figure 82:
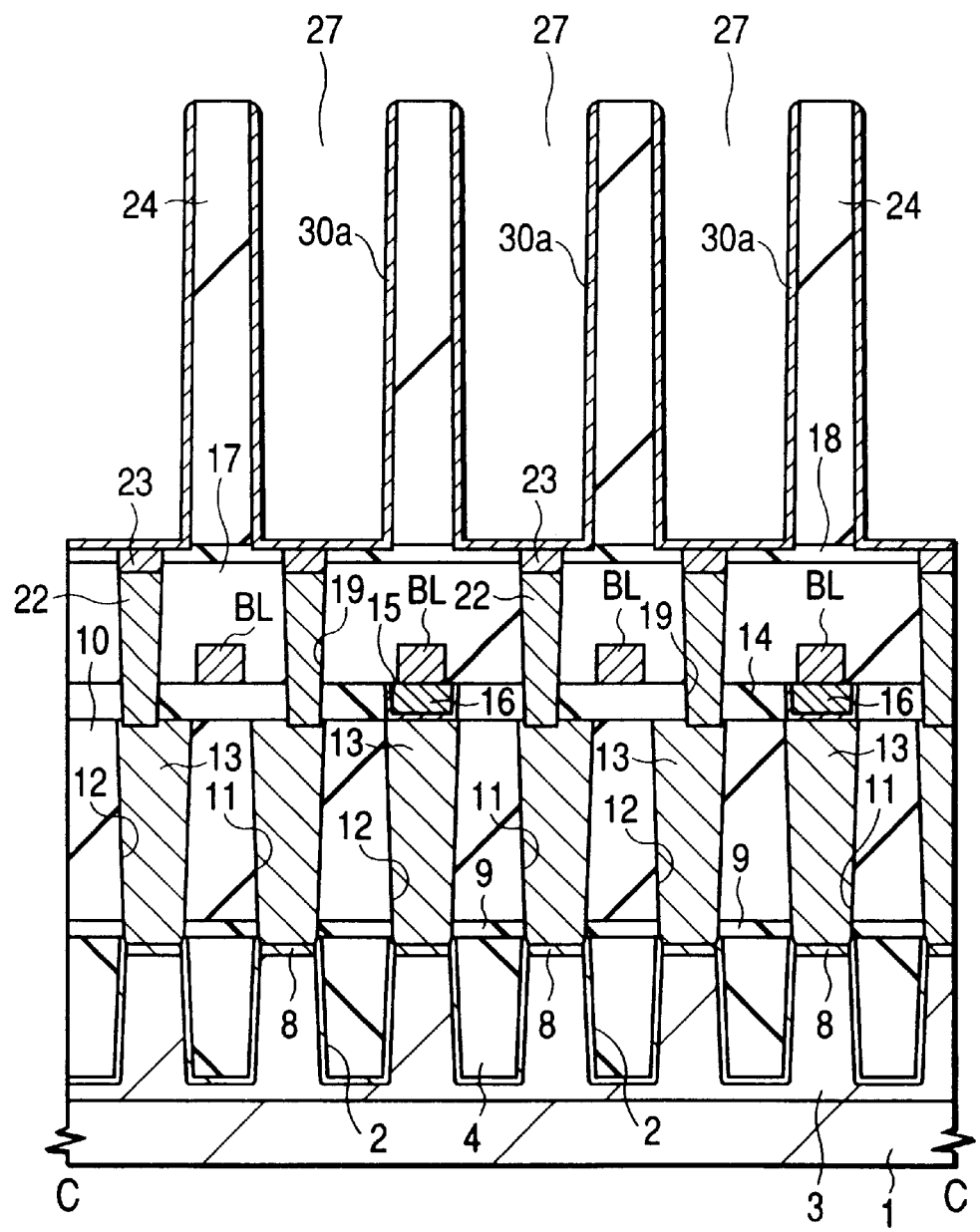
FIG. 82 is a fragmentary cross-sectional view of a semiconductor substrate illustrating the method of manufacture of a DRAM according to one embodiment of the present invention.

As illustrated in FIGS. 81 and 82, the photoresist film 31 inside of the hole 27 was removed by ashing with an oxygen radical, whereby a lower electrode 30 made of the Ru film 30 was formed on the side walls and the bottom surface of the hole 27. At this time, ashing of the photoresist film 31 at a temperature as high as 200 to 250° C. makes it possible to prevent a thickness decrease of the Ru film 30. The photoresist film 31 can be ashed by an apparatus, such as a plasma ashing apparatus or barrel type ashing apparatus.

Figure 83:
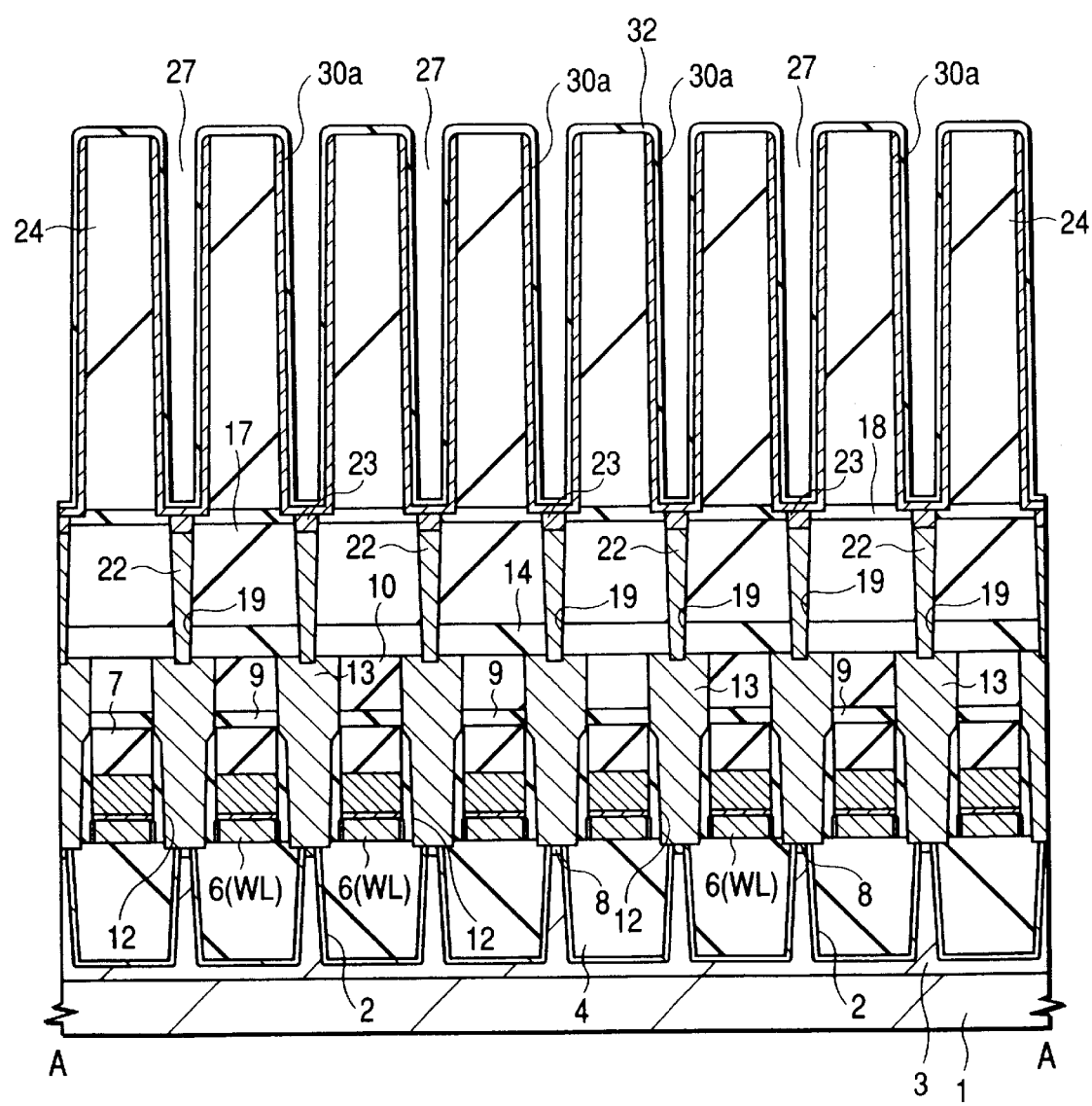
FIG. 83 is a fragmentary cross-sectional view of a semiconductor substrate illustrating the method of manufacture of a DRAM according to one embodiment of the present invention.
Figure 84:
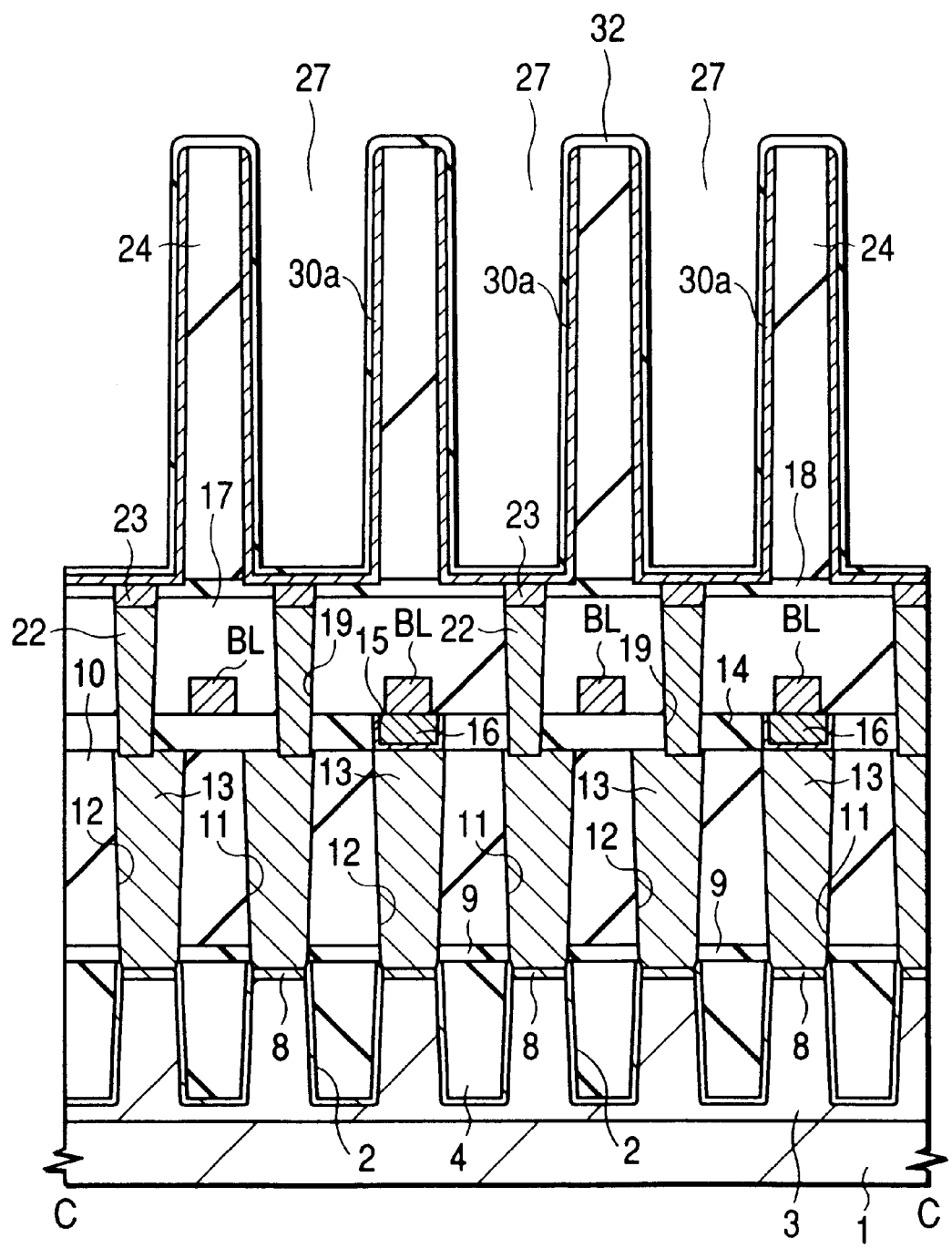
FIG. 84 is a fragmentary cross-sectional view of a semiconductor substrate illustrating the method of manufacture of a DRAM according to one embodiment of the present invention.

As illustrated in FIGS. 83 and 84, a BST film 32, which is to be a capacitor insulating film, was then deposited inside of the hole 27, which had the lower electrode 30a formed therein, and over the silicon oxide film 24. The BST film 32 was deposited by CVD to give a film thickness of about 20 nm. The capacitor insulating film can be formed of, not only the above-described BST film 32, but also of a high dielectric substance (ferroelectric substance) made of a perovskite-type metal oxide such as $BaTiO_3$ (barium titanate), $PbTiO_3$ (lead titanate), PZT ($PbZr_xTi_{1-x}O_3$), PLT ($PbLa_xTi_{1-x}O_3$) or PLZT.

Figure 85:
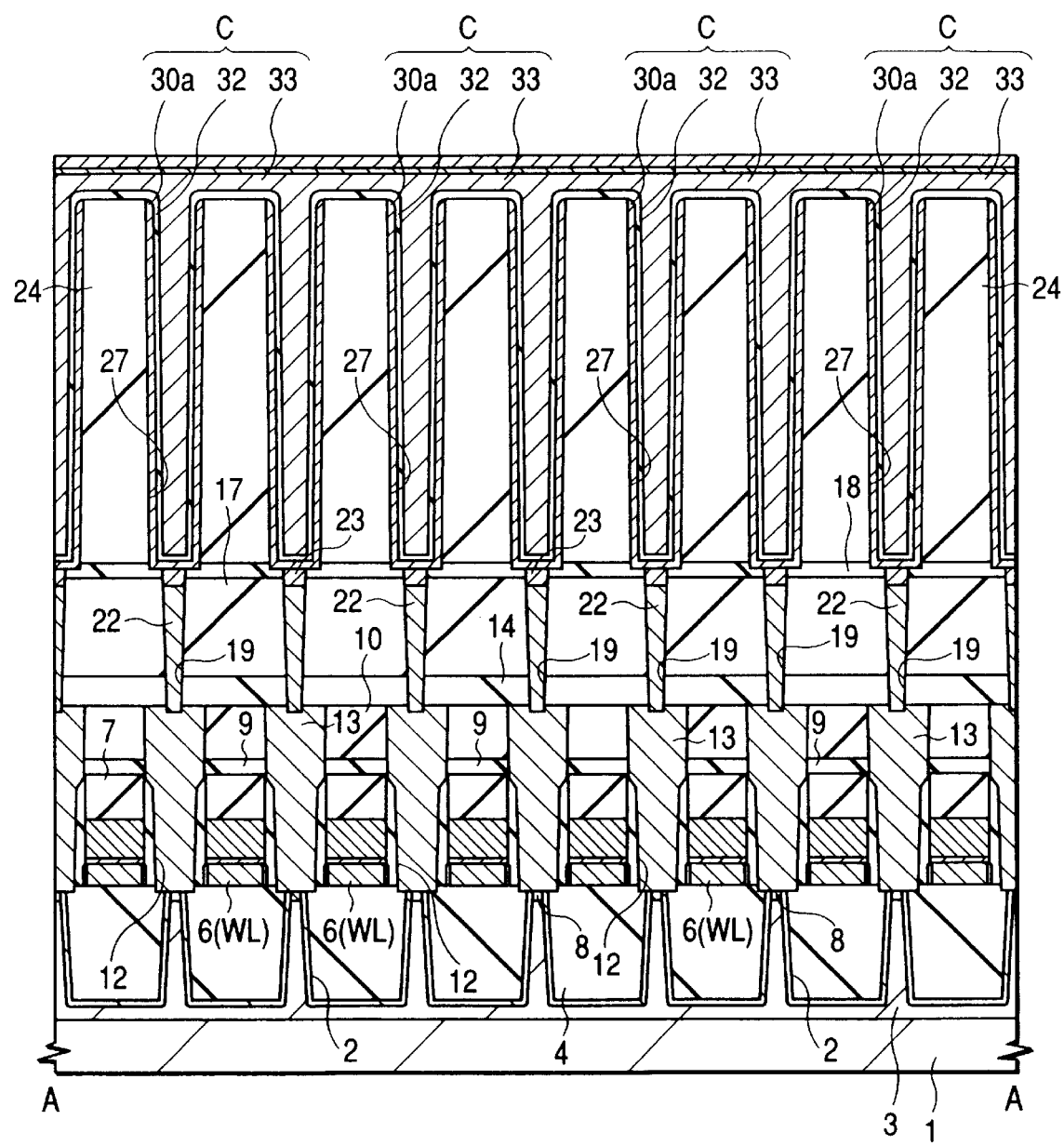
FIG. 85 is a fragmentary cross-sectional view of a semiconductor substrate illustrating the method of manufacture of a DRAM according to one embodiment of the present invention.

After heat treating (annealing) the BST film 32 at about 700° C. in an oxygen atmosphere to repair the film from oxygen defects or the like, an upper electrode 33 is formed over the BST film 32, as illustrated in FIG. 85. The upper electrode 33 is formed, for example, by depositing an Ru filrd (about 70 nm thick), a TiN film (about 30 nm thick) and a W film (about 100 nm thick) over the BST film 32 by CVD or sputtering and, then, removing these films from a region other than the memory array by dry etching using a photoresist film (not illustrated) as a mask. The W film serves to reduce the contact resistance between the upper electrode 33 and the upper metallization, while the TiN film serves to prevent a resistance increase due to diffusion of gases (such as oxygen and hydrogen) from the capacitor insulating film (BST film 32) to the W film.

By the steps so far described, an information storage capacitor C constituted of the lower electrode 30a made of the Ru film 30, the capacitor insulating film made of the BST film 32 and the upper electrode 32 made of the W film, TiN filmland Ru film is completed, and the memory cell of a DRAM constituted of memory cell selecting MISFETQs and information storage capacitor C connected in series therewith is substantially completed.

Over the information storage capacitor C, two Al interconnection layers or so are formed with an interlayer insulating film sandwiched therebetween, and a passivation film is then formed over the uppermost Al layer, but they are not illustrated.

As described in detail, the present embodiment makes it possible to form, with a good yield, the lower electrode of an information storage capacitor inside of the hole having a high aspect ratio, because an Ru film can be etched at a high rate, and, at the same time, the selectivity of it to a resist can be made markedly high.

Embodiment 2

In this Embodiment, a description will be given of the constitution of a capacitor insulating film of an information storage capacitor made from $Ta_2O_5$ (tantalum oxide).

As a capacitor insulating material for an information storage capacitor, $Ta_2O_5$, one of non-perovskite type high dielectric substances has conventionally been used. It is has an advantage in that, compared with tertiary dielectric materials, such as BST, a perovskite-type high dielectric substance, the characteristics thereof can be controlled easily. Although the dielectric constant of BST is 50 or greater, that of $Ta_2O_5$ is 20 to 25. It is therefore necessary to increase the surface area of the lower electrode in order to keep its storage charge amount equal to that of a memory cell of the same size having a capacitor insulating film made of BST. In other words, a hole (recess) having an Ru film deposited on the side walls and bottom surface thereof must have an aspect ratio of 12 or greater, preferably 15 or greater, more preferably 20 or greater, when a capacitor structure having a lower electrode formed on the side walls and bottom surface of the hole is adopted as Embodiment 1.

Next, the results of investigation made by the present inventors on a method of removing a lower electrode material from a silicon oxide film outside a hole without exposing the bottom surface of the lower electrode material (Ru film) deposited on the bottom surface of the hole having a markedly high aspect ratio exceeding 30 will be described.

First, ion assist etching by an oxygen-chlorine gas mixture containing about 10% of chlorine was investigated. Methods of calculating the ion flux and radical flux on the bottom surface of the hole by ion assist etching will next be described with reference to FIGS. 86 and 87.

As illustrated in FIG. 86, the ion flux (Fi) on the bottom surface of the hole was calculated as a function of Ø(P), which is a function of gas pressure, and an aspect ratio (r) of the hole. Ø(P) is an incident angle of ions. With an increase in the gas pressure, the angle becomes larger owing to scattering due to collision of ions, resulting in a decrease in ion flux reaching the bottom of the hole. As illustrated in FIG. 87, on the other hand, an oxygen radical flux (Fr) on the bottom surface of the hole was calculated as a function of an adsorption coefficient (C1) of the radical against side walls of the hole, the adsorption coefficient (C2) of the radical against the bottom surface, and the aspect ratio (r) of the hole. In ion assist etching, the etching of the Ru film proceeds by oxygen radicals excited by ion energy so that the etching rate of the Ru film on the bottom of the hole can be calculated as the multiplication product of the ion flux (Fi) and radical flux (Fr).

Figure 88:
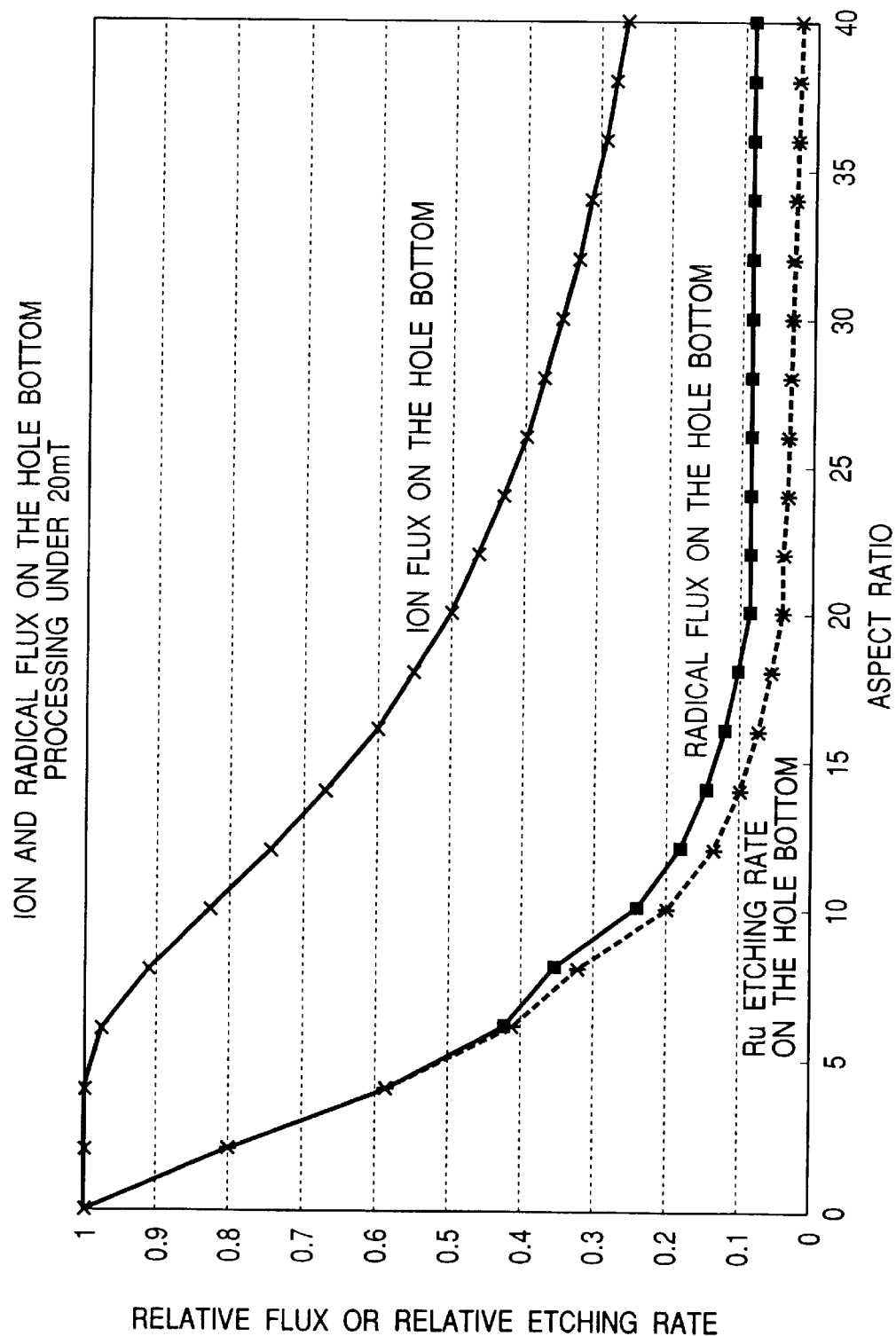
FIG. 88 is a graph illustrating the dependence, on the aspect ratio, of relative ion flux, relative radical flux and relative etching rate, on the bottom of a hole.

FIG. 88 is a graph illustrating the dependence, on the aspect ratio, of relative ion flux, relative radical flux and relative etching rate at a gas pressure of 20 mTorr. In the case of a hole having an aspect ratio of about 30, the ion flux on the hole bottom is about 0.4, the radical flux on the hole bottom is about 0.1 and therefore the etching rate, that is, the multiplication product thereof, becomes 0.1 or less. The etching rate of the Ru film at the hole bottom is reduced to several % of that at the upper part of the hole.

Figure 89:
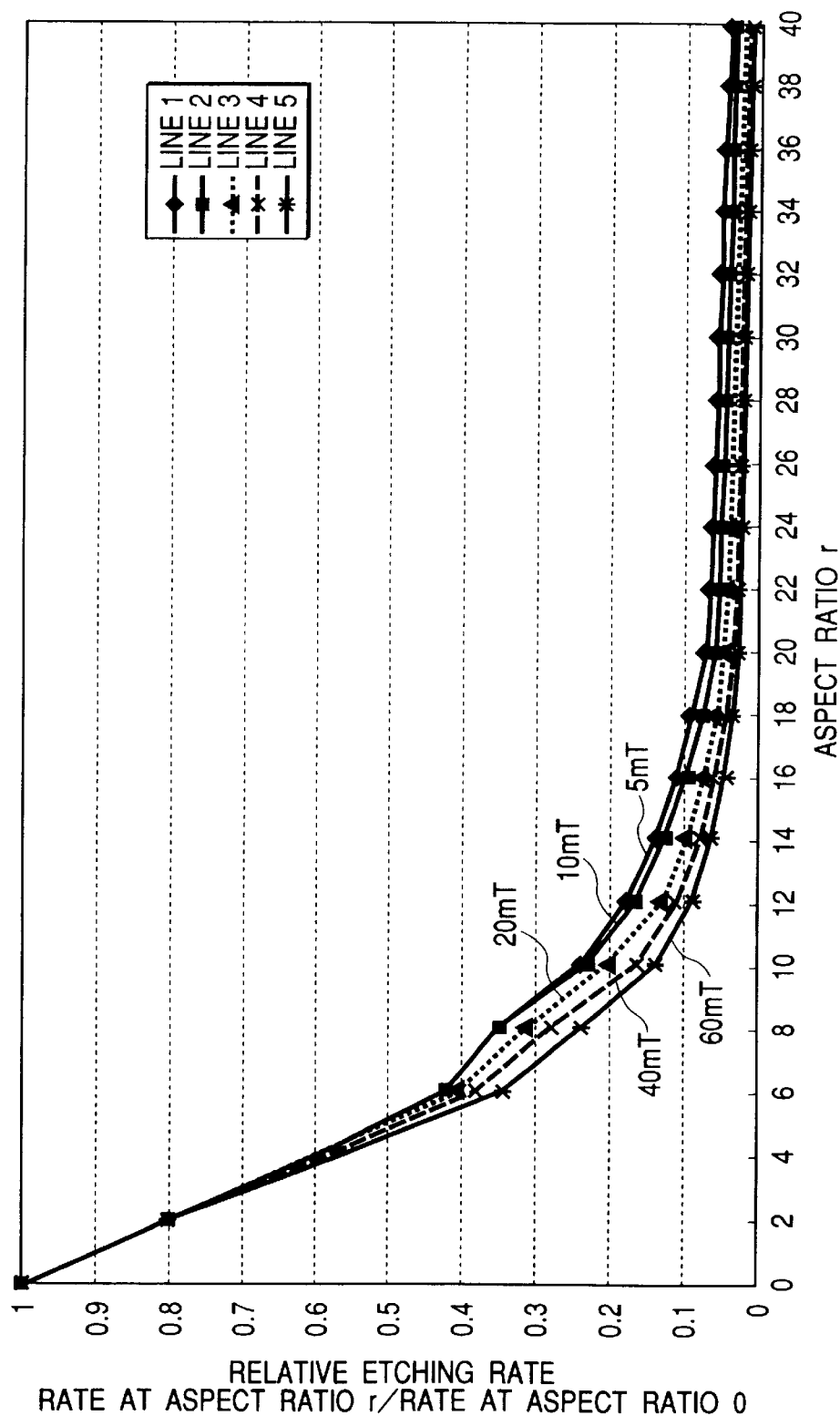
FIG. 89 is a graph illustrating the dependence, on the aspect ratio, of a relative etching rate of an Ru film at the bottom of a hole.

FIG. 89 is a graph illustrating the dependence, on the aspect ratio, of the relative etching rate of an Ru film on the hole bottom at varied gas pressures from 5 mTorr to 60 mTorr. As shown in the above calculation formula, the greater the gas pressure, the amount of ions reaching the bottom surface decreases, resulting in a reduction in the etching rate.

Figure 90:
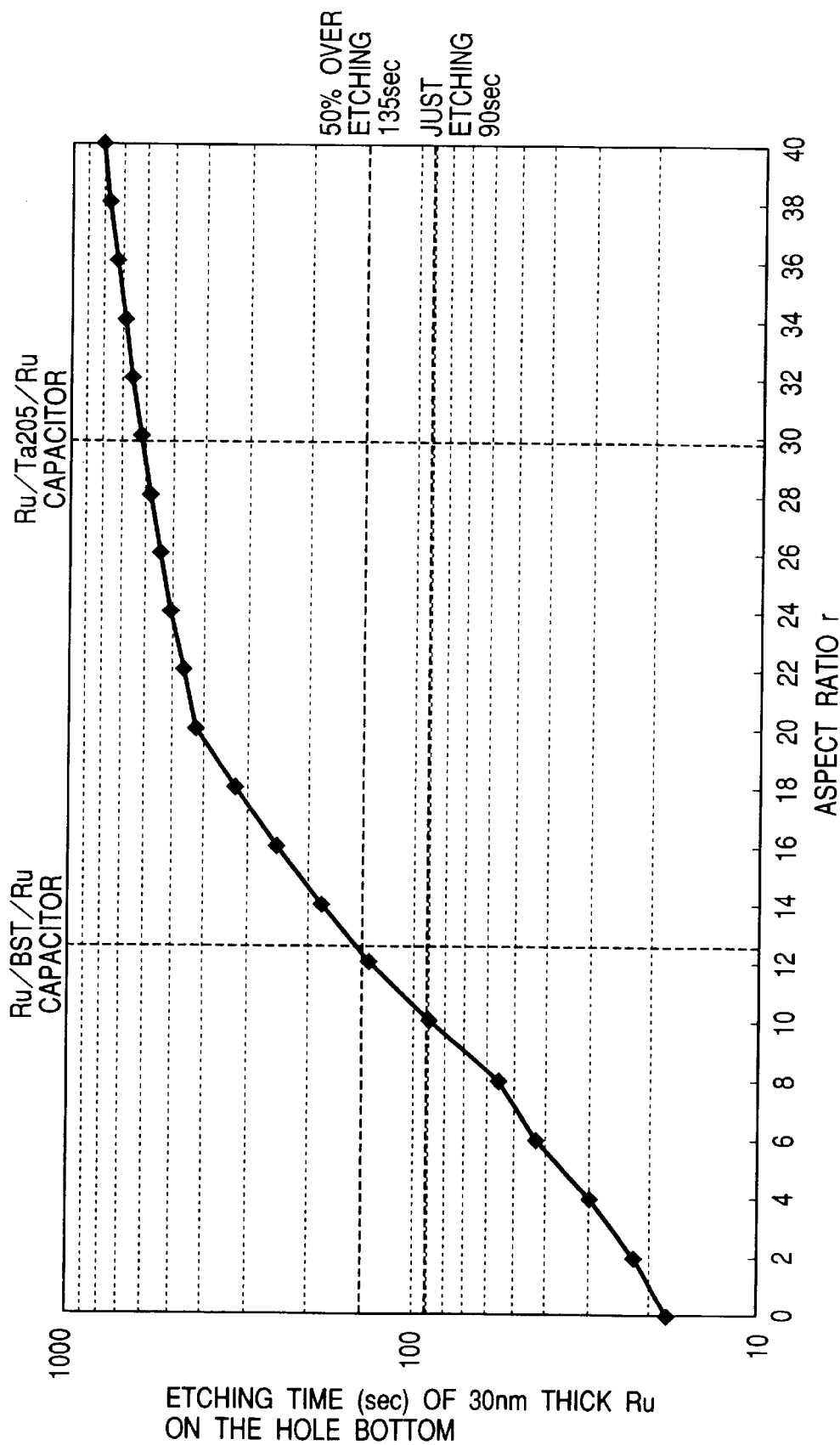
FIG. 90 is a graph illustrating the dependence, on the aspect ratio, of the etching time of an Ru film.
Figure 91:
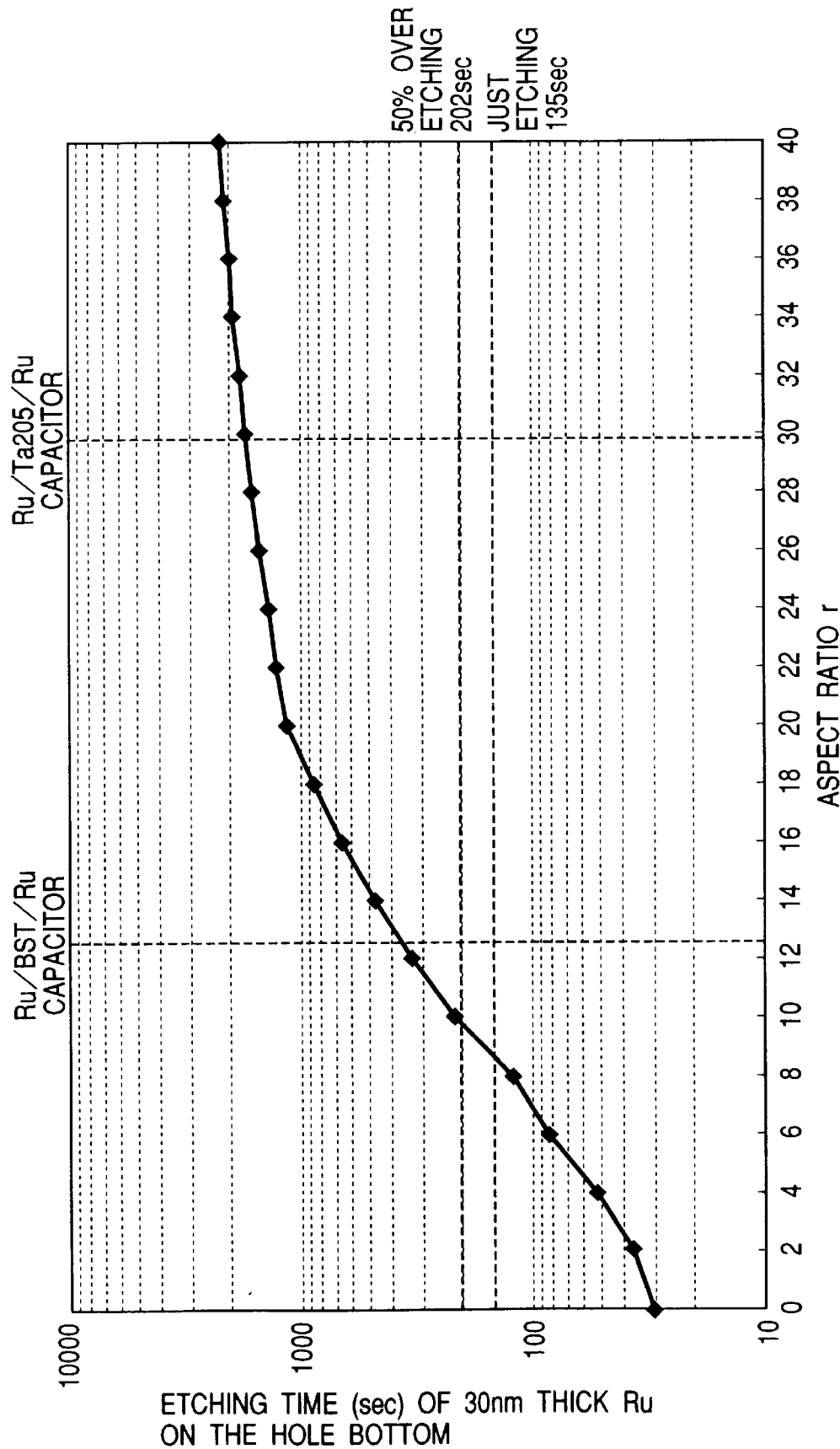
FIG. 91 is a graph illustrating the dependence, on the aspect ratio, of the etching time of an Ru film.
Figure 92:
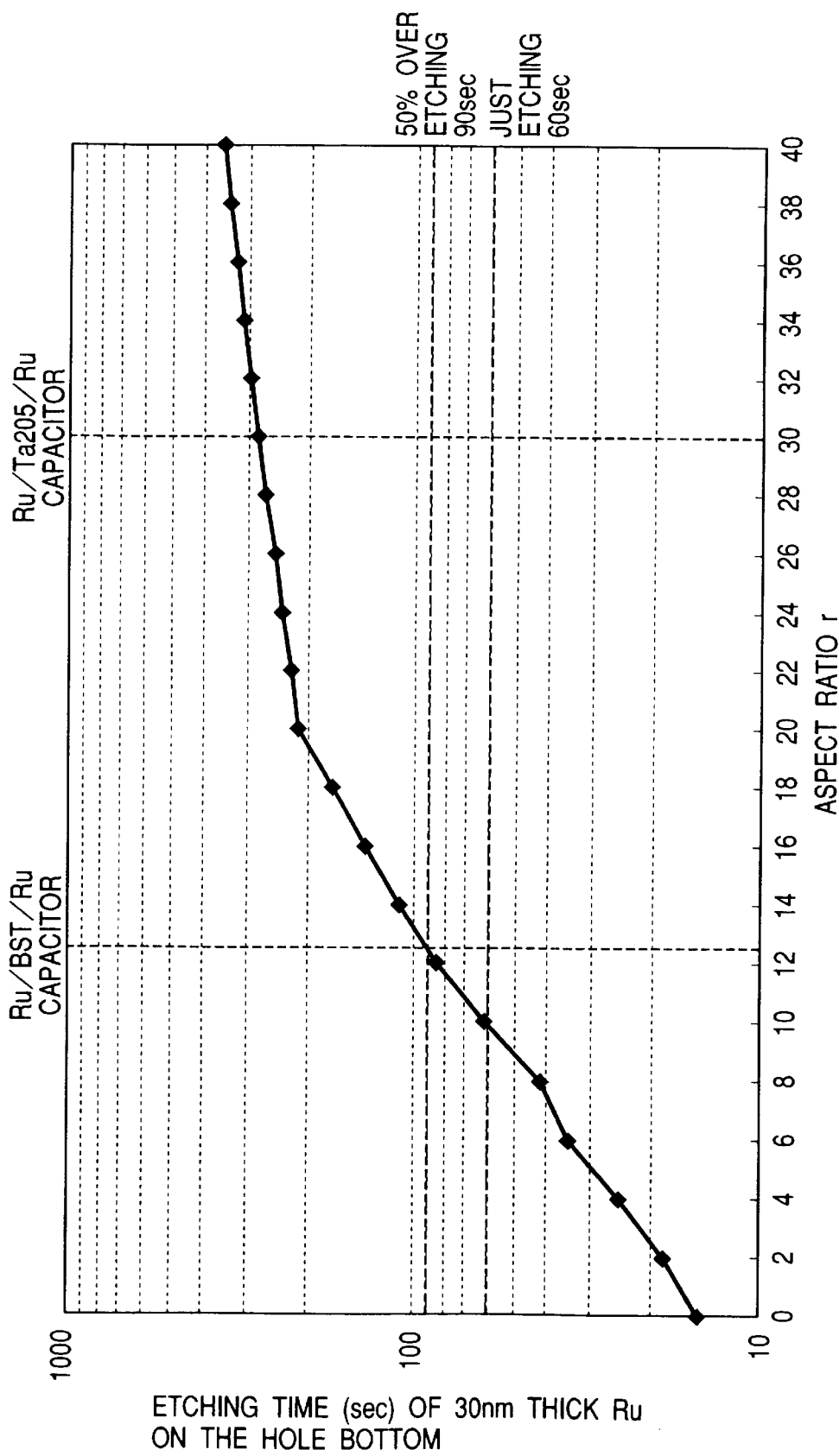
FIG. 92 is a graph illustrating the dependence, on the aspect ratio of the etching time of an Ru film.

FIGS. 90 to 92 are each a graph illustrating the dependence, on the aspect ratio, of the etching time of an Ru film deposited to 30 nm thick on the hole bottom. For example, the etching time of an Ru film deposited on the bottom surface of the hole having an aspect ratio of 29.5 is about 600 seconds (FIG. 90) at a gas pressure of 20 mtorr, about 1700 seconds (FIG. 91) at a gas pressure of 60 mtorr, and at about 280 seconds (FIG. 92) at a gas pressure of 5 mTorr. When an ordinarily-employed etching apparatus is used to etch the Ru film of 30 nm thick deposited over the flat silicon oxide film outside the hole, it takes 90 seconds for just etching and 135 seconds even for 50% over etching, revealing that, in the case of a hole having an aspect ratio of about 30, which is a requirement upon use of $Ta_2O_5$ as a capacitor insulating film, the Ru film outside the hole can be removed without removing the Ru film on the hole bottom by ion assist etching.

The etching time of the Ru film deposited on the bottom surface of a hole having an aspect ratio of 12.4 is almost similar to that spent for the etching of an Ru film of the same thickness deposited outside the hole (FIGS. 90 to 92), showing that by ion assist etching, it is difficult to remove the Ru film outside the hole without removing the Ru film on the hole bottom when, as in Embodiment 1, a capacitor insulating film made of BST is used and the hole has an aspect ratio of about 12. In other words, in the case of a hole having an aspect ratio of 12 or greater, ozone etching, as described in Embodiment 1, using a photoresist film as an etching mask, is suited for removal of the Ru film outside the hole without removing the Ru film on the hole bottom.

Figure 93:
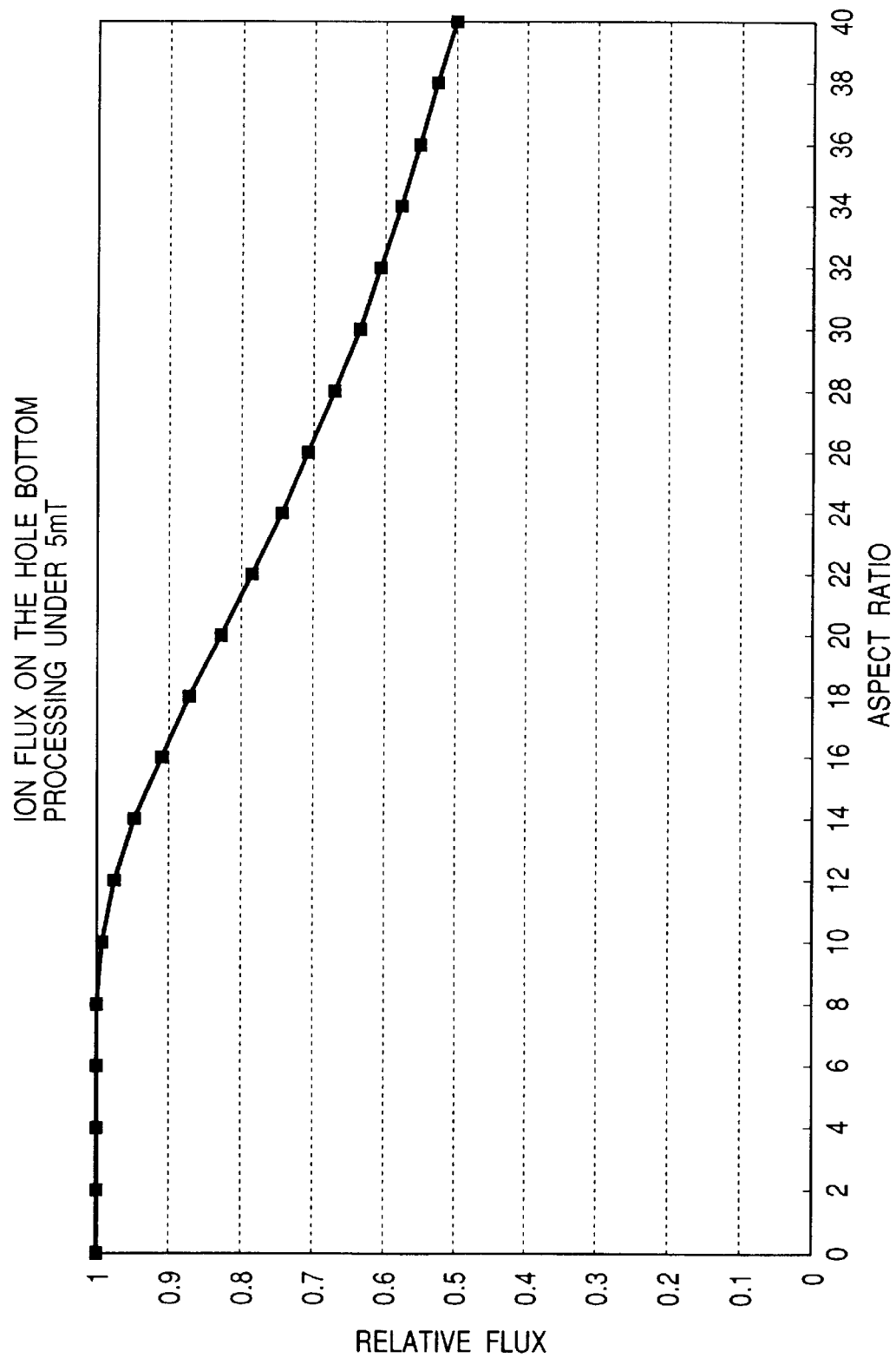
FIG. 93 is a graph illustrating the dependence, on the aspect ratio, of the relative ion flux on the bottom of a hole.
Figure 94:
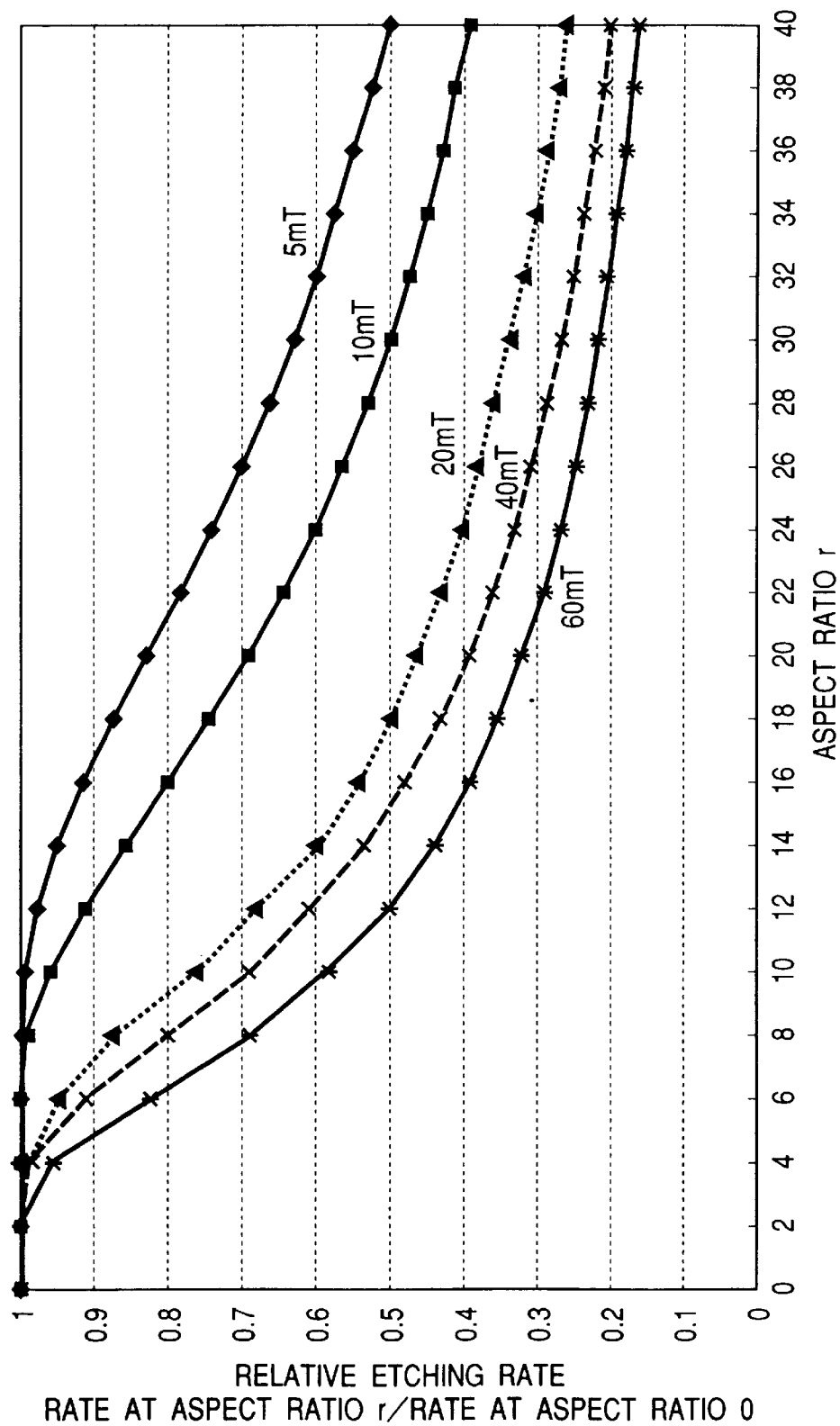
FIG. 94 is a graph illustrating the dependence, on the aspect ratio, of the relative etching rate on the bottom of a hole.
Figure 95:
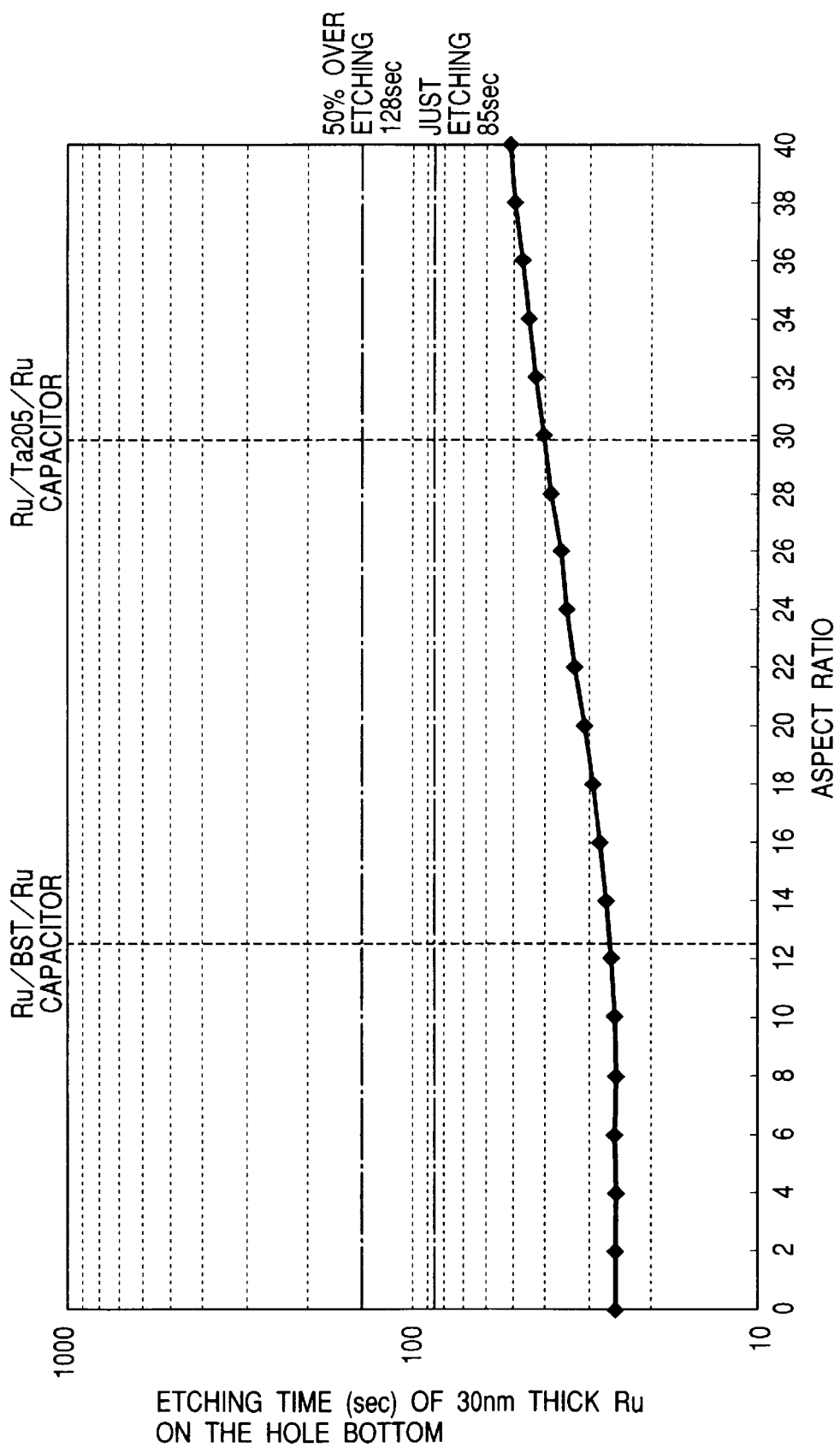
FIG. 95 is a graph illustrating the dependence, on the aspect ratio, of the etching time of an Ru film.
Figure 96:
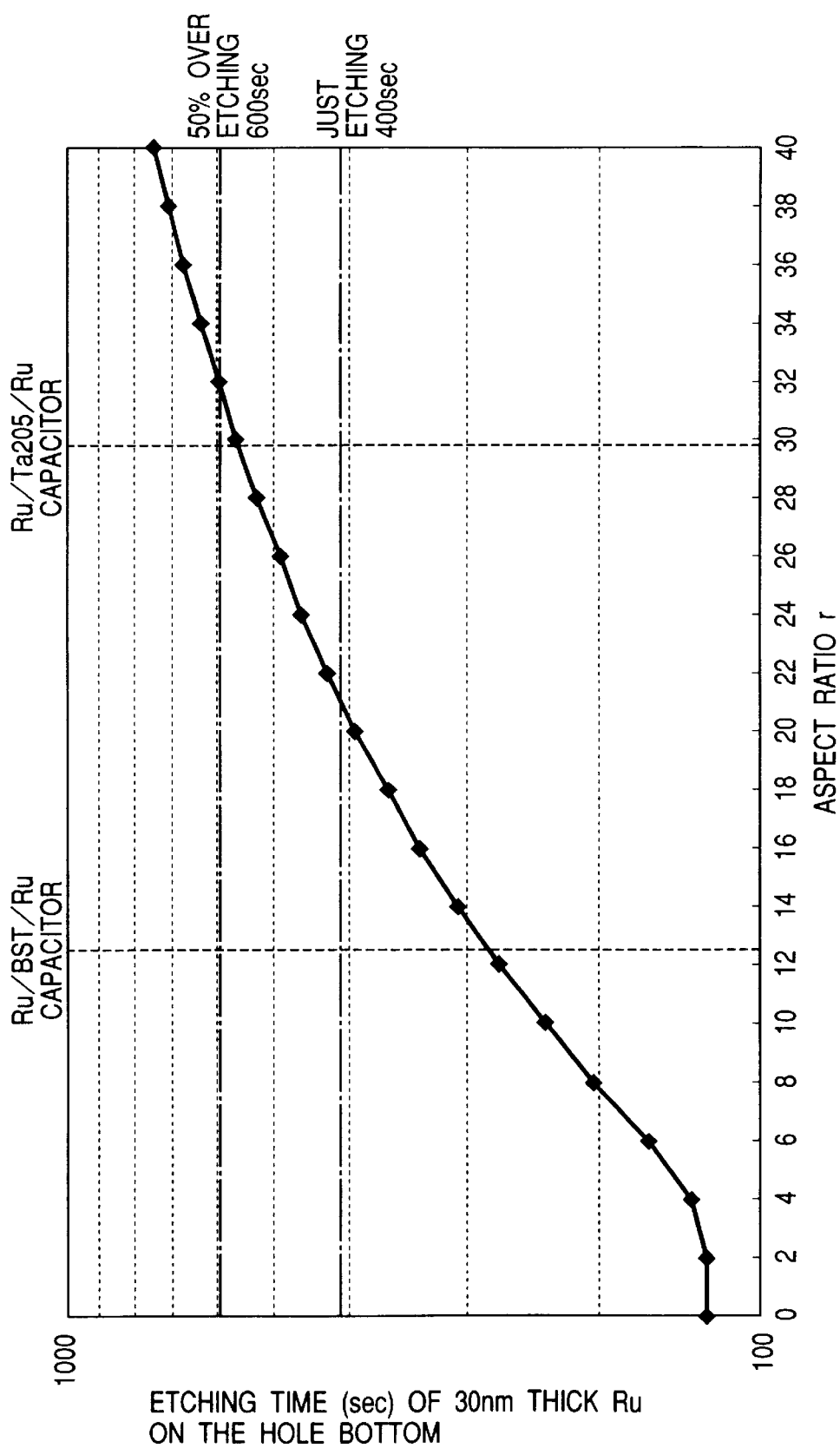
FIG. 96 is a graph illustrating the dependence, on the aspect ratio, of the etching time of an Ru film.

Next, etching of an Ru film by Ar sputtering was investigated. FIG. 93 is a graph illustrating the dependence, on the aspect ratio, of relative ion flux at a gas pressure of 5 mTorr; FIG. 94 is a graph illustrating the dependence, on the aspect ratio, of the relative etching rate at varied gas pressures from 5 mTorr to 60 mTorr; and FIGS. 95 and 96 are each a graph illustrating the dependence, on the aspect ratio, of an etching time of a 30-nm thick Ru film deposited on the hole bottom.

As is apparent from FIG. 93, when a hole has an aspect ratio of about 30, the etching time of the Ru film deposited on the bottom surface of the hole is almost similar to that required for etching of the Ru film of the same thickness outside the hole. When a hole has an aspect ratio of about 12, the Ru film deposited on the bottom surface of the hole is etched earlier than that deposited outside the hole. This suggests that it is difficult to remove the Ru film outside the hole without removing the Ru film on the hole bottom by ion sputtering in either case where BST or $Ta_2O_5$ is used as a capacitor insulating film.

Judging from the above-described investigation results, it is possible to form, in a method of manufacture of a DRAM having a memory capacity of 256 Mbit (mega bit) to 1 Gbti (giga bit), a lower electrode made of Ru inside of a hole having a markedly high aspect ratio and to produce a capacitor structure using $Ta_2O_5$ as a capacitor insulating film by etching the Ru film by ion assist etching.

The process of formation of the information storage capacitor according to this Embodiment will next be described in the order of steps based on FIGS. 97 to 112.

Figure 97:
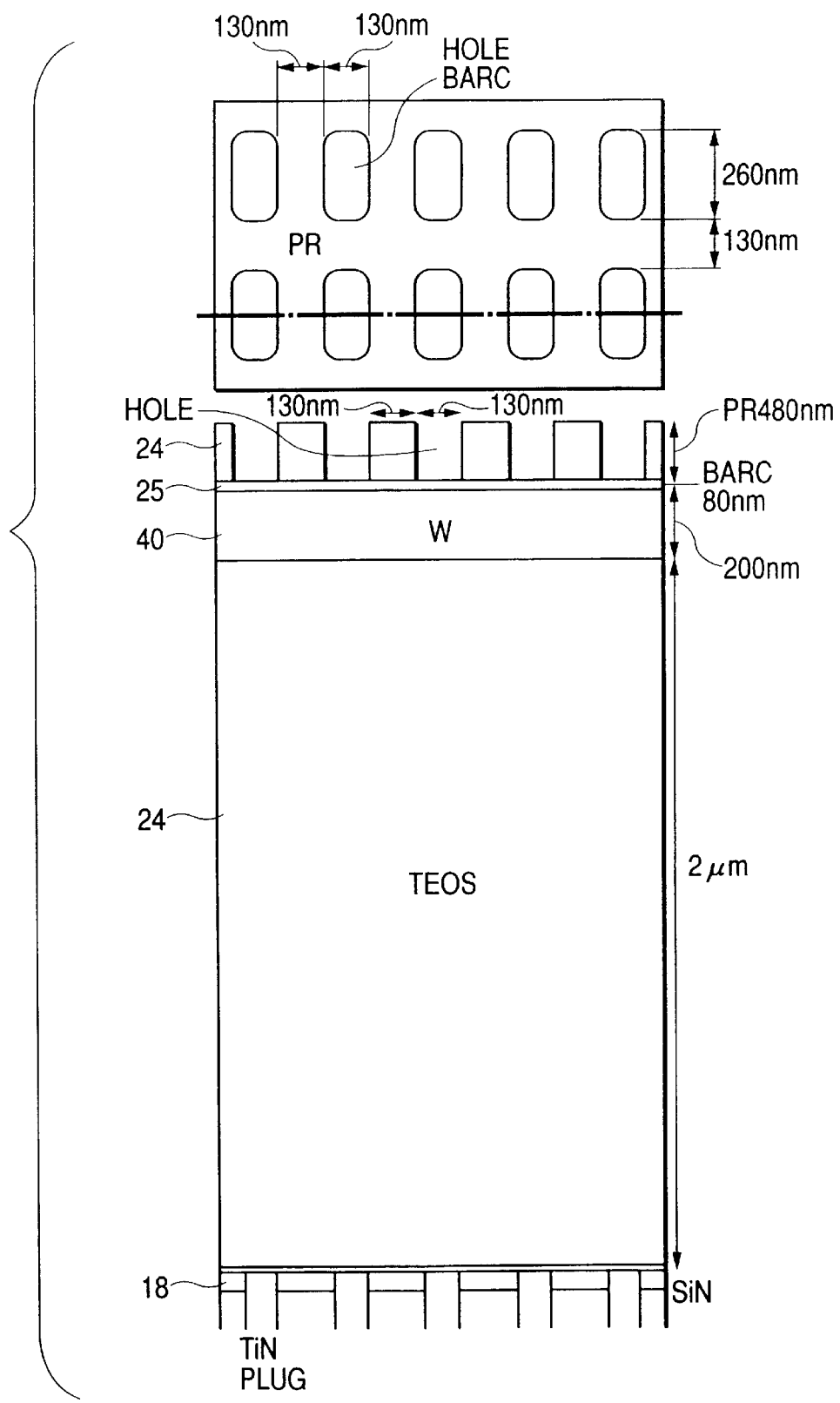
FIG. 97 is a fragmentary cross-sectional view of a semiconductor substrate illustrating the method of manufacture of a DRAM according to another embodiment of the present invention.

As illustrated in FIG. 97, a silicon oxide film 24 is deposited over the silicon nitride film 18 by the steps as illustrated in FIGS. 3 to 36 of Embodiment 1. The steps up to the formation of the silicon oxide film are almost the same as those of Embodiment 1, except that the thickness of the silicon oxide film 24 is adjusted to 2 μm (about 0.8 μm in Embodiment 1) in order to increase the aspect ratio of the hole to have a lower electrode formed therein to about 30. In this Embodiment, a W film 40 of about 200 nm thick is deposited over the silicon oxide film 24 by sputtering, followed by formation thereover of an antireflective film 25 (about 80 nm thick) by spin coating. A photoresist pattern 26 is then formed thereover.

Figure 98:
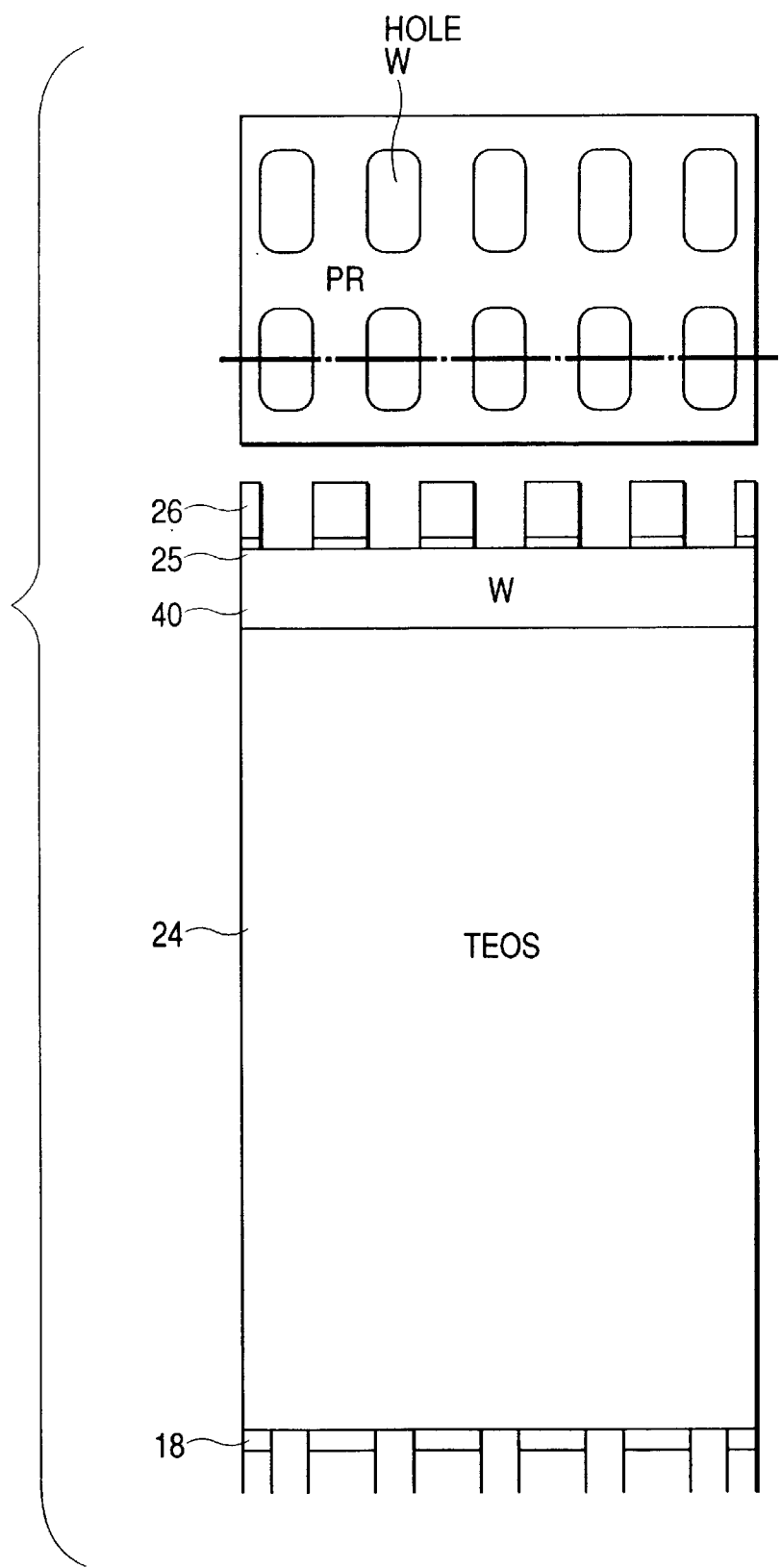
FIG. 98 is a fragmentary cross-sectional view of a semiconductor substrate illustrating the method of manufacture of a DRAM according to another embodiment of the present invention.

As illustrated in FIG. 98, using the photoresist pattern 26 as a mask, the antireflective film 25 lying thereunder is removed by dry etching. This etching is effected under conditions similar to those in Embodiment 1.

Figure 99:
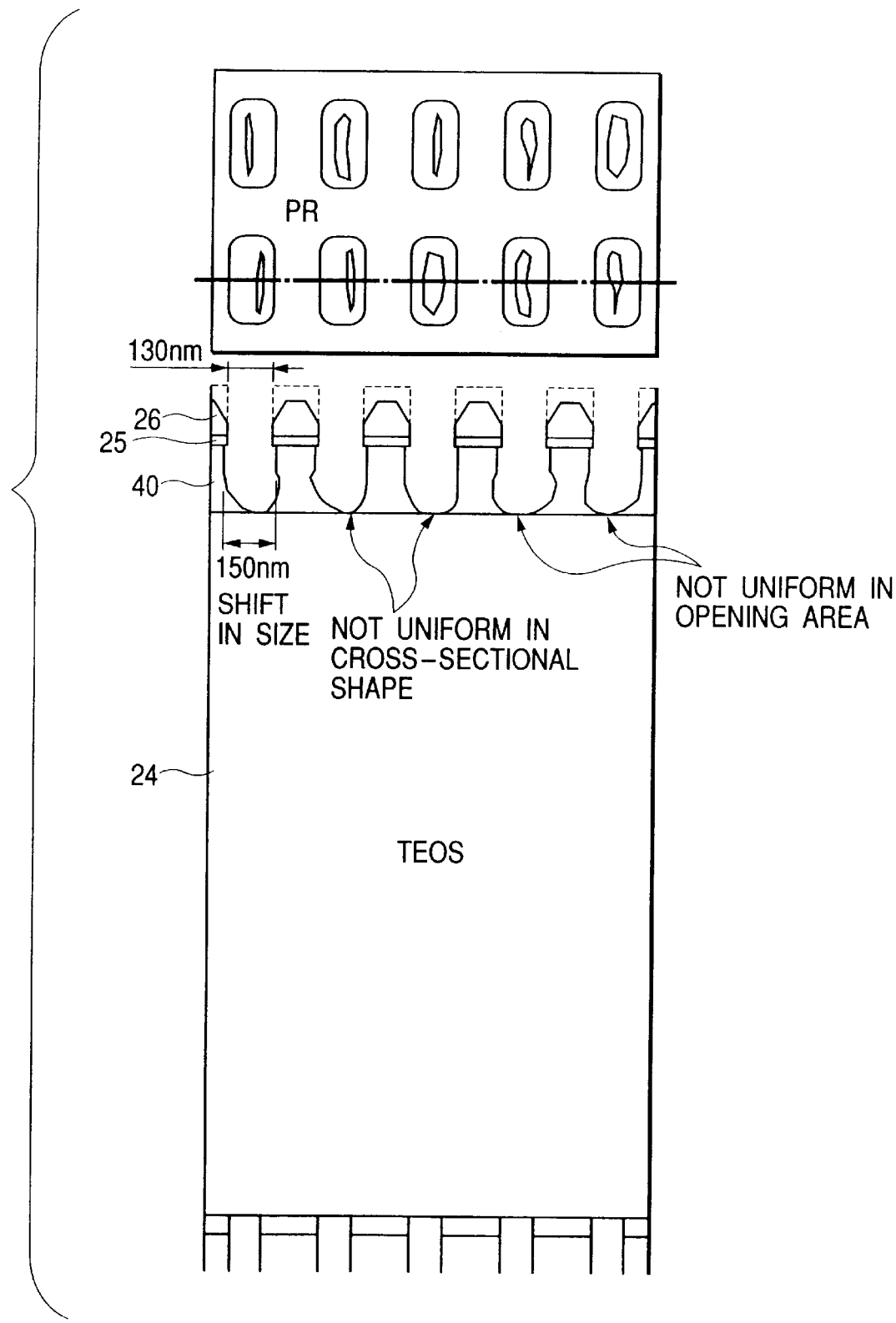
FIG. 99 is a fragmentary cross-sectional view of a semiconductor substrate illustrating the method of manufacture of a DRAM according to another embodiment of the present invention.

As illustrated in FIG. 99, using the photoresist pattern 26 as a mask, the W film 40 lying thereunder is dry etched to form a hard mask for the etching of the silicon oxide film 24. In this Embodiment, a W film, which is larger than a photoresist film in an oxide-film-relative selectivity, is used as an etching mask of the silicon oxide film 24, because the film thickness of the photoresist film decreases largely in the use of it as an etching mask for the silicon oxide film 24. As the etching mask of the silicon oxide film 24, inorganic member films having an oxide-film-relative selectivity of 4 or greater such as Mo (molybdenum) can be used, as well as W.

The W film 40 is dry etched, for example, by a microwave plasma etching apparatus under the conditions of a microwave power of 900 W, RF bias power of 45 W, $SF_6/Cl_2$ of 70/30 sccm (0.75 Pa) and a lower electrode (wafer stage) temperature of −50° C. This etching makes it possible to form hard masks not uniform in the opening area or cross-sectional shape.

Figure 100:
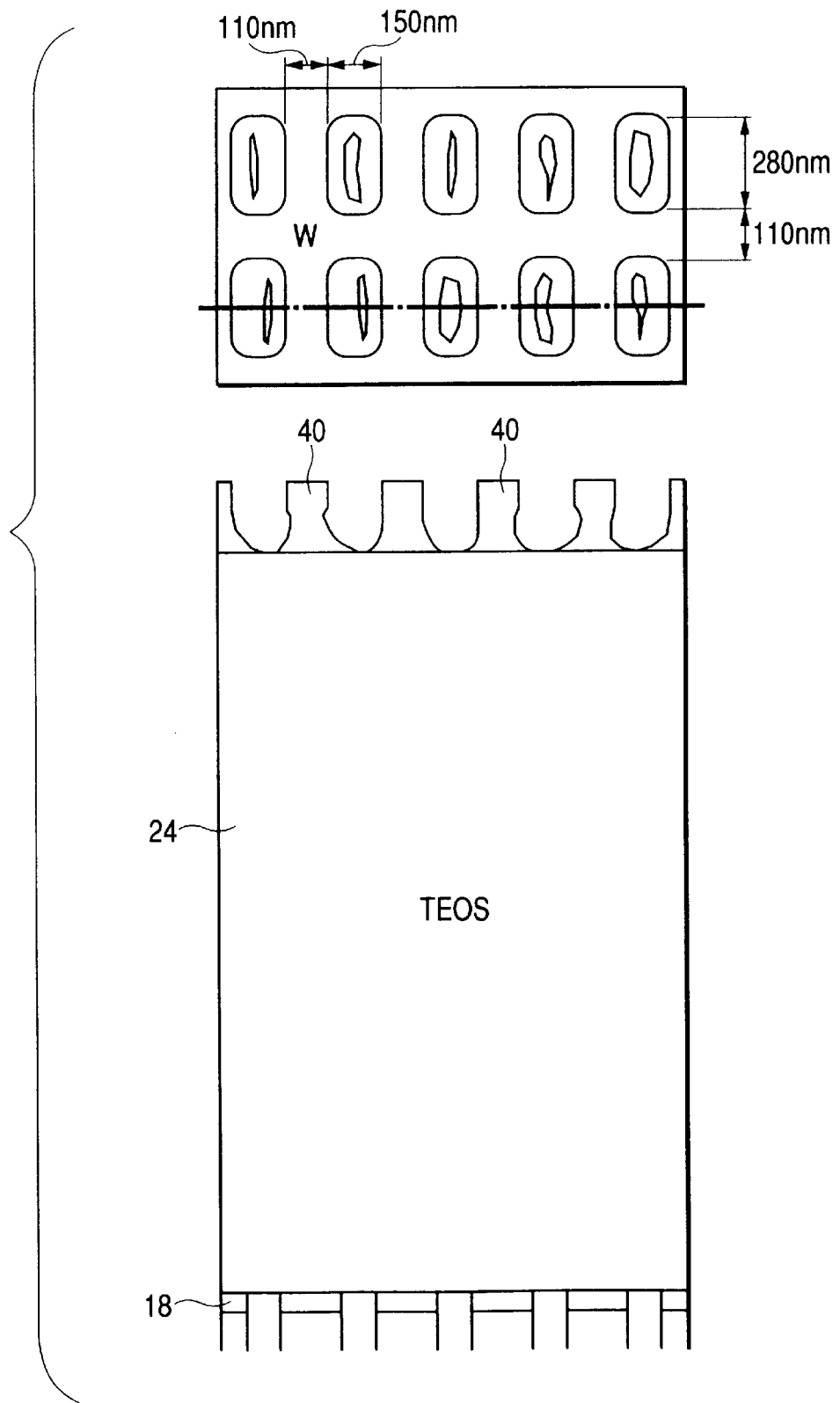
FIG. 100 is a fragmentary cross-sectional view of a semiconductor substrate illustrating the method of manufacture of a DRAM according to another embodiment of the present invention.
Figure 101:
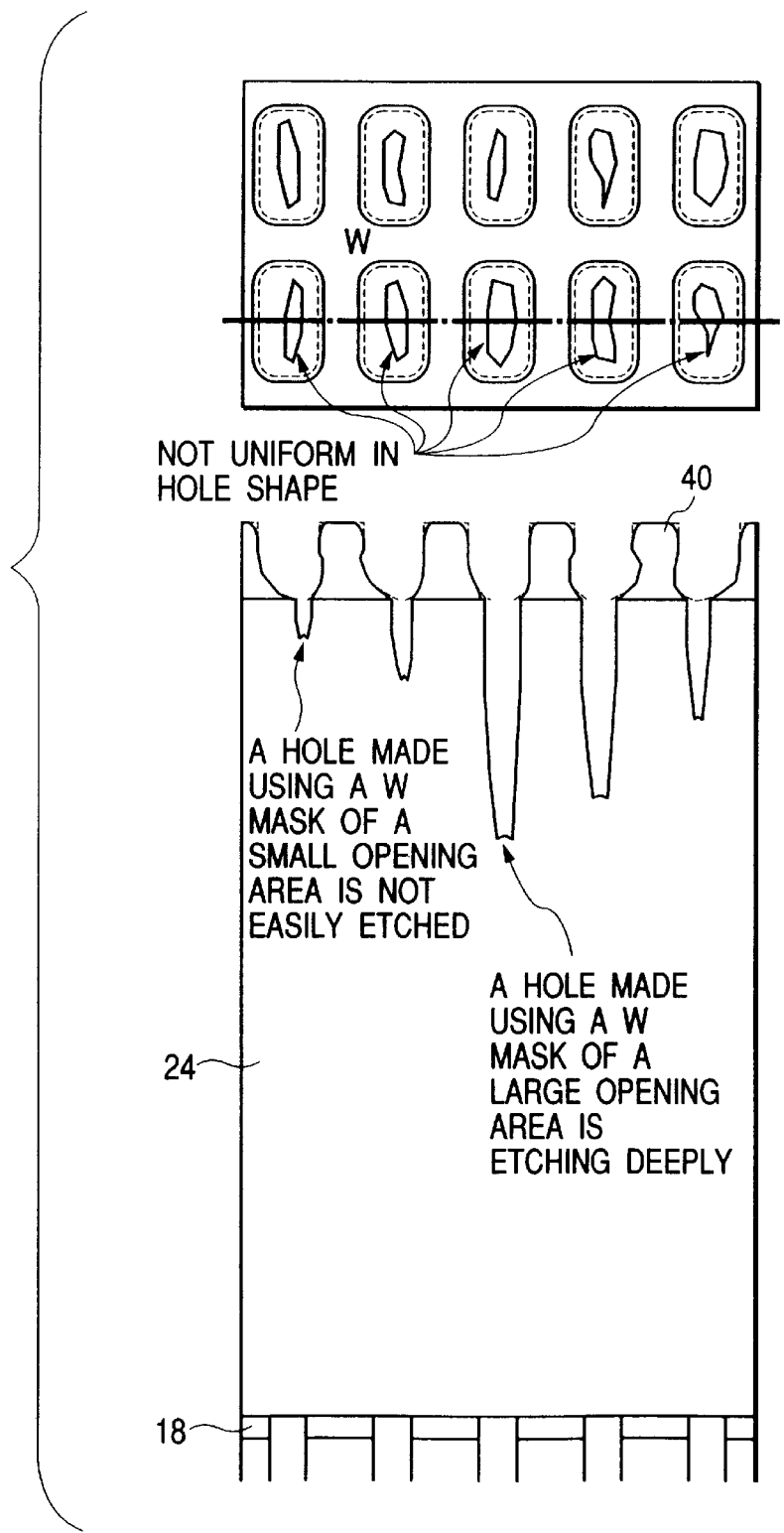
FIG. 101 is a fragmentary cross-sectional view of a semiconductor substrate illustrating the method of manufacture of a DRAM according to another embodiment of the present invention.
Figure 102:
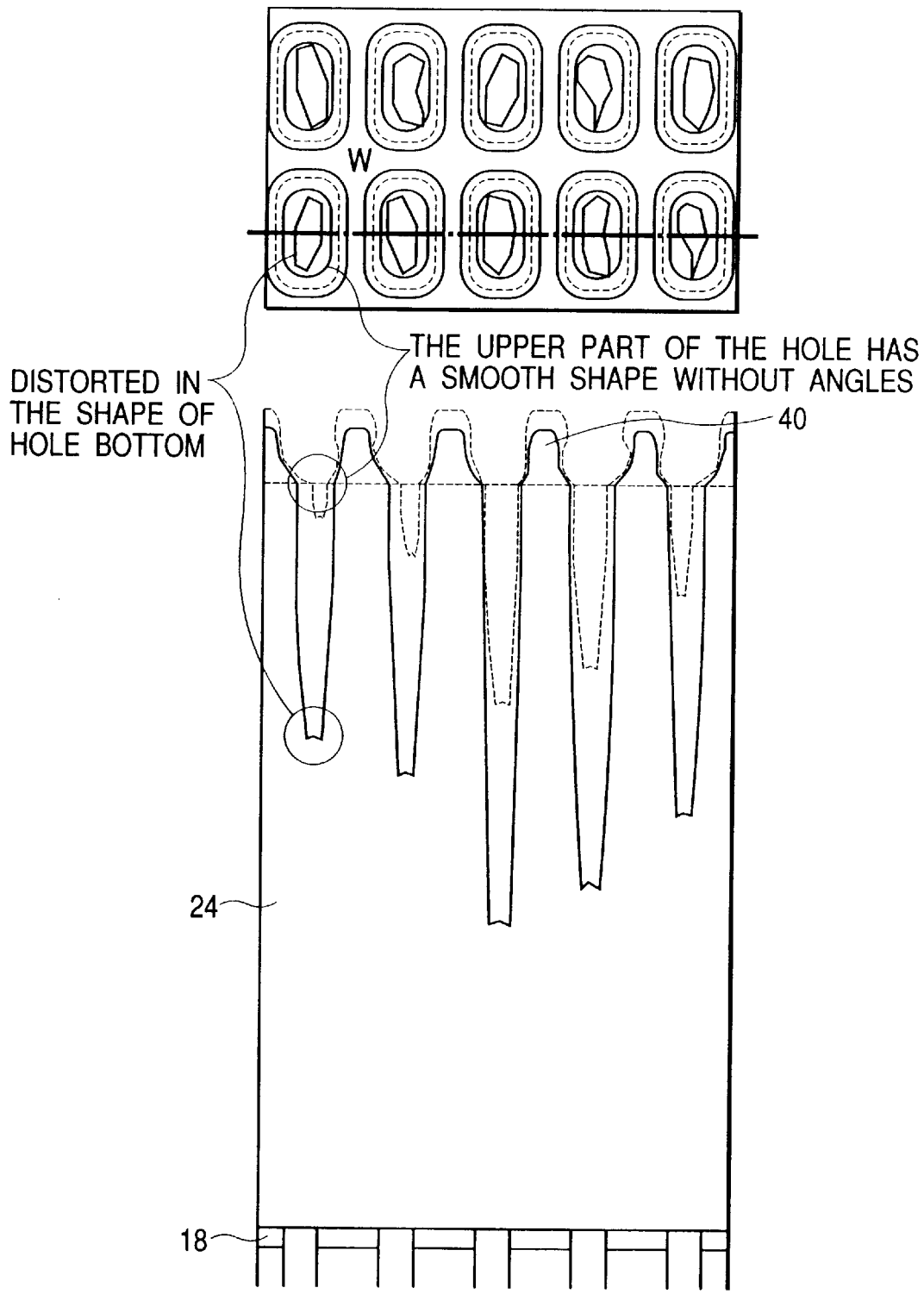
FIG. 102 is a fragmentary cross-sectional view of a semiconductor substrate illustrating the method of manufacture of a DRAM according to another embodiment of the present invention.
Figure 103:
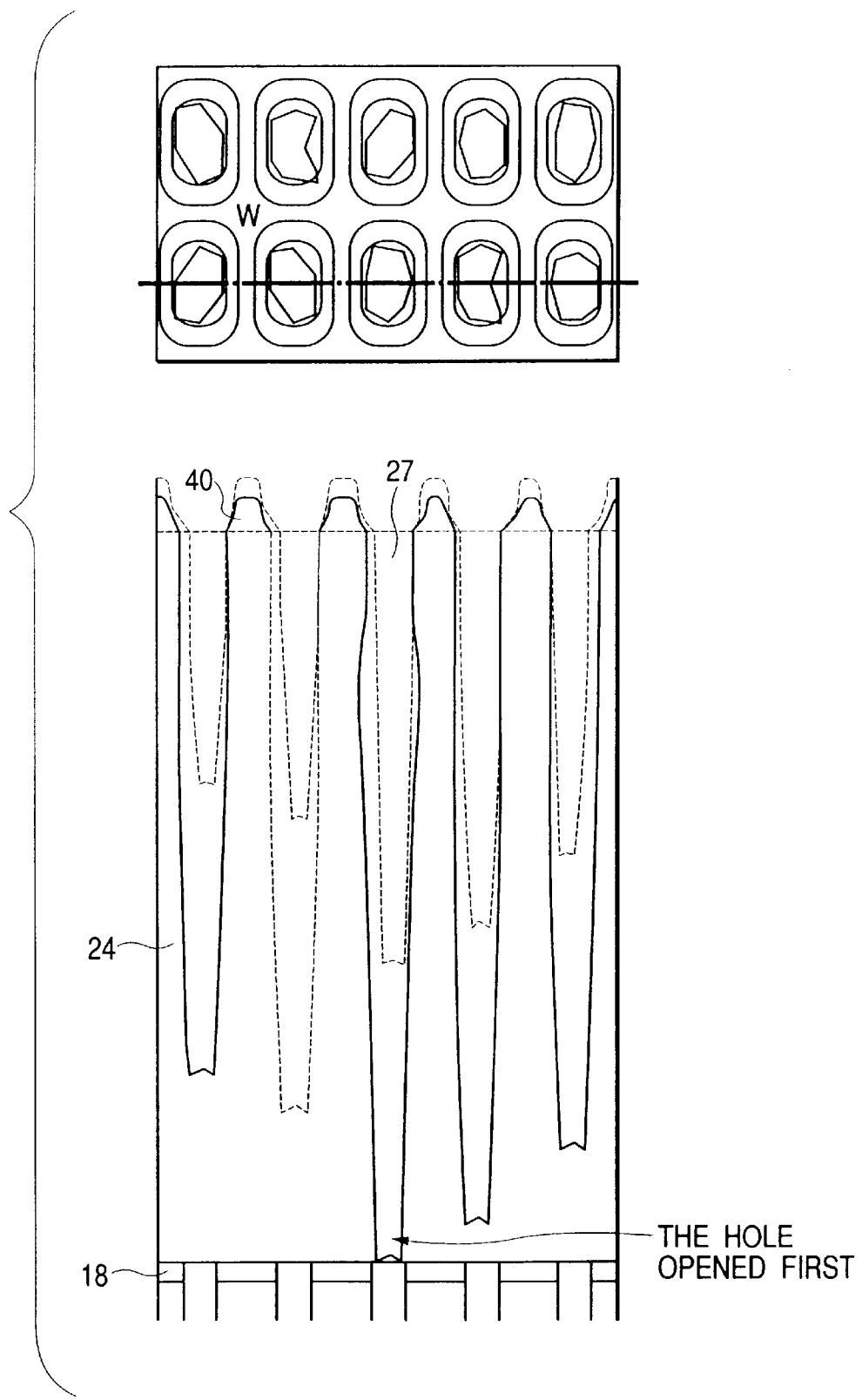
FIG. 103 is a fragmentary cross-sectional view of a semiconductor substrate illustrating the method of manufacture of a DRAM according to another embodiment of the present invention.
Figure 104:
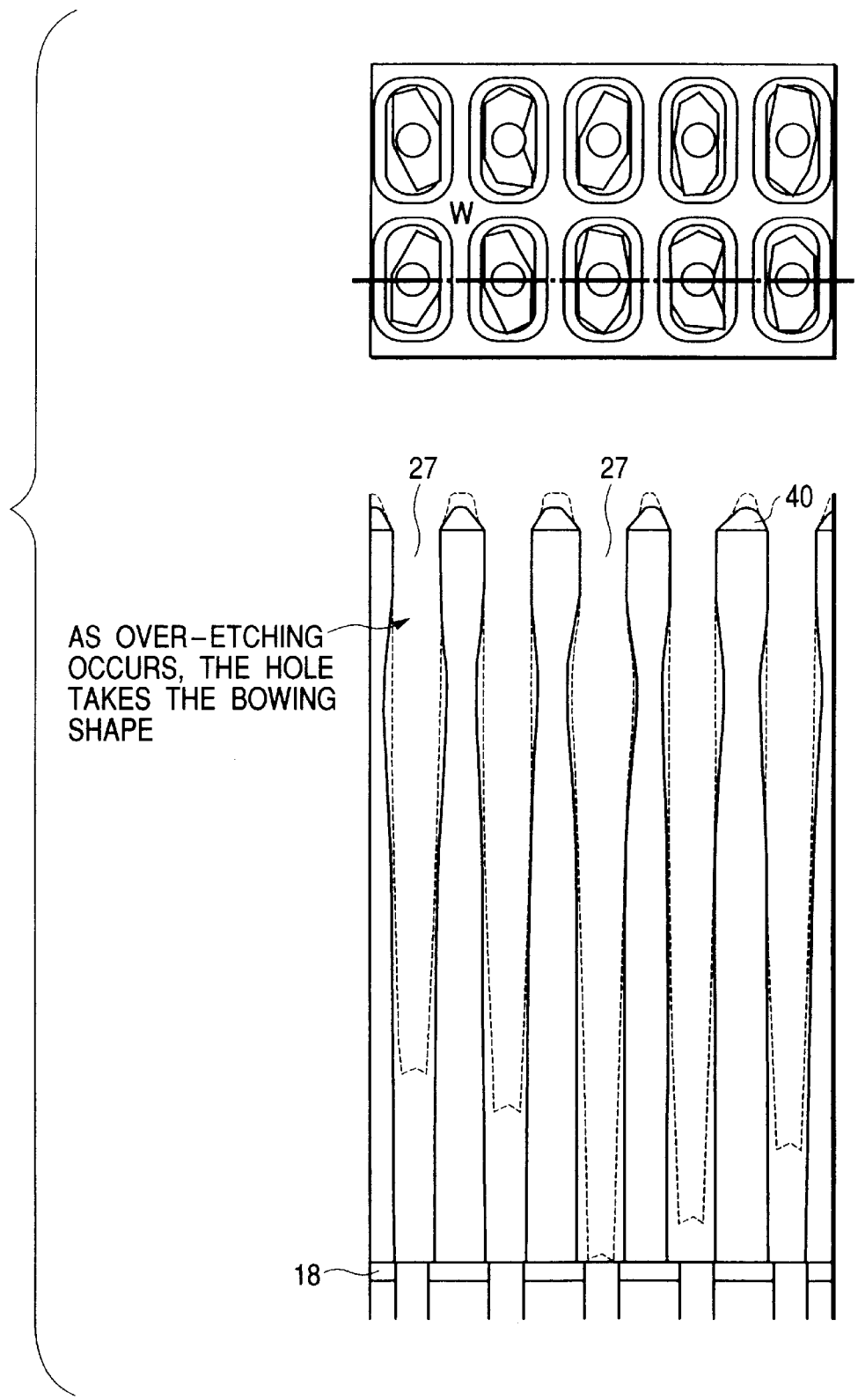
FIG. 104 is a fragmentary cross-sectional view of a semiconductor substrate illustrating the method of manufacture of a DRAM according to another embodiment of the present invention.

As illustrated in FIG. 100, after removal of the photoresist pattern 26 and antireflective film 25 lying thereunder by ashing, the silicon oxide film 24 is etched using the W film 40 as a hard mask, as illustrated in FIGS. 101 to 104 to form a hole 27 wherein a lower electrode is to be formed. The antireflective film 25 is etched under conditions similar to those of Embodiment 1. By etching of the silicon oxide film 24 using the W film 24, which has been formed to have an irregular opening area or cross-sectional shape, as a hard mask, etching starts from the position having a larger opening area and the hole 27 with a bowing cross-sectional-shape is formed (FIG. 104).

Figure 105:
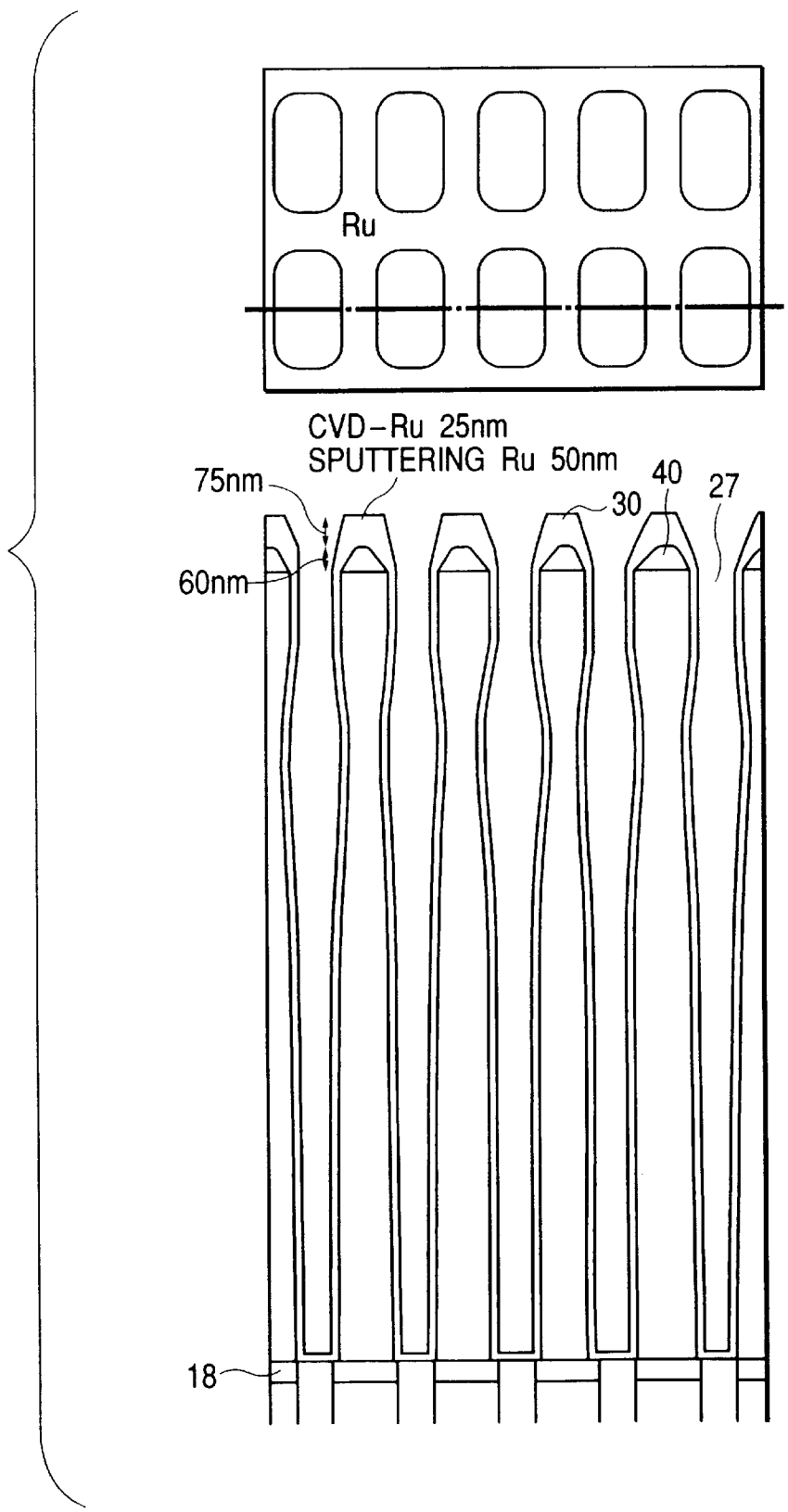
FIG. 105 is a fragmentary cross-sectional view of a semiconductor substrate illustrating the method of manufacture of a DRAM according to another embodiment of the present invention.

As illustrated in FIG. 105, an Ru film 30 is then deposited over the silicon oxide film 24 and inside of the hole 27. More specifically, it is deposited to 50 nm thick over the W film 40 by CVD and then 25 nm thick by sputtering, whereby the Ru film 30 of about 30 nm thick is deposited on the bottom surface and side walls of the hole 27. This hole 27 has an aspect ratio of about 30.

Figure 106:
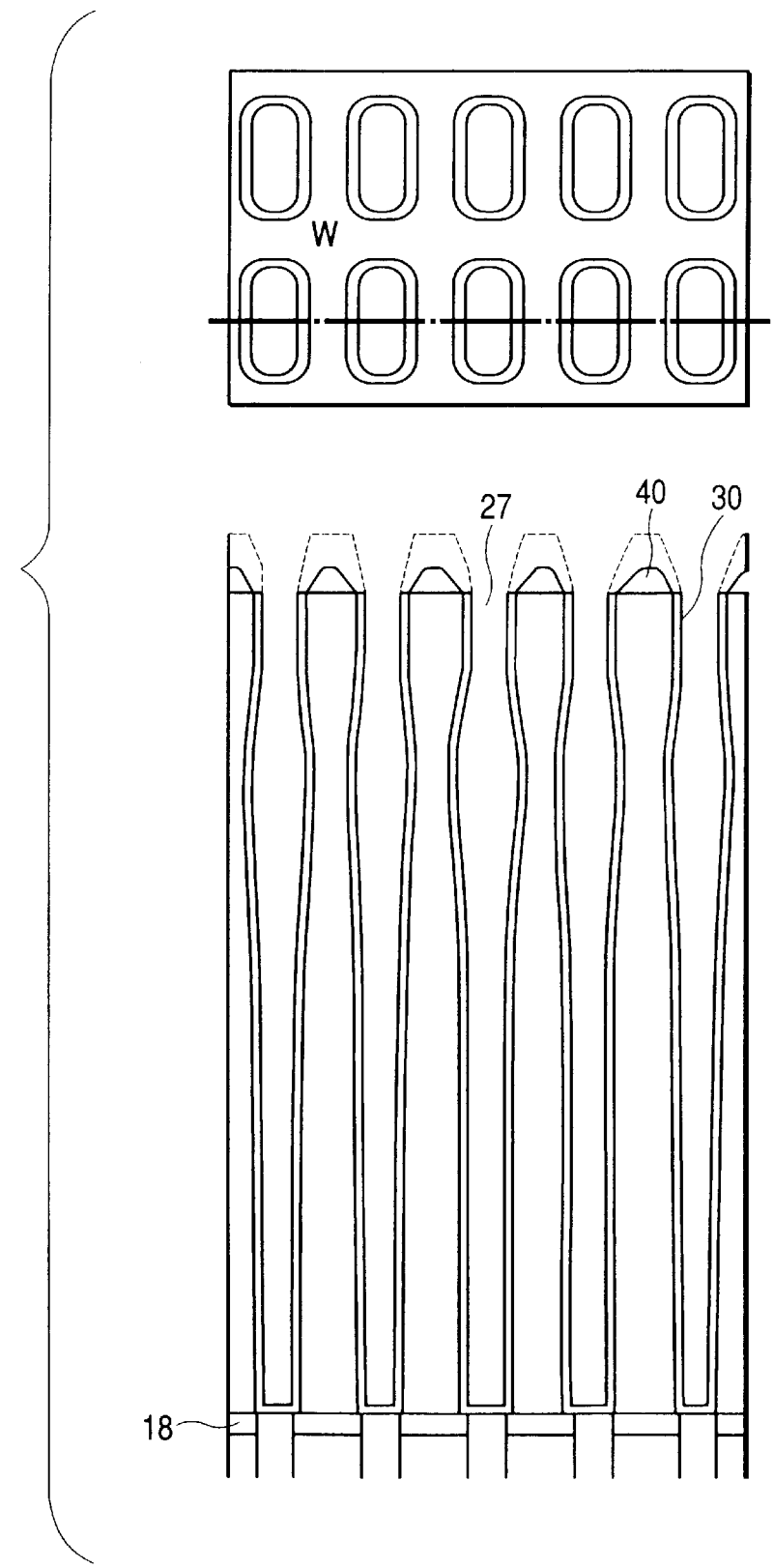
FIG. 106 is a fragmentary cross-sectional view of a semiconductor substrate illustrating the method of manufacture of a DRAM according to another embodiment of the present invention.

As illustrated in FIG. 106, the Ru film 30 outside the hole 27 is removed by ion assist etching to leave it only on the side walls and bottom surface of the hole 27, whereby a lower electrode 30a made of the Ru film 30 embedded inside of the hole 27 having a markedly high aspect ratio of about 30 is formed. The Ru film 30 is etched by an inductively coupled plasma (ICP) etching apparatus under the conditions of an ICP power of 900 W, RF bias power of 150 W, $O_2/Cl_2$ of 900/100 sccm (20 mTorr), a lower electrode (wafer stage) of 50° C. and an etching rate of an Ru film of 100 nm/min.

Figure 107:
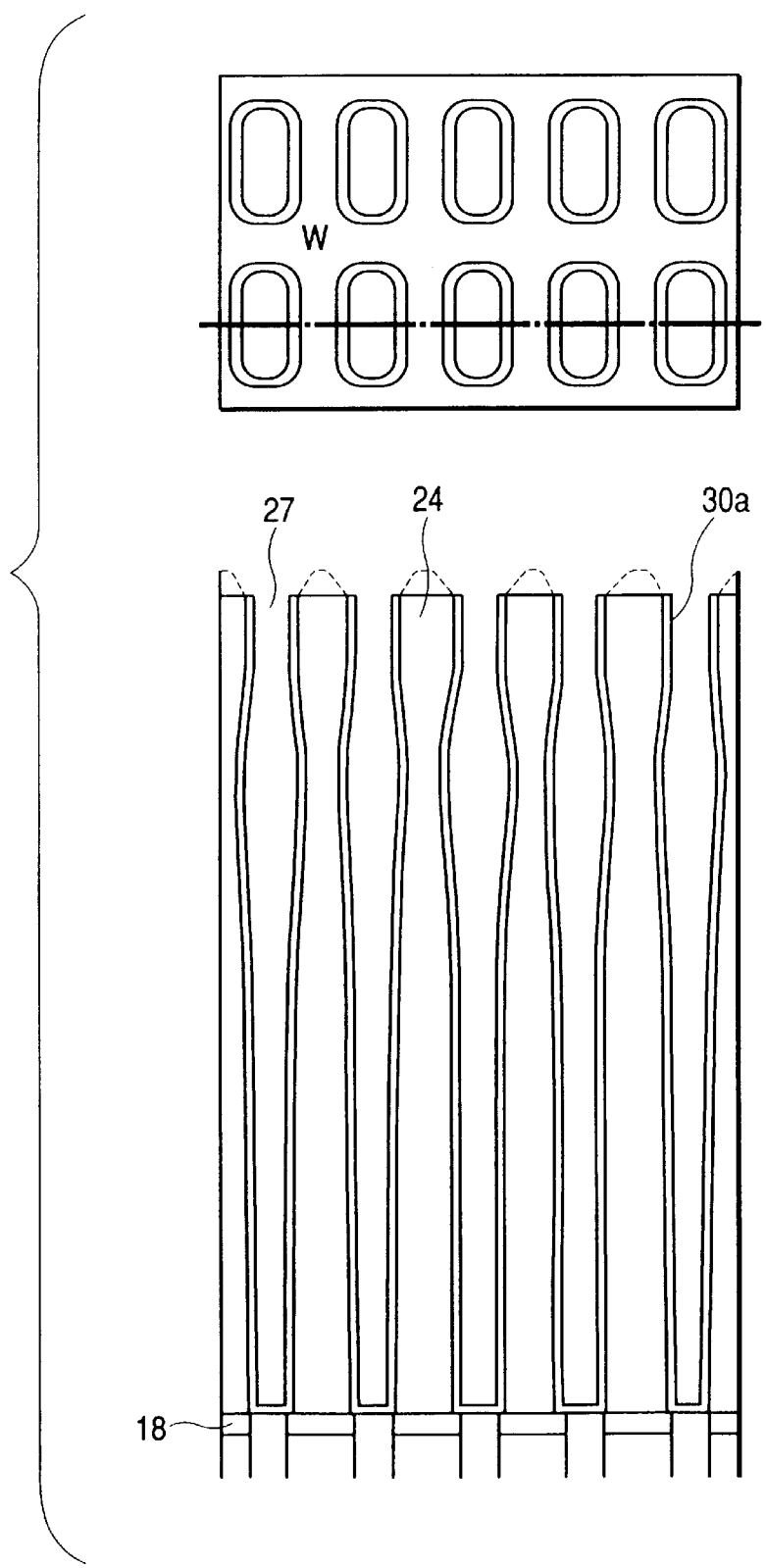
FIG. 107 is a fragmentary cross-sectional view of a semiconductor substrate illustrating the method of manufacture of a DRAM according to another embodiment of the present invention.
Figure 108:
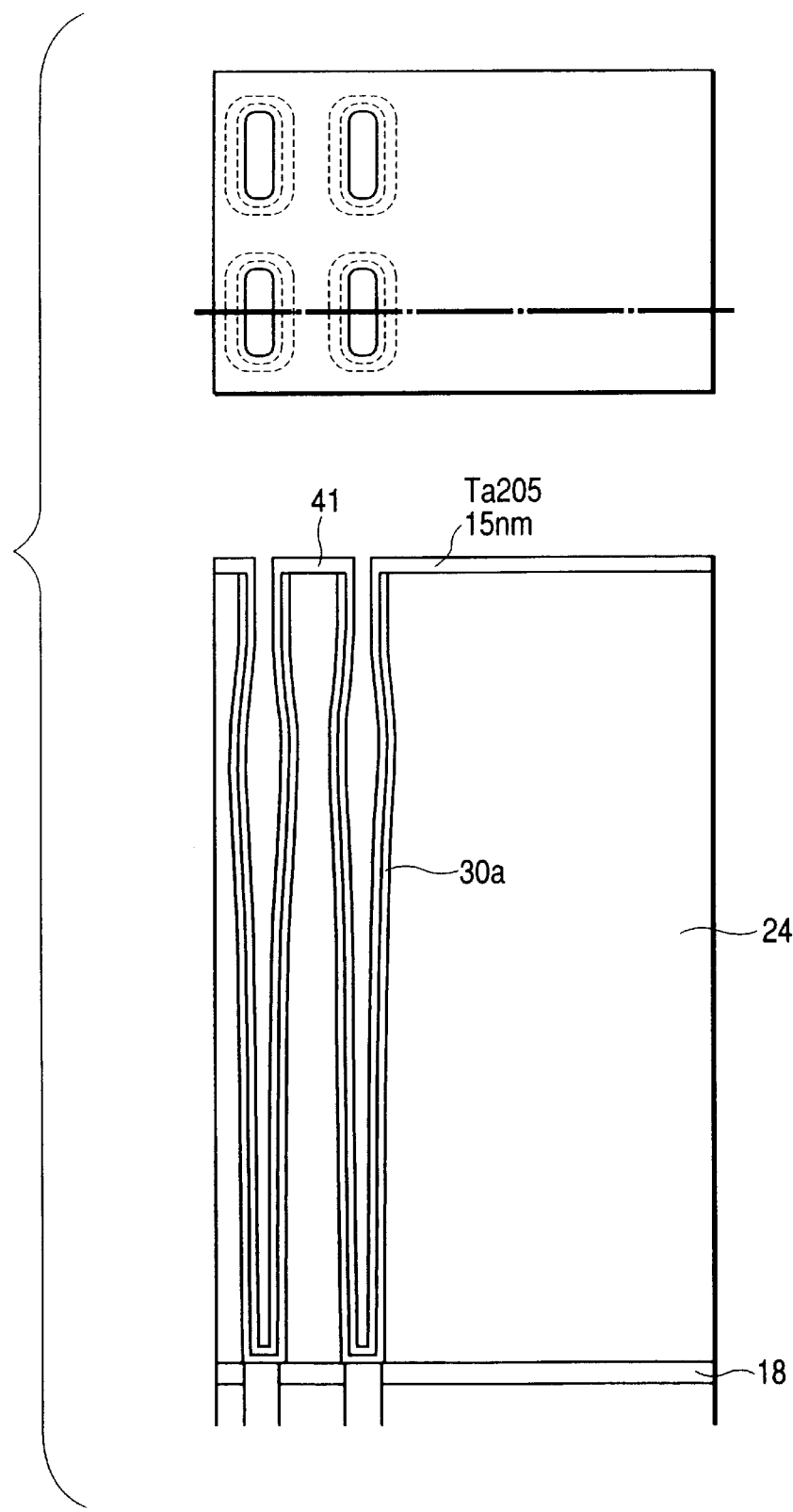
FIG. 108 is a fragmentary cross-sectional view of a semiconductor substrate illustrating the method of manufacture of a DRAM according to another embodiment of the present invention.
Figure 109:
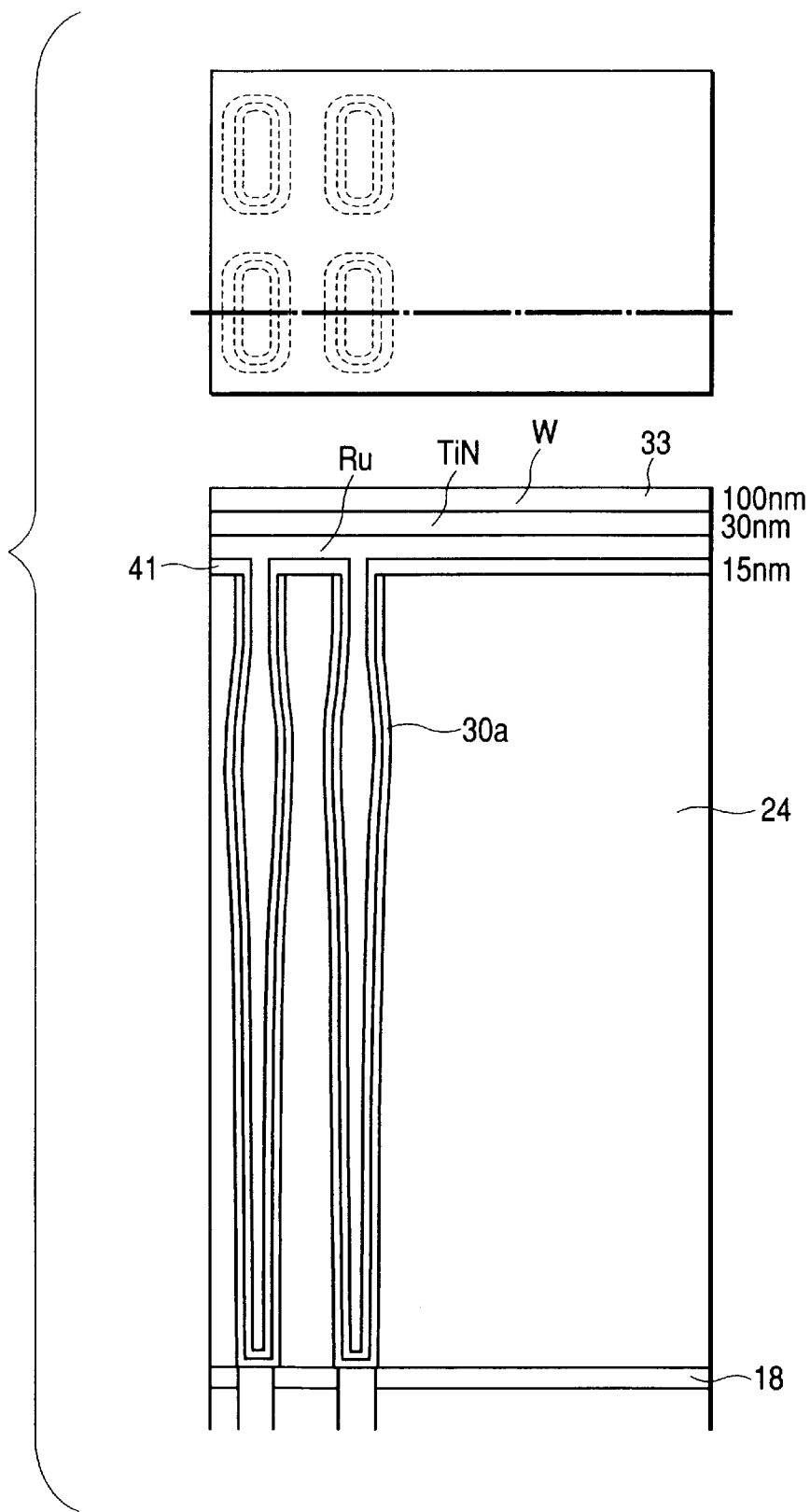

As illustrated in FIG. 107, after removal of the W film 40, which had served as a hard mask, by wet etching with aqueous ammonia, a $Ta_2O_5$ film 41, to be a capacitor insulating film, is deposited over the silicon oxide film 24 and inside of the hole 27 having the lower electrode 30a formed therein. The $Ta_2O_5$ film 41 is deposited by CVD to a thickness of about 15 nm.

After heat treating (annealing) the $Ta_2O_5$ film 41 at about 650° C. in an oxygen atmosphere to repair the film from oxygen defects or the like, an upper electrode 33 is formed over the $Ta_2O_5$ film 41, as illustrated in FIG. 112, for example, by depositing an Ru film (about 70 nm thick), a TiN film (about 30 nm thick) and a W film (about 100 nm thick) over the $Ta_2O_5$ film 41 by CVD or sputtering and then, removing these films from a region other than the memory array by dry etching using a photoresist film 42 as a mask. This etching is conducted, for example, by an inductively coupled plasma etching apparatus under the conditions of an ICP power of 1000 W, RF bias power of 500 W, $Cl_2$/Ar of 50/50 sccm (10 mTorr), lower electrode (stage) temperature of 50° C. and over etching of 20%. As illustrated in FIG. 110, etching can be achieved with good controllability by processing the end of the photoresist film 42 into a round shape in advance.

As described above in detail, this Embodiment makes it possible to selectively remove a portion of the Ru film outside a hole having a markedly high aspect ratio, while leaving another portion inside of the hole so that an information storage capacitor using $Ta_2O_5$ as a capacitor insulating film can be formed with a good yield inside of a hole leaving a markedly high aspect ratio.

Embodiment 3

Another Embodiment of the etching of an Ru film by using ozone will next be described based on FIGS. 113 to 116. As illustrated in FIG. 113, the silicon oxide film 24 is dry etched to form a hole (recess) 27 having a bottom surface from which the surface of a plug 22 in a throughhole 19 is exposed. As illustrated in FIG. 114, after deposition of an Ru film 43 over the silicon oxide film 24 and inside of the hole 27, the Ru film 43 and a polycrystalline silicon film constituting the plug 22 lying under the silicon oxide film are reacted by heat treatment to form, as illustrated in FIG. 115, a barrier metal film 44 made of Ru silicide on the bottom of the hole. As illustrated in FIG. 116, an unreacted portion of the Ru film 43 is then removed by etching with ozone to complete the barrier metal film 44 on the bottom of the hole. Etching of the Ru film 43 with ozone makes it possible to remove an unreacted portion of the Ru film 43 without etqhing the barrier metal film 44 on the bottom of the holel because the selectivity of it relative to Ru silicide becomes 100 or greater. A lower electrode is then formed inside of the hole 27, for example, by the method as described in Embodiment 1.

Embodiment 4

A further Embodiment of etching of an Ru film with ozone will next be described based on FIG. 117. For example, when an Ru film is etched using a photoresist film as a mask, removal of the photoresist film by ashing in the subsequent step happens to remove the Ru film by etching with an oxygen radical. Particularly, when the upper electrode of an information storage capacitor is made of an Ru film, such an inconvenience tends to occur, though depending on the etching conditions, because the Ru film is as thin at 20 to 30 nm.

As illustrated in FIGS. 117(*a*) to 117(*c*), an $RuO_2$ film 47 is then formed as a protector between an Ru film 46 and a photoresist film 45 and an electrode is constituted of the Ru film 46 and $RuO_2$ film 47. In this case, the $RuO_2$ film 47 is not etched by oxygen radicals used upon removal of the photoresist film 44 by ashing so that disappearance of the Ru film 46 lying under the $RuO_2$ film 47 can be prevented.

As a material for the protector formed over the Ru film 46, not only $RuO_2$ but also $OsO_2$ or polymetal double oxides containing $RuO_2$ or $OsO_2$ as a principal component can be used.

Embodiment 5

In this Embodiment, constitution of a capacitor insulating film of an information storage capacitor from $Ta_2O_5$ (tantalum oxide) will be described.

In accordance with the step as illustrated in FIGS. 1 to 74 in Embodiment 1, the photoresist film 31 is embedded inside of the hole 27, followed by dry etching with ozone to remove a portion of the Ru film 30 outside the hole 27 not covered with the photoresist film 31. The hole 27 in this Embodiment with the Ru film 30 being deposited on the side walls and bottom surface thereof has an aspect ratio of about 30, similar to that in Embodiment 2.

In this Embodiment, the photoresist film 31 inside of the hole 27 was ashed for about 2 minutes at 250° C., whereby only the photoresist film 31 could be removed without removing the Ru film 30 from the side walls and bottom surface of the hole 27. Ashing temperature not greater than 150° C. however removed even a portion of the Ru film 30 on the side walls from which the photoresist film 31 has been removed, owing to lowering in the ashing rate of the photoresist film 31. Ashing at 25020 C. for about 4 minutes, on the other hand, removed even the Ru film 30 in addition to the photoresist film 31.

Accordingly, ashing at a temperature within a range of from 180 to 280° C., preferably at a temperature near 250° C. for about 1 to 3 minutes makes it possible to remove only the phbtoresist film 31 without removing or deteriorating a portion of the Ru film 30 on the side walls and bottom surface of the hole 27. In this case, exposure of ozone to ultraviolet rays increases the ashing rate of the photoresist film 31 and reduces the etching rate of the Ru film 30, resulting in an increase in a margin.

As the second method for removing the photoresist film 31 inside of the hole 27, it was treated in a liquid phase. More specifically, 96 wt. % sulfuric acid and 30 wt. % aqueous hydrogen peroxide were mixed at a ratio of 1:1 or 4:1 and the wafer was immersed in the resulting mixture heated to 120° C. During heating, stirring of the mixture was continued. The wafer was then rinsed with pure water for 10 minutes. As a result, only the photoresist film 31 was removed by either one of the 1:1 mixture or 4:1 mixture.

At a temperature within a range of 100 to 160° C., effects similar to the above are available. It is also possible to remove only the photoresist film 31 without removing the Ru film 30 inside of the hole 27 by using, instead of the above-described mixture, ozone sulfuric acid, aqueous ozone, acetone or organic resist removing solution.

The various aspects and features were so far described specifically based on Embodiments of the present invention. It should however be borne in mind that the present invention is not limited to or by the above-described Embodiments. It is needless to say that the Embodiments can be modified within a range not departing from the scope of the invention.

In the above-described Embodiments, a description was made of the constitution of the lower electrode of an information storage capacitor from an Ru film. Metals mainly containing a platinum element other than Ru such as osmium (Os), rhodium (Rh), palladium (Pd), iridium (Ir) or platinum, or metal oxides thereof, can also be employed.

In the above-described Embodiments 1 and 5, a photoresist film is embedded in the hole in order to protect the Ru film inside of the hole. Alternatively, a protecting film such as BARC can also be filled inside of the hole by applying an antireflective film (non-sensitive organic coating film) such as BARC on the silicon oxide film including the inside of the hole and then removing the film outside of the hole by washing.

In the above-described Embodiments, their application to a DRAM or its manufacturing method was described. They can also be applied not only to a general-purpose DRAM but also a logic-mounted DRAM or FeRAM.

Among the features disclosed by the present application, advantages available by the typical ones will next be described.

(1) Without removing a portion of the Ru film inside of the hole having a high aspect ratio, another portion of the Ru film outside the hole can be removed. This makes it possible to promote the heightening of the degree of integration a DRAM.

(2) A lower electrode of an information storage capacitor can be formed inside of a hole having a markedly high aspect ratio. This makes it possible to promote the heightening of the degree of integration of a DRAM.

What is claimed is:

1. A manufacturing method of a semiconductor integrated circuit device, comprising the steps of:

(a) forming a first conductor film made of a metal or an alloy containing ruthenium or osmium as a principal component over a first main surface of a wafer, and (b) forming a first resist pattern on said first main surface of said wafer having said first conductor film formed thereover, and (c) subjecting said first conductor film to isotropic dry etching with said first resist pattern as an etching mask, wherein selectivity of said first conductor film relative to a resist forming the first resist pattern is 0.5 or greater.

2. A manufacturing method of a semiconductor integrated circuit device according to claim 1, wherein said isotropic dry etching is non-plasma type dry etching.

3. A manufacturing method of a semiconductor integrated circuit device according to claim 2, wherein said first conductor film is made of a metal or an alloy containing ruthenium as a principal component.

4. A manufacturing method of a semiconductor integrated circuit device according to claim 3, wherein temperature of said wafer during said etching is 180° C. or less.

5. A manufacturing method of a semiconductor integrated circuit device according to claim 4, wherein temperature of said wafer during said etching is 25° C. or less.

6. A manufacturing method of a semiconductor integrated circuit device according to claim 5, wherein temperature of said wafer during said etching is 150° C. or less.

7. A manufacturing method of a semiconductor integrated circuit device according to claim 6, wherein temperature of said wafer during said etching is 110° C. or less.

8. A manufacturing method of a semiconductor integrated circuit device according to claim 7, wherein the first main surface of said wafer during said etching is not exposed to ultraviolet rays.

9. A manufacturing method of a semiconductor integrated circuit device according to claim 3, wherein the selectivity of said first conductor film relative to the resist upon isotropic dry etching is 4 or greater.

10. A manufacturing method of a semiconductor integrated circuit device according to claim 9, wherein the selectivity of said first conductor film relative to the resist upon isotropic dry etching is 20 or greater.

* * * * *